(12) United States Patent
Lee et al.

(10) Patent No.: US 11,611,048 B2
(45) Date of Patent: Mar. 21, 2023

(54) ORGANOMETALLIC COMPOUND AND ORGANIC LIGHT EMITTING DEVICE INCLUDING THE SAME

(71) Applicant: Samsung Display Co., Ltd., Yongin-si (KR)

(72) Inventors: Hyunjung Lee, Yongin-si (KR); Mina Jeon, Yongin-si (KR); Soobyung Ko, Yongin-si (KR); Sungbum Kim, Yongin-si (KR); Haejin Kim, Yongin-si (KR); Eunsoo Ahn, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 137 days.

(21) Appl. No.: 16/918,657

(22) Filed: Jul. 1, 2020

(65) Prior Publication Data

US 2021/0159428 A1 May 27, 2021

(30) Foreign Application Priority Data

Nov. 27, 2019 (KR) .................. 10-2019-0154560

(51) Int. Cl.
*H01L 51/00* (2006.01)
*C09K 11/06* (2006.01)
*H01L 51/50* (2006.01)

(52) U.S. Cl.
CPC .......... *H01L 51/0085* (2013.01); *C09K 11/06* (2013.01); *C09K 2211/185* (2013.01); *H01L 51/5016* (2013.01)

(58) Field of Classification Search
CPC ............ H01L 51/0085; H01L 51/5072; H01L 51/4273; H01L 51/5056; H01L 51/5092; H01L 51/5016; H01L 2251/552; H01L 51/5012; H01L 51/5024; H01L 51/5048; C09K 11/06; C09K 2211/185; C07F 15/0033
See application file for complete search history.

(56) References Cited

U.S. PATENT DOCUMENTS

| 8,580,961 | B2 | 11/2013 | Chi et al. | |
|---|---|---|---|---|
| 9,219,237 | B1 | 12/2015 | Chi et al. | |
| 9,553,277 | B2* | 1/2017 | Chi | H01L 51/5016 |
| 9,905,784 | B2* | 2/2018 | Xia | C07F 15/0033 |
| 9,929,357 | B2* | 3/2018 | Boudreault | C07F 15/0033 |
| 10,003,033 | B2* | 6/2018 | Boudreault | C07F 15/0033 |
| 10,008,680 | B2* | 6/2018 | Chi | C09K 11/06 |
| 10,043,987 | B2* | 8/2018 | Ma | H01L 51/0085 |
| 10,153,442 | B2* | 12/2018 | Chi | C09K 11/06 |
| 2011/0277841 | A1* | 11/2011 | Chi | H01L 51/0086 136/263 |
| 2013/0018189 | A1* | 1/2013 | Chi | H01L 51/0086 546/275.4 |
| 2015/0155501 | A1* | 6/2015 | Xia | C07F 13/00 546/4 |

(Continued)

*Primary Examiner* — Bitew A Dinke
(74) *Attorney, Agent, or Firm* — Kile Park Reed & Houtteman PLLC

(57) ABSTRACT

An organometallic compound and an organic light-emitting device including the same are provided. The organometallic compound is represented by Formula 1:

$M(L_A)_{n1}(L_B)_{n2}$.  <Formula 1>

14 Claims, 4 Drawing Sheets

10

190

150

110

(56) References Cited

U.S. PATENT DOCUMENTS

| | | | |
|---|---|---|---|
| 2015/0295189 A1* | 10/2015 | Brooks | C07F 15/0033 546/4 |
| 2015/0380666 A1* | 12/2015 | Szigethy | C07F 15/0033 546/4 |
| 2016/0028026 A1* | 1/2016 | Das | H01L 51/0085 546/10 |
| 2016/0049599 A1* | 2/2016 | Ma | C07F 15/0033 546/4 |
| 2016/0093808 A1* | 3/2016 | Adamovich | H01L 51/0085 252/301.16 |
| 2016/0133859 A1* | 5/2016 | Boudreault | H01L 51/0085 546/4 |
| 2016/0133860 A1* | 5/2016 | Boudreault | H01L 51/0085 546/4 |
| 2016/0141522 A1* | 5/2016 | Ma | C09K 11/06 546/4 |
| 2016/0355534 A1 | 12/2016 | Chi et al. | |
| 2016/0380216 A1 | 12/2016 | Tsai et al. | |
| 2017/0237022 A1* | 8/2017 | Lee | H01L 51/0087 257/40 |
| 2017/0365799 A1* | 12/2017 | Ji | H01L 51/0087 |
| 2018/0254417 A1* | 9/2018 | Ma | H01L 51/0054 |
| 2018/0273562 A1* | 9/2018 | Choi | C09K 11/06 |
| 2018/0287078 A1* | 10/2018 | Chen | H01L 51/0085 |
| 2019/0103566 A1* | 4/2019 | Kim | C07F 15/0086 |
| 2019/0112324 A1* | 4/2019 | Kim | H01L 51/5012 |
| 2019/0140192 A1* | 5/2019 | Cho | C07F 15/0086 |
| 2019/0153008 A1* | 5/2019 | Noh | H01L 51/0085 |
| 2019/0326527 A1* | 10/2019 | Choi | H01L 51/0085 |
| 2020/0055886 A1* | 2/2020 | Choi | H01L 51/0087 |
| 2020/0091441 A1* | 3/2020 | Jeon | H01L 51/0085 |
| 2020/0235319 A1* | 7/2020 | Kim | C07F 15/002 |
| 2020/0377537 A1* | 12/2020 | Jeon | C07F 15/0033 |
| 2021/0028374 A1* | 1/2021 | Choi | C09K 11/06 |
| 2021/0167301 A1* | 6/2021 | Ahn | H01L 51/5024 |
| 2021/0184135 A1* | 6/2021 | Kim | H01L 51/0094 |
| 2021/0198297 A1* | 7/2021 | Jeon | C07F 15/0033 |
| 2021/0253618 A1* | 8/2021 | Kwon | H01L 51/0085 |
| 2021/0288268 A1* | 9/2021 | Yi | H01L 51/0085 |
| 2021/0367167 A1* | 11/2021 | Lee | H01L 51/0087 |
| 2021/0376262 A1* | 12/2021 | Ahn | H01L 51/0094 |
| 2021/0399222 A1* | 12/2021 | Park | H01L 51/0073 |
| 2022/0006028 A1* | 1/2022 | Kim | H01L 51/0073 |
| 2022/0013734 A1* | 1/2022 | Lee | C07F 15/0033 |
| 2022/0020939 A1* | 1/2022 | Lee | C09K 11/06 |
| 2022/0037606 A1* | 2/2022 | Syn | H01L 51/5096 |
| 2022/0045286 A1* | 2/2022 | Lee | C07F 15/0086 |

\* cited by examiner

| 190 |
|---|
| 150 |
| 110 |

| 190 |
|---|
| 150 |
| 110 |
| 210 |

| 220 |
|-----|
| 190 |
| 150 |
| 110 |

| 220 |
|---|
| 190 |
| 150 |
| 110 |
| 210 |

ORGANOMETALLIC COMPOUND AND ORGANIC LIGHT EMITTING DEVICE INCLUDING THE SAME

CROSS-REFERENCE TO RELATED APPLICATION(S)

This application claims priority to and benefits of Korean Patent Application No. 10-2019-0154560 under 35 U.S.C. § 119, filed on Nov. 27, 2019, in the Korean Intellectual Property Office, the entire contents of which are incorporated herein by reference.

BACKGROUND

1. Technical Field

Embodiments relate to an organometallic compound and an organic light-emitting device including the same.

2. Description of the Related Art

Organic light-emitting devices are self-emission devices that produce full-color images, and also have wide viewing angles, high contrast ratios, short response times, and excellent characteristics in terms of brightness, driving voltage, and response speed, compared to devices in the art.

An organic light-emitting device may include a first electrode disposed on a substrate, and a hole transport region, an emission layer, an electron transport region, and a second electrode, which are sequentially disposed on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transit from an excited state to a ground state, thereby generating light.

SUMMARY

Embodiments include an organometallic compound and an organic light-emitting device including the same.

Additional embodiments will be set forth in part in the description which follows and, in part, will be apparent from the description, or may be learned by practice of the embodiments of the disclosure.

In an embodiment, an organometallic compound is represented by Formula 1.

$$M(L_A)_{n1}(L_B)_{n2} \quad \text{<Formula 1>}$$

In Formula 1,

M may be selected from platinum (Pt), palladium (Pd), copper (Cu), zinc (Zn), silver (Ag), gold (Au), iridium (Ir), rhodium (Rh), cobalt (Co), ruthenium (Ru), rhenium (Re), osmium (Os), titanium (Ti), zirconium (Zr), hafnium (Hf), europium (Eu), terbium (Tb), and thulium (Tm), n1 may be 1 or 2, n2 may be 0 or 1, the sum of n1 and n2 may be 2, $L_A$ may be a tridentate ligand represented by Formula 1A, $L_B$ may be a tridentate ligand represented by Formula 1B:

<Formula 1A> <Formula 1B>

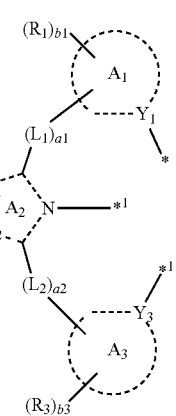

<Formula 1A>

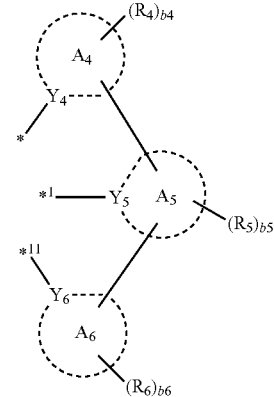

<Formula 1B>

In Formulae 1A and 1B,

*, *', and *'' may each be a binding site to M, $Y_1$ and $Y_3$ to $Y_6$ may each independently be selected from N and C, $X_{21}$ may be selected from $C(Z_{21})$, $N(Z_{21})$, N, O, and S, $X_{22}$ may be selected from $C(Z_{22})$, $N(Z_{22})$, N, O, and S, $A_1$ and $A_3$ to $A_6$ may each independently be selected from a $C_5$-$C_{60}$ carbocyclic ring and a $C_1$-$C_{60}$ heterocyclic ring, $A_2$ may be selected from an imidazole ring, an oxazole ring, a thiazole ring, a selenazole ring, a triazole ring, an oxadiazole ring, a thiadiazole ring, and a selenadiazole ring, $L_1$ and $L_2$ may each independently be selected from *—O—*', *—S—*', *—C($R_7$)($R_8$)—*', *—C($R_7$)=*', *=C($R_7$)—*', *—C($R_7$)=C($R_8$)—*', *—C(=O)—*', *—C(=S)—*', *—C≡C—*', *—B($R_7$)—*', *—N($R_7$)—*', *—P($R_7$)—*', *—Si($R_7$)($R_8$)—*', *—P($R_7$)($R_8$)—*', and *—Ge($R_7$)($R_8$)—*', a1 and a2 may each independently be selected from 0, 1, and 2, $Z_{21}$, $Z_{22}$, $R_1$, and $R_3$ to $R_8$ may each independently be selected from hydrogen, deuterium, —F, —Cl, —Br, —I, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —C(=O)($Q_1$), —S(=O)$_2$($Q_1$), and —P(=O)($Q_1$)($Q_2$), b1 and b3 to b6 may each independently be selected from 1, 2, 3, 4, 5, 6, 7, and 8, with the proviso that: at least one pair of substituents may optionally be linked together to form a substituted or unsubstituted $C_5$-$C_{60}$ carbocyclic group or a substituted or unsubstituted $C_1$-$C_{60}$ heterocyclic group, the pair of substituents selected from the group consisting of $Z_{21}$ and $Z_{22}$, two neighboring $R_1$(s) in $R_1$(s) in the number of b1, two neighboring $R_3$(s) in $R_3$(s) in the number of b3, two neighboring $R_4$(s) in $R_4$(s) in the number of b4, two neighboring $R_5$(s) in $R_5$ (s) in the number of b5, two neighboring $R_6$(s) in $R_6$(s) in the number of b6, $R_1$ and $R_7$, and $R_3$ and $R_7$, one of the following conditions i) to iii) may be satisfied, i) $Y_1$ is N, and $A_1$ is a $Y_1$-containing 5-membered ring, a $Y_1$-containing 6-membered ring, a $C_5$-$C_{60}$ heterocyclic ring to which a $Y_1$-containing 5-membered ring is condensed, or a $C_5$-$C_{60}$ heterocyclic ring to which a $Y_1$-containing 6-membered ring is condensed, ii) $Y_1$ is C and each of a1 and a2 is 0, iii) $Y_1$ is C and a1 and a2 are each independently selected from 1 and 2, and at least one substituent of the substituted $C_5$-$C_{60}$ carbocyclic group, the substituted $C_1$-$C_{60}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_1$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$), and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each independently selected from hydrogen, deuterium, —F, —Cl, —Br, —I, a hydroxyl group, a cyano group, a nitro group, an amino group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

In an embodiment, an organic light-emitting device may include: a first electrode, a second electrode facing the first electrode, and an organic layer disposed between the first electrode and the second electrode and including an emission layer, wherein the organic light-emitting device includes an organometallic compound represented by Formula 1.

In an embodiment, the organometallic compound may have a T1 energy of greater than or equal to about 2.25 eV.

In an embodiment, the organic layer may comprise the organometallic compound.

In an embodiment, the emission layer may comprise the organometallic compound.

In an embodiment, the emission layer may further comprise a host, and the amount of the host included in the emission layer may be greater than the amount of the organometallic compound included in the emission layer.

In an embodiment, the emission layer may emit light having a wavelength of maximum emission from about 445 nm to about 550 nm.

In an embodiment, the first electrode may be an anode, the second electrode may be a cathode, and the organic layer may further comprise a hole transport region disposed between the first electrode and the emission layer, and an electron transport region disposed between the emission layer and the second electrode. The hole transport region may comprise a hole injection layer, a hole transport layer, an emission auxiliary layer, an electron blocking layer, or any combination thereof. The electron transport region may comprise a buffer layer, a hole blocking layer, an electron transport layer, an electron injection layer, or any combination thereof.

BRIEF DESCRIPTION OF THE DRAWINGS

The above and other aspects, features, and advantages of embodiments of the disclosure will be more apparent from the following description taken in conjunction with the figures.

FIGS. 1 to 4 are each schematic cross-sectional views of organic light-emitting devices according to embodiments.

DETAILED DESCRIPTION OF THE EMBODIMENTS

Reference will now be made in detail to embodiments, examples of which are illustrated in the accompanying drawings. In this regard, the embodiments may have different forms and should not be construed as being limited to the descriptions set forth herein. Accordingly, the embodiments are described below, by referring to the figures, to explain aspects of the invention.

Like reference numerals refer to like elements throughout. In the drawings, the dimensions of structures are exaggerated for clarity of illustration. It will be understood that, although the terms first, second, etc. may be used herein to describe various elements, these elements should not be limited by these terms. These terms are only used to distinguish one element from another element. Thus, a first element could be termed a second element without departing from the teachings of the invention. Similarly, a second element could be termed a first element. As used herein, the singular forms are intended to include the plural forms as well, unless the context clearly indicates otherwise.

As used herein, the term "and/or" includes any and all combinations of one or more of the associated listed items for the purpose of its meaning and interpretation. For example, "A and/or B" may be understood to mean "A, B, or A and B." The terms "and" and "or" may be used in the conjunctive or disjunctive sense and may be understood to be equivalent to "and/or". Throughout the disclosure, the expression "at least one of a, b or c" indicates only a, only b, only c, both a and b, both a and c, both b and c, all of a, b, and c, or variations thereof.

The phrase "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be further understood that the terms "comprises," "comprising," "includes," and/or "including," when used in this specification, specify the presence of stated features, numerals, steps, operations, elements, parts, or the combination thereof, but do not preclude the presence or addition of one or more other features, numerals, steps, operations, elements, parts, or the combination thereof.

It will be further understood that when a layer, a film, a region, a plate, etc. is referred to as being "on" or "above" another part, it can be "directly on" the other part, or intervening layers may also be present. It will also be understood that when a layer, a film, a region, a plate, etc. is referred to as being "under" or "below" another part, it can be "directly under" the other part, or intervening layers may also be present. When an element is referred to as being disposed "on" another element, it can be disposed under the other element.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

In an embodiment, an organometallic compound is represented by Formula 1 below:

$$M(L_A)_{n1}(L_B)_{n2} \qquad <\text{Formula 1}>$$

M in Formula 1 may be selected from platinum (Pt), palladium (Pd), copper (Cu), zinc (Zn), silver (Ag), gold (Au), iridium (Ir), rhodium (Rh), cobalt (Co), ruthenium (Ru), rhenium (Re), osmium (Os), titanium (Ti), zirconium (Zr), hafnium (Hf), europium (Eu), terbium (Tb), and thulium (Tm).

In one embodiment, M may be iridium or rhodium.

Regarding Formula 1, n1 may be 1 or 2, n2 may be 0 or 1, and the sum of n1 and n2 may be 2.

n1 indicates the number of $L_A(s)$ included in Formula 1 and n2 indicates the number of $L_B(s)$ included in Formula 1.

In one embodiment, n1 may be 1, and n2 may be 1.

Regarding Formula 1, Formula 1, $L_A$ may be a tridentate ligand represented by Formula 1A, and $L_B$ may be a tridentate ligand represented by Formula 1B:

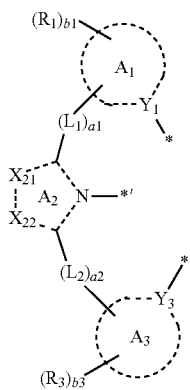

<Formula 1A>

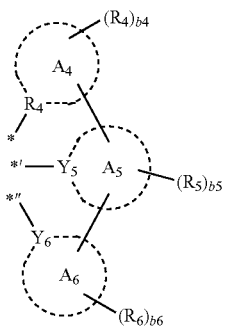

<Formula 1B>

In Formulae 1A and 1B, *, *', and *" indicate binding sites to M.

$Y_1$ and $Y_3$ to $Y_6$ in Formulae 1A and 1B may each independently be selected from N and C.

$Y_1$, N linked to *' in $A_2$, and $Y_3$ to $Y_6$ may each form a chemical bond with M. The chemical bond may be a covalent bond or a coordination bond.

In one embodiment, in Formula 1A, a bond between $Y_1$ and M may be a covalent bond, a bond between M and N linked to *' in $A_2$ may be a coordination bond, and a bond between $Y_3$ and M may be a covalent bond, and in Formula 1B, a bond between $Y_4$ and M may be a coordination bond, a bond between $Y_5$ and M may be a covalent bond, and a bond between $Y_6$ and M may be a coordination bond.

In Formula 1A, $X_{21}$ may be selected from $C(Z_{21})$, $N(Z_{21})$, N, O, and S, and $X_{22}$ may be selected from $C(Z_{22})$, $N(Z_{22})$, N, O, and S.

In Formulae 1A and 1B, $A_1$ and $A_3$ to $A_8$ may each independently be selected from a $C_5$-$C_{60}$ carbocyclic ring and a $C_1$-$C_{60}$ heterocyclic ring, and $A_2$ may be selected from an imidazole ring, an oxazole ring, a thiazole ring, a selenazole ring, a triazole ring, an oxadiazole ring, a thiadiazole ring, and a selenadiazole ring.

In one embodiment, $A_1$ and $A_3$ to $A_6$ in Formulae 1A and 1B may each independently be selected from a cyclohexane ring, a cyclohexene ring, cyclohexadiene ring, a benzene ring, a naphthalene ring, an anthracene ring, a phenanthrene ring, an azulene ring, a triphenylene ring, a pyrene ring, a chrysene ring, a cyclopentadiene ring, a 1,2,3,4-tetrahydronaphthalene ring, a furan ring, a thiophene ring, borole ring, silole ring, an indene ring, a fluorene ring, an indole ring, a carbazole ring, a benzofuran ring, a dibenzofuran ring, a benzothiophene ring, a dibenzothiophene ring, benzosilole ring, dibenzosilole ring, indenopyridine ring, an indolopyridine ring, a benzofuropyridine ring, a benzothienopyridine ring, a benzosilolopyridine ring, an indenopyrimidine ring, an indolopyrimidine ring, a benzofuropyrimidine ring, a benzothienopyrimidine ring, a benzosiloloyrimidine ring, a dihydropyridine ring, a pyridine ring, a pyrimidine ring, a pyrazine ring, a pyridazine ring, a triazine ring, a quinoline ring, an isoquinoline ring, a quinoxaline ring, a quinazoline ring, a phenanthroline ring, a pyrrole ring, a pyrazole ring, an imidazole ring, a 2,3-dihydroimidazole ring, a triazole ring, a 2,3-dihydrotriazole ring, a tetrazole ring, an oxazole ring, an isoxazole ring, an oxadiazole ring, an isoxadiazole ring, an oxatriazole ring, an isoxatriazole ring, a thiazole ring, an isothiazole ring, a thiadiazole ring, an isothiadiazole ring, a thiatriazole ring, an isothiatriazole ring, an azasilole ring, a diazasilole ring, a triazasilole ring, a benzopyrazole ring, a pyrazolopyridine ring, a furopyrazole ring, a thienopyrazole ring, a benzimidazole ring, a 2,3-dihydrobenzimidazole ring, an imidazopyridine ring, a 2,3-dihydroimidazopyridine ring, a furoimidazole ring, a thienoimidazole ring, an imidazopyrimidine ring, a 2,3-dihydroimidazopyrimidine ring, an imidazopyrazine ring, a 2,3-dihydroimidazopyrazine ring, a benzoxazole ring, a benzothiazole ring, a benzoxadiazole ring, a benzothiadiazole ring, a 5,6,7,8-tetrahydroisoquinoline ring, and a 5,6,7,8-tetrahydroquinoline ring.

The oxadiazole ring described herein may include a 1,2,3-oxadiazole ring, a 1,2,4-oxadiazole ring, a 1,2,5-oxadiazole ring, and a 1,3,4-oxadiazole ring. The thiadiazole ring may include a 1,2,3-thiadiazole ring, a 1,2,4-thiadiazole ring, a 1,2,5-thiadiazole ring, and a 1,3,4-thiadiazole ring. The triazole ring may include a 1,2,3-triazole ring and a 1,2,4-triazole ring.

In embodiments, $A_1$ in Formula 1A may be selected from a cyclohexane ring, a cyclohexene ring, a cyclohexadiene ring, a benzene ring, a pyridine ring, a pyrimidine ring, a pyrazine ring, a pyridazine ring, a triazine ring, a furan ring, a thiophene ring, a pyrrole ring, a borole ring, a silole ring, an oxazole ring, an isoxazole ring, an oxadiazole ring, an isoxadiazole ring, an oxatriazole ring, an isoxatriazole ring, a thiazole ring, an isothiazole ring, a thiadiazole ring, an isothiadiazole ring, a thiatriazole ring, an isothiatriazole ring, a pyrazole ring, an imidazole ring, a triazole ring, a tetrazole ring, an azasilole ring, a diazasilole ring, and a triazasilole ring.

In embodiments, in Formula 1A, $A_1$ may be selected from groups represented by Formulae A1-1 to A1-21, and $A_3$ may be selected from groups represented by Formulae A3-1 to A3-13:

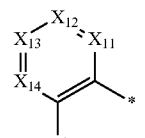

A1-1

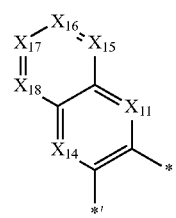

A1-2

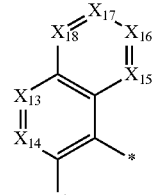

A1-3

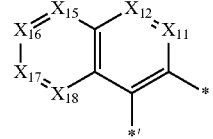

A1-4

-continued
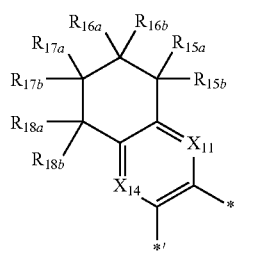
A1-5
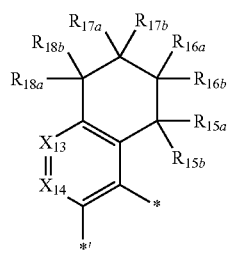
A1-6
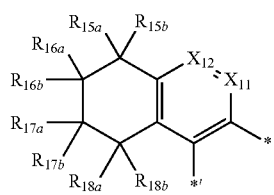
A1-7
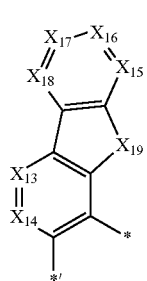
A1-8
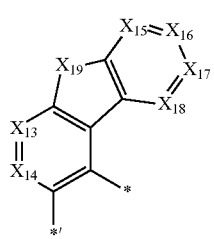
A1-9
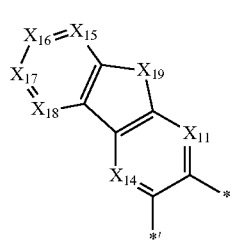
A1-10
-continued
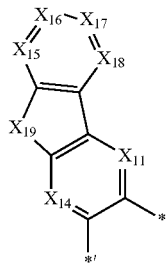
A1-11
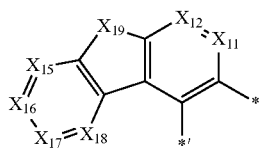
A1-12
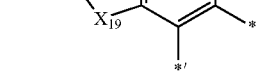
A1-13
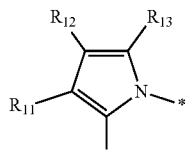
A1-14
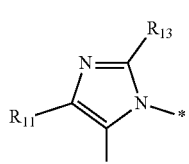
A1-15
A1-16
A1-17
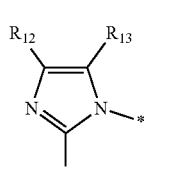
A1-18
A1-19

-continued
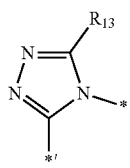
A1-20
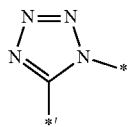
A1-21
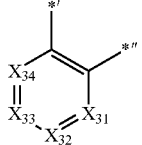
A3-1
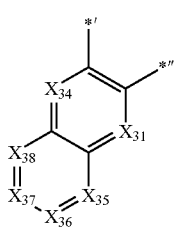
A3-2
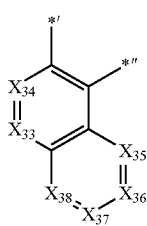
A3-3
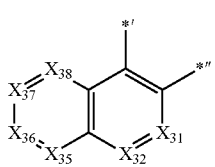
A3-4
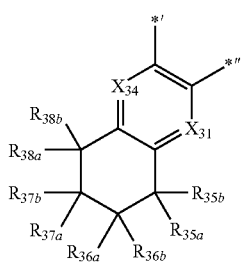
A3-5
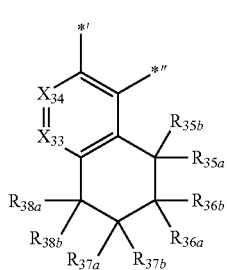
A3-6
-continued
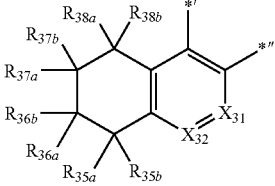
A3-7
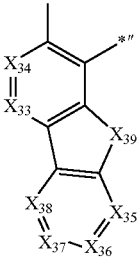
A3-8
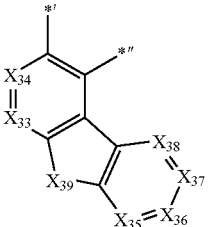
A3-9
A3-10
A3-11
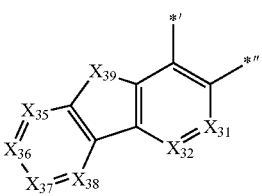
A3-12
A3-13

In Formulae A1-1 to A1-21 and A3-1 to A3-13, $X_{11}$ may be N or $C(R_{11})$, $X_{12}$ may be N or $C(R_{12})$, $X_{13}$ may be N or $C(R_{13})$, $X_{14}$ may be N or $C(R_{14})$, $X_{15}$ may be N or $C(R_{15})$, $X_{16}$ may be N or $C(R_{16})$, $X_{17}$ may be N or $C(R_{17})$, $X_{18}$ may be N or $C(R_{18})$, $X_{19}$ may be $C(R_{19a})(R_{19b})$, $Si(R_{19a})(R_{19b})$, $N(R_{19})$, O, or S, $X_{31}$ may be N or $C(R_{31})$, $X_{32}$ may be N or $C(R_{32})$, $X_{33}$ may be N or $C(R_{33})$, $X_{34}$ may be N or $C(R_{34})$, $X_{35}$ may be N or $C(R_{35})$, $X_{36}$ may be N or $C(R_{36})$, $X_{37}$ may be N or $C(R_{37})$, $X_{38}$ may be N or $C(R_{38})$, $X_{39}$ may be $C(R_{39a})(R_{39b})$, $Si(R_{39a})(R_{39b})$, $N(R_{39})$, O, or S, $R_{11}$ to $R_{19}$ and $R_{15a}$ to $R_{19b}$ may each independently be the same as described in connection with $R_1$ in Formula 1A, $R_{31}$ to $R_{39}$ and $R_{35a}$ to $R_{39b}$ may each independently be the same as described in connection with $R_3$ in Formula 1A,

* and *'' may each be a binding site to M, and

*' indicates a binding site to a neighboring atom.

In one embodiment, $A_1$ in Formula 1A may be selected from groups represented by Formulae A1-1, A1-15, and A1-19.

In one embodiment, when $A_1$ is a group represented by Formula A1-1, i) $A_1$ may be a group represented by Formula A1-1 in which $X_{11}$ is $C(R_{11})$, $X_{12}$ is $C(R_{12})$, and $X_{13}$ is $C(R_{13})$, and $X_{14}$ is $C(R_{14})$, for example, a benzene ring, or ii) $A_1$ may be a group represented by Formula A1-1 in which one of $X_{11}$ to $X_{14}$ is N, for example, a pyridine ring.

In one embodiment, $A_3$ in Formula 1A may be a group represented by Formula A3-1. For example, i) $A_3$ may be a group represented by Formula A3-1 in which $X_{31}$ is $C(R_{31})$, $X_{32}$ is $C(R_{32})$, $X_{33}$ is $C(R_{33})$, and $X_{34}$ is $C(R_{34})$, for example, a benzene ring, or ii) $A_3$ may be a group represented by Formula A3-1 in which one of $X_{31}$ to $X_{34}$ is N, for example, a pyridine ring.

In one embodiment, $A_2$ in Formula 1A may be selected from groups represented by Formulae A2-1 to A2-18:

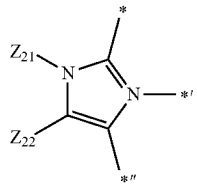

A2-1

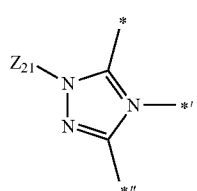

A2-2

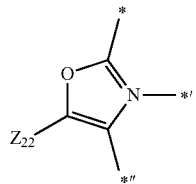

A2-3

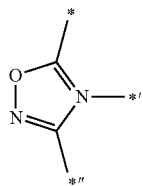

A2-4

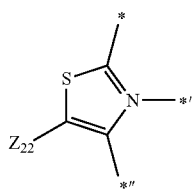

A2-5

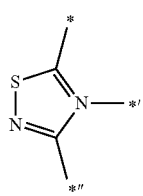

A2-6

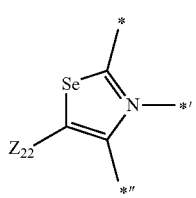

A2-7

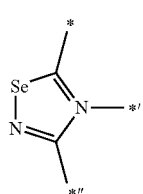

A2-8

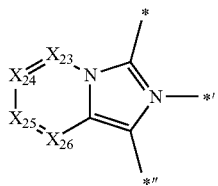

A2-9

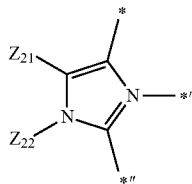

A2-10

A2-11
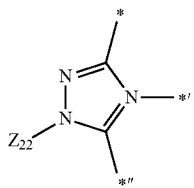

A2-12
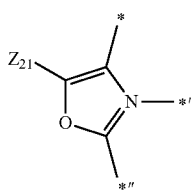

A2-13
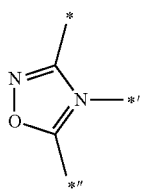

A2-14
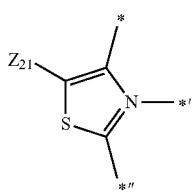

A2-15
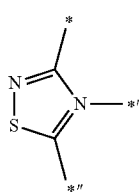

A2-16
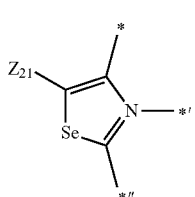

A2-17
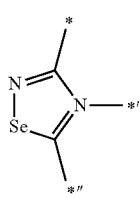

A2-18
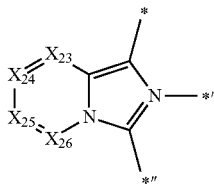

In Formulae A2-1 to A2-18, $X_{23}$ may be N or $C(R_{21})$, $X_{24}$ may be N or $C(R_{22})$, $X_{25}$ may be N or $C(R_{23})$, $X_{26}$ may be N or $C(R_{24})$, $Z_{21}$ and $Z_{22}$ may be the same as described above in connection with Formula $R_{21}$ to $R_{24}$ may be the same as described in connection with $R_1$ in Formula 1A,

* may be a binding site to $L_1$,

*' may be a binding site to M, and

*'' may be a binding site to $L_2$.

In one embodiment, $A_2$ in Formula 1A may be selected from groups represented by Formulae A2-1, A2-3, A2-9, A2-10, A2-12, and A2-18. For example, $A_2$ may be selected from groups represented by Formulae A2-1, A2-3, and A2-9.

In one embodiment, in Formula 1A, $A_2$ may be a group represented by Formula A2-9, $X_{23}$ may be $C(R_{21})$, $X_{24}$ may be $C(R_{22})$, $X_{25}$ may be $C(R_{23})$, and $X_{26}$ may be $C(R_{24})$.

In one embodiment, in Formula 1B, $A_4$ may be selected from groups represented by Formulae A4-1 to A4-26, and $A_6$ may be selected from groups represented by Formulae A6-1 to A6-26:

A4-1
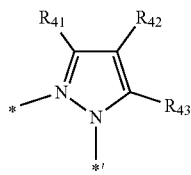

A4-2
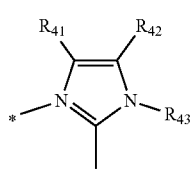

A4-3
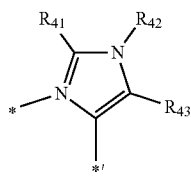

A4-4
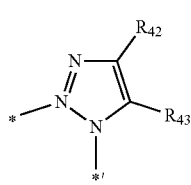

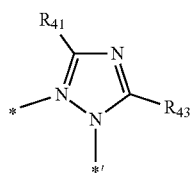 A4-5
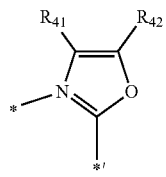 A4-13
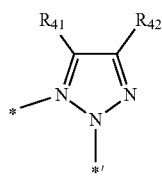 A4-6
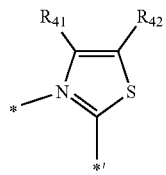 A4-14
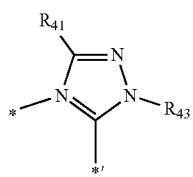 A4-7
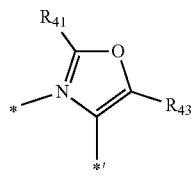 A4-15
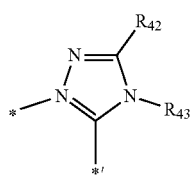 A4-8
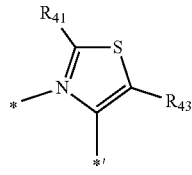 A4-16
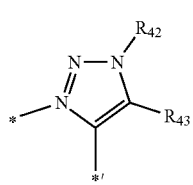 A4-9
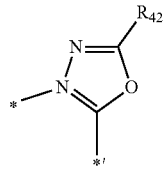 A4-17
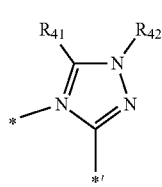 A4-10
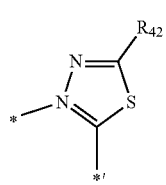 A4-18
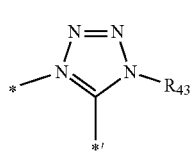 A4-11
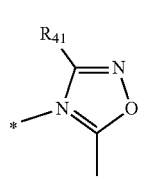 A4-19
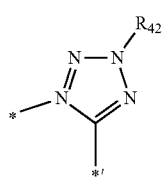 A4-12
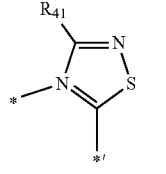 A4-20

-continued
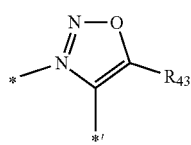
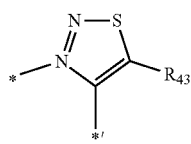
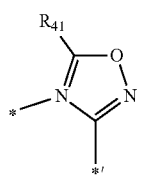
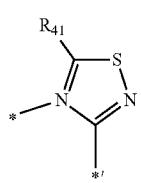
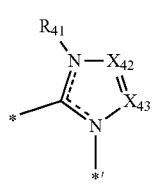
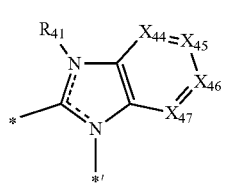
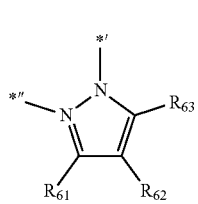
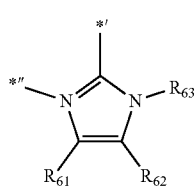
-continued
A4-21
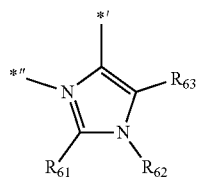
A6-3
A4-22
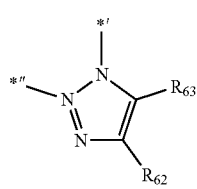
A6-4
A4-23
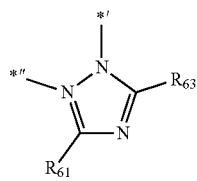
A6-5
A4-24
A6-6
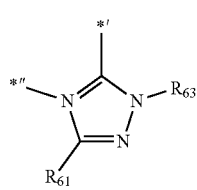
A4-25
A6-7
A4-26
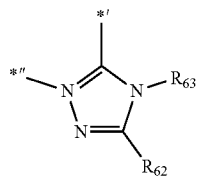
A6-8
A6-1
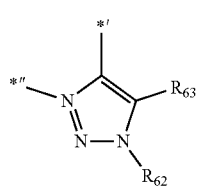
A6-9
A6-2
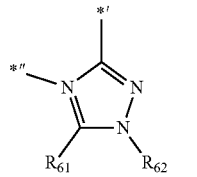
A6-10

-continued
A6-11
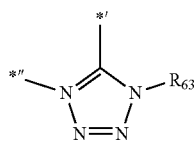
A6-12
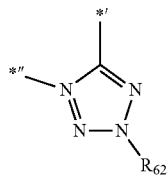
A6-13
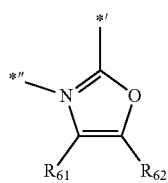
A6-14
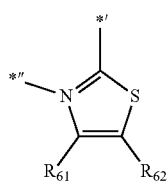
A6-15
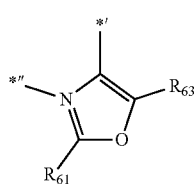
A6-16
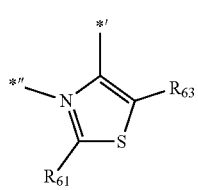
A6-17
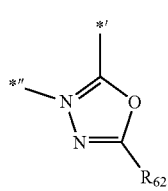
A6-18
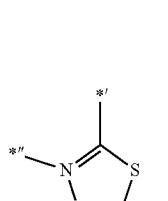
-continued
A6-19
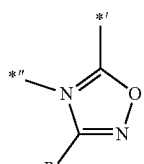
A6-20
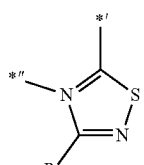
A6-21
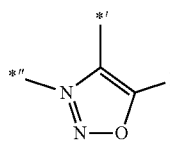
A6-22
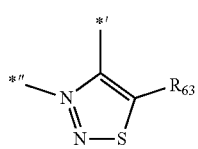
A6-23
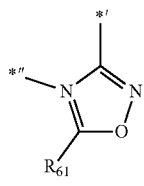
A6-24
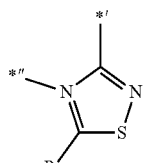
A6-25
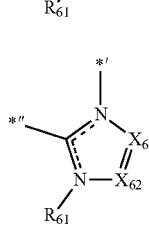
A6-26
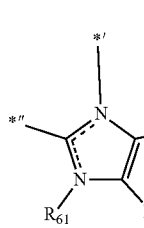
In Formulae A4-1 to A4-26 and A6-1 to A6-26,
$X_{42}$ may be N or $C(R_{42})$, $X_{43}$ may be N or $C(R_{43})$, $X_{44}$ may be N or $C(R_{44})$, $X_{45}$ may be N or $C(R_{45})$, $X_{46}$ may be N or $C(R_{46})$, $X_{47}$ may be N or $C(R_{47})$, $X_{62}$ may be N or $C(R_{62})$, $X_{63}$ may be N or $C(R_{63})$, $X_{64}$ may be N or $C(R_{64})$, $X_{65}$ may be N or $C(R_{65})$, $X_{66}$ may be N or $C(R_{66})$, $X_{67}$ may be N or $C(R_{67})$, $R_{41}$ to $R_{47}$ may each independently be the same as described in connection with $R_4$ in Formula 1B, $R_{61}$ to $R_{67}$ may each independently be the same as described in connection with $R_6$ in Formula 1B,

* and *″ may each be a binding site to M, and

*′ indicates a binding site to a neighboring atom.

In one embodiment, in Formula 1B, $A_4$ may be selected from groups represented by Formulae A4-25 and A4-26, and $A_6$ may be selected from groups represented by Formulae A6-25 to A6-26:

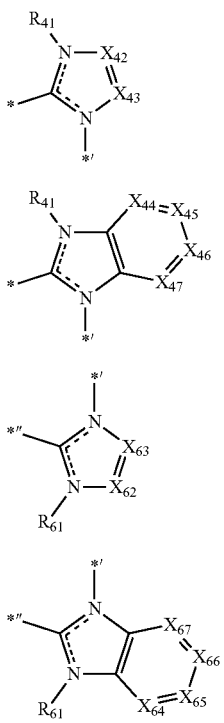

The description of substituents which have been described in connection with Formulae A4-25, A4-26, A6-25 and A6-26 may be the same as described above for Formulae A4-1 to A4-26 and A6-1 to A6-26.

In one embodiment, in Formulae A4-25 and A6-25, a) $X_{42}$ may be $C(R_{42})$, $X_{43}$ may be $C(R_{43})$, $X_{62}$ may be $C(R_{62})$, and $X_{63}$ may be $C(R_{63})$, or b) $X_{42}$ may be N, $X_{43}$ may be $C(R_{43})$, $X_{62}$ may be N, and $X_{63}$ may be $C(R_{63})$.

In one embodiment, in Formulae A4-26 and A6-26, $X_{44}$ may be $C(R_{44})$, $X_{45}$ may be $C(R_{45})$, $X_{46}$ may be $C(R_{46})$, $X_{47}$ may be $C(R_{47})$, $X_{64}$ may be $C(R_{64})$, $X_{65}$ may be $C(R_{65})$, $X_{66}$ may be $C(R_{66})$, and $X_{67}$ may be $C(R_{67})$.

In one embodiment, $A_5$ in Formula 1B may be selected from groups represented by Formulae A5-1 or A5-2:

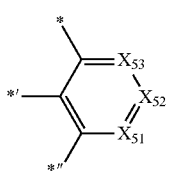

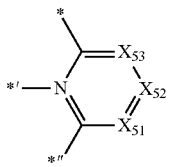

In Formulae A5-1 and A5-2, $X_{51}$ may be N or $C(R_{51})$, $X_{52}$ may be N or $C(R_{52})$, and $X_{53}$ may be N or $C(R_{53})$, $R_{51}$ to $R_{53}$ may each independently be the same as described in connection with $R_5$ in Formula 1B,

* may be a binding site to $A_4$,

*′ may be a binding site to M, and

*″ may be a binding site to $A_6$.

In one embodiment, in Formulae A5-1 and A5-2, $X_{51}$ may be $C(R_{51})$, $X_{52}$ may be $C(R_{52})$, and $X_{53}$ may be $C(R_{53})$.

$L_1$ and $L_2$ in Formula 1A may each independently be selected from *—O—*′, *—S—*′, *—$C(R_7)(R_8)$—*′, *—$C(R_7)$=*′, *=$C(R_7)$—*′, *—$C(R_7)$=$C(R_8)$—*′, *—C(=O)—*′, *—C(=S)—*′, *—C≡C—*′, *—$B(R_7)$—*′, *—$N(R_7)$—*′, *—$P(R_7)$—*′, *—$Si(R_7)(R_8)$—*′, *—$P(R_7)(Ra)$—*′, and *—$Ge(R_7)(R_8)$—*′.

In Formula 1A, a1 and a2 may each independently be selected from 0, 1, and 2. When a1 is 0, the bond represented by *-$(L_1)_{a1}$-*′ may be a single bond. For example, $A_1$ and $A_2$ may be linked to each other via a single bond. When a2 is 0, the bond represented by *-$(L_2)_{a2}$-*′ may be a single bond. For example, $A_2$ and $A_3$ may be linked to each other via a single bond.

The organometallic compound represented by Formula 1 satisfies one of the following conditions i) to iii).

i) $Y_1$ is N, and $A_1$ is a $Y_1$-containing 5-membered ring, a $Y_1$-containing 6-membered ring, a $C_5$-$C_{60}$ heterocyclic ring to which a $Y_1$-containing 5-membered ring is condensed, or a $C_5$-$C_{60}$ heterocyclic ring to which a $Y_1$-containing 6-membered ring is condensed, ii) $Y_1$ is C and each of a1 and a2 is 0, iii) $Y_1$ is C and a1 and a2 are each independently selected from 1 and 2.

The term "$Y_1$-containing 5-membered ring" used herein refers to a 5-membered ring in which $Y_1$ is used as a ring-forming atom. The term "$Y_1$-containing 6-membered ring" used herein refers to a 6-membered ring in which $Y_1$ is used as a ring-forming atom. The "$C_5$-$C_{60}$ heterocyclic ring to which a $Y_1$-containing 5-membered ring is condensed" refers to a polycyclic group in which a $Y_1$-containing 5-membered ring is condensed with at least one $C_5$-$C_6$O carbocyclic ring. The "$C_5$-$C_{60}$ heterocyclic ring to which a $Y_1$-containing 6-membered ring is condensed" refers to a polycyclic group in which a $Y_1$-containing 6-membered ring is condensed with at least one $C_5$-$C_{60}$ carbocyclic ring.

In one embodiment, when the organometallic compound satisfies the condition i), $A_1$ may be selected from a pyrrole ring, an oxazole ring, an isoxazole ring, an oxadiazole ring, an isoxadiazole ring, an oxatriazole ring, an isoxatriazole ring, a thiazole ring, an isothiazole ring, a thiadiazole ring, an isothiadiazole ring, a thiatriazole ring, an isothiatriazole ring, a pyrazole ring, an imidazole ring, a triazole ring, a tetrazole ring, an azasilole ring, a diazasilole ring, and a triazasilole ring.

In one embodiment, when the organometallic compound satisfies the condition i), $A_1$ may be selected from groups represented by Formulae A1-14 to A1-21.

In one embodiment, in Formula 1A, $Y_1$ may be N, and $A_1$ may be a $Y_1$-containing 5-membered ring, a $Y_1$-containing 6-membered ring, a $C_5$-$C_{60}$ heterocyclic ring to which a $Y_1$-containing 5-membered ring is condensed, or a $C_5$-$C_{60}$ heterocyclic ring to which a $Y_1$-containing 6-membered ring is condensed, a1 may be 0, and a2 may be 1. For example, $L_2$ may be *—O—*' or *—N($R_7$)—*'.

In embodiments, in Formula 1A, $Y_1$ may be C, and each of a1 and a2 may be 1. For example, $L_1$ and $L_2$ may be *—O—*' or *—N($R_7$)—*'.

$Z_{21}$, $Z_{22}$, $R_1$ and $R_3$ to $R_8$ in Formulae 1A and 1B may each independently be selected from hydrogen, deuterium, —F —Cl, —Br, —I, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_5$-$C_{60}$ aryloxy group, a substituted or unsubstituted $C_2$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —C(=O)($Q_1$), —S(=O)$_2$($Q_1$), and —P(=O)($Q_1$)($Q_2$), b1 and b3 to b6 may each independently be selected from 1, 2, 3, 4, 5, 6, 7, and 8, and with the proviso that: at least one pair of substituents may optionally be linked together to form a substituted or unsubstituted $C_5$-$C_{60}$ carbocyclic group or a substituted or unsubstituted $C_1$-$C_{60}$ heterocyclic group, the pair of substituents selected from the group consisting of $Z_{21}$ and $Z_{22}$, two neighboring $R_1$(s) in $R_1$(s) in the number of b1, two neighboring $R_3$(s) in $R_3$(s) in the number of b3, two neighboring $R_4$(s) in $R_4$(s) in the number of b4, two neighboring $R_5$(s) in $R_5$(s) in the number of b5, two neighboring $R_6$(s) in $R_6$(s) in the number of b6, $R_1$ and $R_7$, and $R_3$ and $R_7$.

In one embodiment, $Z_{21}$, $Z_{22}$, $R_1$, and $R_3$ to $R_a$ in Formulae 1A and 1B may each independently be selected from hydrogen, deuterium, —F, —Cl, —Br, —I, a hydroxyl group, a cyano group, a nitro group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a cyano group, a phenyl group, and a biphenyl group.

a cyclopentyl group, a cyclohexyl group, a cycloheptyl group, a cyclopentenyl group, a cyclohexenyl group, a phenyl group, a biphenyl group, a terphenyl group, a naphthyl group, a fluorenyl group, a spiro-bifluorenyl group, a spiro-fluorene-benzofluorenyl group, a benzofluorenyl group, a dibenzofluorenyl group, a pyrenyl group, a phenalenyl group, a phenanthrenyl group, an anthracenyl group, a fluoranthenyl group, a triphenylenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, —Si($Q_1$)($Q_2$)($Q_3$), —N($Q_1$)($Q_2$), and —B($Q_1$)($Q_2$); and a cyclopentyl group, a cyclohexyl group, a cycloheptyl group, a cyclopentenyl group, a cyclohexenyl group, a phenyl group, a biphenyl group, a terphenyl group, a naphthyl group, a fluorenyl group, a spiro-bifluorenyl group, a spiro-fluorene-benzofluorenyl group, a benzofluorenyl group, a dibenzofluorenyl group, a pyrenyl group, a phenalenyl group, a phenanthrenyl group, an anthracenyl group, a fluoranthenyl group, a triphenylenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, and an azadibenzosilolyl group, each substituted with at least one selected from deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a naphthyl group, a fluorenyl group, a spiro-bifluorenyl group, a spiro-fluorene-benzofluorenyl group, a benzofluorenyl group, a dibenzofluorenyl group, a pyrenyl group, a phenalenyl group, a phenanthrenyl group, an anthracenyl group, a fluoranthenyl group, a triphenylenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, e benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspirobifluorenyl group, an azacarbazolyl group, an azadibenzofuranyl group, an azadibenzothiophenyl group, an azadibenzosilolyl group, a biphenyl group, and a terphenyl group.

In embodiments, $Z_{21}$, $Z_{22}$, $R_1$ and $R_3$ to $R_8$ may each independently be selected from hydrogen, deuterium, —F, —Cl, —Br, —I, a cyano group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a cyano group, a phenyl group, and a biphenyl group;

a phenyl group, a biphenyl group, a terphenyl group, a naphthyl group, a fluorenyl group, a spiro-bifluorenyl group, a phenanthrenyl group, an anthracenyl group, a pyridinyl group, a pyrimidinyl group, a carbazolyl group, and a triazinyl group; and a phenyl group, a biphenyl group, a terphenyl group, a naphthyl group, a fluorenyl group, a spiro-bifluorenyl group, a phenanthrenyl group, an anthracenyl group, a pyridinyl group, a pyrimidinyl group, a carbazolyl group, and a triazinyl group, each substituted with at least one selected from deuterium, —F, —Cl, —Br, —I, a cyano group, a $C_1$-$C_{20}$ alkyl group, a $C_1$-$C_{20}$ alkoxy group, —$CF_3$, —$CCl_3$, —$CBr_3$, —$Cl_3$, a phenyl group, a biphenyl group, a terphenyl group, a naphthyl group, a fluorenyl group, a spiro-bifluorenyl group, a phenanthrenyl group, an anthracenyl group, a pyridinyl group, a pyrimidinyl group, a carbazolyl group, and a triazinyl group.

In embodiments, $Z_{21}$, $Z_{22}$, $R_1$ and $R_3$ to $R_8$ may each independently be selected from: hydrogen, deuterium, —F, —Cl, —Br, —I, a cyano group, a methyl group, —$CF_3$, —$CCl_3$, —$CBr_3$, —$Cl_3$, an ethyl group, a propyl group, an isopropyl group, an n-butyl group, an isobutyl group, a sec-butyl group, and a tert-butyl group;

a phenyl group and a pyridinyl group; and a phenyl group and a pyridinyl group, each substituted with at least one selected from deuterium, —F, —Cl, —Br, —I, a cyano group, a methyl group, —$CF_3$, —$CCl_3$, —$CBr_3$, —$Cl_3$, an ethyl group, a propyl group, an isopropyl group, an n-butyl group, an isobutyl group, a sec-butyl group, and a tert-butyl group.

In one embodiment, in Formulae 1A and 1B, at least one selected from $Z_{21}$, $Z_{22}$, $R_1$(s) in the number of b1, $R_3$(s) in the number of b3, $R_4$(s) in the number of b4, $R_5$(s) in the number of b5, and $R_6$(s) in the number of b6 may be an electron withdrawing group. The electron withdrawing group may be selected from, for example, —F, a cyano group, a $C_1$-$C_{10}$ alkyl group substituted with at least one —F, a $C_1$-$C_{10}$ alkyl group substituted with at least one —Cl, a $C_1$-$C_{10}$ alkyl group substituted with at least one —Br, and a $C_1$-$C_{10}$ alkyl group substituted with at least one —I.

In embodiments, in Formulae 1A and 1B, at least one of $Z_{21}$, $Z_{22}$, $R_1$(s) in the number of b1, $R_3$(s) in the number of b3, $R_4$(s) in the number of b4, $R_5$(s) in the number of b5, and $R_6$(s) in the number of b6 may be selected from —F, a cyano group, —$CF_3$, —$CCl_3$, —$CBr_3$, and —$Cl_3$.

When the organometallic compound represented by Formula 1 includes at least one electron withdrawing group, the emission wavelength of the organometallic compound may be shifted to a short wavelength (blue shift) to produce blue light with high color purity. The emission wavelength may be controlled by controlling the number of electron withdrawing groups substituted to a compound.

In one embodiment, in Formula 1A, $L_2$ may be selected from *—B($R_7$)—*', *—N($R_7$)—*', *—P($R_7$)—*', and *—Ge($R_7$)($R_8$)—*', and $R_7$ may be linked to a neighboring $R_3$ to form a substituted or unsubstituted $C_5$-$C_{60}$ carbocyclic group or a substituted or unsubstituted $C_1$-$C_{60}$ heterocyclic group.

In one embodiment, a moiety represented by

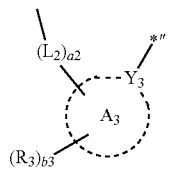

in Formula 1A may be represented by one of Formulae AL-1 to AL-28:

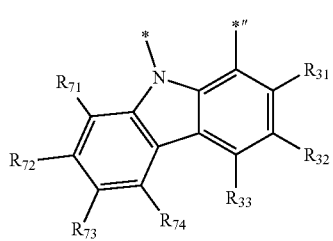

AL-1

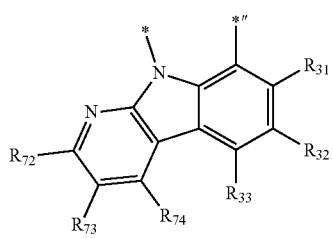

AL-2

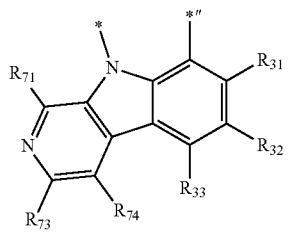

AL-3

-continued
AL-4
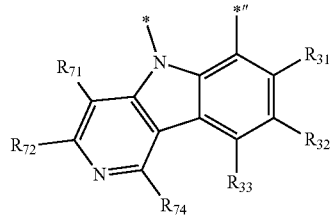
AL-5
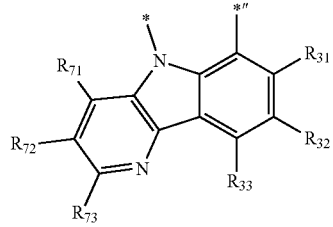
AL-6
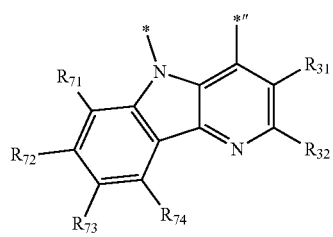
AL-7
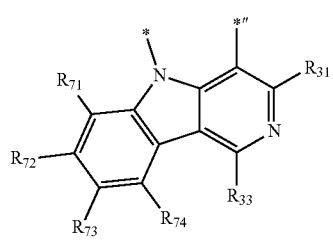
AL-8
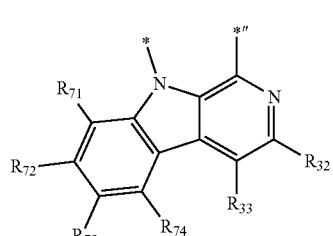
AL-9
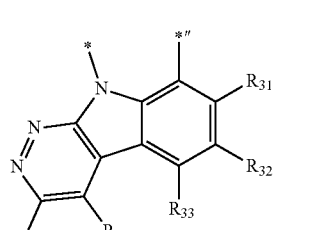
AL-10
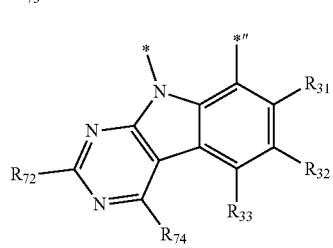
-continued
AL-11
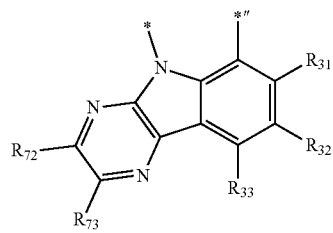
AL-12
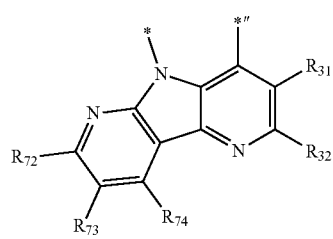
AL-13
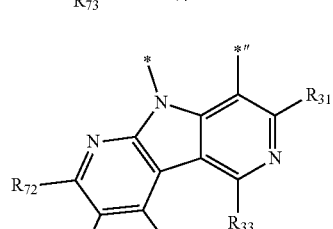
AL-14
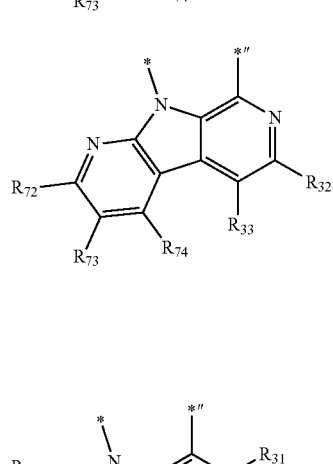
AL-15
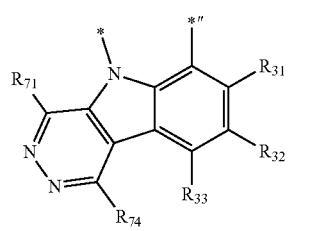
AL-16
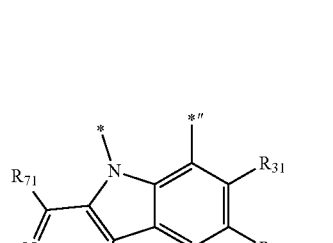

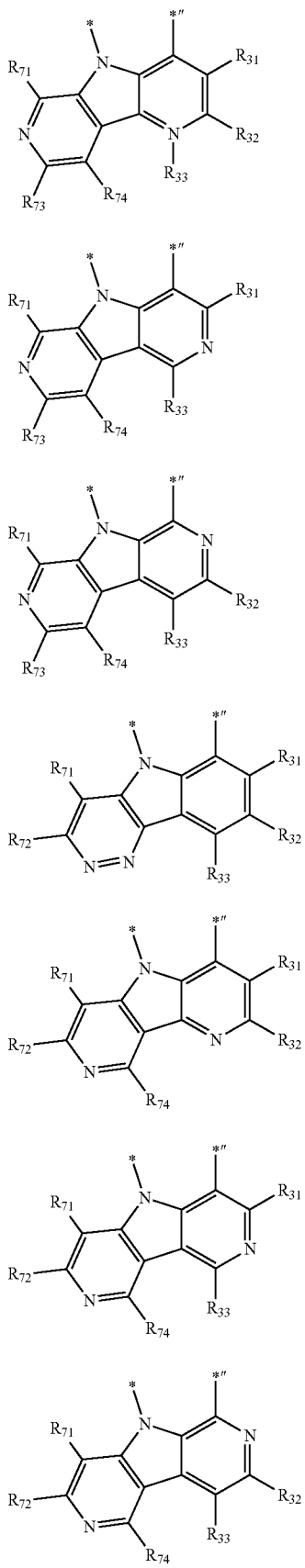
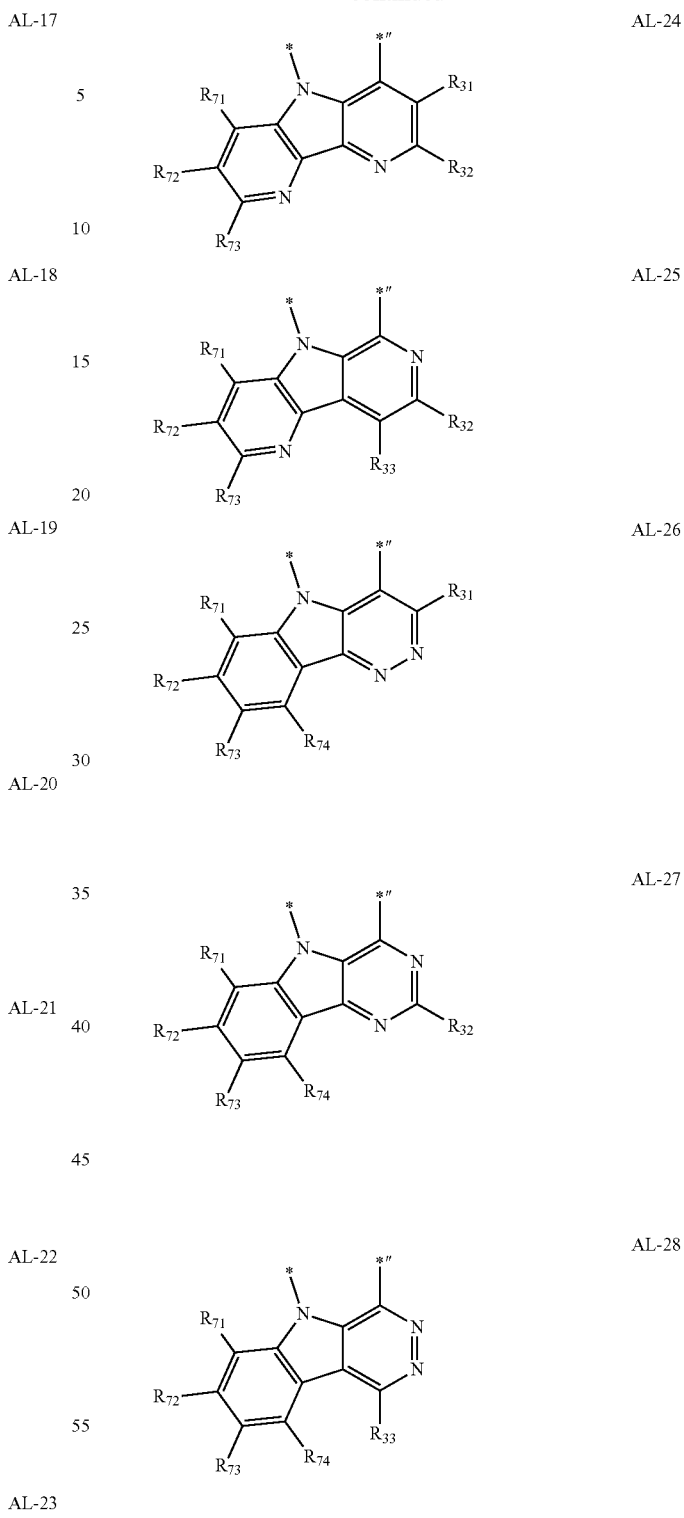
In Formulae AL-1 to AL-28,
$R_{31}$ to $R_{33}$ may each independently be the same as described in connection with $R_3$ in Formula 1A,
$R_{71}$ to $R_{74}$ may be the same as described in connection with $R_7$ in Formula 1A,
*" may be a binding site to M, and
* may be a binding site to $A_2$.

In one embodiment, $L_A$ in Formula 1 may be selected from tridentate ligands represented by Formulae 1AA-1 to 1AA-3, 1AB-1 to 1AB-3, and 1AC-1 to 1AC-3:
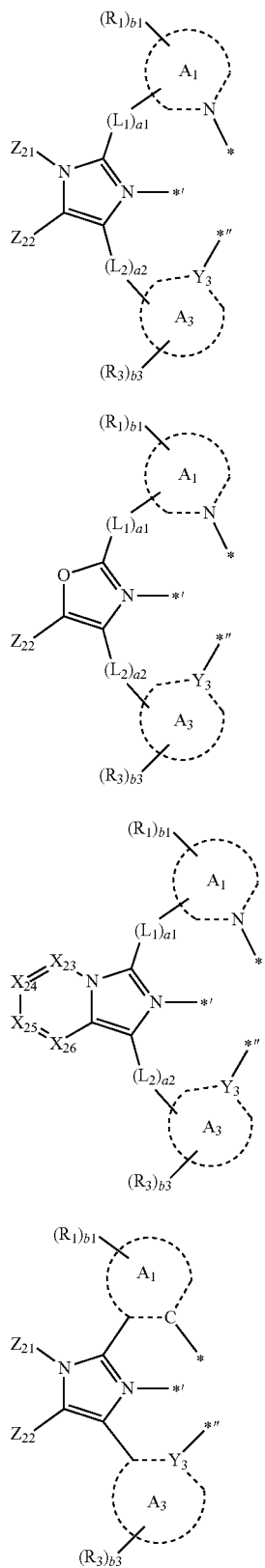
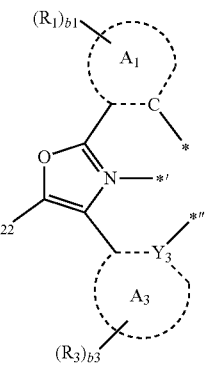
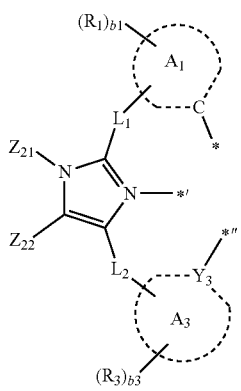
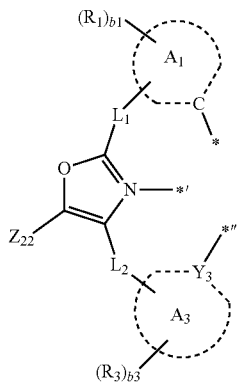

-continued

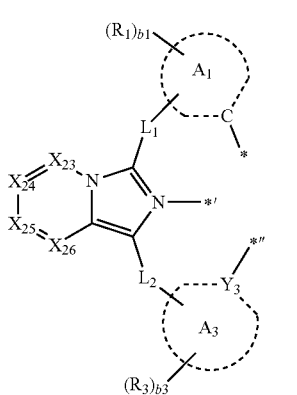
1AC-3

In Formulae 1AA-1 to 1AA-3, 1AB-1 to 1AB-3, and 1AC-1 to 1AC-3, $Y_3, A_1, A_3, L_1, L_2, a1, a2, Z_{21}, Z_{22}, R_1, R_3, b1$, and $b3$ are the same as described above in connection with Formula 1A, $X_{23}$ may be N or $C(R_{21})$, $X_{24}$ is N or $C(R_{22})$, $X_{25}$ is N or $C(R_{23})$, $X_{26}$ may be N or $C(R_{24})$, $R_{21}$ to $R_{24}$ may be the same as described above in connection with $R_1$ in Formula 1A, and

*, *', and *" may be each a binding site to M.

In one embodiment, in Formulae 1AA-3, 1AB-3, and 1AC-3, $X_{23}$ may be $C(R_{21})$, $X_{24}$ may be $C(R_{22})$, $X_{25}$ may be $C(R_{23})$, and $X_{26}$ may be $C(R_{24})$.

In one embodiment, $L_B$ in Formula 1 may be selected from tridentate ligands represented by Formulae 1B-1 and 1B-2:

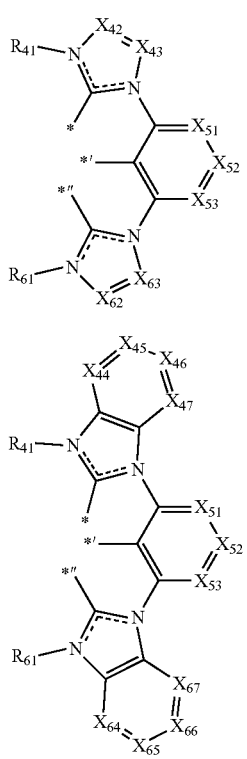

In Formulae 1B-1 and 1B-2, $X_{42}$ to $X_{47}$, $X_{51}$ to $X_{53}$, $X_{62}$ to $X_{67}$, $R_{41}$, and $R_{61}$ are the same as described above, and

*, *', and *" are each a binding site to M.

In one embodiment, in Formula 1B-1, a) $X_{42}$ may be $C(R_{42})$, $X_{43}$ may be $C(R_{43})$, $X_{62}$ may be $C(R_{62})$, and $X_{63}$ may be $C(R_{63})$, or b) $X_{42}$ may be N, $X_{43}$ may be $C(R_{43})$, $X_{62}$ may be N, and $X_{63}$ may be $C(R_{63})$.

In one embodiment, in Formula 1B-2, $X_{44}$ may be $C(R_{44})$, $X_{45}$ may be $C(R_{45})$, $X_{46}$ may be $C(R_{46})$, $X_{47}$ may be $C(R_{47})$, $X_{51}$ may be $C(R_{51})$, $X_{52}$ may be $C(R_{52})$, $X_{53}$ may be $C(R_{53})$, $X_{64}$ may be $C(R_{64})$, $X_{65}$ may be $C(R_{65})$, $X_{66}$ may be $C(R_{66})$, and $X_{67}$ may be $C(R_{67})$.

In one embodiment, the organometallic compound may have a T1 energy of greater than or equal to about 2.25 eV.

In one embodiment, the organometallic compound may be selected from Compounds 1 to 65:

1

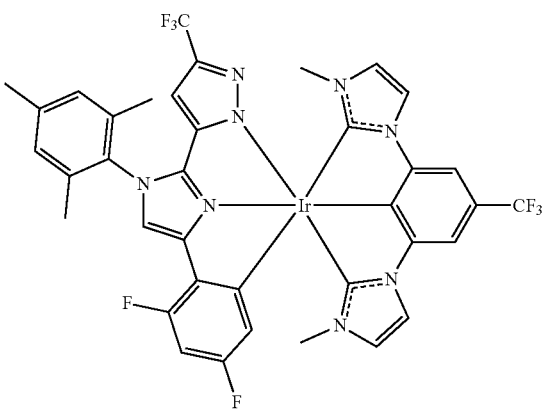

2

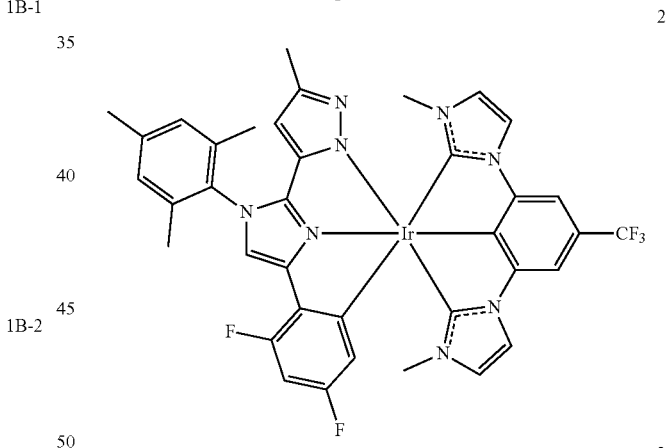

3

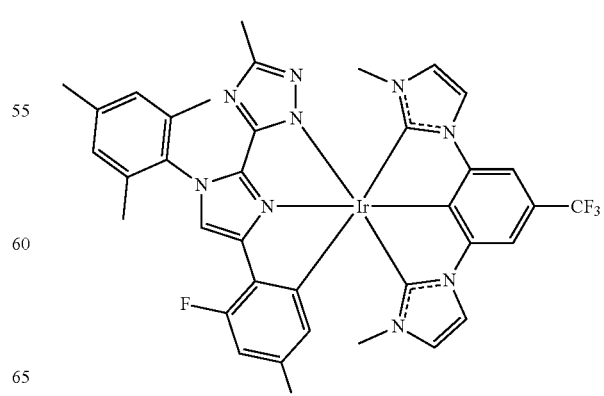

4
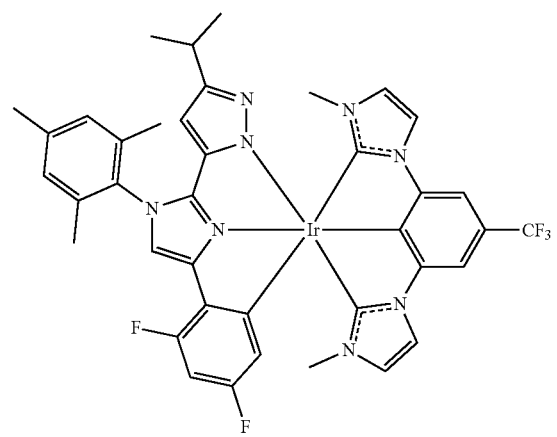
5
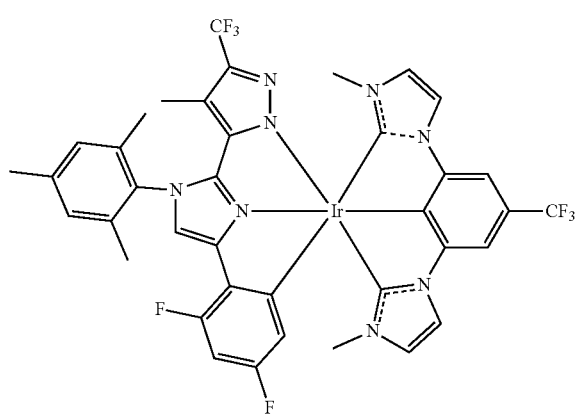
6
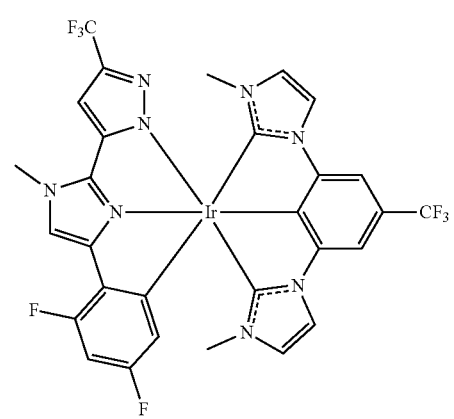
7
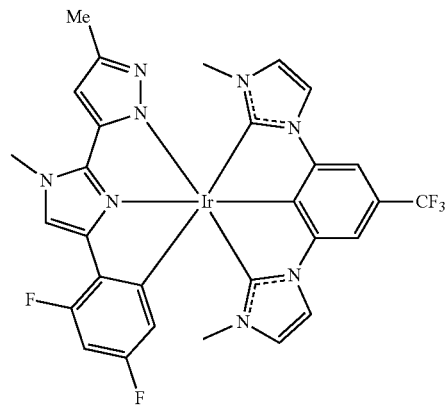
8
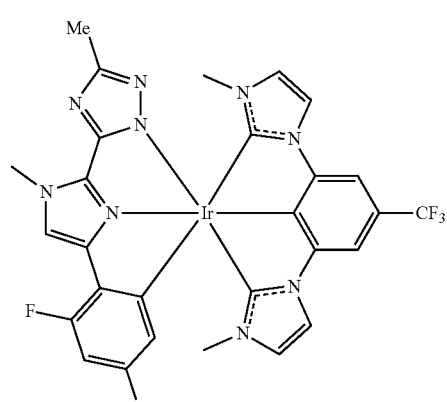
9
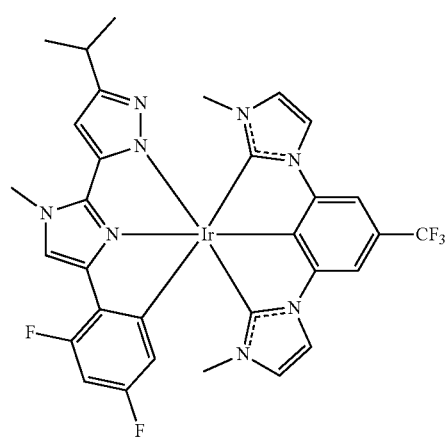
10
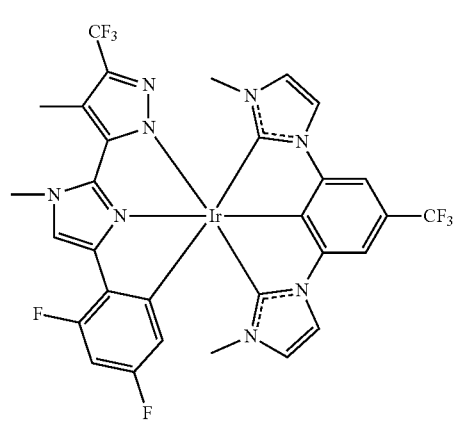

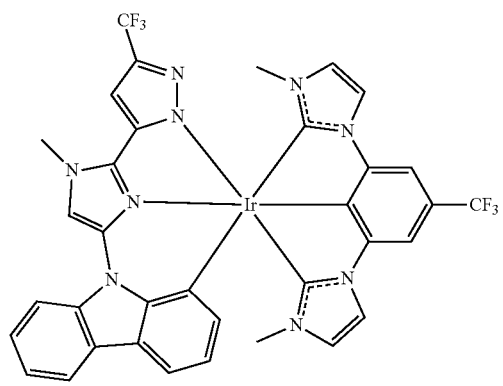
11
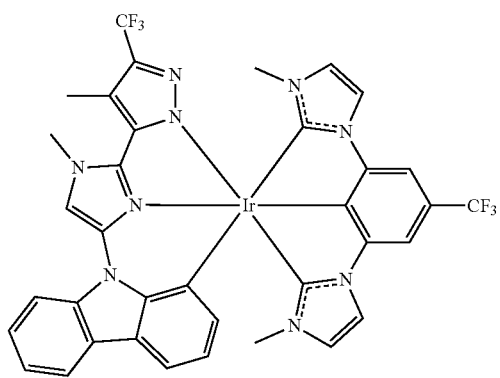
15
12
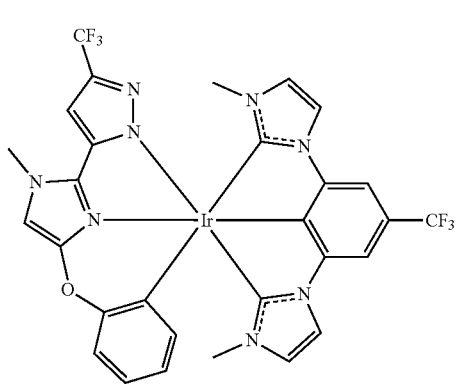
16
13
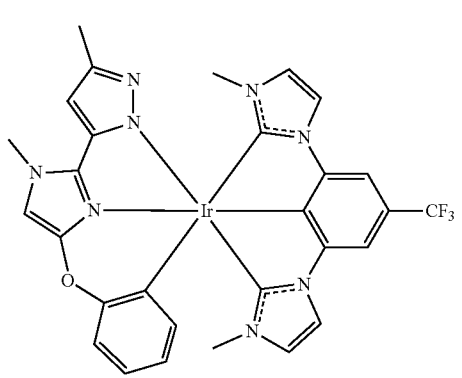
17
14
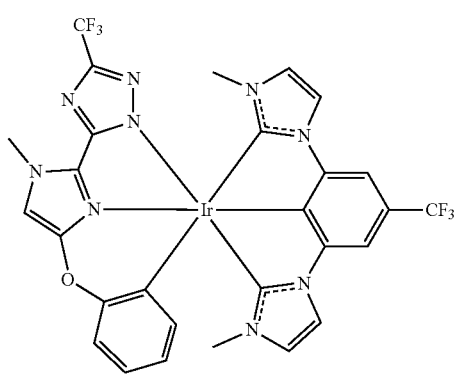
18

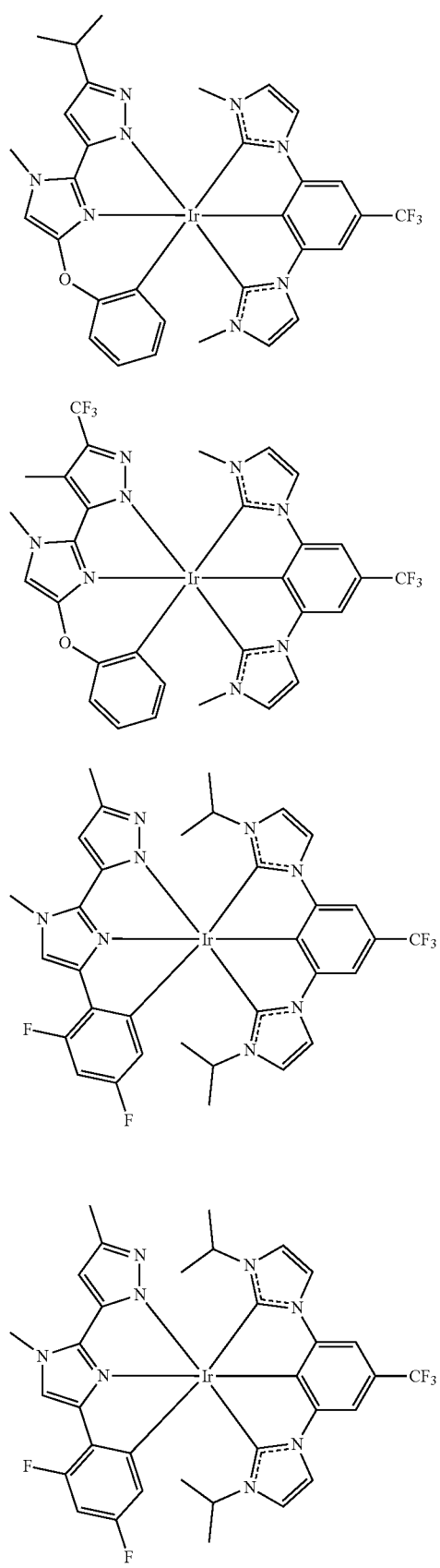
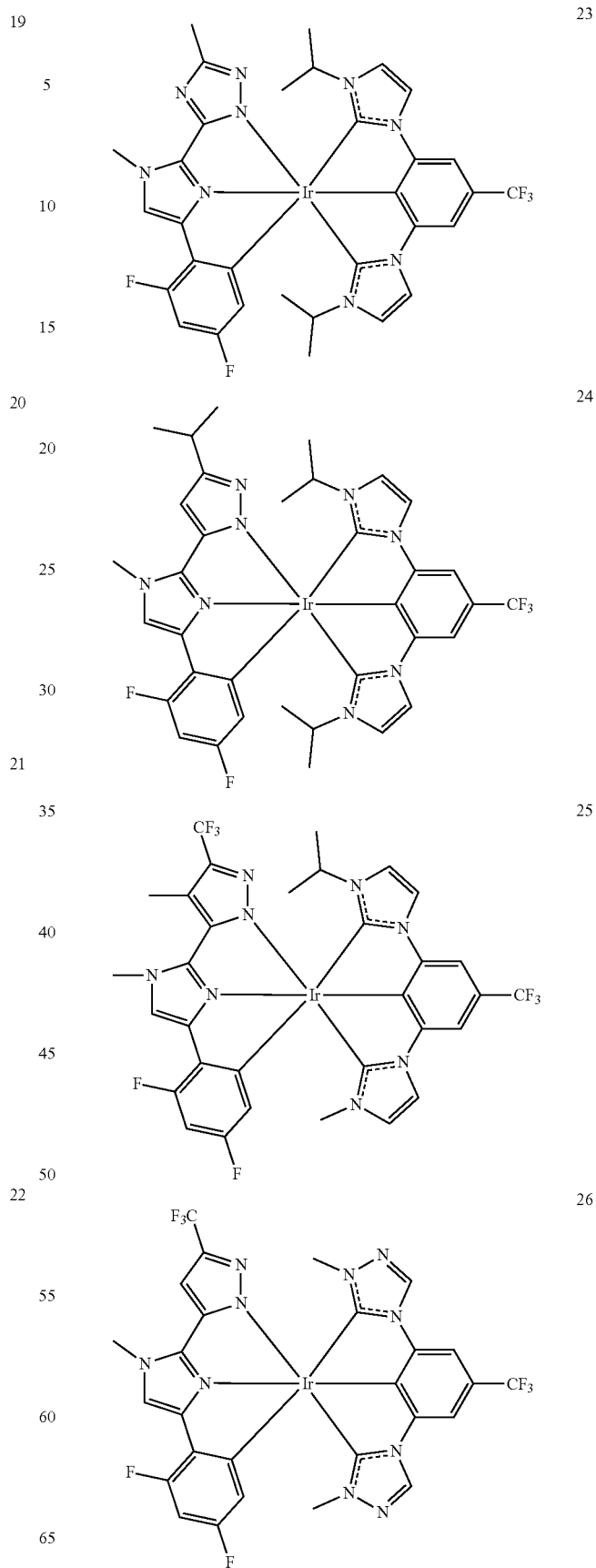

27
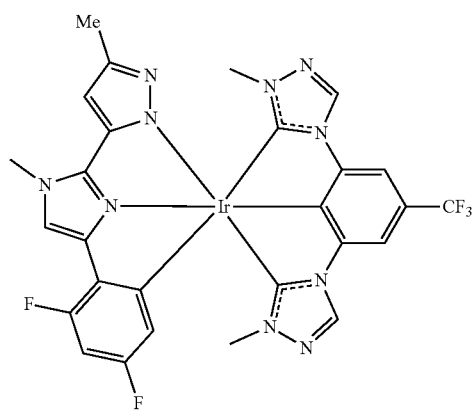
28
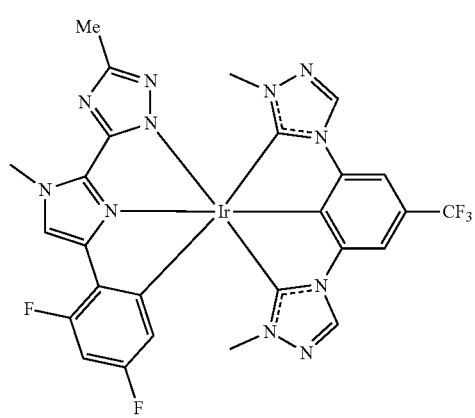
29
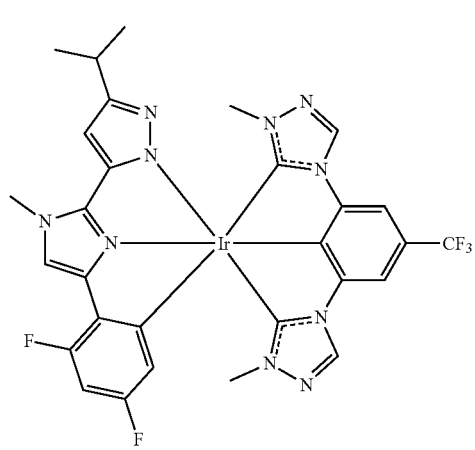
30
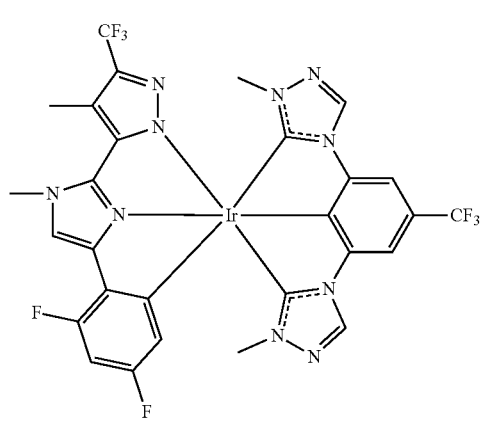
31
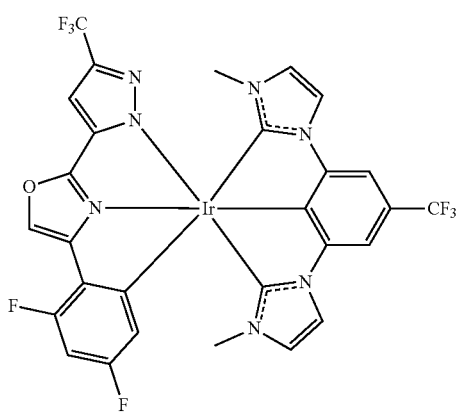
32
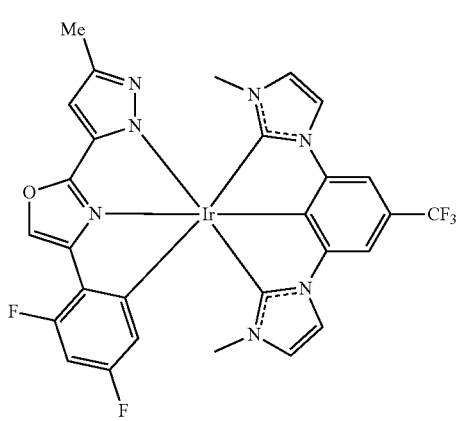
33
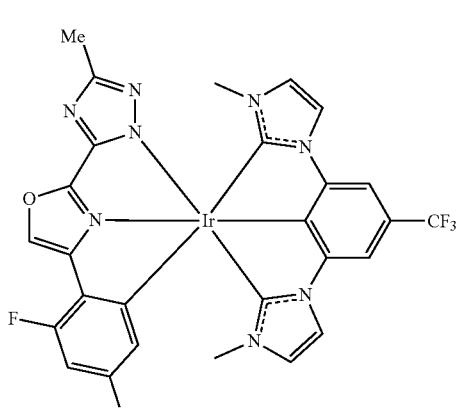
34
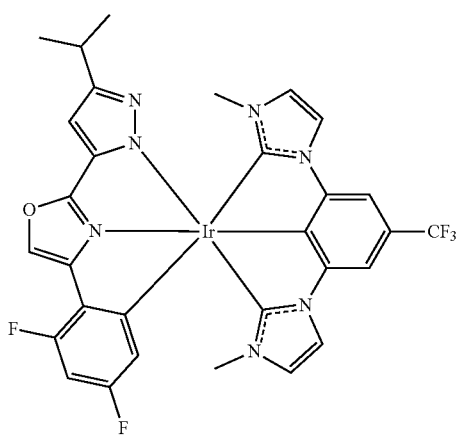

35
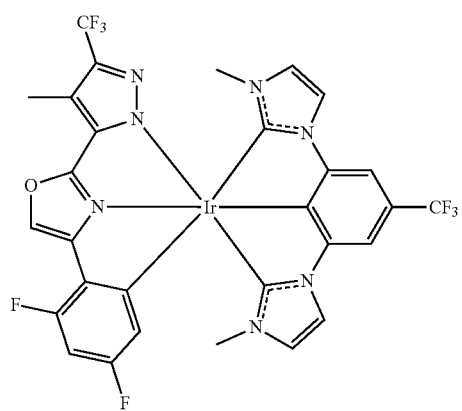
36
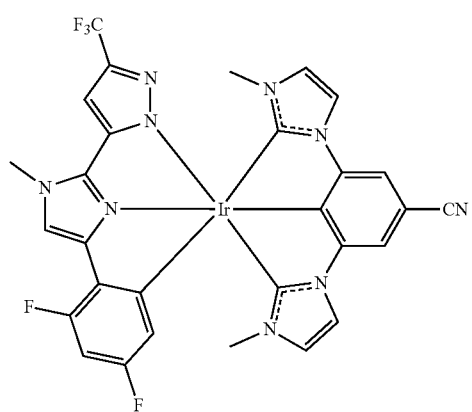
37
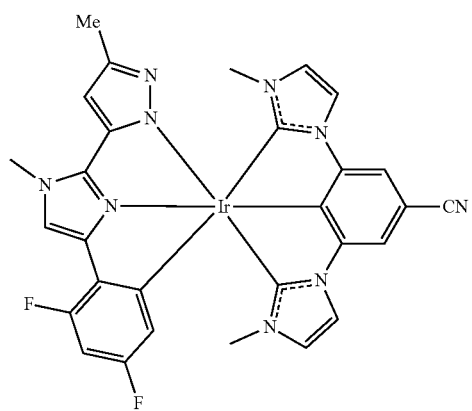
38
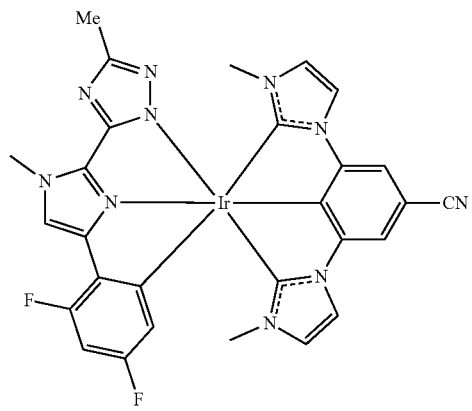
39
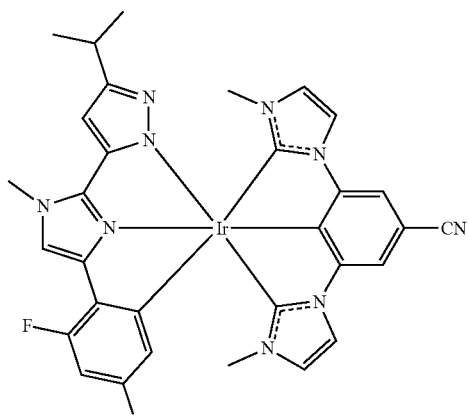
40
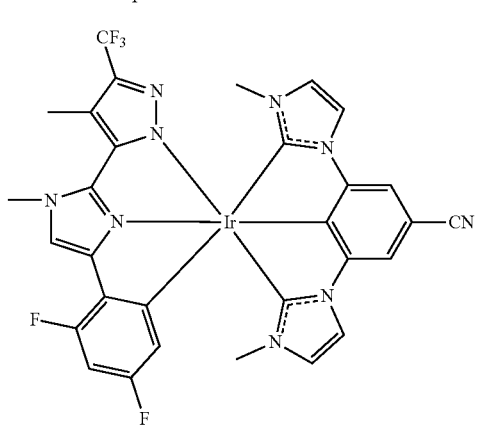
41
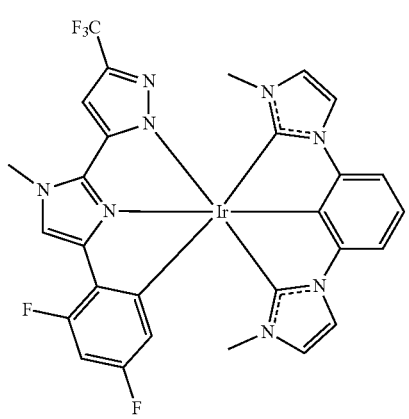
42
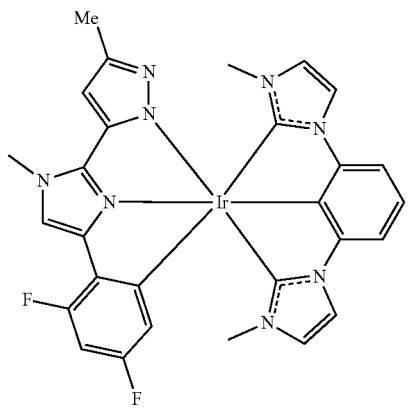

43
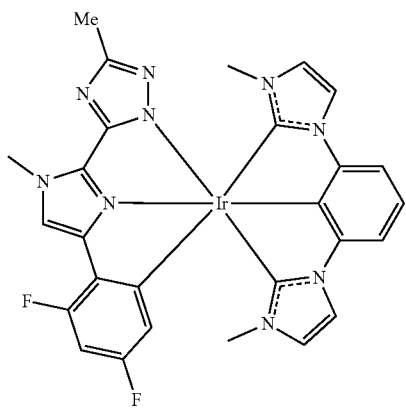
44
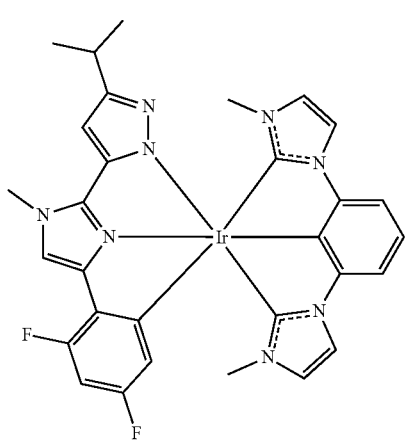
45
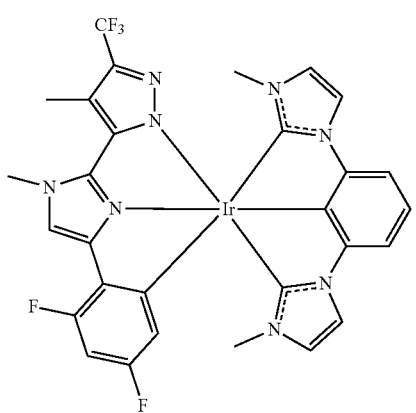
46
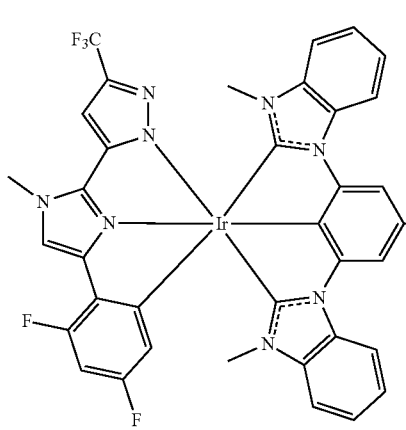
47
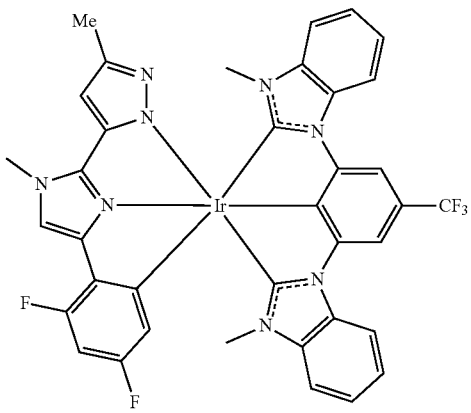
48
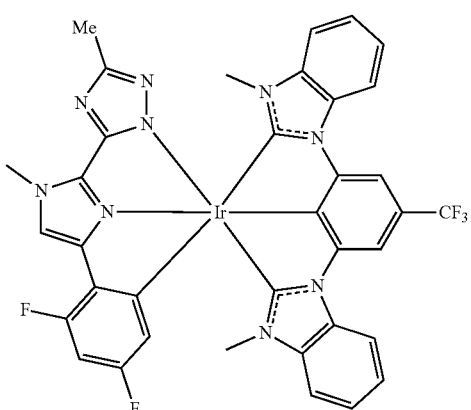
49
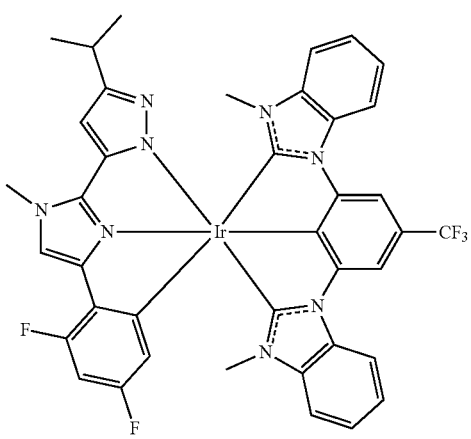

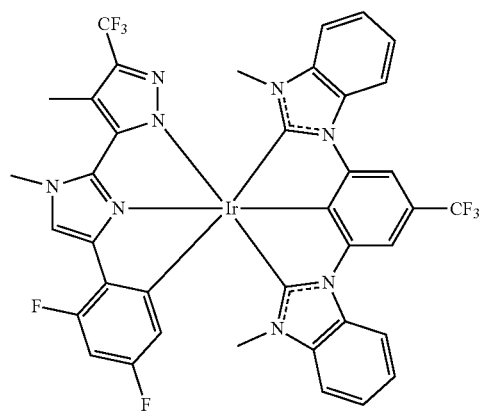
50
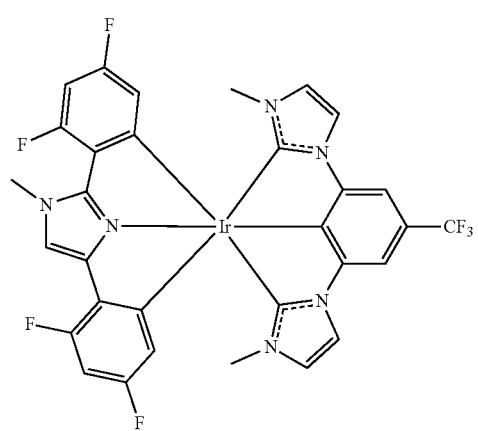
51
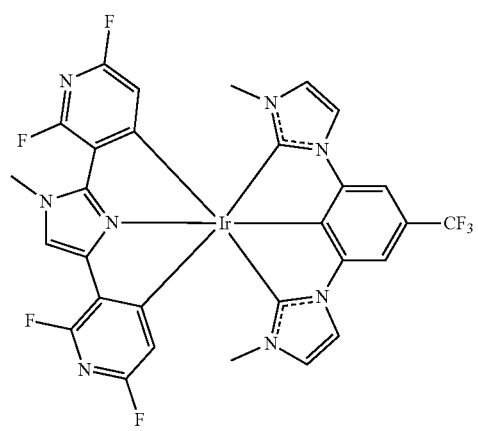
52
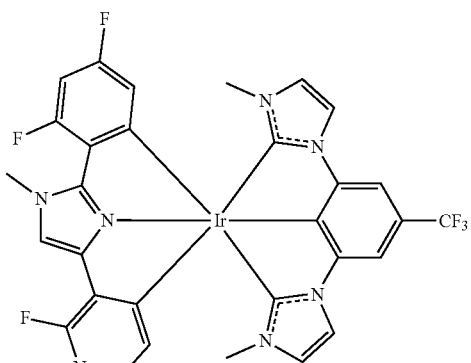
53
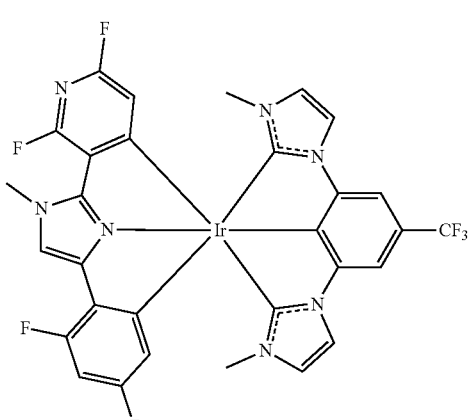
54
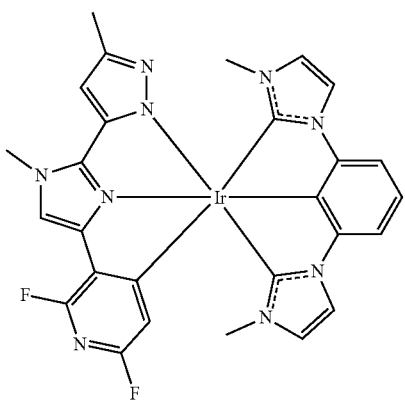
55
56

57
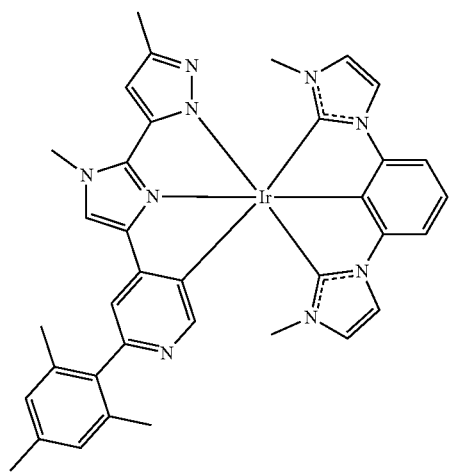
58
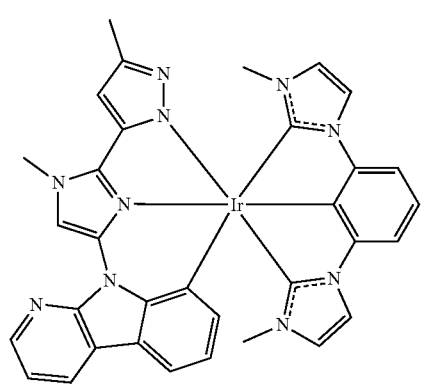
59
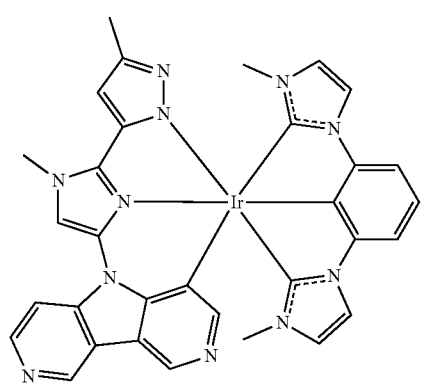
60
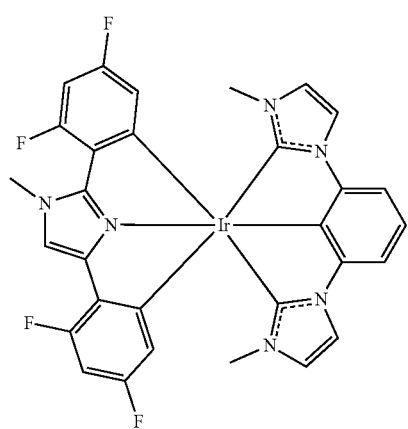
61
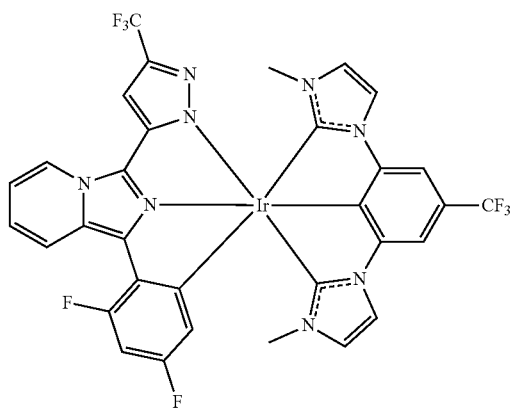
62
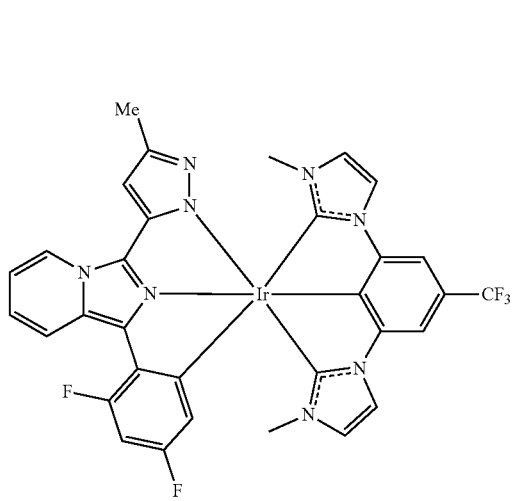
63
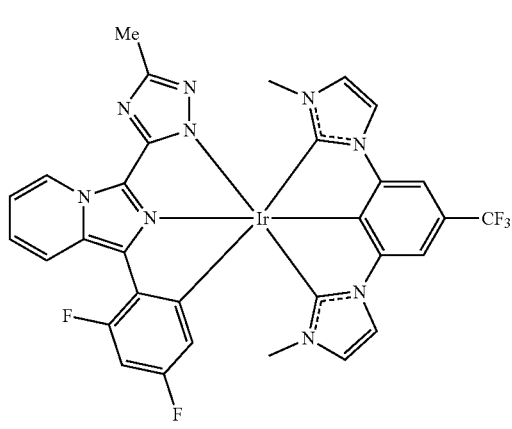

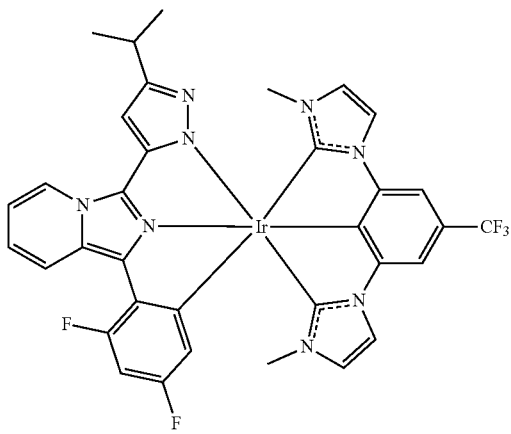

64

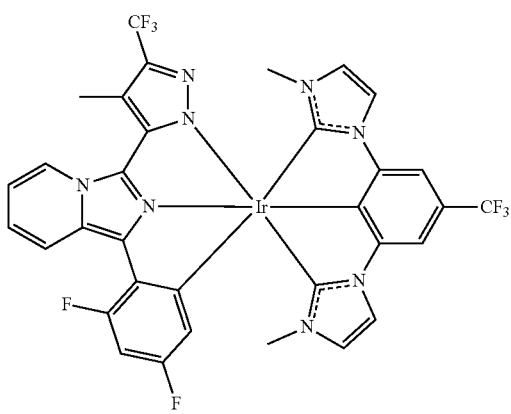

65

Since the ligand represented by Formula 1A includes a A$_2$ ring which is an N-containing 5-membered ring, the organometallic compound represented by Formula 1 may have an increased lowest unoccupied molecular orbital (LUMO) energy level. Accordingly, the emission wavelength of the organometallic compound may be blue shifted.

A$_2$ in the organometallic compound may be an N-containing 5-membered ring, and a bond between M and N atom linked to an M may be a coordination bond. Most of LUMO exists in the A$_2$ moiety. The organometallic compound represented by Formula 1 includes a tridentate ligand L$_A$ in which A$_1$ and A$_3$ are linked to both sides of A$_2$ ring via a covalent bond, thereby improving bonding stability by increasing bonding energy between A$_2$ and central metal M. Therefore, the bond dissociation energy between L$_A$ ligand and the central metal may be increased, and thus, the possibility of the organometallic compound transferring to the dissociation path may be reduced. Therefore, since the stability of the organometallic compound is improved, the organic light-emitting device including the organometallic compound has a long lifespan.

The central metal M and ligand L$_A$ in the organometallic compound may form a cyclometalated ring. For example, in the organometallic compound, the central metal M and ligand L$_A$ may form two cyclometalated rings. In the organometallic compound according to an embodiment, when Y$_1$ is C, the two cyclometalated rings may each be a 5-membered ring, or a 6-membered ring. By satisfying these conditions, compared to a compound in which one of the two cyclometalated rings is a 5-membered ring and the other is a 6-membered ring, due to sigma electron donor characteristics from a ligand to central metal M and the increase of MLCT, the stability of the compound is increased.

Due to the inclusion of tridentate ligand L$_B$, the organometallic compound represented by Formula 1 may have high stability based on a similar principle as applied to the case in which tridentate ligand L$_A$ is included.

The organometallic compound according to an embodiment may include at least one electron withdrawing group in the molecular structure thereof. Accordingly, the emission wavelength of the organometallic compound may be blue shifted and thus may emit blue light having high color purity.

A synthesis method for the organometallic compound represented by Formula 1 would be apparent to those of ordinary skill in the art by referring to the following examples.

The organometallic compound of Formula 1 may be used between a pair of electrodes of an organic light-emitting device. For example, the organometallic compound may be included in an emission layer. The organometallic compound may act as a dopant in the emission layer. In embodiments, the organometallic compound of Formula 1 may be used as a material for a capping layer disposed outside a pair of electrodes of an organic light-emitting device.

Accordingly, provided is an organic light-emitting device including: a first electrode; a second electrode facing the first electrode; and an organic layer disposed between the first electrode and the second electrode and including an emission layer; and wherein the organic light-emitting device includes an organometallic compound represented by Formula 1.

In one embodiment, the organic layer of the organic light-emitting device may include at least one organometallic compound represented by Formula 1.

The expression "(an organic layer) includes at least one of organometallic compounds" used herein may include a case in which "(an organic layer) includes identical organometallic compounds represented by Formula 1" and a case in which "(an organic layer) includes two or more different organometallic compounds represented by Formula 1".

For example, the organic layer may include, as the organometallic compound, only Compound 1. In this regard, Compound 1 may exist only in the emission layer of the organic light-emitting device. In embodiments, the organic layer may include, as the organometallic compound, Compound 1 and Compound 2. In this regard, Compound 1 and Compound 2 may exist in an identical layer (for example, Compound 1 and Compound 2 may all exist in an emission layer), or different layers (for example, Compound 1 may exist in an emission layer and Compound 2 may exist in an electron transport region).

In one embodiment, the emission layer of the organic light-emitting device may include the organometallic compound.

In embodiments, the emission layer of the organic light-emitting device may include the organometallic compound, the emission layer may further include a host, and the amount of the host included in the emission layer may be greater than the amount of the organometallic compound included in the emission layer. For example, the amount of the organometallic compound may be from about 0.01 parts by weight to 30 parts by weight based on 100 parts by weight of the emission layer.

In one embodiment, the emission layer may include the organometallic compound, and light having a maximum emission wavelength of about 445 nm to about 550 nm may be emitted from the emission layer. For example, blue light having a maximum emission wavelength of about 445 nm to about 480 nm, or green light having a maximum emission wavelength of about 481 nm to about 550 nm may be emitted.

The maximum emission wavelength of the organometallic compound may be a value which is calculated by using a TD-DFT method under B3LYP/LanL2DZ//m062x & 6-311G(d,p) using functional and basis set using the Gaussian 09 program. In one embodiment, the maximum emission wavelength of the organometallic compound may be an actual value measured by a photoluminescence (PL) measuring equipment.

In one embodiment, in the organic light-emitting device, the first electrode is an anode, and the second electrode is a cathode, and the organic layer further includes a hole transport region disposed between the first electrode and the emission layer and an electron transport region disposed between the emission layer and the second electrode. The hole transport region includes a hole injection layer, a hole transport layer, an emission auxiliary layer, an electron blocking layer, or any combination thereof. The electron transport region includes a buffer layer, a hole blocking layer, an electron transport layer, an electron injection layer, or any combination thereof.

The term "an organic layer" as used herein refers to a single layer and/or multiple layers disposed between the first electrode and the second electrode of an organic light-emitting device. A material included in the "organic layer" is not limited to an organic material.

[Description of FIG. 1]

Figure 1:
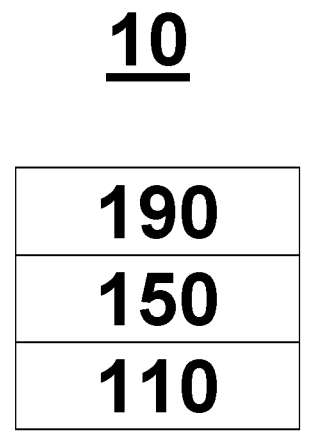

FIG. 1 is a schematic cross-sectional view of an organic light-emitting device 10 according to an embodiment. The organic light-emitting device 10 includes a first electrode 110, an organic layer 150, and a second electrode 190.

Hereinafter, the structure of the organic light-emitting device 10 according to an embodiment and a method of manufacturing the organic light-emitting device 10 will be described in connection with FIG. 1.

[First electrode 110]

In FIG. 1, a substrate may be disposed under the first electrode 110 or above the second electrode 190. The substrate may be a glass substrate or a plastic substrate, each having excellent mechanical strength, thermal stability, transparency, surface smoothness, ease of handling, and water resistance.

The first electrode 110 may be formed by depositing or sputtering a material for forming the first electrode 110 on the substrate. When the first electrode 110 is an anode, the material for forming the first electrode 110 may be selected from materials with a high work function to facilitate hole injection.

The first electrode 110 may be a reflective electrode, a semi-transmissive electrode, or a transmissive electrode. When the first electrode 110 is a transmissive electrode, a material for forming a first electrode may be selected from indium tin oxide (ITO), indium zinc oxide (IZO), tin oxide ($SnO_2$), zinc oxide (ZnO), and any combinations thereof, but embodiments are not limited thereto. In embodiments, when the first electrode 110 is a semi-transmissive electrode or a reflective electrode, a material for forming a first electrode may be selected from magnesium (Mg), silver (Ag), aluminum (Al), aluminum-lithium (Al—Li), calcium (Ca), magnesium-indium (Mg—In), magnesium-silver (Mg—Ag), and any combinations thereof, but embodiments are not limited thereto.

The first electrode 110 may have a single-layered structure or a multi-layered structure including two or more layers. For example, the first electrode 110 may have a three-layered structure of ITO/Ag/ITO, but the structure of the first electrode 110 is not limited thereto.

[Organic Layer 150]

The organic layer 150 is disposed on the first electrode 110. The organic layer 150 may include an emission layer.

The organic layer 150 may further include a hole transport region disposed between the first electrode 110 and the emission layer and an electron transport region disposed between the emission layer and the second electrode 190.

[Hole Transport Region in Organic Layer 150]

The hole transport region may have i) a single-layered structure including a single layer including a single material, ii) a single-layered structure including a single layer including different materials, or iii) a multi-layered structure having multiple layers including different materials.

The hole transport region may include a hole injection layer, a hole transport layer, an emission auxiliary layer, an electron blocking layer, or any combination thereof.

For example, the hole transport region may have a single-layered structure including a single layer including different materials or a multi-layered structure having a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein for each structure, constituting layers may be sequentially stacked (or disposed) from the first electrode 110 in this stated order, but the structure of the hole transport region is not limited thereto.

The hole transport region may include at least one selected from m-MTDATA, TDATA, 2-TNATA, NPB (NPD), β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly (4-styrenesulfonate) (PEDOT/PSS), polyaniline/camphor sulfonic acid (PANI/CSA), polyaniline/poly(4-styrenesulfonate) (PANI/PSS), a compound represented by Formula 201, and a compound represented by Formula 202:

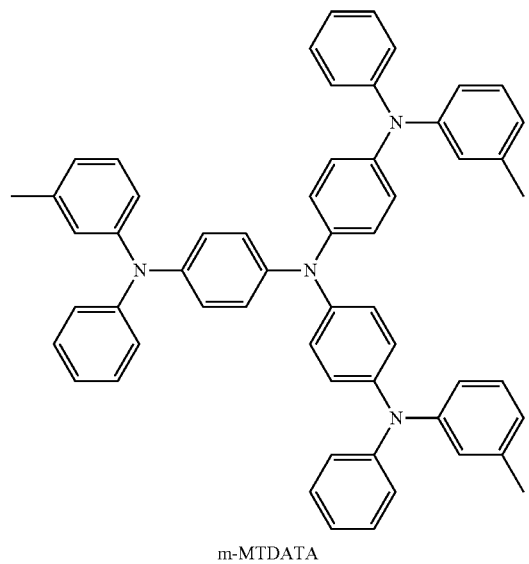

m-MTDATA

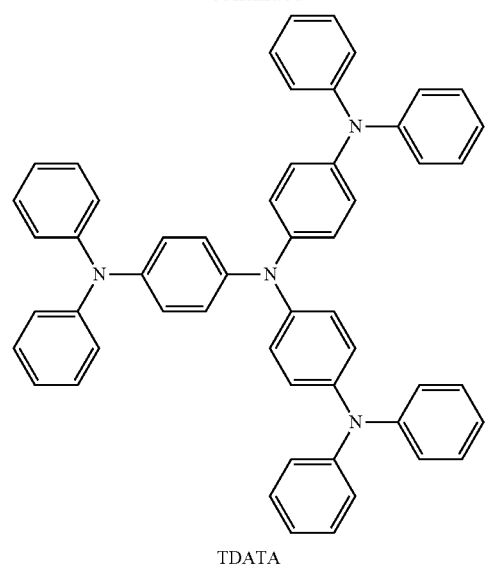
TDATA
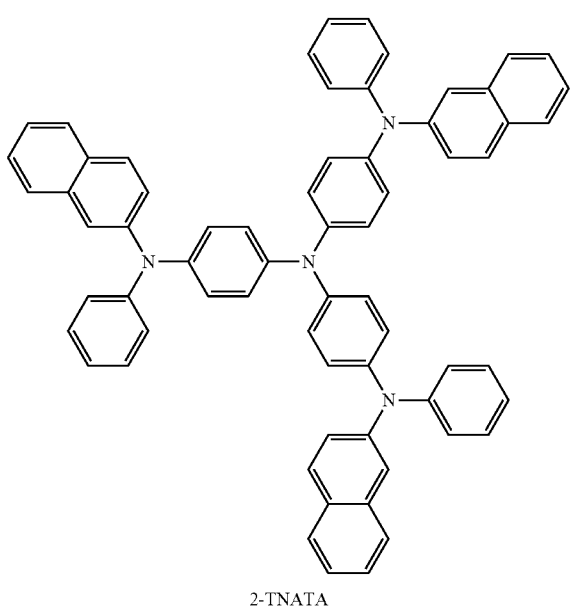
2-TNATA
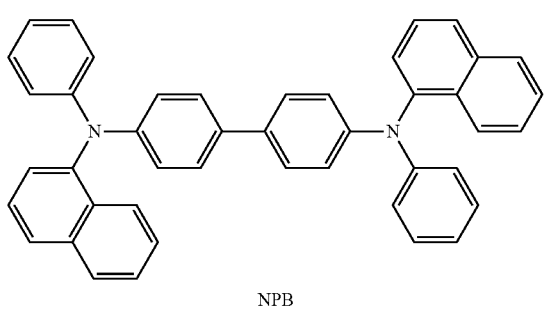
NPB
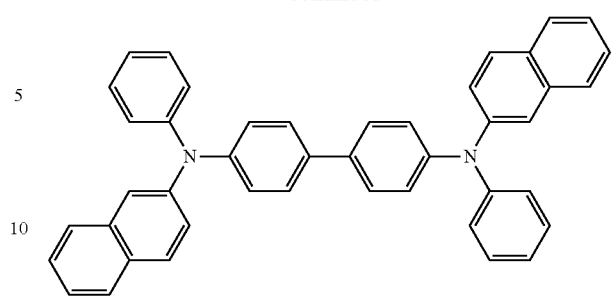
β-NPB
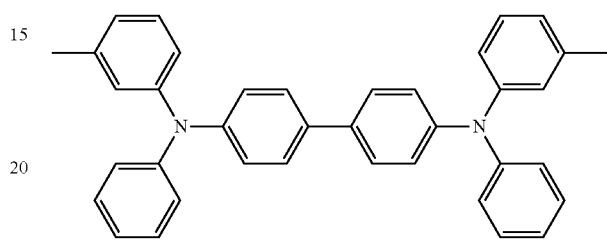
TPD
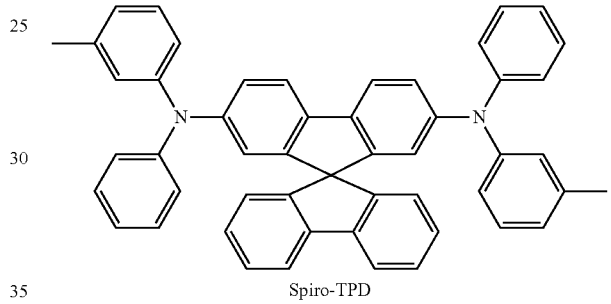
Spiro-TPD
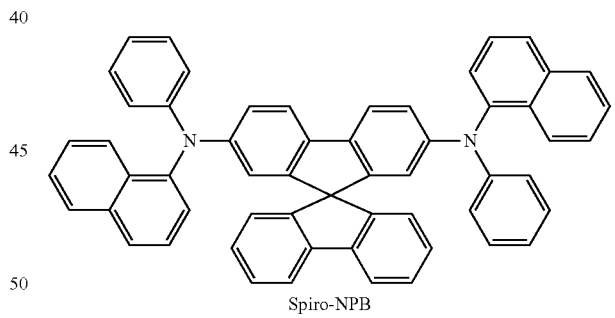
Spiro-NPB
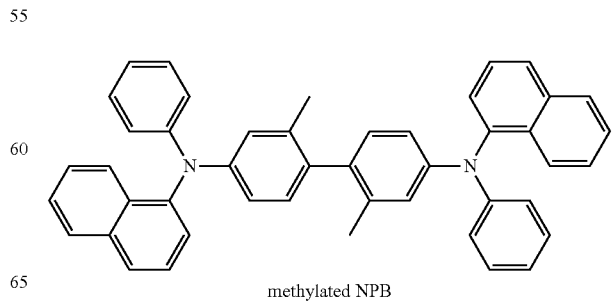
methylated NPB

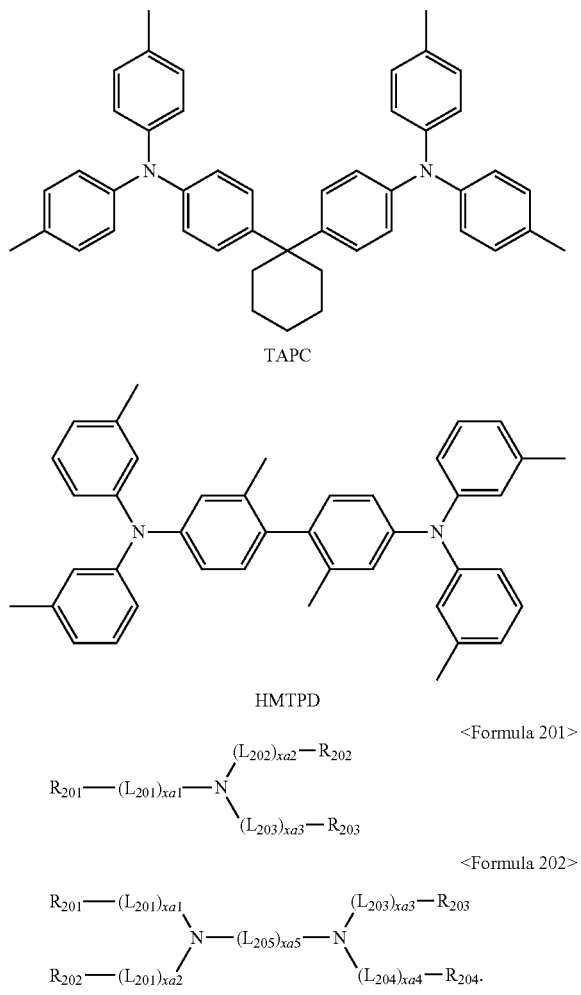

TAPC

HMTPD

<Formula 201>

$R_{201}$—$(L_{201})_{xa1}$—N$\begin{matrix}(L_{202})_{xa2}-R_{202}\\(L_{203})_{xa3}-R_{203}\end{matrix}$ <Formula 202>

$\begin{matrix}R_{201}-(L_{201})_{xa1}\\R_{202}-(L_{201})_{xa2}\end{matrix}$N—$(L_{205})_{xa5}$—N$\begin{matrix}(L_{203})_{xa3}-R_{203}\\(L_{204})_{xa4}-R_{204}.\end{matrix}$ In Formulae 201 and 202, $L_{201}$ to $L_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ may be selected from *—O—*', *—S—*', *—N($Q_{201}$)—*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer from 0 to 3, xa5 may be an integer from 1 to 10, and $R_{201}$ to $R_{204}$ and $Q_{201}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

For example, in Formula 202, $R_{201}$ and $R_{202}$ may optionally be linked to each other via a single bond, a dimethyl-methylene group, or a diphenyl-methylene group, and $R_{203}$ and $R_{204}$ may optionally be linked to each other via a single bond, a dimethyl-methylene group, or a diphenyl-methylene group.

In one embodiment, in Formulae 201 and 202, $L_{201}$ to $L_{205}$ may each independently be selected from:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, $-Si(Q_{31})(Q_{32})(Q_{33})$, and $-N(Q_{31})(Q_{32})$, wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In embodiments, xa1 to xa4 may each independently be 0, 1, or 2.

In embodiments, xa5 may be 1, 2, 3, or 4.

In embodiments, $R_{201}$ to $R_{204}$ and $Q_{201}$ may each independently be selected from:

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, $-Si(Q_{31})(Q_{32})(Q_{33})$, and $-N(Q_{31})(Q_{32})$, wherein $Q_{31}$ to $Q_{33}$ are the same as described above.

In embodiments, at least one selected from $R_{201}$ to $R_{203}$ in Formula 201 may each independently be selected from:

a fluorenyl group, a spiro-bifluorenyl group, a carbazolyl group, a dibenzofuranyl group, and a dibenzothiophenyl group; and a fluorenyl group, a spiro-bifluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments are not limited thereto.

In embodiments, in Formula 202, i) $R_{201}$ and $R_{202}$ may be linked to each other via a single bond, and/or ii) $R_{203}$ and $R_{204}$ may be linked to each other via a single bond.

In embodiments, at least one selected from $R_{201}$ to $R_{204}$ in Formula 202 may each independently be selected from:

a carbazolyl group; and a carbazolyl group substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments are not limited thereto.

The compound represented by Formula 201 may be represented by Formula 201-1 below:

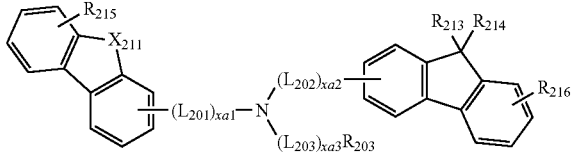

<Formula 201-1>

In one embodiment, the compound represented by Formula 201 may be represented by Formula 201-2 below, but embodiments are not limited thereto:

<Formula 201-2>

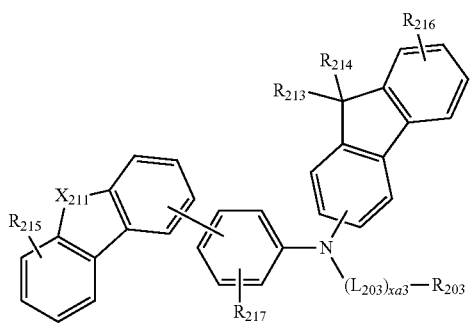

In embodiments, the compound represented by Formula 201 may be represented by Formula 201-2(1) below, but embodiments are not limited thereto:

<Formula 201-2(1)>

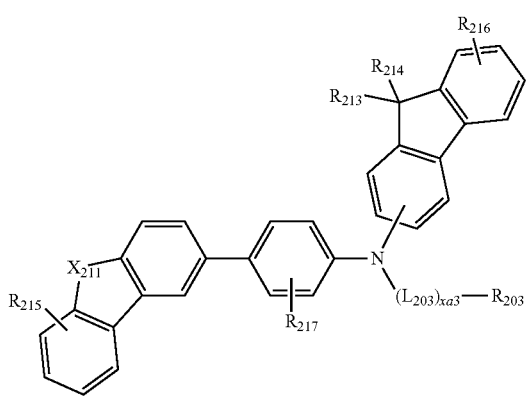

In embodiments, the compound represented by Formula 201 may be represented by Formula 201A below:

<Formula 201A>

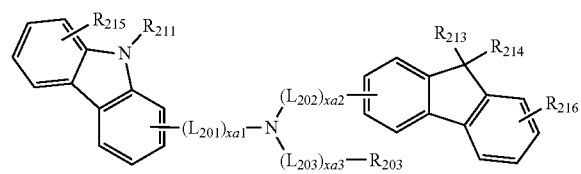

In embodiments, the compound represented by Formula 201 may be represented by Formula 201A(1) below, but embodiments are not limited thereto:

<Formula 201A (1)>

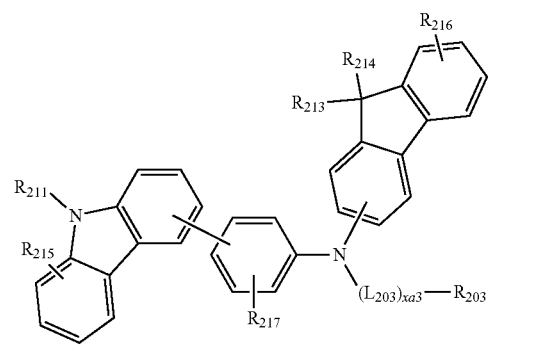

In embodiments, the compound represented by Formula 201 may be represented by Formula 201A-1 below, but embodiments are not limited thereto:

<Formula 201A-1>

In one embodiment, the compound represented by Formula 202 may be represented by Formula 202-1 below:

<Formula 202-1>

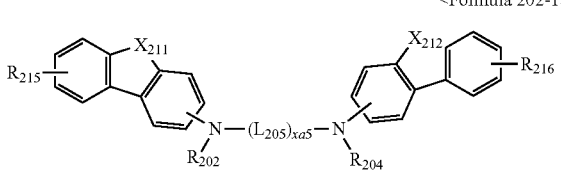

In embodiments, the compound represented by Formula 202 may be represented by Formula 202-1(1) below:

<Formula 202-1(1)>

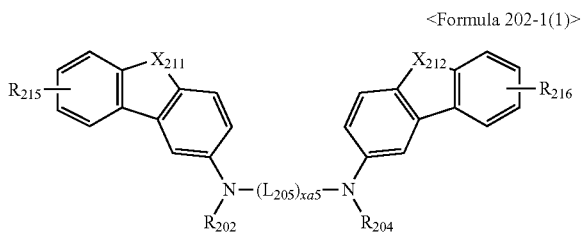

In embodiments, the compound represented by Formula 202 may be represented by Formula 202A below:

<Formula 202A>

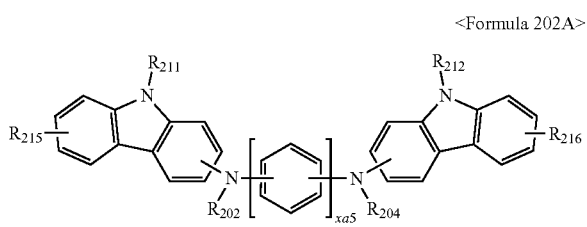

In embodiments, the compound represented by Formula 202 may be represented by Formula 202A-1 below:

<Formula 202A-1>

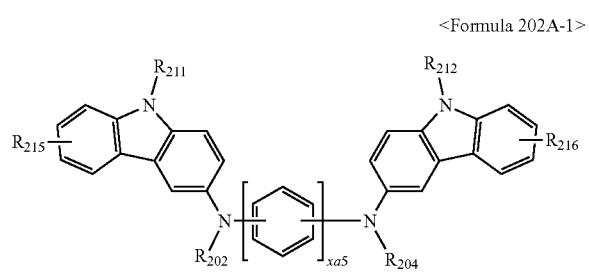

In Formulae 201-1, 201-2, 201-2(1), 201A, 201A(1), 201A-1, 202-1, 202-1(1), 202A, and 202A-1, $L_{201}$ to $L_{203}$, xa1 to xa3, xa5, and $R_{202}$ to $R_{204}$ are the same as described above, $L_{205}$ may be selected from a phenylene group and a fluorenylene group, $X_{211}$ may be selected from O, S, and $N(R_{211})$, $X_{212}$ may be selected from O, S, and $N(R_{212})$, $R_{211}$ and $R_{212}$ are the same as described in connection with $R_{203}$, and $R_{213}$ to $R_{217}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

The hole transport region may include at least one compound selected from Compounds HT1 to HT48, but embodiments are not limited thereto:

HT1

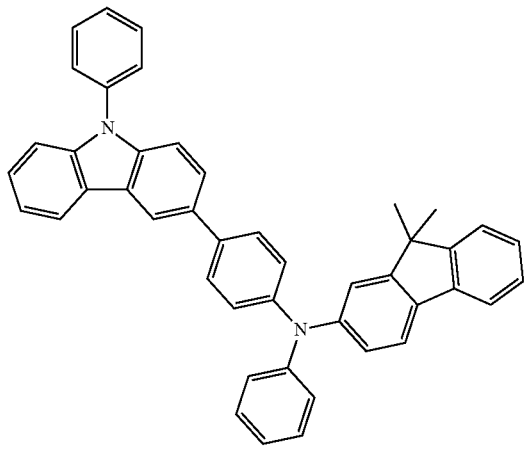

HT2

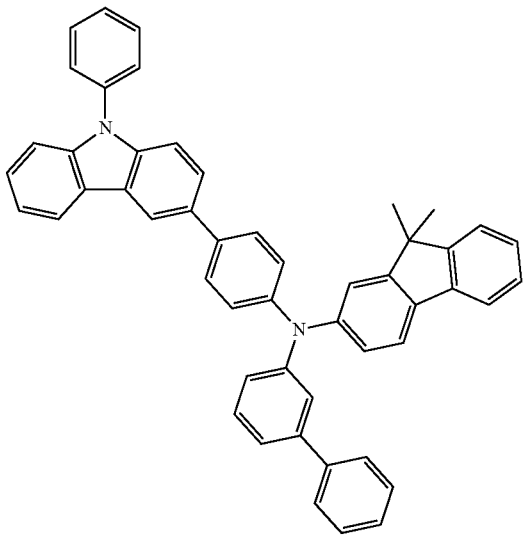

HT3
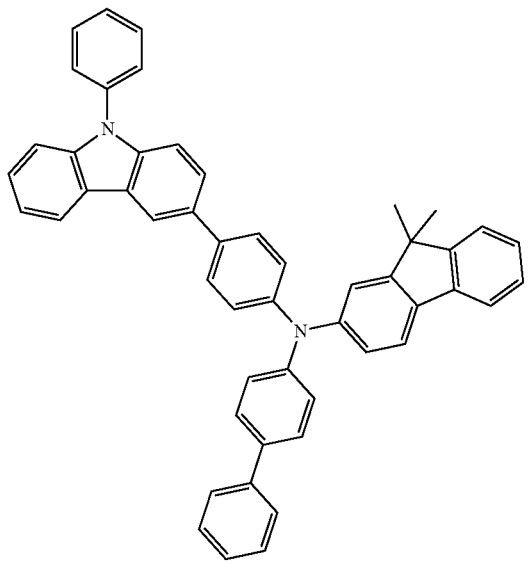
HT4
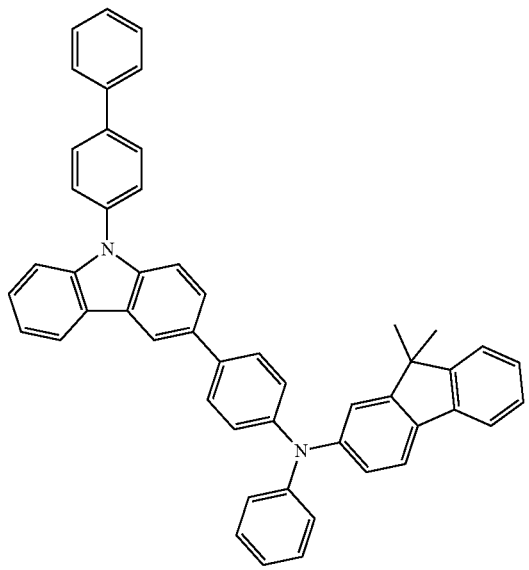
HT5
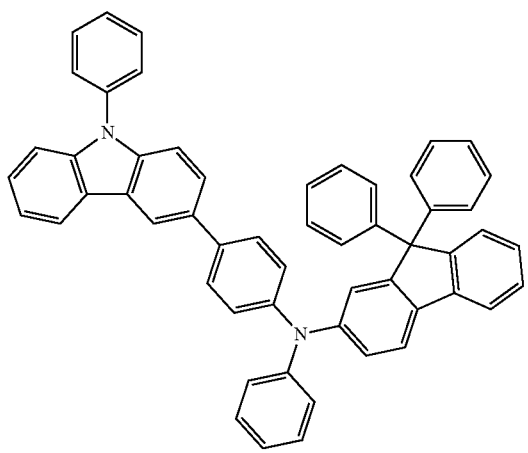
HT6
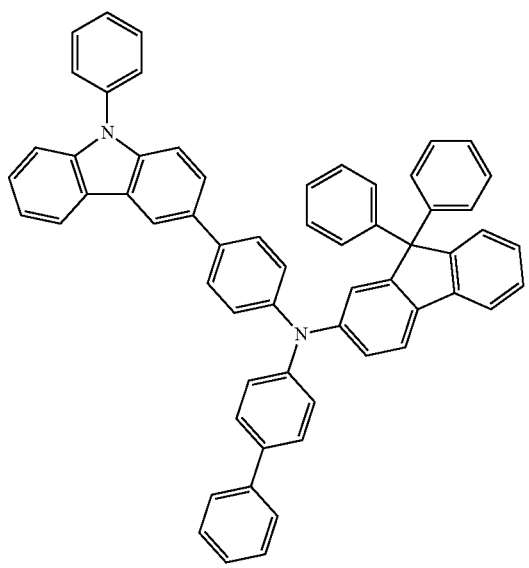

-continued
HT7
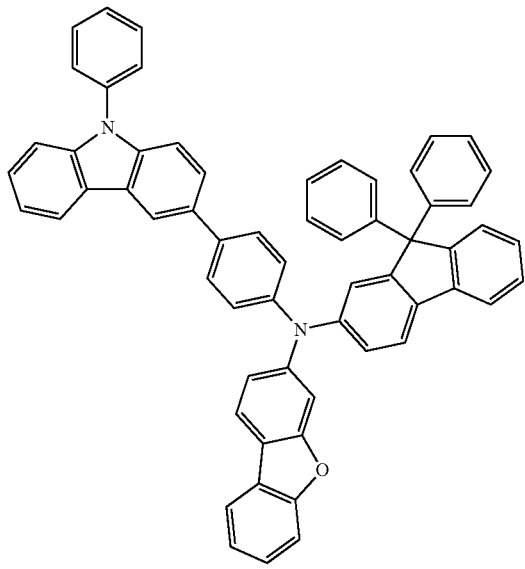
HT8
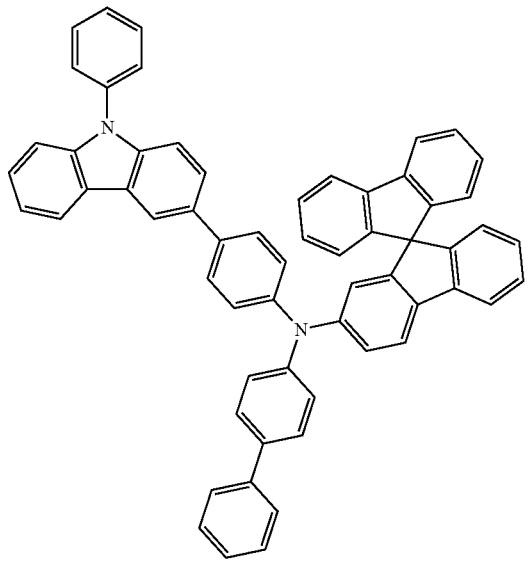
HT9
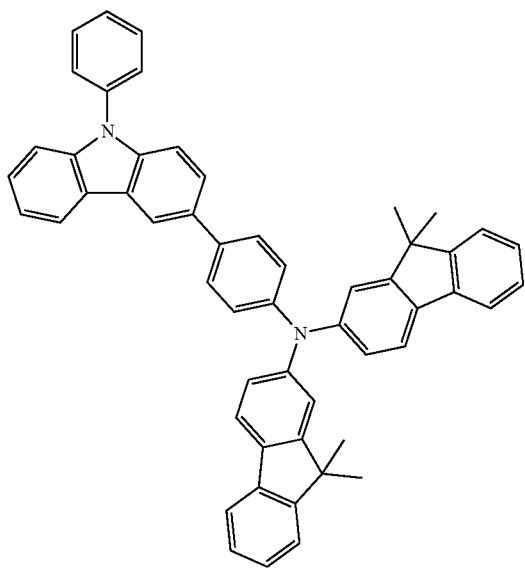
HT10
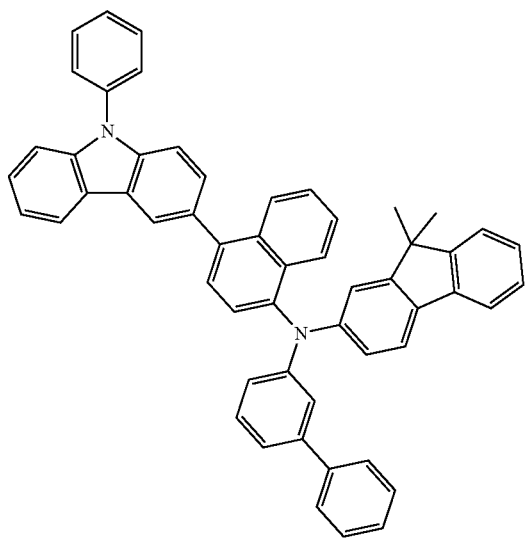

-continued
HT11
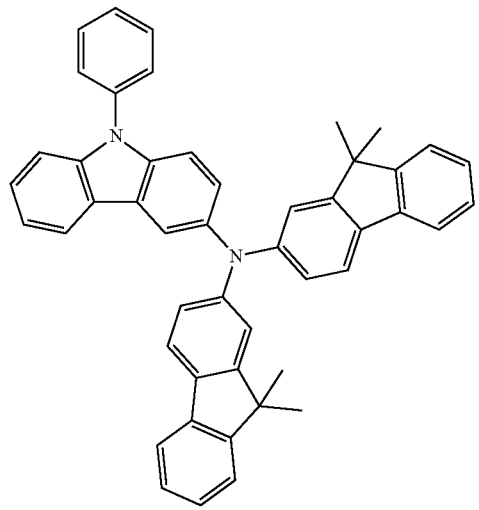
HT12
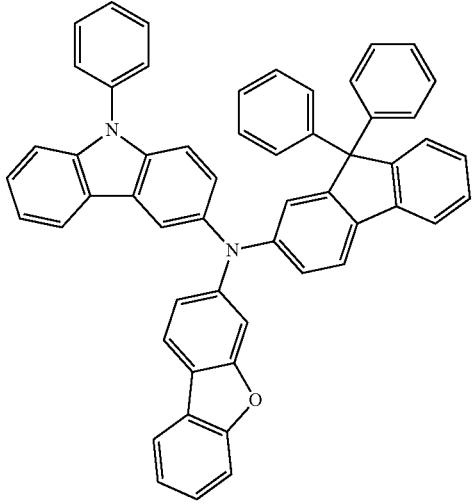
HT13
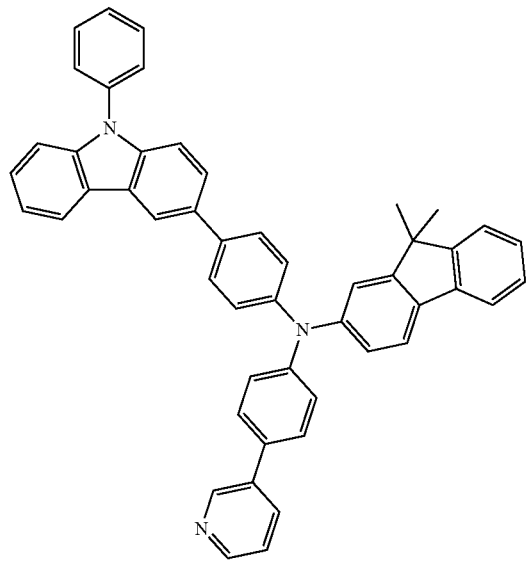
HT14
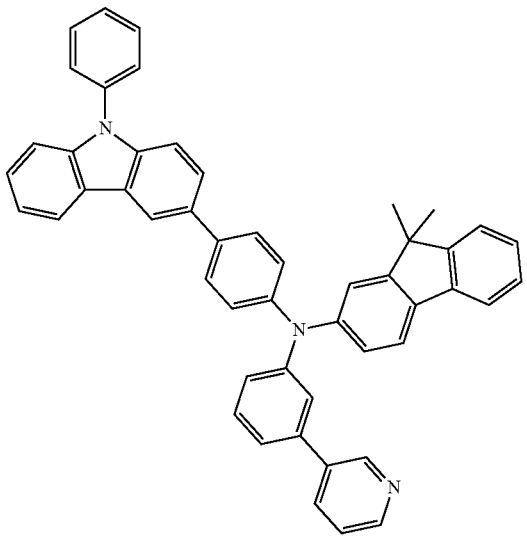
HT15
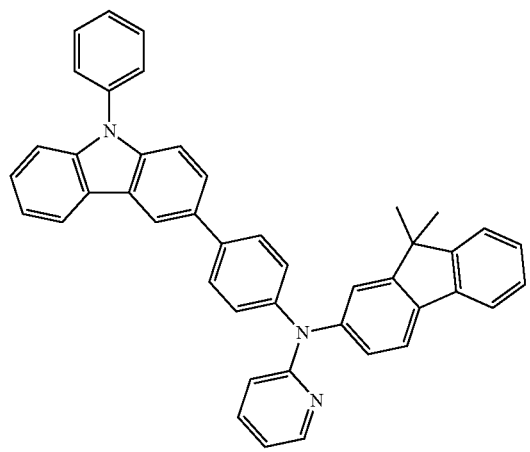
HT16
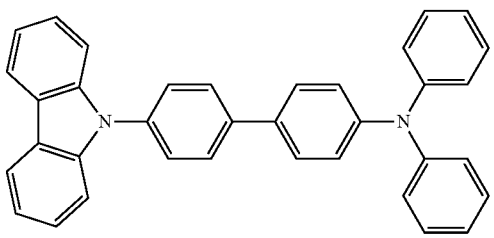

-continued
HT17
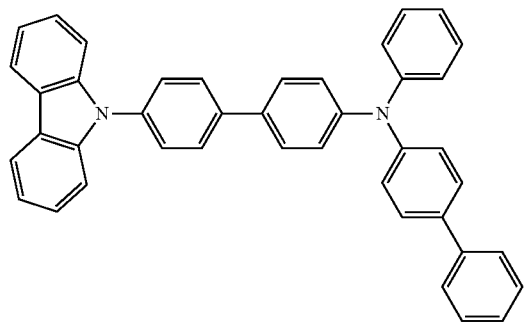
HT18
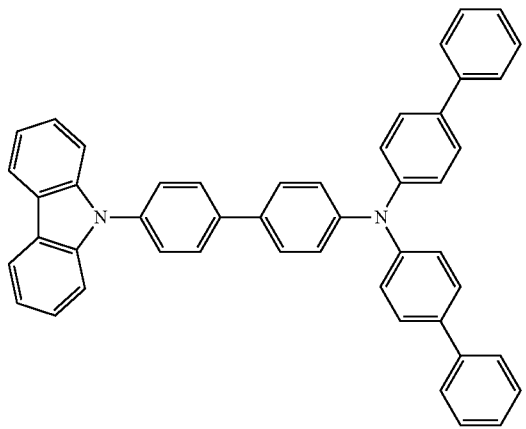
HT19
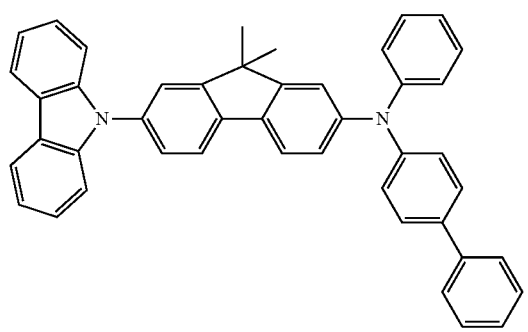
HT20
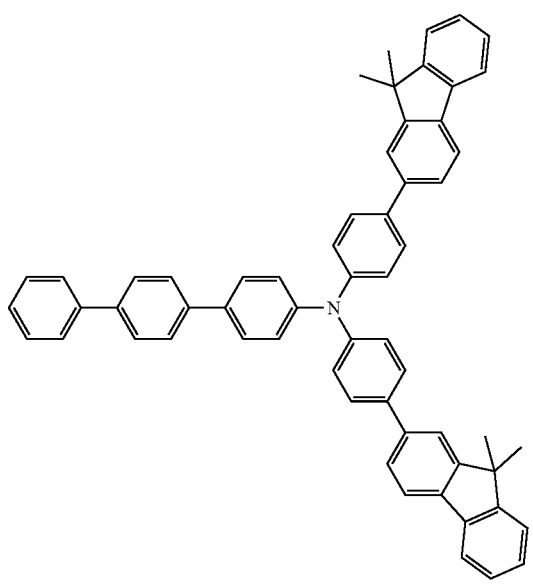
HT21
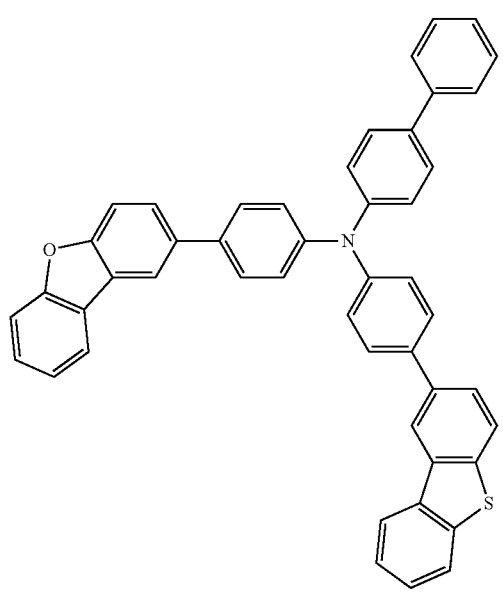
HT22
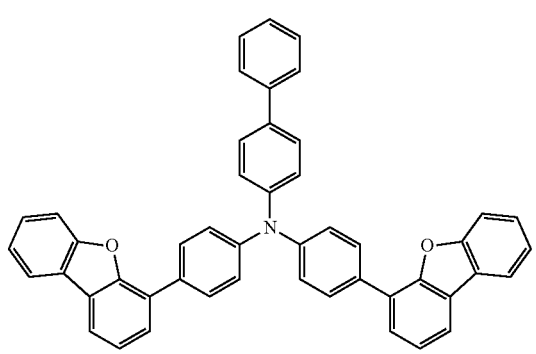

HT23
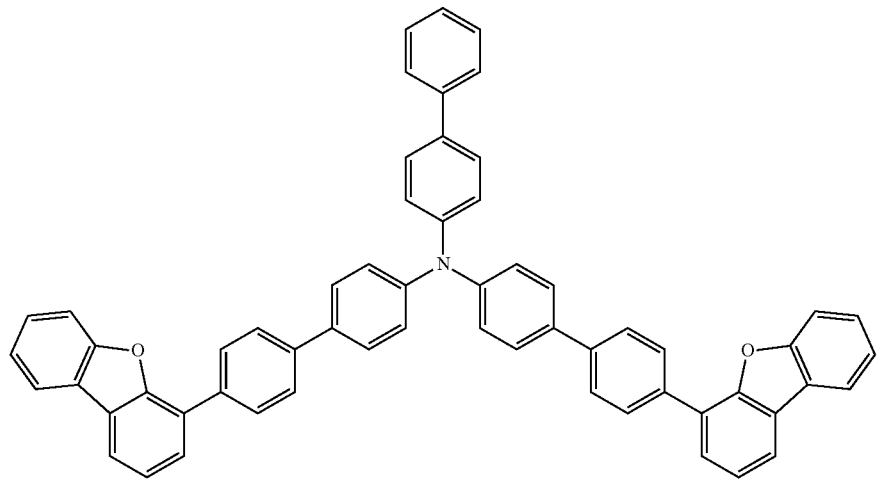
HT24
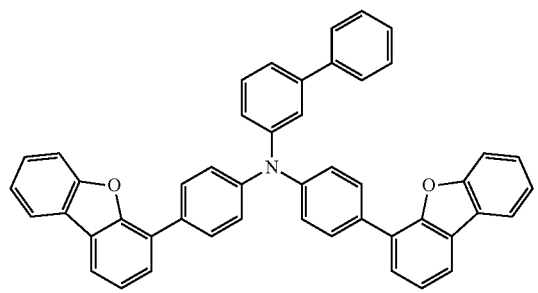
HT25
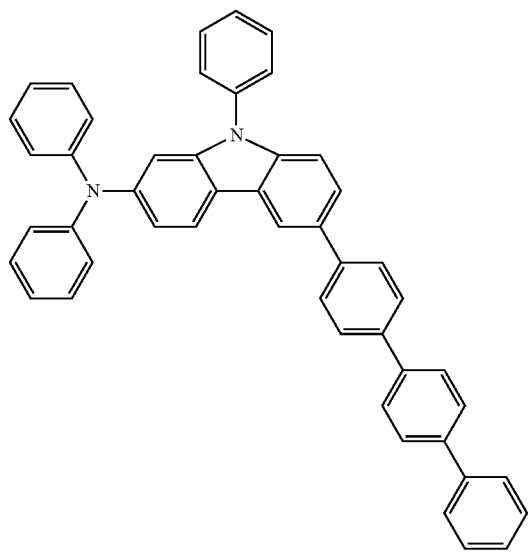
HT26
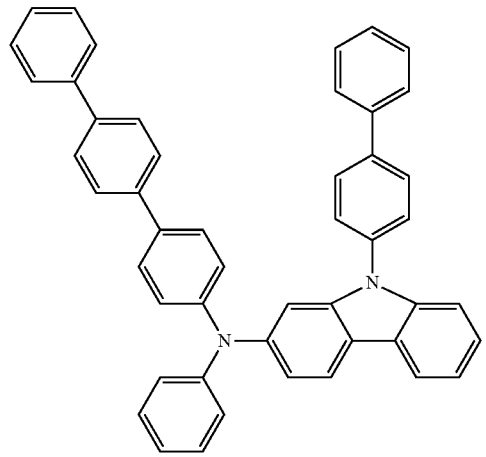
HT27
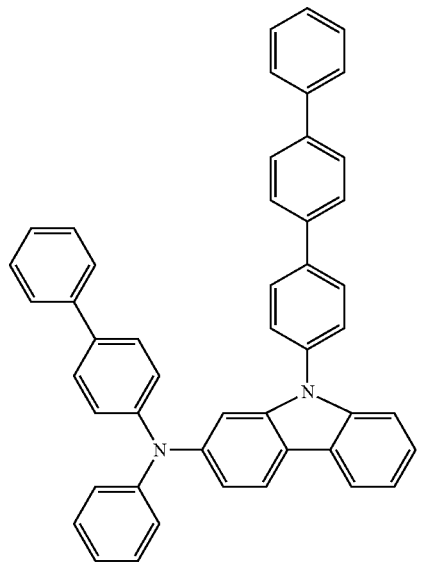

-continued
HT28
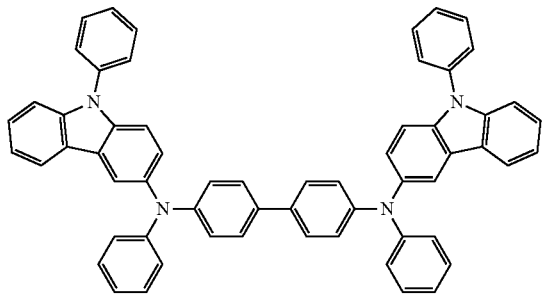
HT29
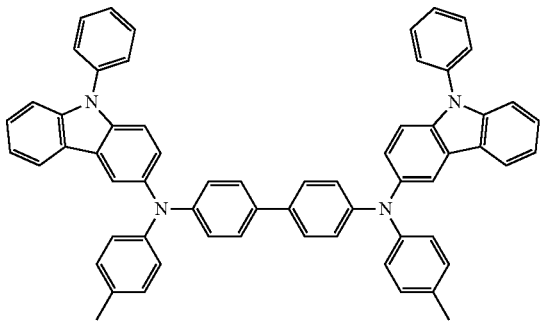
HT30
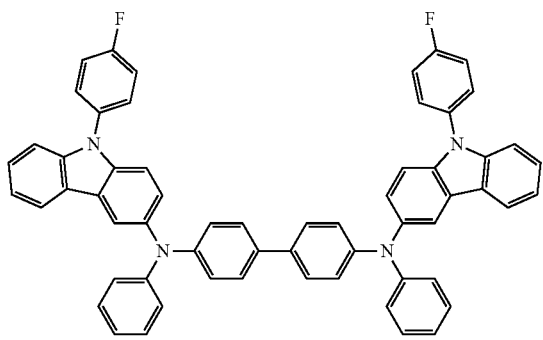
HT31
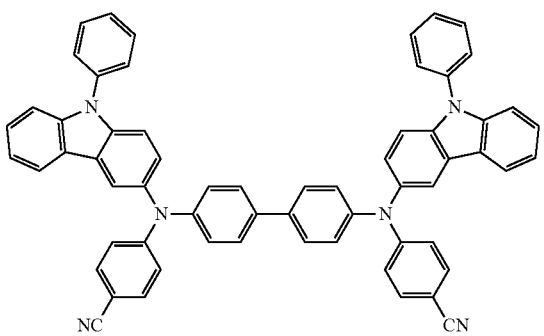
HT32
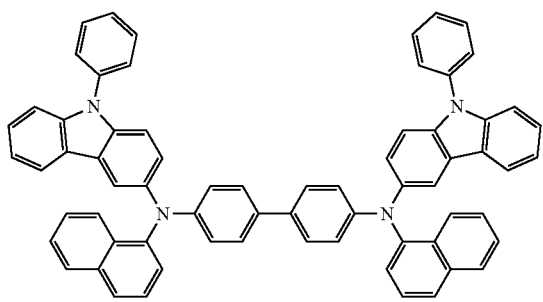
HT33
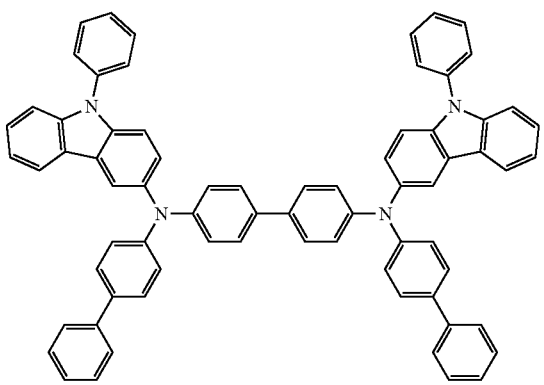
HT34
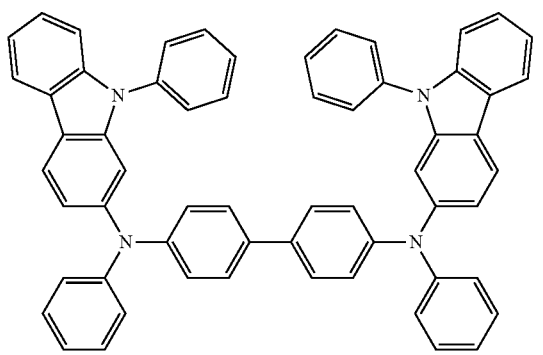
HT35
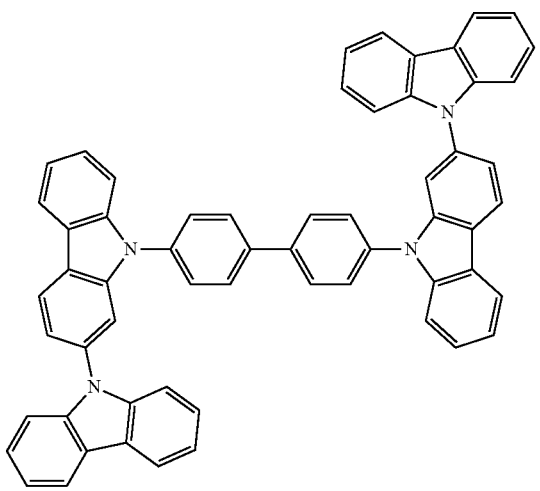

-continued
HT36
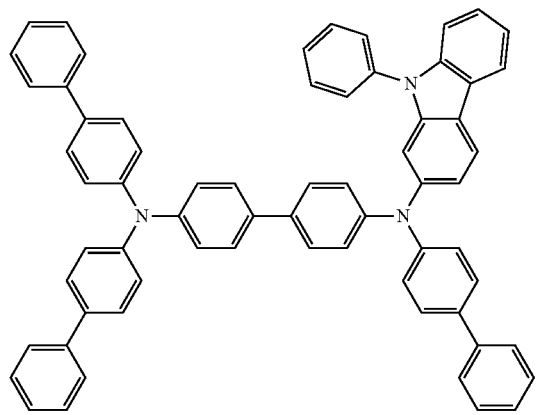
HT37
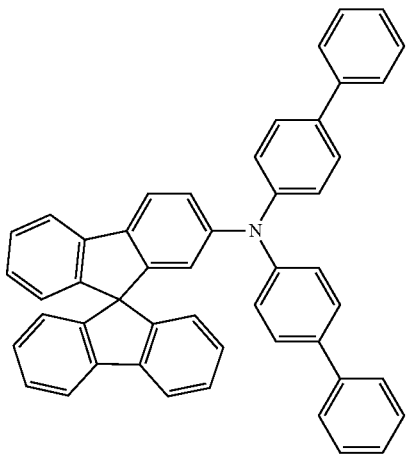
HT38
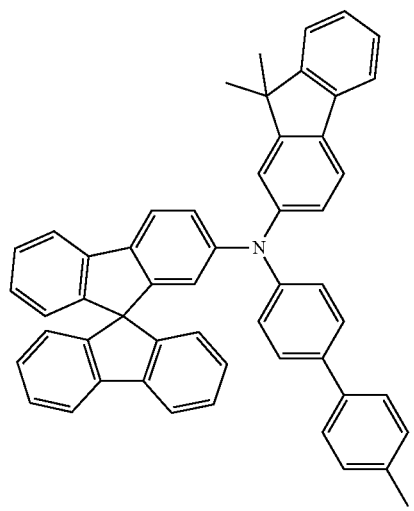
HT39
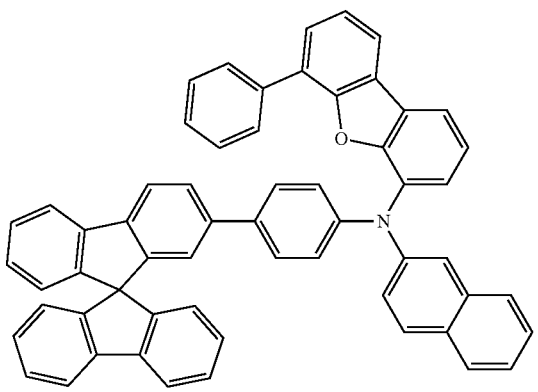
HT40
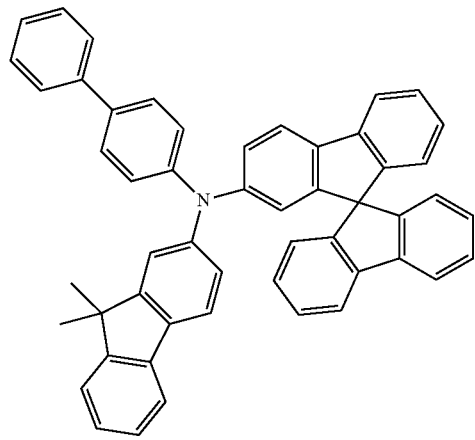
HT41
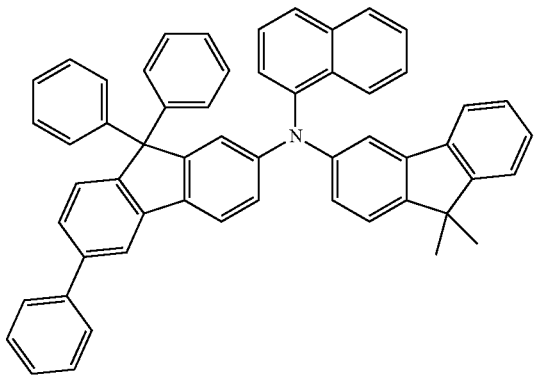

-continued
HT42
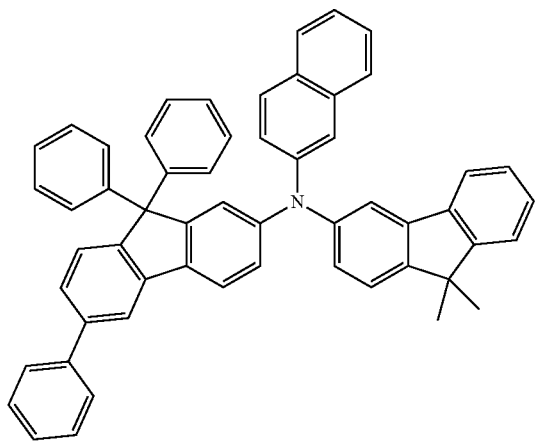
HT43
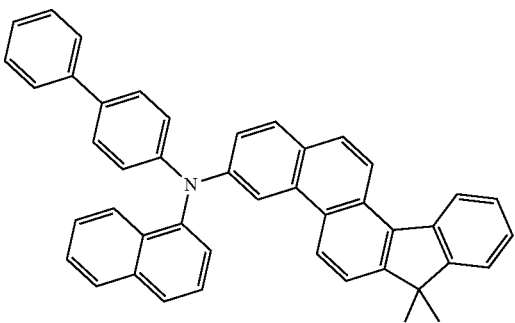
HT44
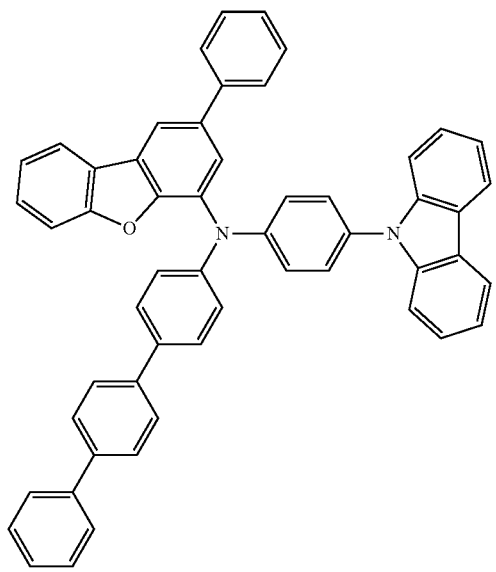
HT45
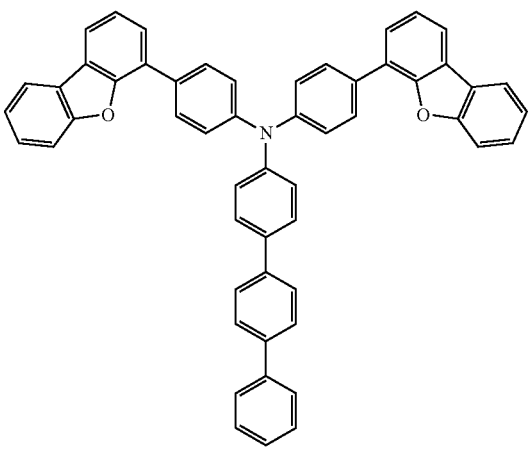
HT46
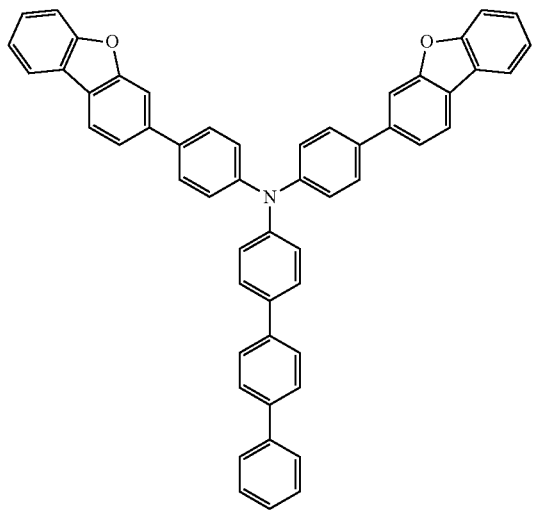
HT47
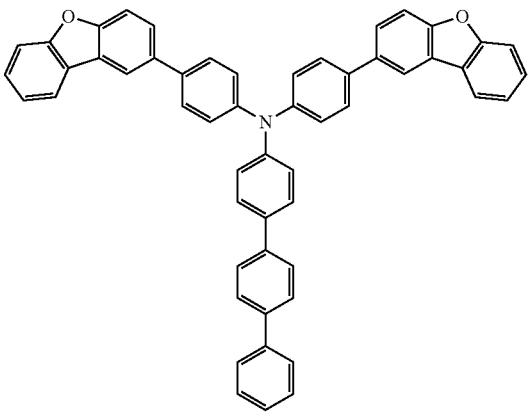

HT48

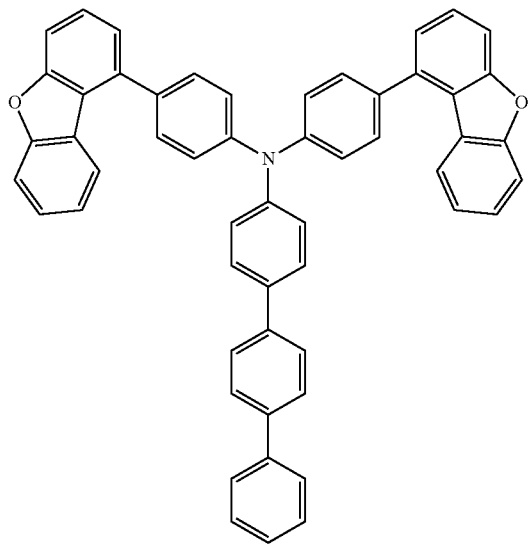

A thickness of the hole transport region may be in a range of about 100 Å to about 10,000 Å. In an embodiment, the thickness of the hole transport region may be in a range of about 100 Å to about 1,000 Å. When the hole transport region includes at least one selected from a hole injection layer and a hole transport layer, the thickness of the hole injection layer may be in a range of about 100 Å to about 9,000 Å, and the thickness of the hole transport layer may be in a range of about 50 Å to about 2,000 Å. In an embodiment, the thickness of the hole injection layer, may be in a range of about 100 Å to about 1,000 Å. In an embodiment, the thickness of the hole transport layer may be in a range of about 100 Å to about 1,500 Å. When the thicknesses of the hole transport region, the hole injection layer and the hole transport layer are within these ranges, satisfactory hole transporting characteristics may be obtained without a substantial increase in driving voltage.

The emission auxiliary layer may increase light-emission efficiency by compensating for an optical resonance distance according to the wavelength of light emitted by an emission layer, and the electron blocking layer may block the flow of electrons from an electron transport region. The emission auxiliary layer and the electron blocking layer may include the materials as described above.

[p-Dopant]

The hole transport region may further include a charge-generation material for improvement of conductive properties. The charge-generation material may be homogeneously or non-homogeneously dispersed in the hole transport region.

The charge-generation material may be, for example, a p-dopant.

In one embodiment, a lowest unoccupied molecular orbital (LUMO) energy level of the p-dopant may be −3.5 eV or less.

The p-dopant may include at least one selected from a quinone derivative, a metal oxide, and a cyano group-containing compound, but embodiments are not limited thereto.

In one embodiment, the p-dopant may include at least one selected from:
a quinone derivative, such as tetracyanoquinodimethane (TCNQ) and 2,3,5,6-Tetrafluoro-7,7,8,8-tetracyanoquinodimethane (F4-TCNQ);
a metal oxide, such as tungsten oxide or molybdenum oxide;
1,4,5,8,9,12-Hexaazatriphenylene-hexacarbonitrile (HAT-CN); and
a compound represented by Formula 221 below,
but embodiments are not limited thereto:

<HAT-CN>

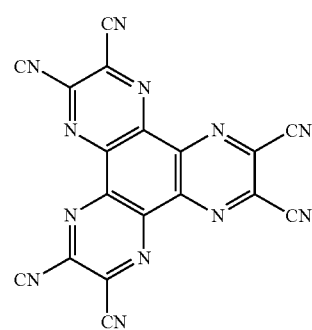

<F4-TCNQ>

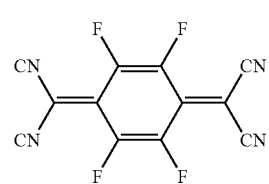

<Formula 221>

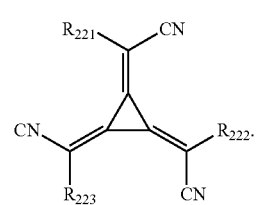

In Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one selected from $R_{221}$ to $R_{223}$ may have at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

[Emission Layer in Organic Layer 150]

When the organic light-emitting device 10 is a full-color organic light-emitting device, the emission layer may be patterned into a red emission layer, a green emission layer, or a blue emission layer, according to a sub-pixel. In embodiments, the emission layer may have a stacked structure of two or more layers selected from a red emission layer, a green emission layer, and a blue emission layer, in which the two or more layers contact each other or are separated from each other. In embodiments, the emission layer may include two or more materials selected from a red light-emitting material, a green light-emitting material, and a blue light-emitting material, in which the two or more materials are mixed with each other in a single layer to emit white light.

The emission layer may include a host and a dopant. The dopant may include at least one selected from a phosphorescent dopant and a fluorescent dopant.

In the emission layer, an amount of the dopant may be in a range of about 0.01 parts by weight to about 15 parts by weight based on 100 parts by weight of the host, but embodiments are not limited thereto.

A thickness of the emission layer may be in a range of about 100 Å to about 1,000 Å. In an embodiment, the thickness of the emission layer may be in a range of about 200 Å to about 600 Å. When the thickness of the emission layer is within this range, excellent light-emission characteristics may be obtained without a substantial increase in driving voltage.

[Host in Emission Layer]

In embodiments, the host may include a compound represented by Formula 301 below:

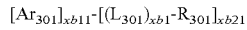  <Formula 301>

In Formula 301, $Ar_{301}$ may be a substituted or unsubstituted $C_5$-$C_{60}$ carbocyclic group or a substituted or unsubstituted $C_1$-$C_{60}$ heterocyclic group, xb11 may be 1, 2, or 3, $L_{301}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xb1 may be an integer from 0 to 5, $R_{301}$ may be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_5$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), and —P(=O)($Q_{301}$)($Q_{302}$), xb21 may be an integer from 1 to 5, and $Q_{301}$ to $Q_{303}$ may each independently be selected from a $C_1$-$C_{10}$ alkyl group, a $C_1$-$C_{10}$ alkoxy group, a phenyl group, a biphenyl group, a terphenyl group, and a naphthyl group, but embodiments are not limited thereto.

In one embodiment, $Ar_{301}$ in Formula 301 may be selected from:

a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group; and a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group, but embodiments are not limited thereto.

When xb11 in Formula 301 is 2 or more, two or more $Ar_{301}$(s) may be linked to each other via a single bond.

In embodiments, the compound represented by Formula 301 may be represented by Formula 301-1 or 301-2:

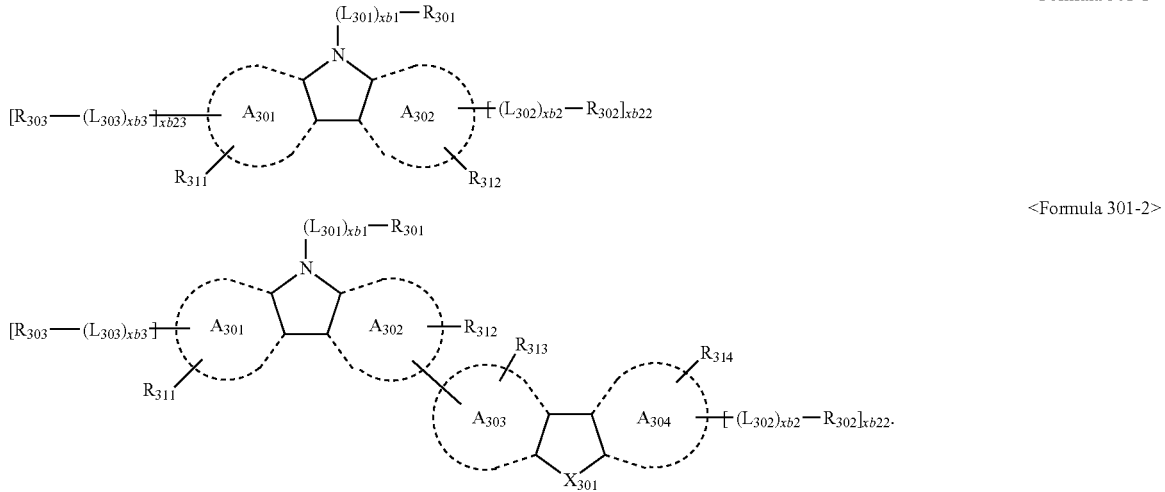

<Formula 301-1>

<Formula 301-2>

In Formulae 301-1 and 301-2, $A_{301}$ to $A_{304}$ may each independently be selected from a benzene ring, a naphthalene ring, a phenanthrene ring, a fluoranthene ring, a triphenylene ring, a pyrene ring, a chrysene ring, a pyridine ring, a pyrimidine ring, an indene ring, a fluorene ring, a spiro-bifluorene ring, a benzofluorene ring, a dibenzofluorene ring, an indole ring, a carbazole ring, a benzocarbazole ring, a dibenzocarbazole ring, a furan ring, a benzofuran ring, a dibenzofuran ring, a naphthofuran ring, a benzonaphthofuran ring, a dinaphthofuran ring, a thiophene ring, a benzothiophene ring, a dibenzothiophene ring, a naphthothiophene ring, a benzonaphthothiophene ring, and a dinaphthothiophene ring, $X_{301}$ may be O, S, or $N-[(L_{304})_{xb4}-R_{304}]$, $R_{311}$ to $R_{314}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si$(Q_{31})(Q_{32})(Q_{33})$, —N$(Q_{31})(Q_{32})$, —B$(Q_{31})(Q_{32})$, —C(=O)$(Q_{31})$, —S(=O)$_2(Q_{31})$, and —P(=O)$(Q_{31})(Q_{32})$, xb22 and xb23 may each independently be 0, 1, or 2, $L_{301}$, xb1, $R_{301}$, and $Q_{31}$ to $Q_{33}$ are each the same as described above, $L_{302}$ to $L_{304}$ are each independently the same as described in connection with $L_{301}$, xb2 to xb4 may each independently be the same as described in connection with xb1, and $R_{302}$ to $R_{304}$ are each independently the same as described in connection with For example, in Formulae 301, 301-1, and 301-2, $L_{301}$ to $L_{304}$ may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{31}$ to $Q_{33}$ are the same as described above.

In one embodiment, in Formulae 301, 301-1, and 301-2, $R_{301}$ to $R_{304}$ may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{31}$ to $Q_{33}$ are the same as described above.

In one embodiment, the host may include an alkaline earth-metal complex. For example, the host may be selected from a Be complex (for example, Compound H55), a Mg complex, and a Zn complex.

In embodiments, the host may include at least one selected from 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolyl-benzene (mCP), 1,3,5-tri(carbazol-9-yl)benzene (TCP), and Compounds H1 to H55, but embodiments are not limited thereto:

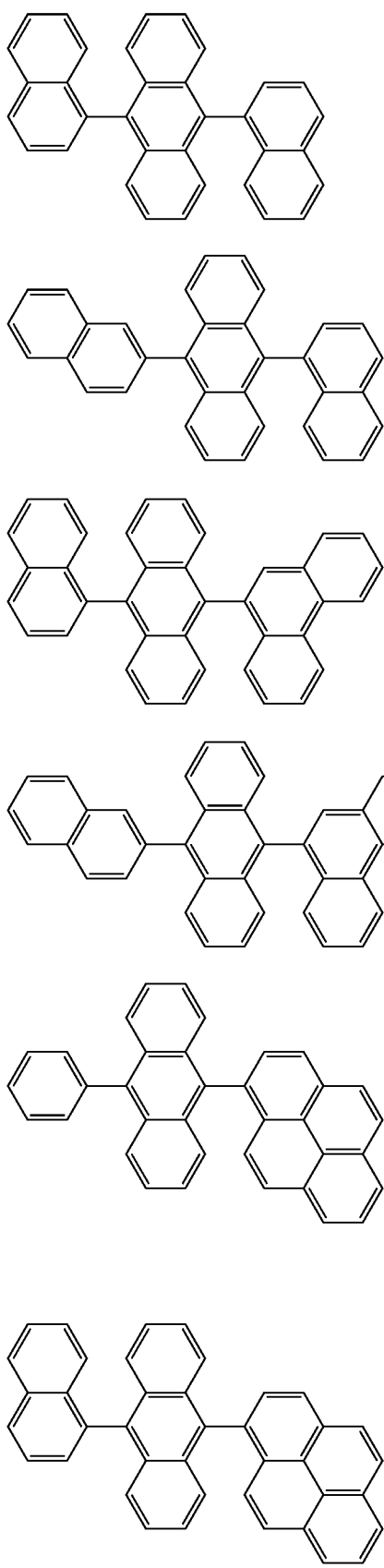
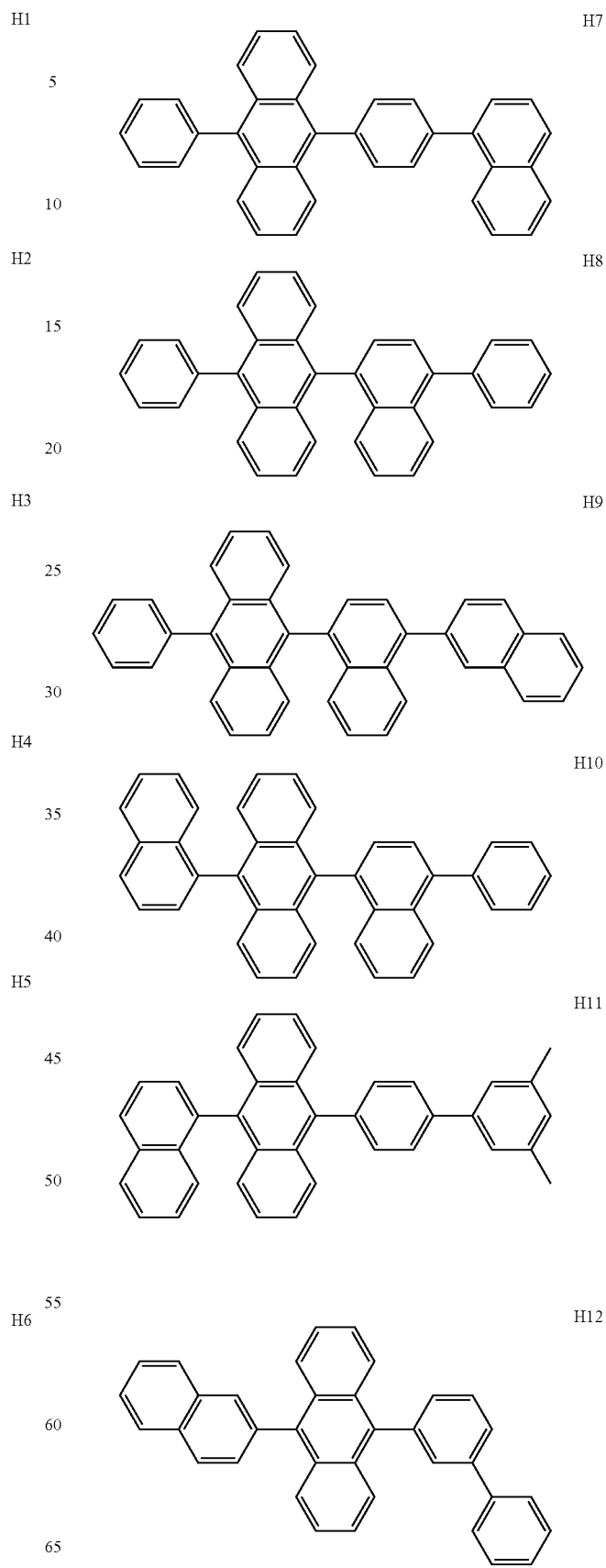

H13
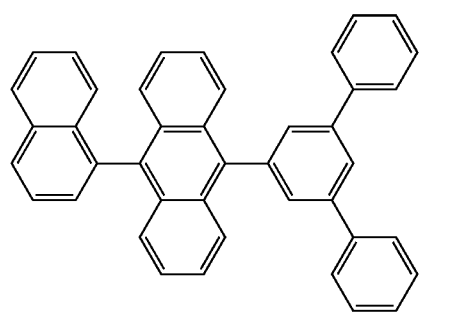
H14
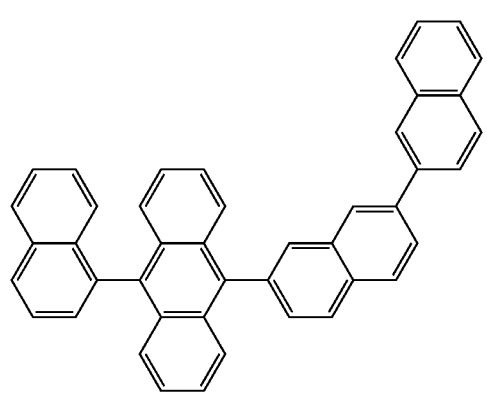
H15
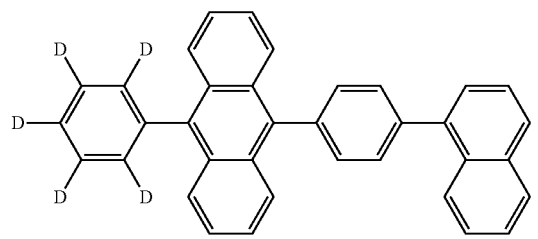
H16
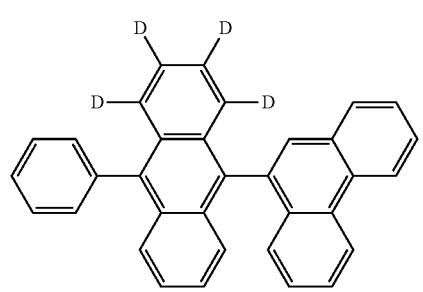
H17
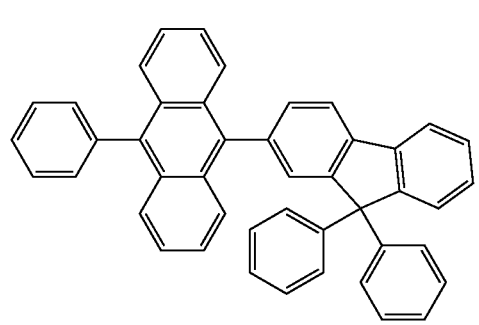
H18
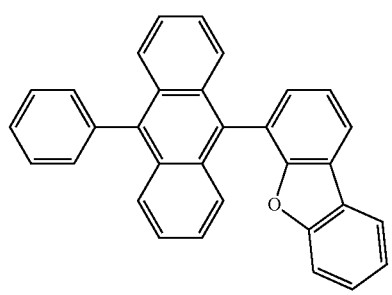
H19
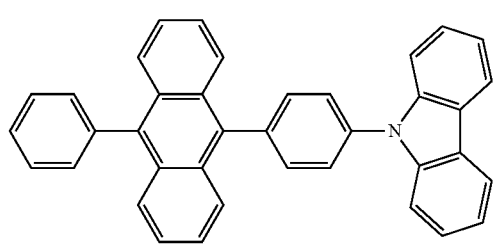
H20
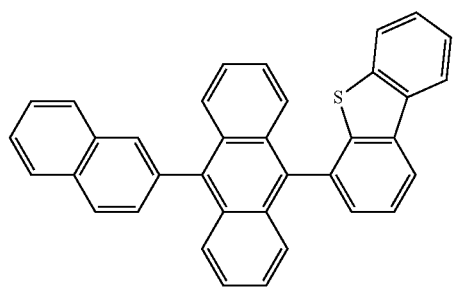
H21
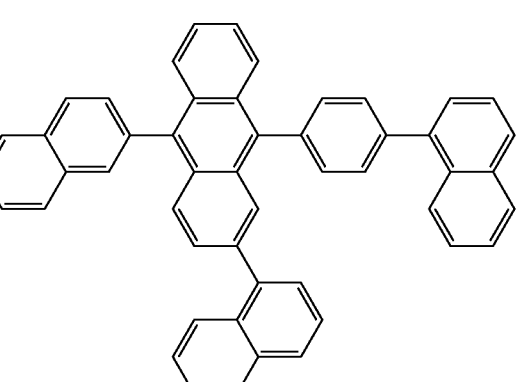
H22
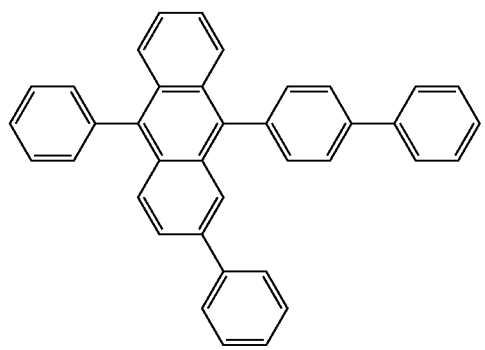

-continued
H23
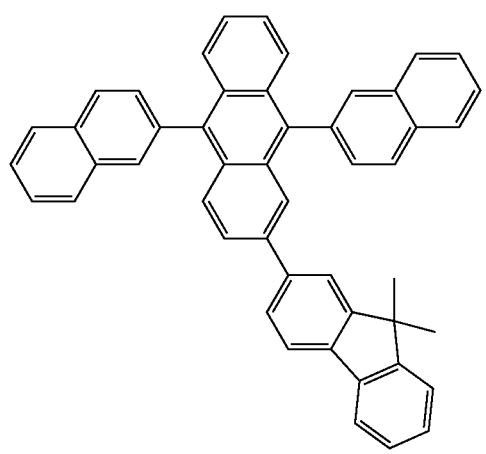
H24
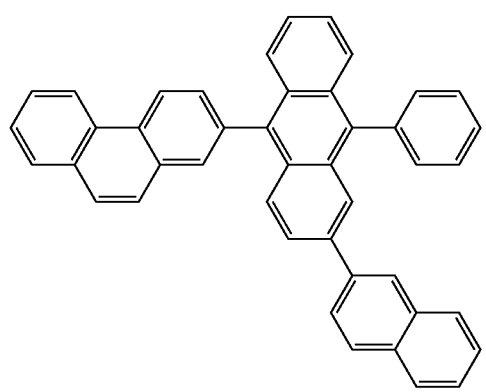
H25
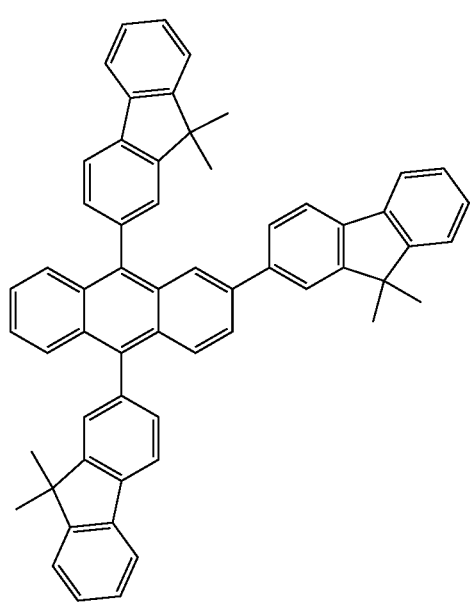
-continued
H26
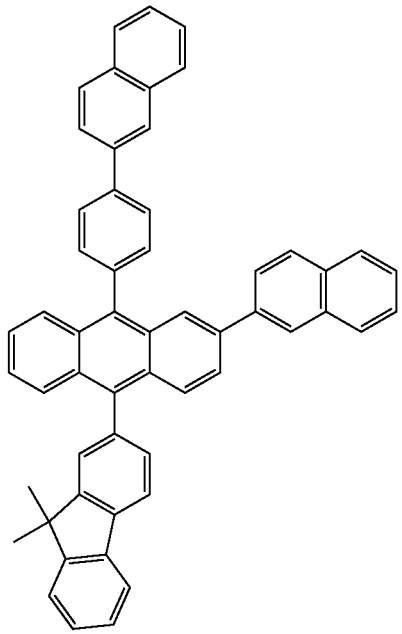
H27
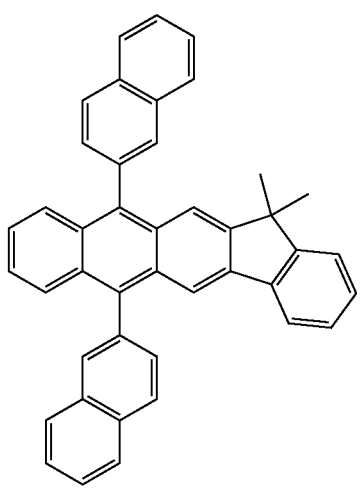
H28
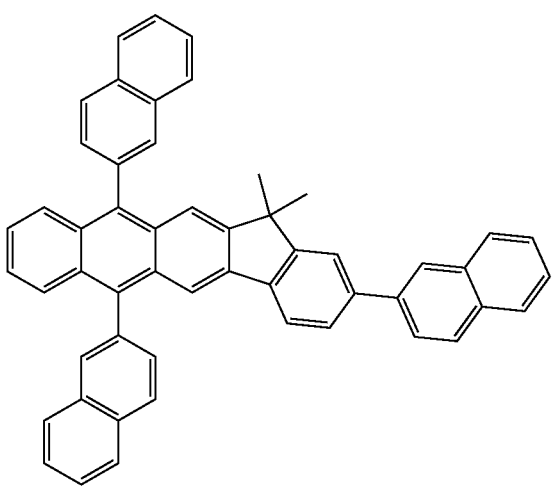

H29
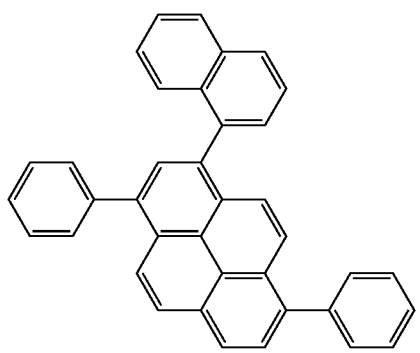
H34
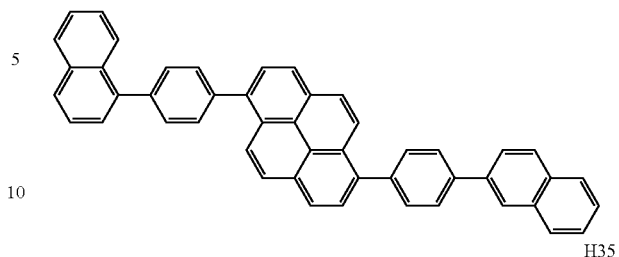
H35
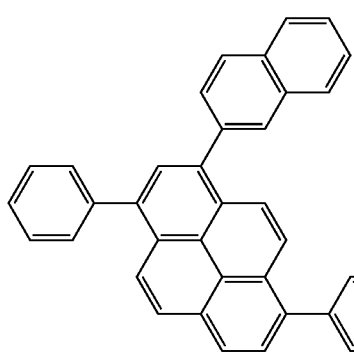
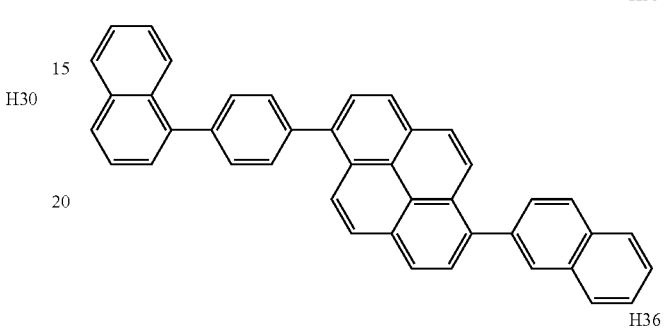
H36
H30
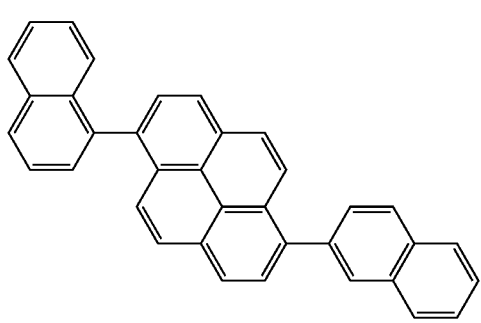
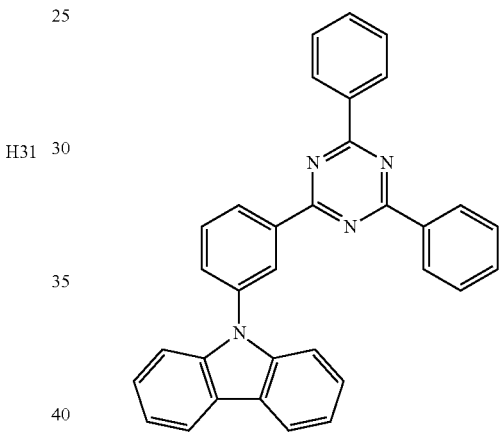
H31
H32
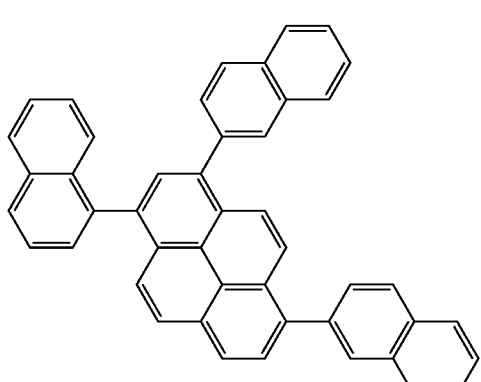
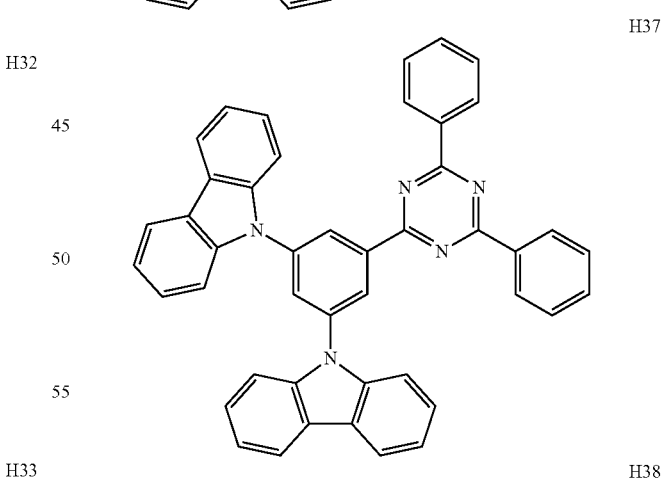
H37
H33
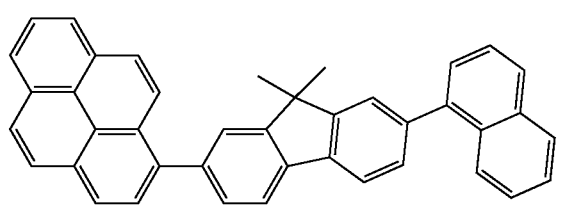
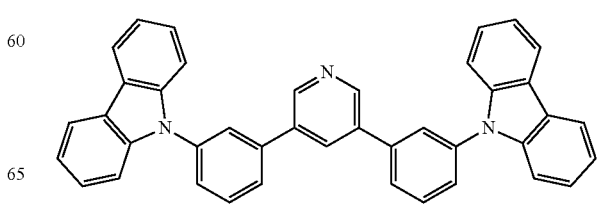
H38

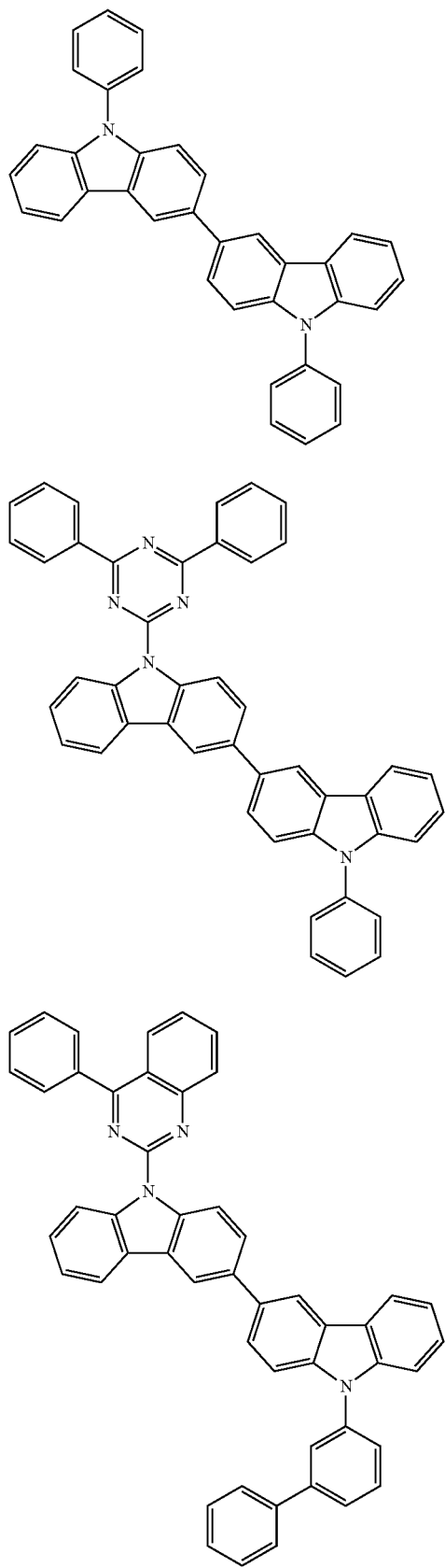
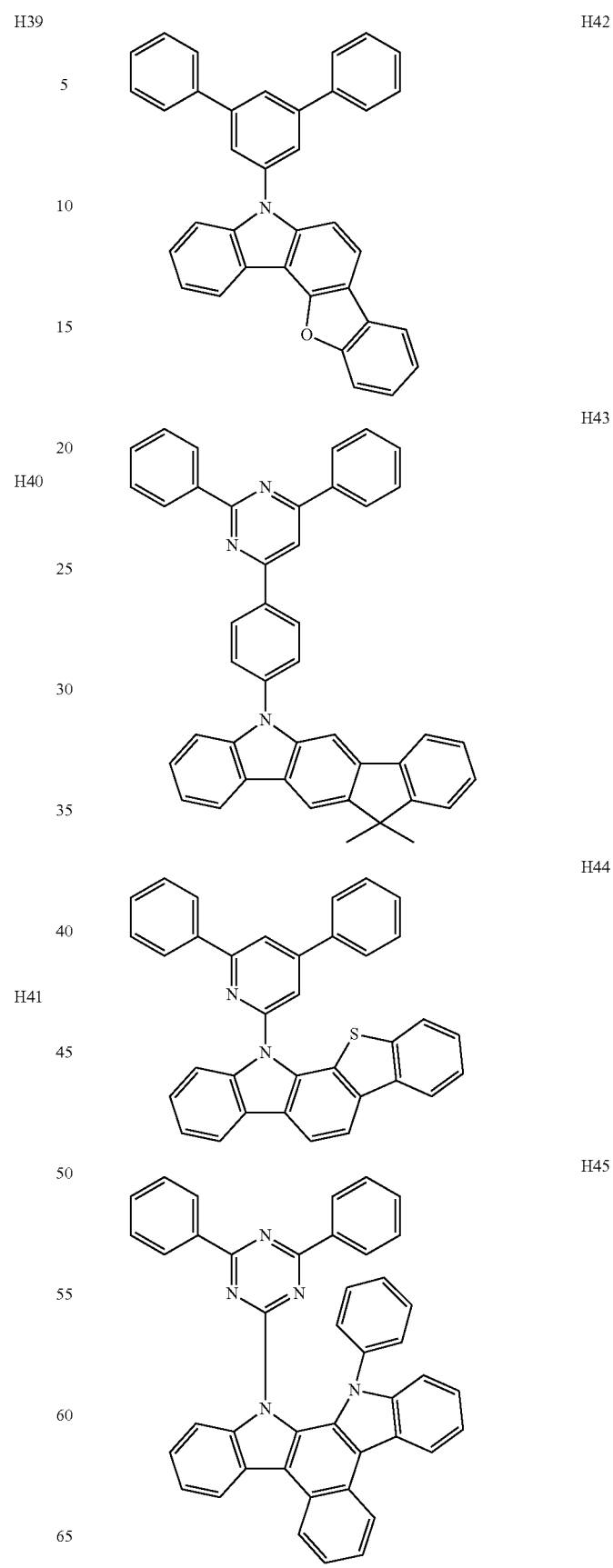

H46
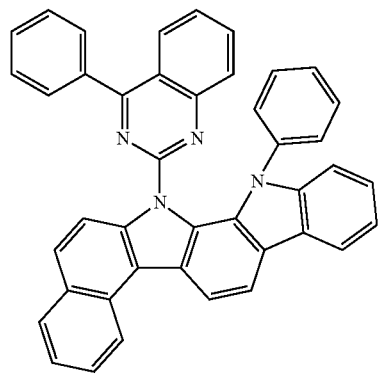
H47
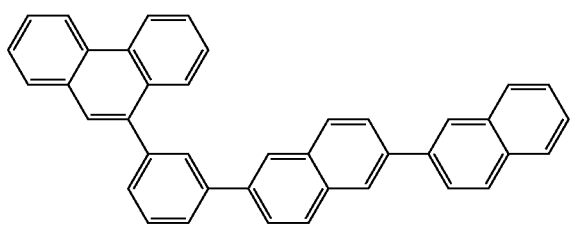
H48
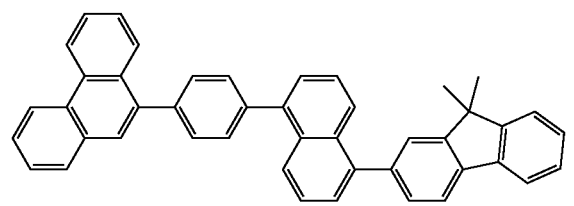
H49
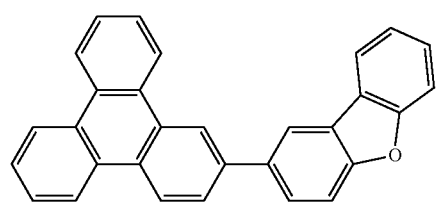
H50
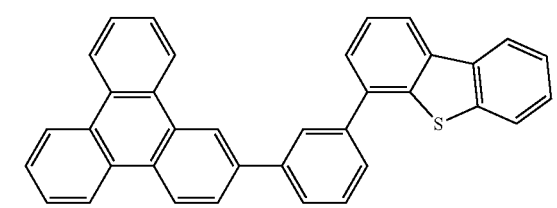
H51
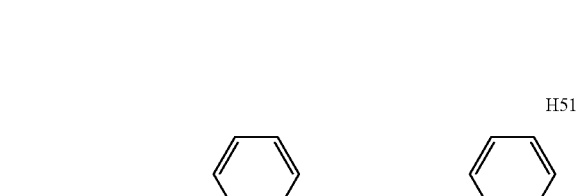
H52
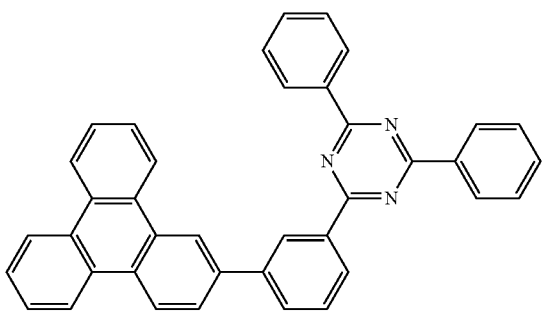
H53
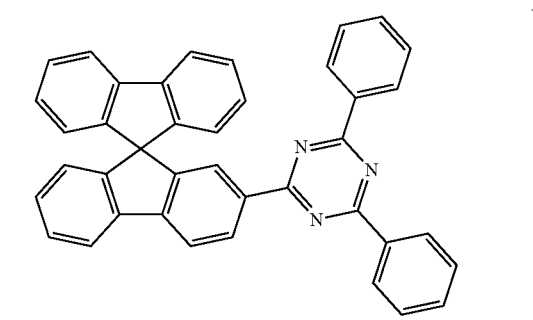
H54
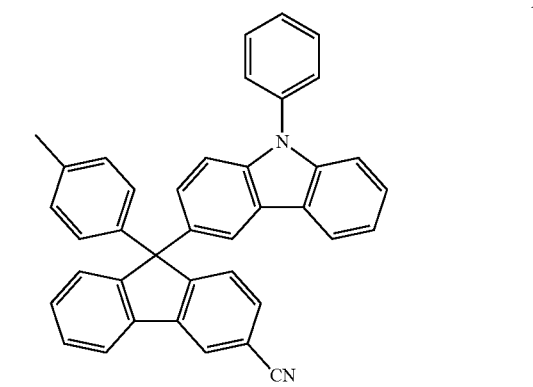
H55
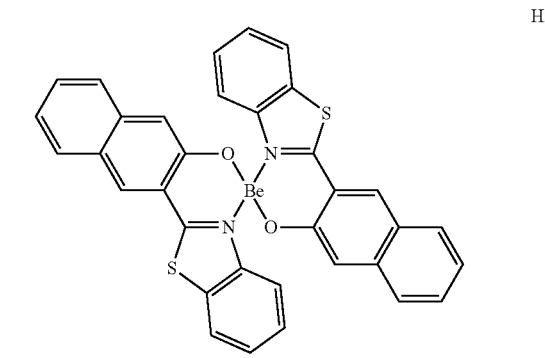
[Phosphorescent Dopant Included in Emission Layer in Organic Layer 150]
The phosphorescent dopant may include the organometallic compound represented by Formula 1.

The phosphorescent dopant may further include an organometallic complex represented by Formula 401 below:

$$M(L_{401})_{xc1}(L_{402})_{xc2}$$ <Formula 401>

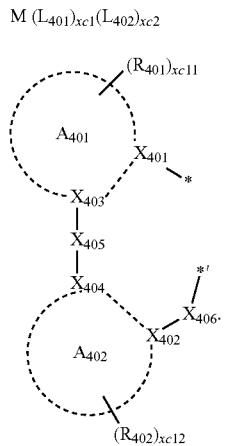

<Formula 402>

In Formulae 401 and 402,

M may be selected from iridium (Ir), platinum (Pt), palladium (Pd), osmium (Os), titanium (Ti), zirconium (Zr), hafnium (Hf), europium (Eu), terbium (Tb), rhodium (Rh), and thulium (Tm), $L_{401}$ may be selected from ligands represented by Formula 402, and xc1 may be 1, 2, or 3, wherein, when xc1 is 2 or more, two or more $L_{401}(s)$ may be identical to or different from each other, $L_{402}$ may be an organic ligand, and xc2 may be an integer from 0 to 4, wherein, when xc2 is 2 or more, two or more $L_{402}(s)$ may be identical to or different from each other, $X_{401}$ to $X_{404}$ may each independently be nitrogen or carbon, $X_{401}$ and $X_{403}$ may be linked to each other via a single bond or a double bond, and $X_{402}$ and $X_{404}$ may be linked to each other via a single bond or a double bond, $A_{401}$ and $A_{402}$ may each independently be selected from a $C_5$-$C_{60}$ carbocyclic group or a $C_1$-$C_{60}$ heterocyclic group, $X_{405}$ may be a single bond, *—O—*', *—S—*', *—C(=O)—*', *—N($Q_{411}$)—*', *—C($Q_{411}$)($Q_{412}$)—*', *—C($Q_{411}$)=C($Q_{412}$)*', *—C($Q_{411}$)=*', or *=C=*', wherein $Q_{411}$ and $Q_{412}$ may each independently be hydrogen, deuterium, a $C_1$-$C_{20}$ alkyl group, a $C_1$-$C_{20}$ alkoxy group, a phenyl group, a biphenyl group, a terphenyl group, or a naphthyl group, $X_{406}$ may be a single bond, O, or S, $R_{401}$ and $R_{402}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), and —P(=O)($Q_{401}$)($Q_{402}$), and $Q_{401}$ to $Q_{403}$ may each independently be selected from a $C_1$-$C_{10}$ alkyl group, a $C_1$-$C_{10}$ alkoxy group, a $C_6$-$C_{20}$ aryl group, and a $C_1$-$C_{20}$ heteroaryl group, xc11 and xc12 may each independently be an integer from 0 to 10, and

* and *' in Formula 402 each indicate a binding site to M in Formula 401.

In one embodiment, $A_{401}$ and $A_{402}$ in Formula 402 may each independently be selected from a benzene group, a naphthalene group, a fluorene group, a spiro-bifluorene group, an indene group, a pyrrole group, a thiophene group, a furan group, an imidazole group, a pyrazole group, a thiazole group, an isothiazole group, an oxazole group, an isoxazole group, a pyridine group, a pyrazine group, a pyrimidine group, a pyridazine group, a quinoline group, an isoquinoline group, a benzoquinoline group, a quinoxaline group, a quinazoline group, a carbazole group, a benzimidazole group, a benzofuran group, a benzothiophene group, an isobenzothiophene group, a benzoxazole group, an isobenzoxazole group, a triazole group, a tetrazole group, an oxadiazole group, a triazine group, a dibenzofuran group, and a dibenzothiophene group.

In embodiments, in Formula 402, i) $X_{401}$ may be nitrogen, and $X_{402}$ may be carbon, or ii) each of $X_{401}$ and $X_{402}$ may be nitrogen.

In embodiments, $R_{401}$ and $R_{402}$ in Formula 402 may each independently be selected from:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amidino group, a hydrazino group, a hydrazono group, a phenyl group, a naphthyl group, a cyclopentyl group, a cyclohexyl group, an adamantanyl group, a norbornanyl group, and a norbornenyl group;

a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group;

a cyclopentyl group, a cyclohexyl group, an adamantanyl group, a norbornanyl group, a norbornenyl group a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group; and —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), and —P(=O)($Q_{401}$)($Q_{402}$), wherein $Q_{401}$ to $Q_{403}$ may each independently be selected from a $C_1$-$C_{10}$ alkyl group, a $C_1$-$C_{10}$ alkoxy group, a phenyl group, a biphenyl group, and a naphthyl group, but embodiments are not limited thereto.

In embodiments, when xc1 in Formula 401 is 2 or more, two $A_{401}$(s) in two or more $L_{401}$(s) may optionally be linked to each other via $X_{407}$, which is a linking group, or two $A_{402}$(s) in two or more $L_{401}$(s) may optionally be linked to each other via $X_{408}$, which is a linking group (see Compounds PD1 to PD4 and PD7). $X_{407}$ and $X_{408}$ may each independently be a single bond, *—O—*', *—S—*', *—C(=O)—*', *—N($Q_{413}$)—*', *—C($Q_{413}$)($Q_{414}$)—*', or *—C($Q_{413}$)=C($Q_{414}$)—*' (wherein $Q_{413}$ and $Q_{414}$ may each independently be hydrogen, deuterium, a $C_1$-$C_{20}$ alkyl group, a $C_1$-$C_{20}$ alkoxy group, a phenyl group, a biphenyl group, a terphenyl group, or a naphthyl group), but embodiments are not limited thereto.

$L_{402}$ in Formula 401 may be a monovalent, divalent, or trivalent organic ligand. For example, $L_{402}$ may be selected from halogen, diketone (for example, acetylacetonate), carboxylic acid (for example, picolinate), —C(=O), isonitrile, —CN, and phosphorus (for example, phosphine, or phosphite), but embodiments are not limited thereto.

In embodiments, the phosphorescent dopant may be selected from, for example, Compounds PD1 to PD25, but embodiments are not limited thereto:

PD1

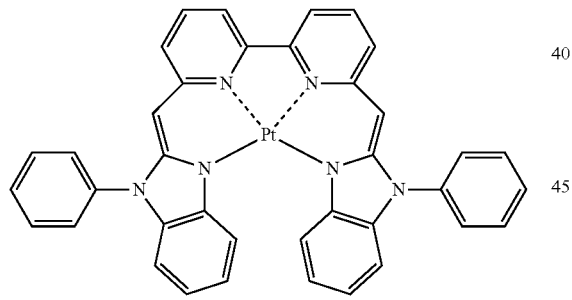

PD2

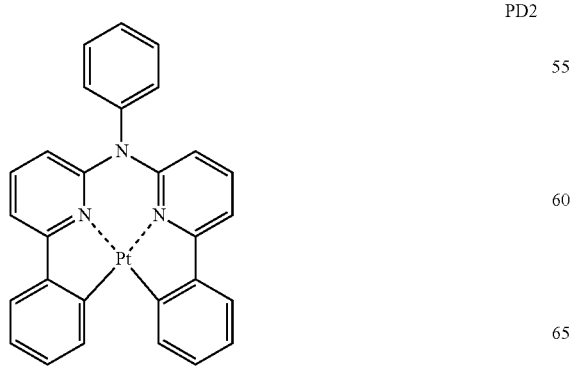

PD3

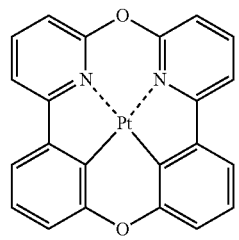

PD4

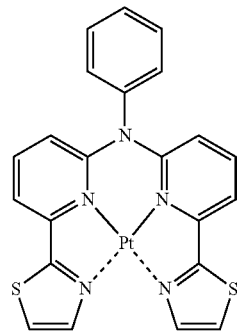

PD5

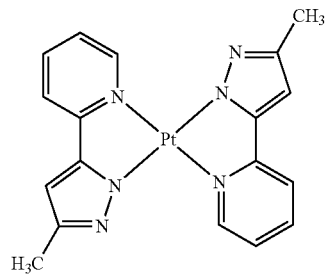

PD6

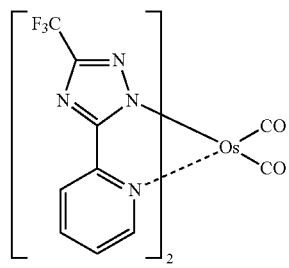

PD7

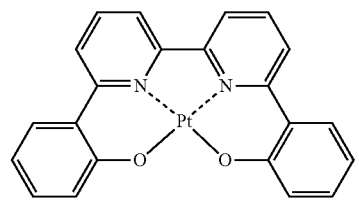

PD8

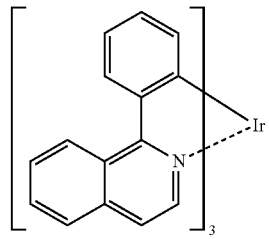

PD9 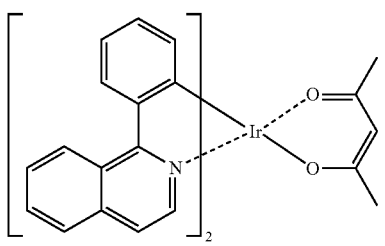
PD10 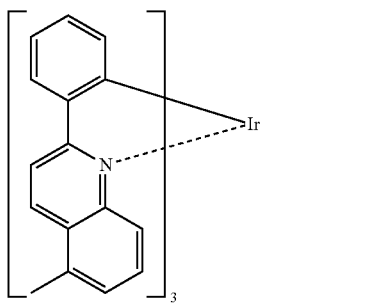
PD11 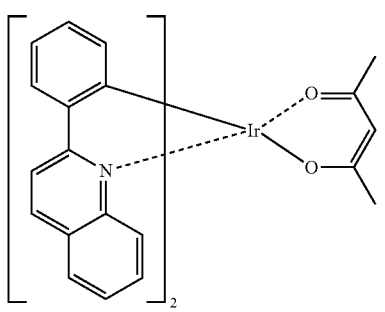
PD12 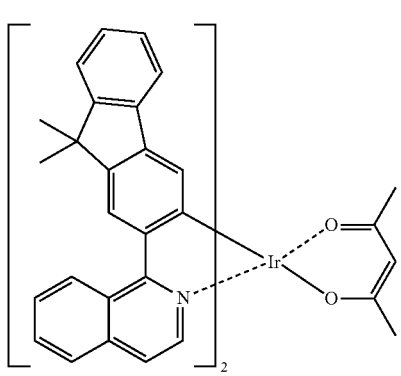
PD13 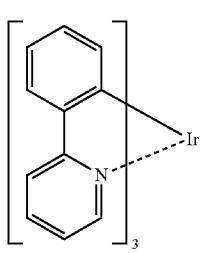
PD14 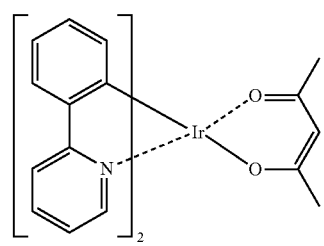
PD15 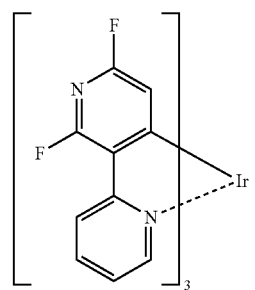
PD16 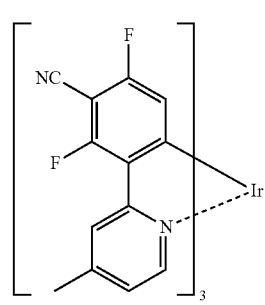
PD17 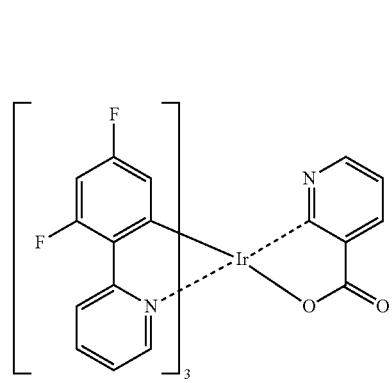
PD18 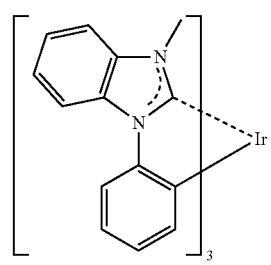

PD19 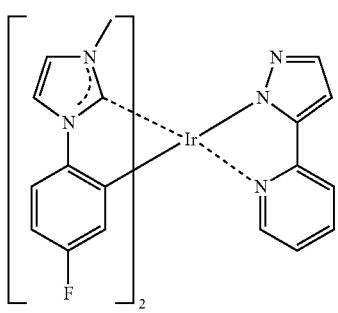

PD20 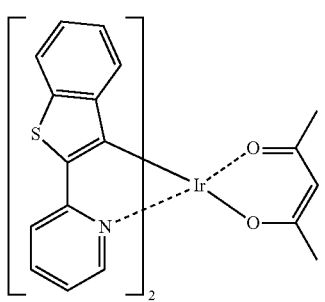

PD21 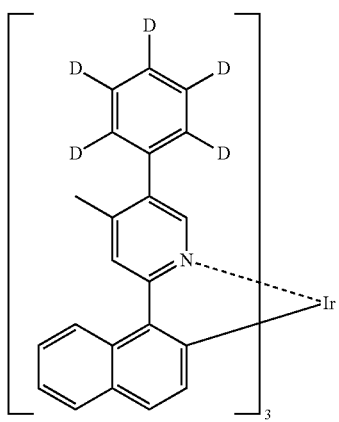

PD22 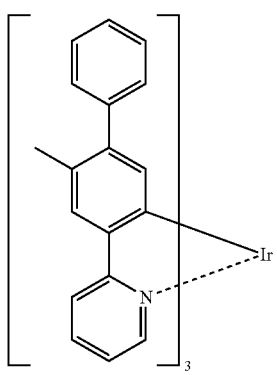

PD23 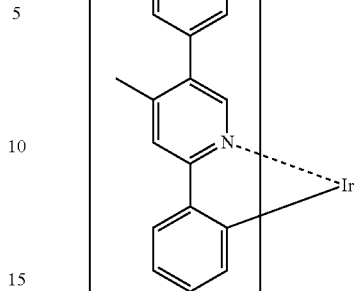

PD24 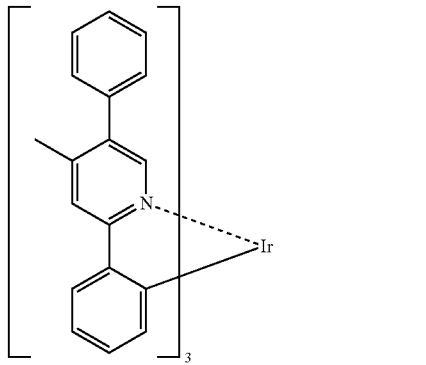

PD25 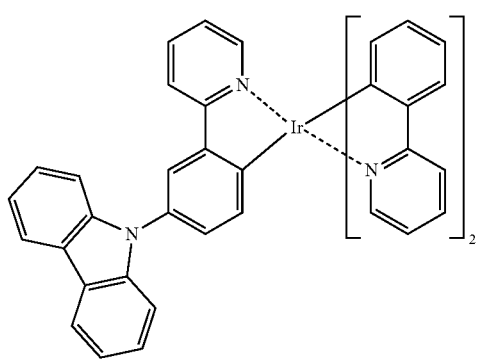

[Fluorescent Dopant in Emission Layer]

The fluorescent dopant may include an arylamine compound or a styrylamine compound.

The fluorescent dopant may include a compound represented by Formula 501 below:

<Formula 501>

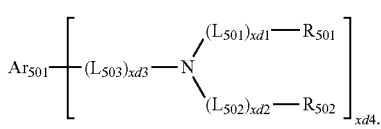

In Formula 501, $Ar_{501}$ may be a substituted or unsubstituted $C_5$-$C_{60}$ carbocyclic group or a substituted or unsubstituted $C_1$-$C_{60}$ heterocyclic group, $L_{501}$ to $L_{503}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xd1 to xd3 may each independently be an integer from 0 to 3, $R_{501}$ and $R_{502}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and xd4 may be an integer from 1 to 6.

In one embodiment, $Ar_{501}$ in Formula 501 may be selected from:

a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group; and a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In embodiments, $L_{501}$ to $L_{503}$ in Formula 501 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

In embodiments, $R_{501}$ and $R_{502}$ in Formula 501 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, and —Si($Q_{31}$)($Q_{32}$)($Q_{33}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In embodiments, xd4 in Formula 501 may be 2, but embodiments are not limited thereto.
For example, the fluorescent dopant may be selected from Compounds FD1 to FD22:
FD1
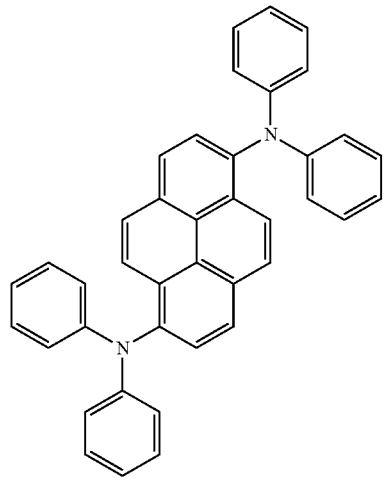
FD2
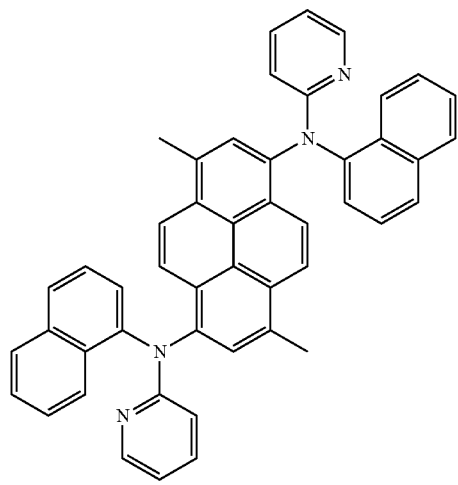
FD3
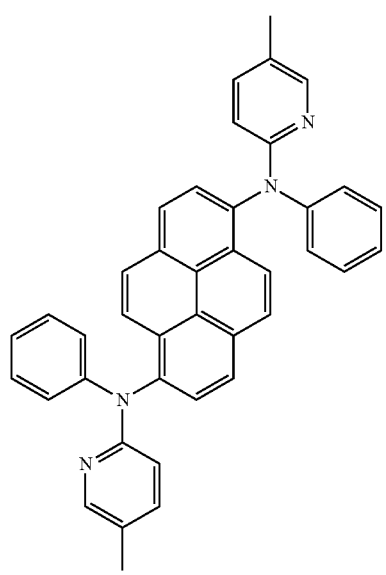
-continued
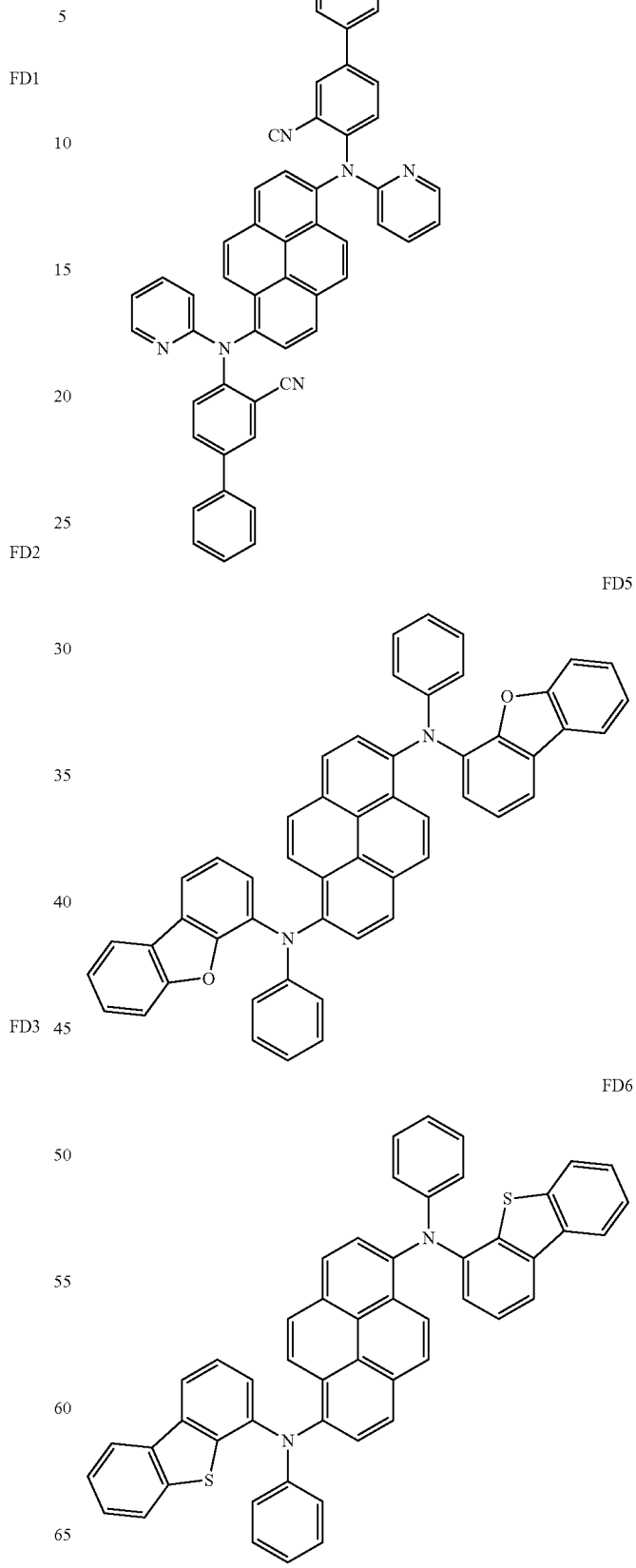

FD7
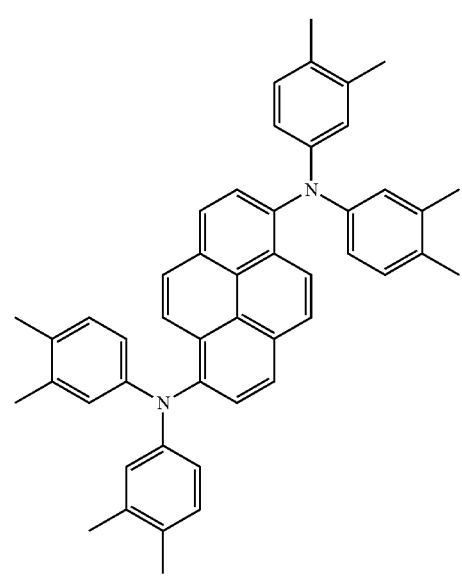
FD8
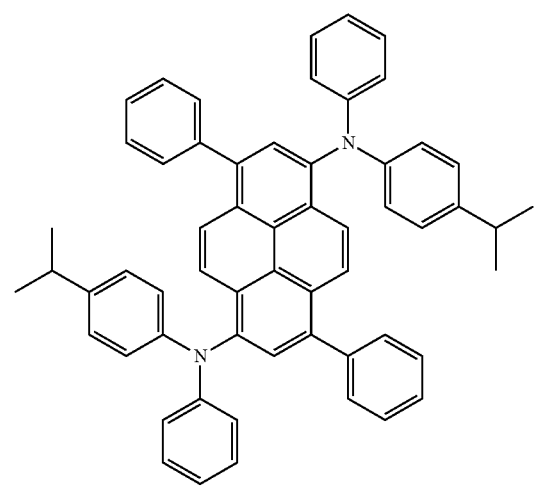
FD9
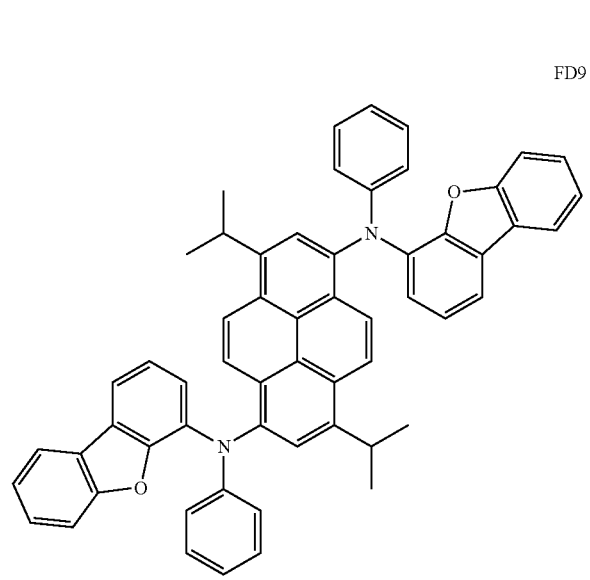
FD10
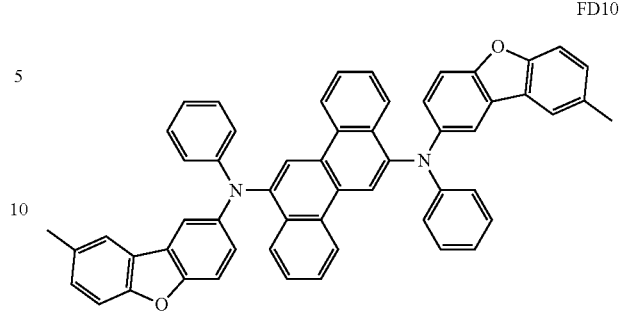
FD11
FD12
FD13
FD14
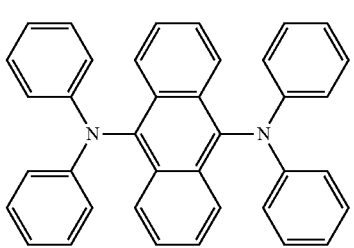

FD15
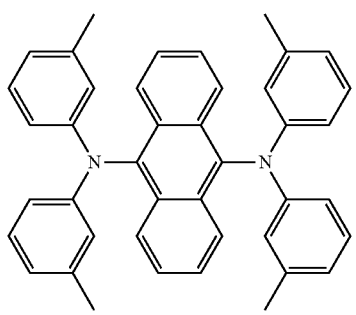
FD16
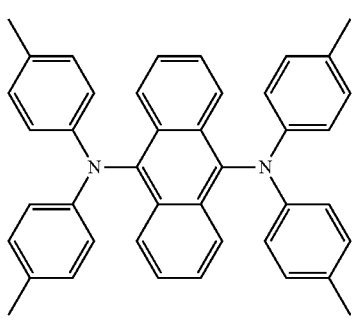
FD17
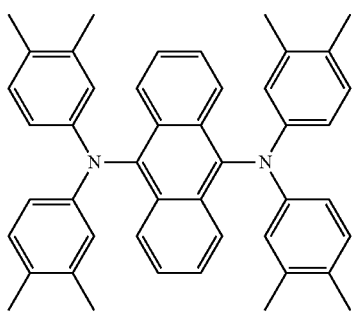
FD18
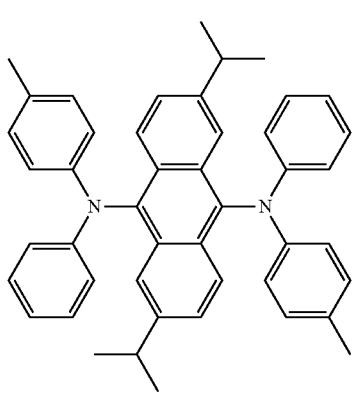
FD19
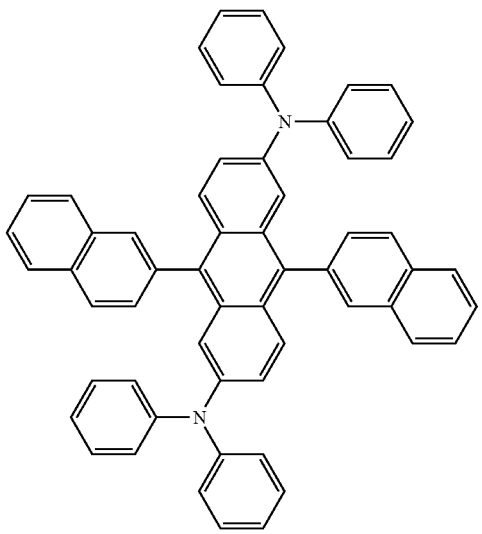
FD20
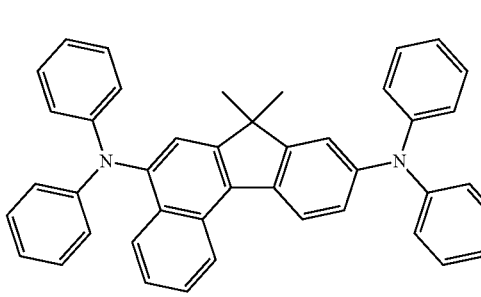
FD21
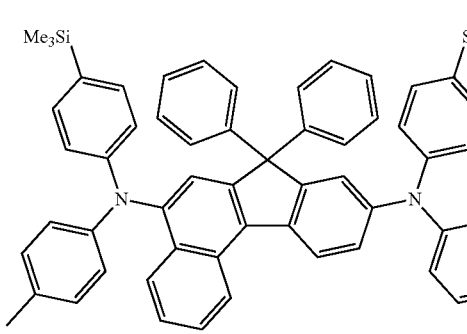
FD22
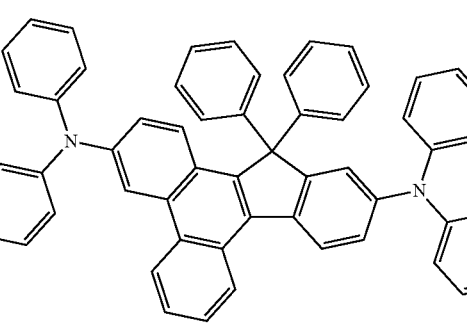

In embodiments, the fluorescent dopant may be selected from the following compounds, but embodiments are not limited thereto:

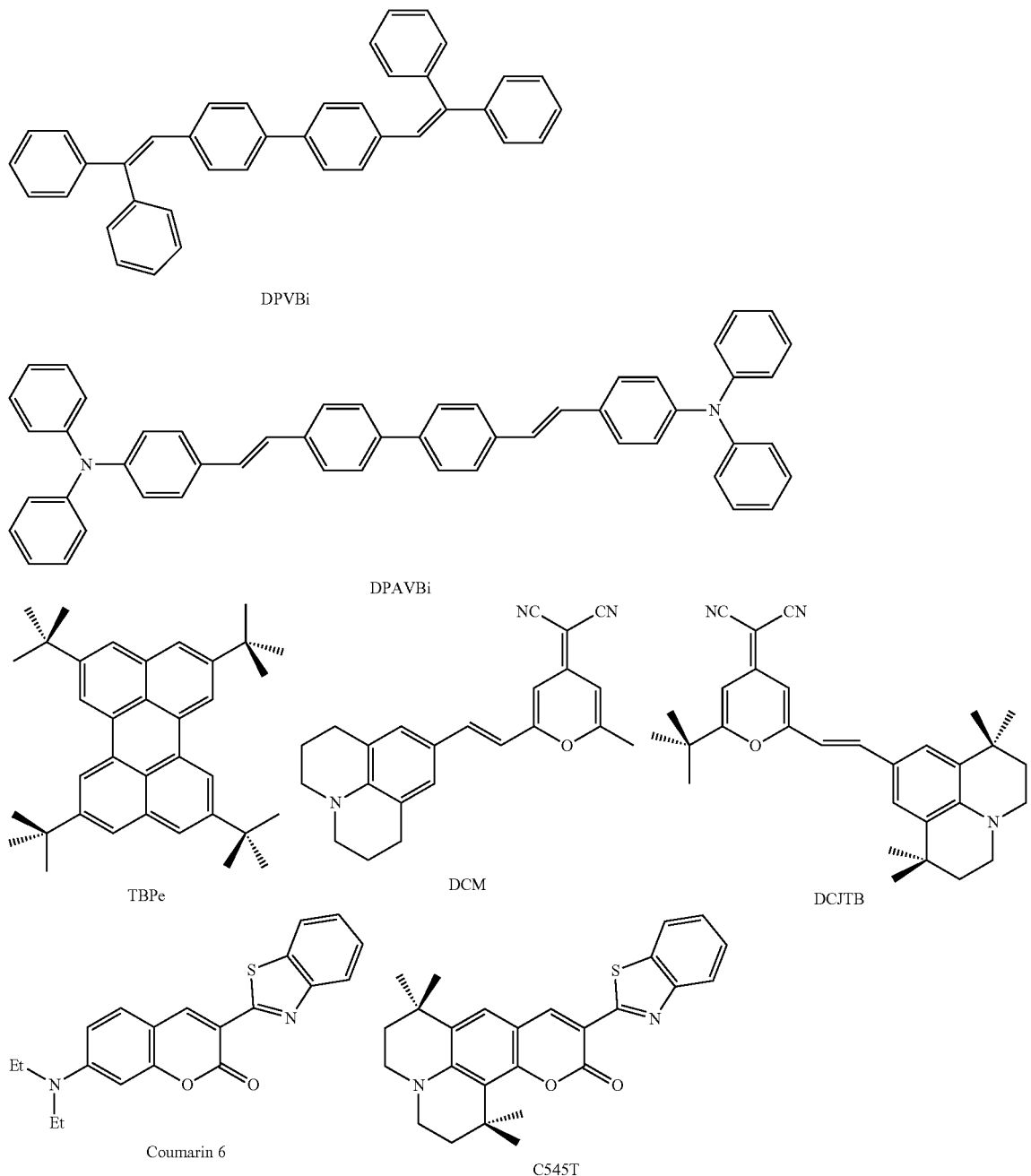

[Electron Transport Region in Organic Layer 150]

The electron transport region may have i) a single-layered structure including a single layer including a single material, ii) a single-layered structure including a single layer including different materials, or iii) a multi-layered structure having multiple layers including different materials.

The electron transport region may include a buffer layer, a hole blocking layer, an electron control layer, an electron transport layer, an electron injection layer, or any combination thereof, but embodiments are not limited thereto.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein for each structure, constituting layers may be sequentially stacked (or disposed) from an emission layer. However, embodiments of the structure of the electron transport region are not limited thereto.

The electron transport region (for example, a buffer layer, a hole blocking layer, an electron control layer, or an electron transport layer in the electron transport region) may include a metal-free compound containing at least one π electron-deficient nitrogen-containing ring.

The "π electron-deficient nitrogen-containing ring" indicates a $C_1$-$C_{60}$ heterocyclic group having at least one *—N=*' moiety as a ring-forming moiety.

For example, the "π electron-deficient nitrogen-containing ring" may be i) a 5-membered to 7-membered heteromonocyclic group having at least one *—N=*' moiety, ii) a heteropolycyclic group in which two or more 5-membered to 7-membered heteromonocyclic groups each having at least one *—N=*' moiety are condensed with each other, or iii) a heteropolycyclic group in which at least one of 5-membered to 7-membered heteromonocyclic groups, each having at least one *—N=*' moiety, is condensed with at least one $C_5$-$C_{60}$ carbocyclic group.

Examples of the π electron-deficient nitrogen-containing ring include an imidazole ring, a pyrazole ring, a thiazole ring, an isothiazole ring, an oxazole ring, an isoxazole ring, a pyridine ring, a pyrazine ring, a pyrimidine ring, a pyridazine ring, an indazole ring, a purine ring, a quinoline ring, an isoquinoline ring, a benzoquinoline ring, a phthalazine ring, a naphthyridine ring, a quinoxaline ring, a quinazoline ring, a cinnoline ring, a phenanthridine ring, an acridine ring, a phenanthroline ring, a phenazine ring, a benzimidazole ring, an isobenzothiazole ring, a benzoxazole ring, an isobenzoxazole ring, a triazole ring, a tetrazole ring, an oxadiazole ring, a triazine ring, a thiadiazole ring, an imidazopyridine ring, an imidazopyrimidine ring, and an azacarbazole ring, but are not limited thereto.

For example, the electron transport region may include a compound represented by Formula 601 below:

<Formula 601>

In Formula 601, $Ar_{601}$ may be a substituted or unsubstituted $C_5$-$C_{60}$ carbocyclic group or a substituted or unsubstituted $C_1$-$C_{60}$ heterocyclic group, xe11 may be 1, 2, or 3, $L_{601}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xe1 may be an integer from 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{601}$)($Q_{602}$)($Q_{603}$), —C(=O)($Q_{601}$), —S(=O)$_2$($Q_{601}$), and —P(=O)($Q_{601}$)($Q_{602}$), $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer from 1 to 5.

In one embodiment, at least one of $Ar_{601}$(s) in the number of xe11 and $R_{601}$(s) in the number of xe21 may include the π electron-deficient nitrogen-containing ring.

In one embodiment, $Ar_{601}$ in Formula 601 may be selected from a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —S(=O)$_2$($Q_{31}$), and —P(=O)($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is 2 or more, two or more $Ar_{601}$(s) may be linked to each other via a single bond.

In embodiments, $Ar_{601}$ in Formula 601 may be an anthracene group.

In embodiments, a compound represented by Formula 601 may be represented by Formula 601-1 below:

<Formula 601-1>

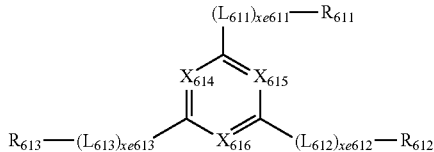

In Formula 601-1, $X_{614}$ may be N or $C(R_{614})$, $X_{615}$ may be N or $C(R_{615})$, $X_{616}$ may be N or $C(R_{616})$, and at least one selected from $X_{614}$ to $X_{616}$ may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one embodiment, $L_{601}$ and $L_{611}$ to $L_{613}$ in Formulae 601 and 601-1 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, but embodiments are not limited thereto.

In embodiments, xe1 and xe611 to xe613 in Formulae 601 and 601-1 may each independently be 0, 1, or 2.

In embodiments, $R_{601}$ and $R_{611}$ to $R_{613}$ in Formulae 601 and 601-1 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and —S($=$O)$_2$(Q$_{601}$) and —P($=$O)(Q$_{601}$)(Q$_{602}$), wherein Q$_{601}$ and Q$_{602}$ are the same as described above.

The electron transport region may include at least one compound selected from Compounds ET1 to ET36, but embodiments are not limited thereto:

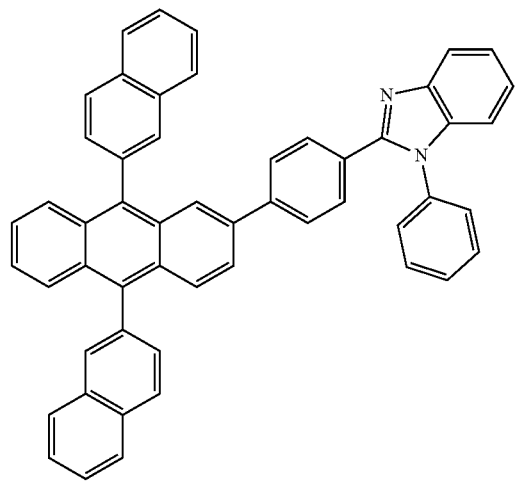

ET1

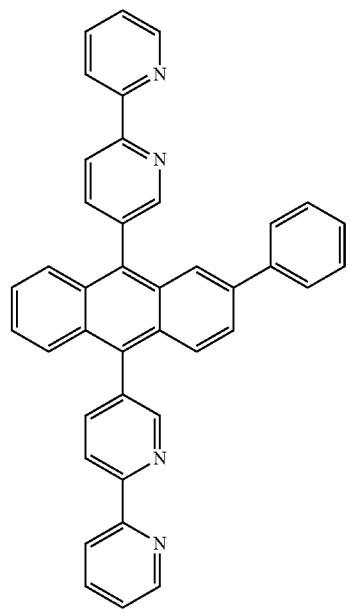

ET2

127
-continued
ET3
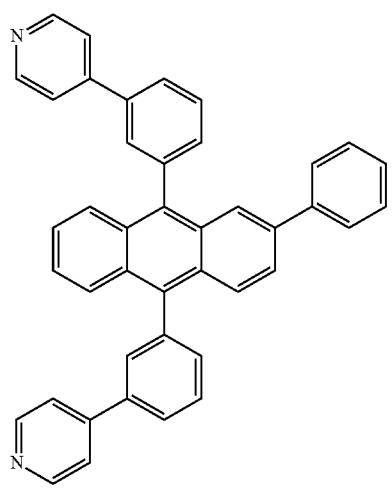
ET4
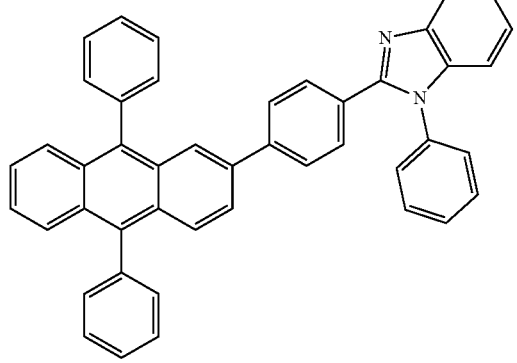
ET5
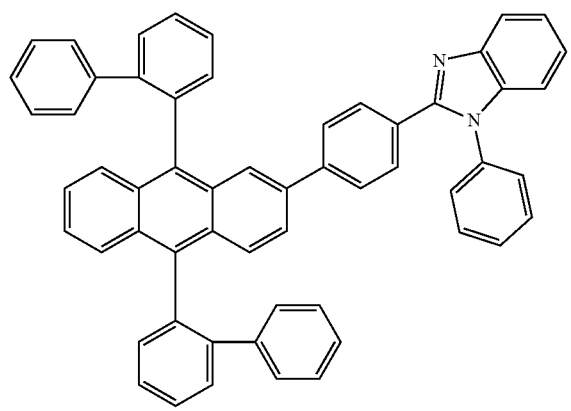
128
-continued
ET6
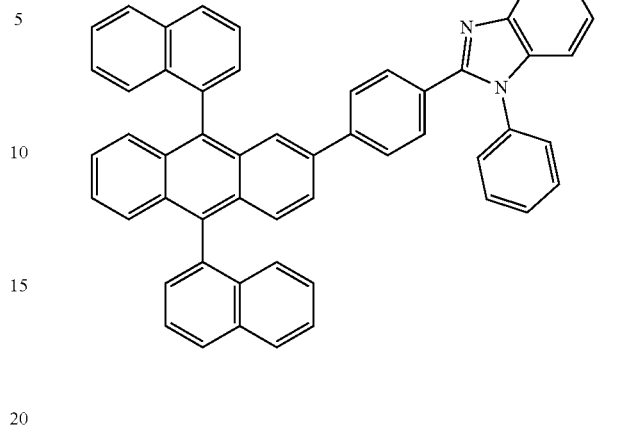
ET7
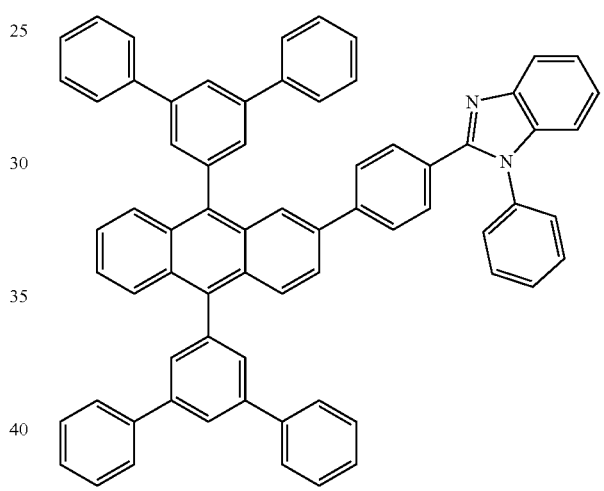
ET8
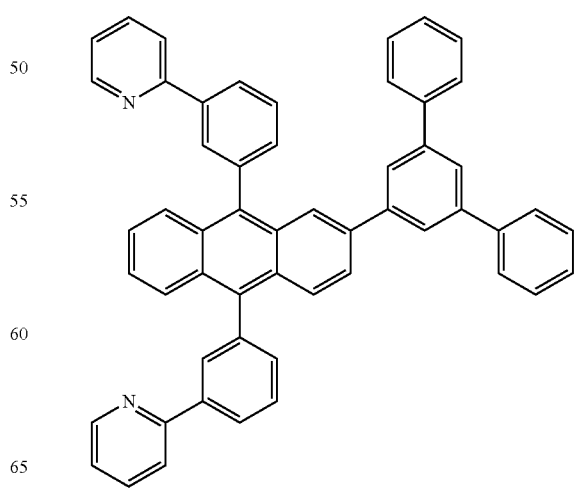

ET9 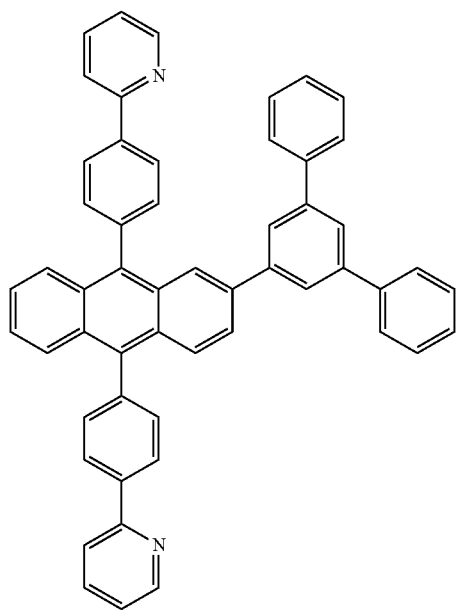
ET10 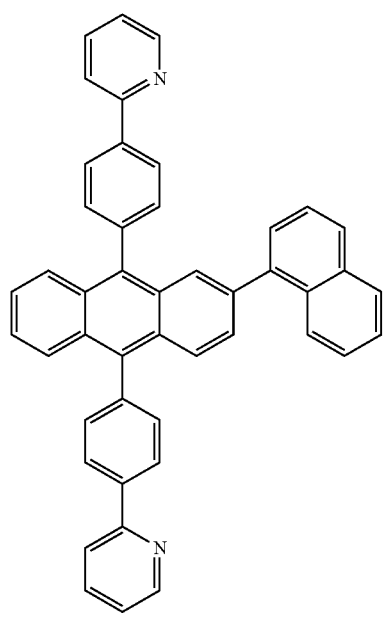
ET11 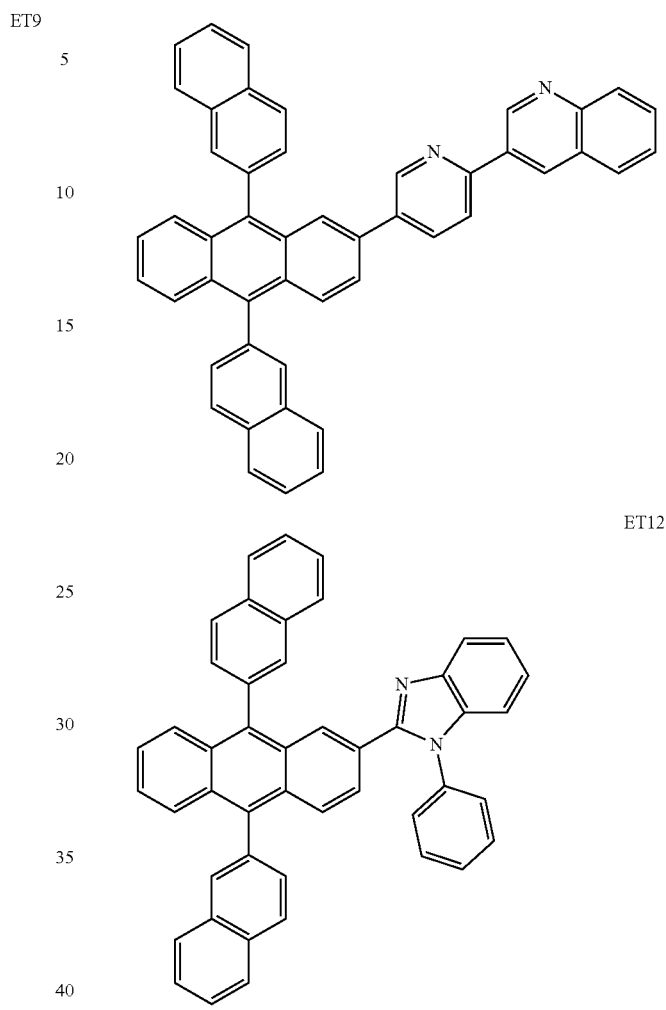
ET12
ET13 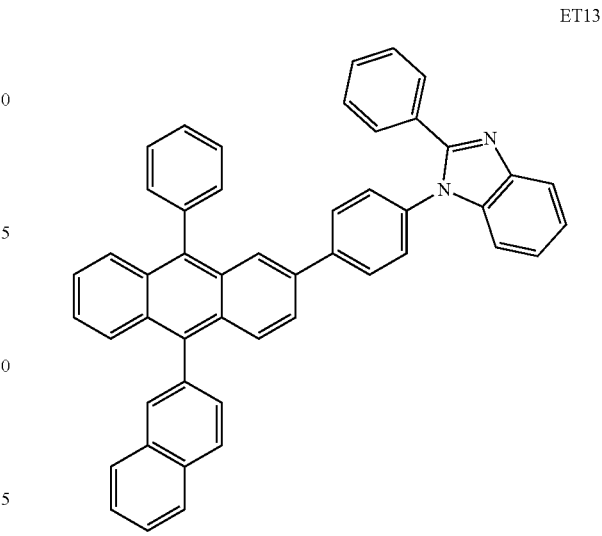

ET14
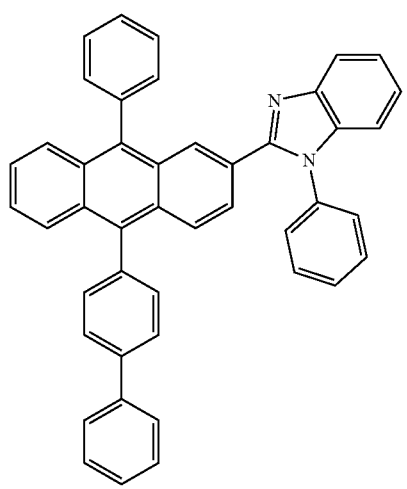
ET15
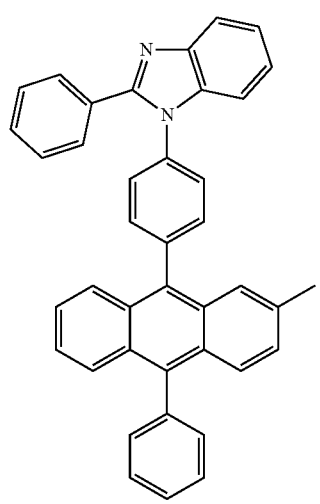
ET16
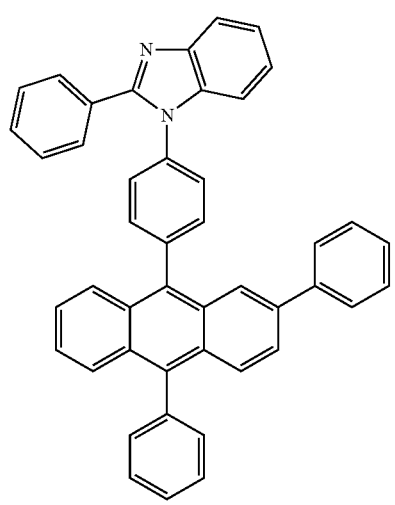
ET17
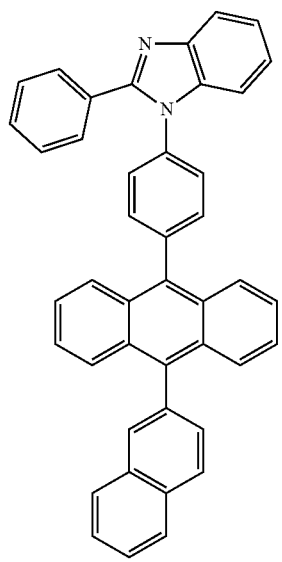
ET18
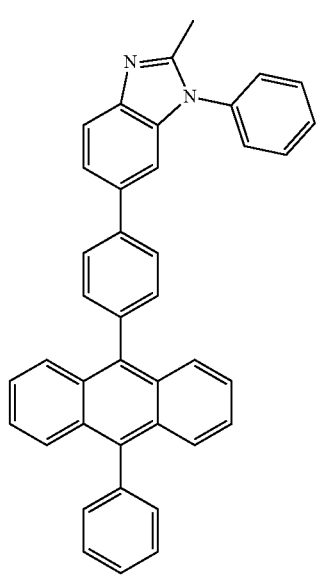
ET19
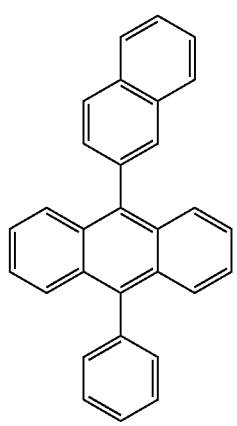

ET20
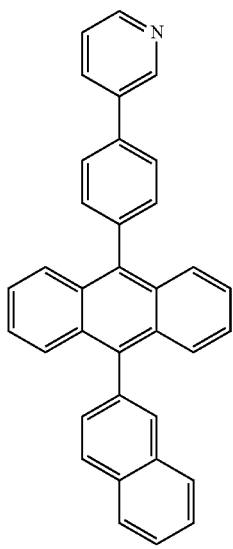
ET21
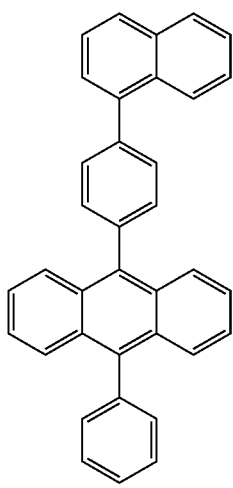
ET22
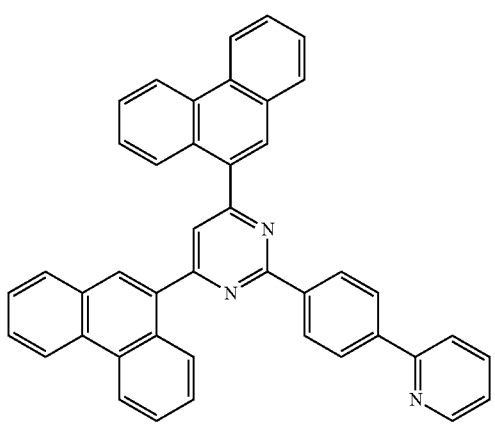
ET23
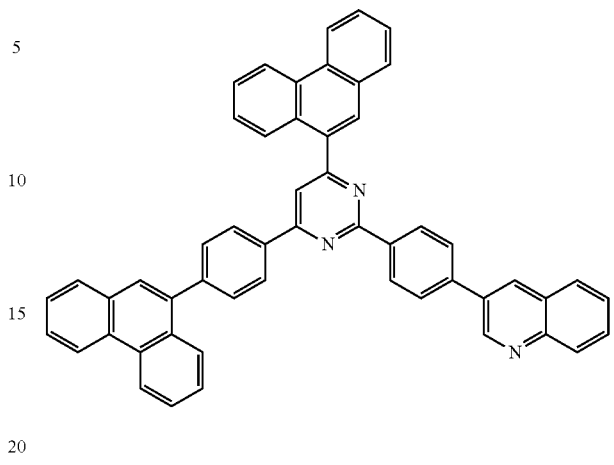
ET24
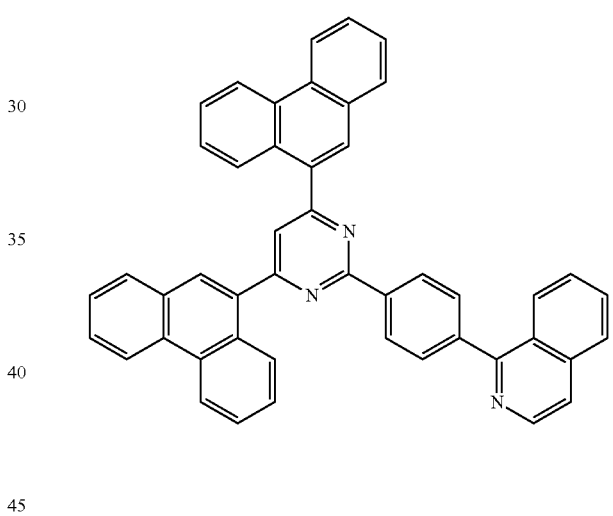
ET25
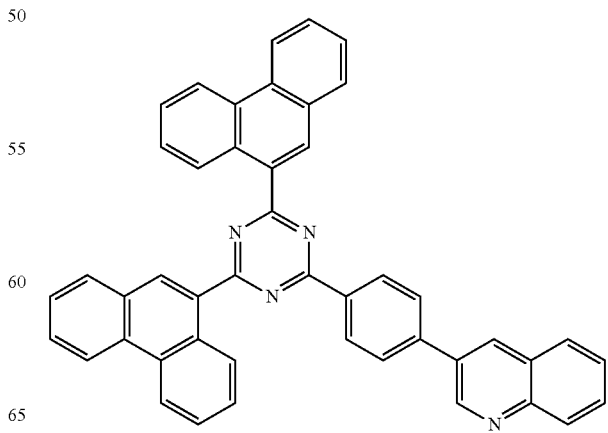

ET26
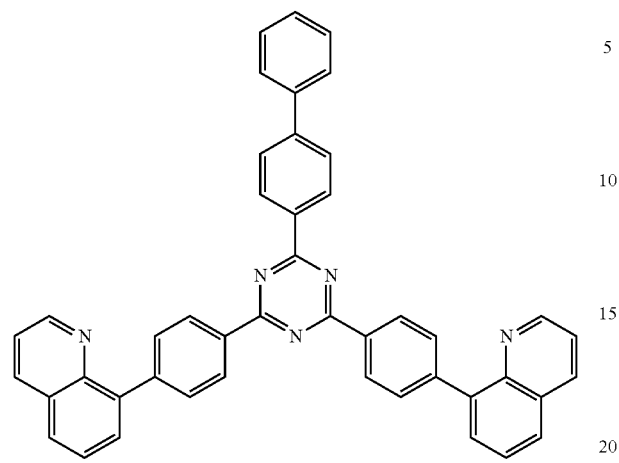
ET29
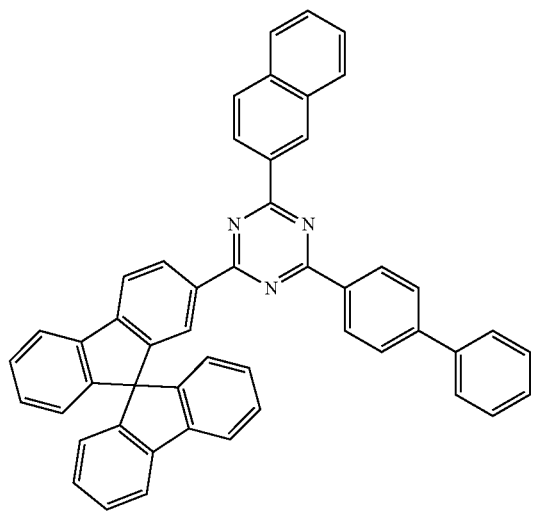
ET27
ET30
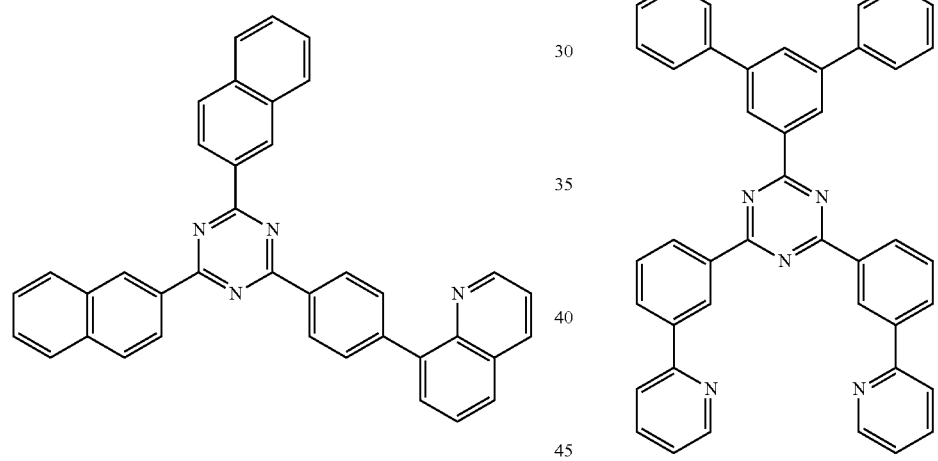
ET28
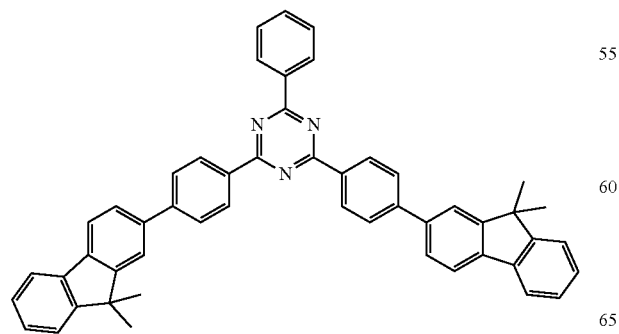
ET31
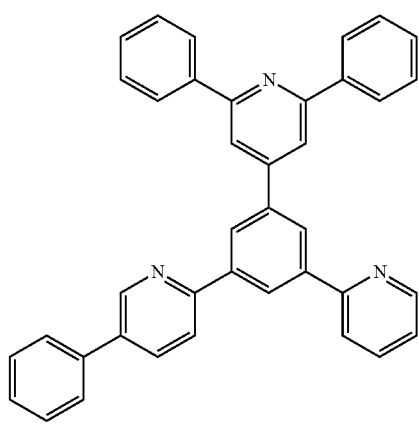

ET32
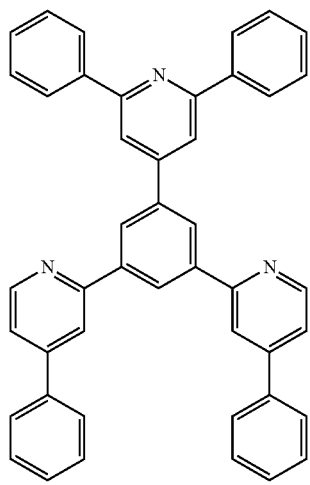
ET35
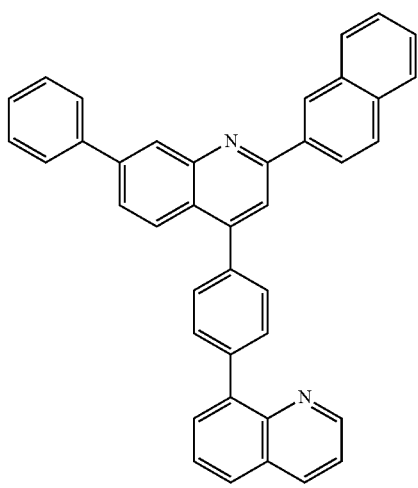
ET33
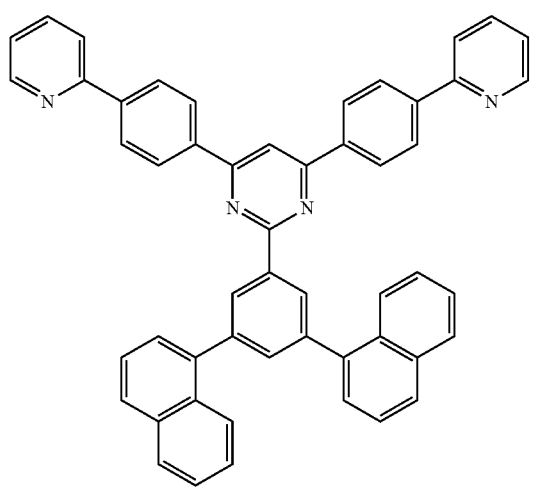
ET36
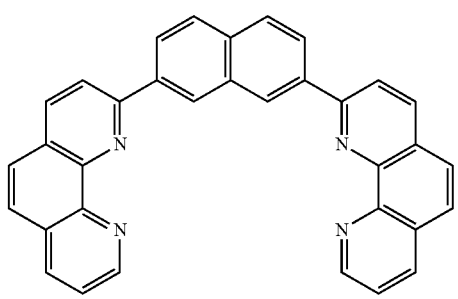
In embodiments, the electron transport region may include at least one compound selected from 2,9-dimethyl-4,7-diphenyl-1,10-phenanthroline (BCP), 4,7-diphenyl-1,10-phenanthroline (Bphen), Alq$_3$, BAlq, 3-(biphenyl-4-yl)-5-(4-tert-butylphenyl)-4-phenyl-4H-1,2,4-triazole (TAZ), and NTAZ.
ET34
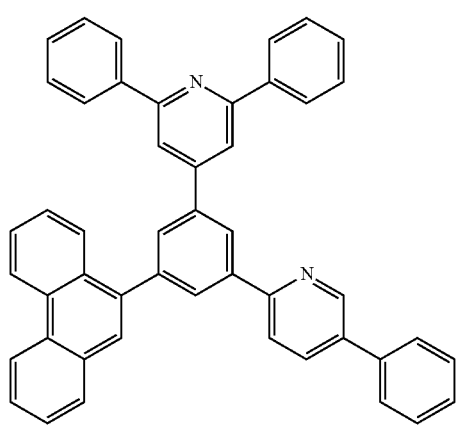
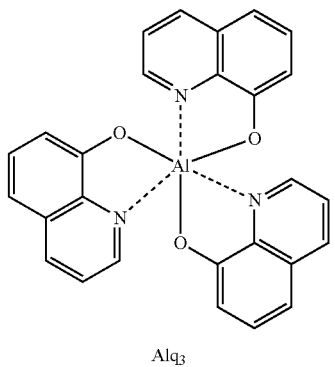
Alq$_3$

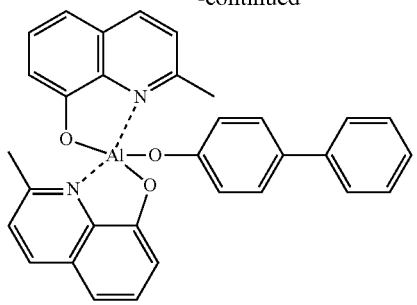

BAlq

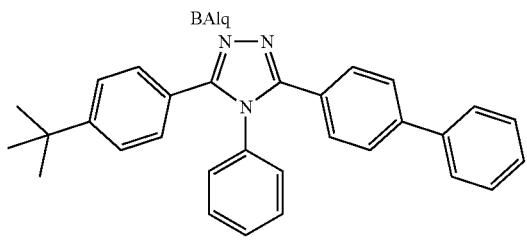

TAZ

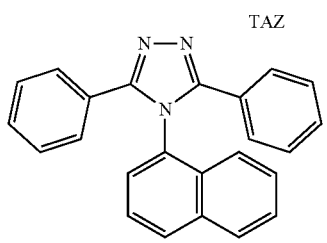

NTAZ

Thicknesses of the buffer layer, the hole blocking layer, and the electron control layer may each independently be in a range of about 20 Å to about 1,000 Å. In an embodiment, the thickness of the buffer layer may be in a range of about 30 Å to about 300 Å. In an embodiment, the thickness of the hole blocking layer may be in a range of about 30 Å to about 300 Å. In an embodiment, the thickness of the electron control layer may be in a range of about 30 Å to about 300 Å. When the thicknesses of the buffer layer, the hole blocking layer, and the electron control layer are within these ranges, excellent hole blocking characteristics or excellent electron control characteristics may be obtained without a substantial increase in driving voltage.

A thickness of the electron transport layer may be in a range of about 100 Å to about 1,000 Å. In an embodiment, the thickness of the electron transport layer may be in a range of about 150 Å to about 500 Å. When the thickness of the electron transport layer is within the range described above, the electron transport layer may have satisfactory electron transport characteristics without a substantial increase in driving voltage.

The electron transport region (for example, the electron transport layer in the electron transport region) may further include a metal-containing material.

The metal-containing material may include at least one selected from alkali metal complex and alkaline earth-metal complex. The alkali metal complex may include a metal ion selected from a Li ion, a Na ion, a K ion, a Rb ion, and a Cs ion, and the alkaline earth-metal complex may include a metal ion selected from a Be ion, a Mg ion, a Ca ion, a Sr ion, and a Ba ion. A ligand coordinated with the metal ion of the alkali metal complex or the alkaline earth-metal complex may be selected from a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, and a cyclopentadiene, but embodiments are not limited thereto.

For example, the metal-containing material may include a Li complex. The Li complex may include, for example, Compound ET-D1 (lithium quinolate, LiQ) or ET-D2:

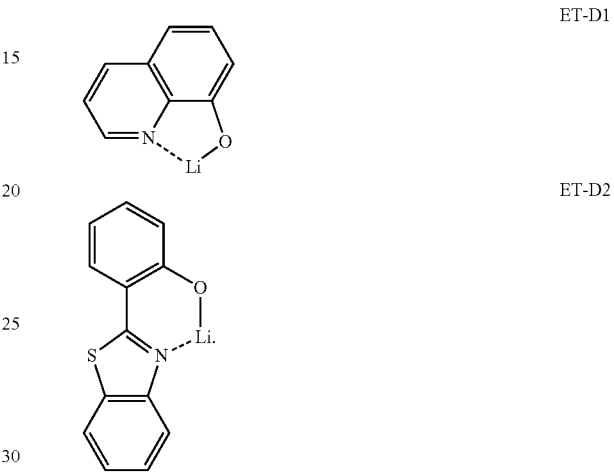

The electron transport region may include an electron injection layer that facilitates electron injection from the second electrode 190. The electron injection layer may directly contact the second electrode 190.

The electron injection layer may have i) a single-layered structure including a single layer including a single material, ii) a single-layered structure including a single layer including different materials, or iii) a multi-layered structure having multiple layers including different materials.

The electron injection layer may include an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof.

The alkali metal may be selected from Li, Na, K, Rb, and Cs. In one embodiment, the alkali metal may be Li, Na, or Cs. In embodiments, the alkali metal may be Li or Cs, but embodiments are not limited thereto.

The alkaline earth metal may be selected from Mg, Ca, Sr, and Ba.

The rare earth metal may be selected from Sc, Y, Ce, Tb, Yb, and Gd.

The alkali metal compound, the alkaline earth-metal compound, and the rare earth metal compound may be selected from oxides and halides (for example, fluorides, chlorides, bromides, or iodides) of the alkali metal, the alkaline earth-metal, and the rare earth metal.

The alkali metal compound may be selected from alkali metal oxides, such as $Li_2O$, $Cs_2O$, or $K_2O$, and alkali metal halides, such as LiF, NaF, CsF, KF, LiI, NaI, CsI, or KI. In one embodiment, the alkali metal compound may be selected from LiF, $Li_2O$, NaF, LiI, NaI, CsI, and KI, but embodiments are not limited thereto.

The alkaline earth-metal compound may be selected from alkaline earth-metal oxides, such as BaO, SrO, CaO, $Ba_xSr_{1-x}O$ (0<x<1), or $Ba_xCa_{1-x}O$ (0<x<1). In one embodiment, the alkaline earth-metal compound may be selected from BaO, SrO, and CaO, but embodiments are not limited thereto.

The rare earth metal compound may be selected from $YbF_3$, $ScF_3$, $Sc_2O_3$, $Y_2O_3$, $Ce_2O_3$, $GdF_3$ and $TbF_3$. In one embodiment, the rare earth metal compound may be selected from $YbF_3$, $ScF_3$, $TbF_3$, $YbI_3$, $ScI_3$, and $TbI_3$, but embodiments are not limited thereto.

The alkali metal complex, the alkaline earth-metal complex, and the rare earth metal complex may include an ion of alkali metal, alkaline earth-metal, and rare earth metal as described above, and a ligand coordinated with a metal ion of the alkali metal complex, the alkaline earth-metal complex, or the rare earth metal complex may be selected from hydroxy quinoline, hydroxy isoquinoline, hydroxy benzoquinoline, hydroxy acridine, hydroxy phenanthridine, hydroxy phenyloxazole, hydroxy phenylthiazole, hydroxy diphenyloxadiazole, hydroxy diphenylthiadiazole, hydroxy phenylpyridine, hydroxy phenylbenzimidazole, hydroxy phenylbenzothiazole, bipyridine, phenanthroline, and cyclopentadiene, but embodiments are not limited thereto.

The electron injection layer may consist of an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof, as described above. In embodiments, the electron injection layer may further include an organic material. When the electron injection layer further includes an organic material, then an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof may be homogeneously or non-homogeneously dispersed in a matrix including the organic material.

A thickness of the electron injection layer may be in a range of about 1 Å to about 100 Å. In an embodiment, the thickness of the electron injection layer may be in a range of about 3 Å to about 90 Å. When the thickness of the electron injection layer is within the range described above, the electron injection layer may have satisfactory electron injection characteristics without a substantial increase in driving voltage.

[Second Electrode 190]

The second electrode 190 may be disposed on the organic layer 150 having such a structure. The second electrode 190 may be a cathode which is an electron injection electrode, and in this regard, a material for forming the second electrode 190 may be selected from a metal, an alloy, an electrically conductive compound, and a combination thereof, which have a relatively low work function.

The second electrode 190 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ITO, and IZO, but embodiments are not limited thereto. The second electrode 190 may be a transmissive electrode, a semi-transmissive electrode, or a reflective electrode.

The second electrode 190 may have a single-layered structure or a multi-layered structure including two or more layers.

Figure 3:
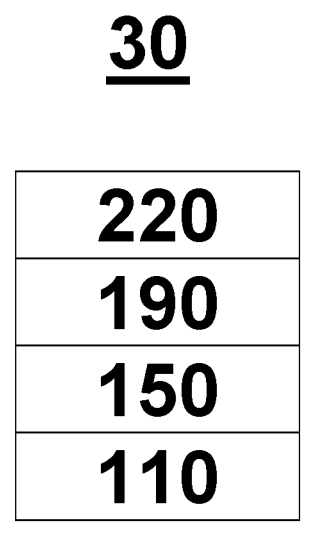
Figure 4:
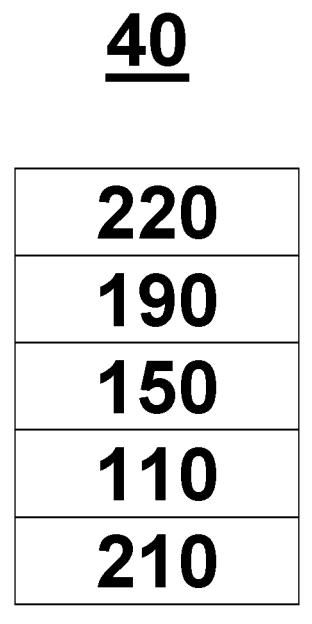

[Description of FIGS. 2 to 4]

Figure 2:
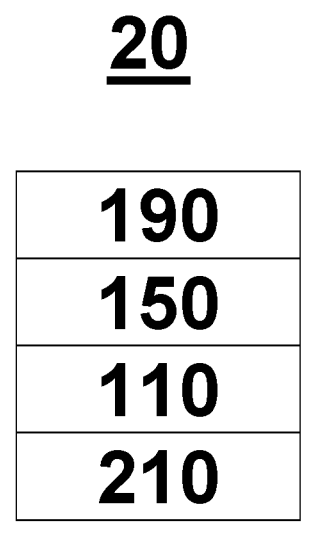

FIG. 2 is a schematic cross-sectional view of an organic light-emitting device 20 according to an embodiment. The organic light-emitting device 20 includes a first capping layer 210, the first electrode 110, the organic layer 150, and the second electrode 190, which are sequentially stacked (or disposed) in this stated order. FIG. 3 is a schematic cross-sectional view of an organic light-emitting device 30 according to an embodiment. The organic light-emitting device 30 includes the first electrode 110, the organic layer 150, the second electrode 190, and a second capping layer 220, which are sequentially stacked (or disposed) in this stated order. FIG. 4 is a schematic cross-sectional view of an organic light-emitting device 40 according to an embodiment. The organic light-emitting device 40 includes the first capping layer 210, the first electrode 110, the organic layer 150, the second electrode 190, and the second capping layer 220, which are sequentially stacked (or disposed) in this stated order.

Regarding FIGS. 2 to 4, the first electrode 110, the organic layer 150, and the second electrode 190 may be understood by referring to the description presented in connection with FIG. 1.

In the organic layer 150 of each of the organic light-emitting devices 20 and 40, light generated in an emission layer may pass through the first electrode 110 and the first capping layer 210 toward the outside, wherein the first electrode 110 may be a semi-transmissive electrode or a transmissive electrode. In the organic layer 150 of each of the organic light-emitting devices 30 and 40, light generated in an emission layer may pass through the second electrode 190 and the second capping layer 220 toward the outside, wherein the second electrode 190 may be a semi-transmissive electrode or a transmissive electrode.

The first capping layer 210 and the second capping layer 220 may increase external luminescence efficiency according to the principle of constructive interference.

The first capping layer 210 and the second capping layer 220 may each independently be an organic capping layer including an organic material, an inorganic capping layer including an inorganic material, or a composite capping layer including an organic material and an inorganic material.

At least one selected from the first capping layer 210 and the second capping layer 220 may each independently include at least one material selected from a carbocyclic compound, a heterocyclic compound, an amine-based compound, a porphine derivative, a phthalocyanine derivative, a naphthalocyanine derivative, an alkali metal complex, and an alkaline earth-metal complex. The carbocyclic compound, the heterocyclic compound, and the amine-based compound may be optionally substituted with a substituent containing at least one element selected from O, N, S, Se, Si, F, Cl, Br, and I. In one embodiment, at least one selected from the first capping layer 210 and the second capping layer 220 may each independently include an amine-based compound.

In one embodiment, at least one selected from the first capping layer 210 and the second capping layer 220 may each independently include the compound represented by Formula 201 or the compound represented by Formula 202.

In embodiments, at least one selected from the first capping layer 210 and the second capping layer 220 may each independently include a compound selected from Compounds HT28 to HT33 and Compounds CP1 to CP5, but embodiments are not limited thereto:

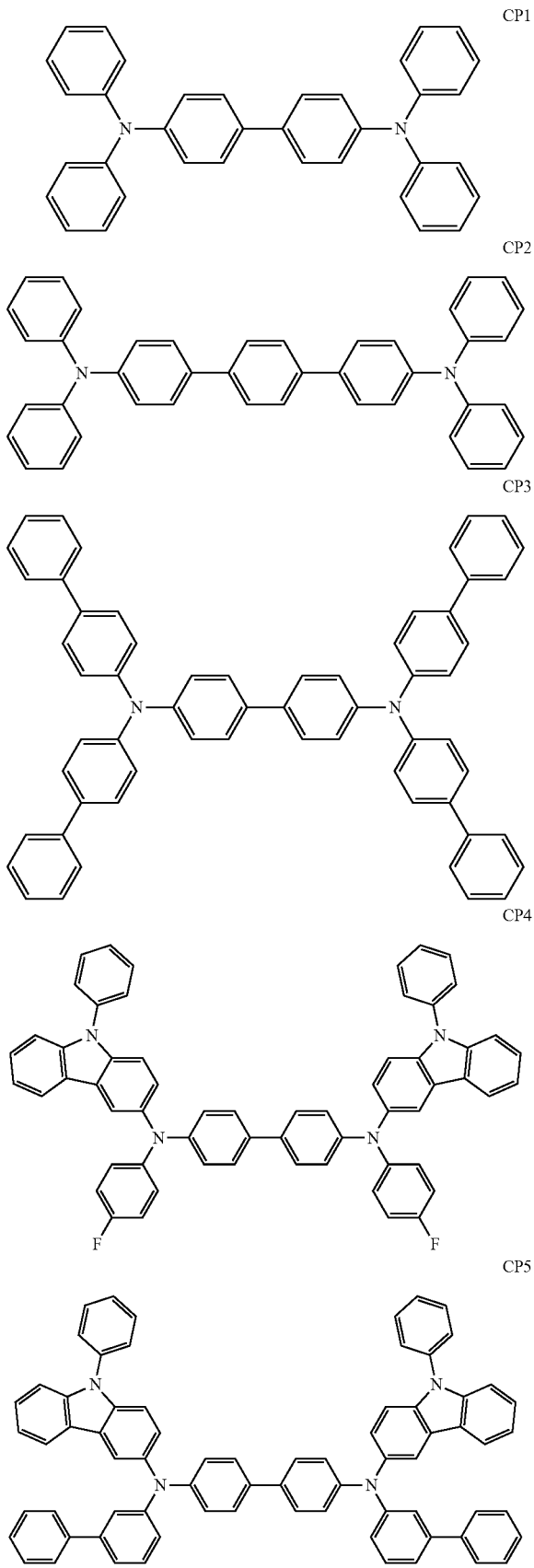

Hereinbefore, the organic light-emitting device according to an embodiment has been described in connection with FIGS. 1 to 4, but embodiments are not limited thereto.

Layers constituting the hole transport region, an emission layer, and layers constituting the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, an emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec by taking into account a material to be included in a layer to be formed and the structure of a layer to be formed.

When layers constituting the hole transport region, an emission layer, and layers constituting the electron transport region are formed by spin coating, the spin coating may be performed at a coating speed of about 2,000 rpm to about 5,000 rpm and at a heat treatment temperature of about 80° C. to about 200° C. by taking into account a material to be included in a layer to be formed and the structure of a layer to be formed.

Definitions of Substituents

The term "$C_1$-$C_{60}$ alkyl group" as used herein refers to a linear or branched aliphatic saturated hydrocarbon monovalent group having 1 to 60 carbon atoms, and examples thereof include a methyl group, an ethyl group, a propyl group, an isobutyl group, a sec-butyl group, a tert-butyl group, a pentyl group, an iso-amyl group, and a hexyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a hydrocarbon group having at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group having at least one carbon-carbon triple bond in the middle or at the terminus of the $C_2$-$C_{60}$ alkyl group, and examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group" as used herein refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent monocyclic group having at least one heteroatom selected from N, O, Si, P, and S as a ring-forming atom and 1 to 10 carbon atoms, and examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" used herein refers to a monovalent monocyclic group that has 3 to 10 carbon atoms and at least one double bond in the ring thereof and no aromaticity, and examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, Si, P, and S as a ring-forming atom, 1 to 10 carbon atoms, and at least one double bond in its ring. Non-limiting examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and a $C_6$-$C_{60}$ arylene group used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the two or more rings may be fused to each other.

The term "$C_1$-$C_{60}$ heteroaryl group" as used herein refers to a monovalent group having a heterocyclic aromatic system that has at least one heteroatom selected from N, O, Si, P, and S as a ring-forming atom, in addition to 1 to 60 carbon atoms. The term "$C_1$-$C_{60}$ heteroarylene group" as used herein refers to a divalent group having a heterocyclic aromatic system that has at least one heteroatom selected from N, O, Si, P, and S as a ring-forming atom, in addition to 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the two or more rings may be condensed with each other.

The term "$C_6$-$C_{60}$ aryloxy group" as used herein refers to —$OA_{102}$ (wherein $A_{102}$ is the $C_6$-$C_{60}$ aryl group), and a $C_6$-$C_{60}$ arylthio group used herein refers to —$SA_{103}$ (wherein $A_{103}$ is the $C_6$-$C_{60}$ aryl group).

The term "monovalent non-aromatic condensed polycyclic group" as used herein refers to a monovalent group (for example, having 8 to 60 carbon atoms) having two or more rings condensed with each other, only carbon atoms as ring-forming atoms, and no aromaticity in its entire molecular structure. A detailed example of the monovalent non-aromatic condensed polycyclic group is a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 1 to 60 carbon atoms) having two or more rings condensed to each other, at least one heteroatom selected from N, O, Si, P, and S, other than carbon atoms, as a ring-forming atom, and no aromaticity in its entire molecular structure. A detailed example of the monovalent non-aromatic condensed heteropolycyclic group is a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{60}$ carbocyclic group" as used herein refers to a monocyclic or polycyclic group that includes only carbon as a ring-forming atom and consists of 5 to 60 carbon atoms. The $C_5$-$C_{60}$ carbocyclic group may be an aromatic carbocyclic group or a non-aromatic carbocyclic group. The $C_5$-$C_{60}$ carbocyclic group may be a ring, such as benzene, a monovalent group, such as a phenyl group, or a divalent group, such as a phenylene group. In embodiments, depending on the number of substituents connected to the $C_5$-$C_{60}$ carbocyclic group, the $C_5$-$C_{60}$ carbocyclic group may be a trivalent group or a quadrivalent group.

The term "$C_1$-$C_{60}$ heterocyclic group" as used herein refers to a group having the same structure as the $C_5$-$C_{60}$ carbocyclic group, except that as a ring-forming atom, at least one heteroatom selected from N, O, Si, P, and S is used in addition to carbon (the number of carbon atoms may be in a range of 1 to 60).

In the specification, at least one substituent of the substituted $C_5$-$C_{60}$ carbocyclic group, the substituted $C_1$-$C_{60}$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —$C_1$, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si(Q$_{11}$)(Q$_{12}$)(Q$_{13}$), —N(Q$_{11}$)(Q$_{12}$), —B(Q$_{11}$)(Q$_{12}$), —C(=O)(Q$_{11}$), —S(=O)$_2$(Q$_{11}$), and —P(=O)(Q$_{11}$)(Q$_{12}$);

a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_6$-C$_{60}$ aryloxy group, a C$_6$-C$_{60}$ arylthio group, a C$_1$-C$_{60}$ heteroaryl group, a monovalent non-aromatic condensed polycyclic group, and a monovalent non-aromatic condensed heteropolycyclic group;

a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_6$-C$_{60}$ aryloxy group, a C$_6$-C$_{60}$ arylthio group, a C$_1$-C$_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_6$-C$_{60}$ aryloxy group, a C$_6$-C$_{60}$ arylthio group, a C$_1$-C$_{60}$ heteroaryl group, a monovalent non-aromatic condensed polycyclic group, a monovalent non-aromatic condensed heteropolycyclic group, —Si(Q$_{21}$)(Q$_{22}$)(Q$_{23}$), —N(Q$_{21}$)(Q$_{22}$), —B(Q$_{21}$)(Q$_{22}$), —C(=O)(Q$_{21}$), —S(=O)$_2$(Q$_{21}$), and —P(=O)(Q$_{21}$)(Q$_{22}$); and —Si(Q$_{31}$)(Q$_{32}$)(Q$_{33}$), —N(Q$_{31}$)(Q$_{32}$), —B(Q$_{31}$)(Q$_{32}$), —C(=O)(Q$_{31}$), —S(=O)$_2$(Q$_{31}$), and —P(=O)(Q$_{31}$)(Q$_{32}$), wherein Q$_{11}$ to Q$_{13}$, Q$_{21}$ to Q$_{23}$ and Q$_{31}$ to Q$_{33}$ may each independently be selected from hydrogen, deuterium, —F, —Cl, —Br, —I, a hydroxyl group, a cyano group, a nitro group, an amidino group, a hydrazino group, a hydrazono group, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_1$-C$_{60}$ heteroaryl group, a monovalent non-aromatic condensed polycyclic group, a monovalent non-aromatic condensed heteropolycyclic group, a biphenyl group, and a terphenyl group.

The term "Ph" as used herein refers to a phenyl group, the term "Me" as used herein refers to a methyl group, the term "Et" as used herein refers to an ethyl group, the term "ter-Bu" or "t-Bu" or "Bu$^t$" as used herein refers to a tert-butyl group, and the term "OMe" as used herein refers to a methoxy group.

The term "biphenyl group" as used herein refers to "a phenyl group substituted with a phenyl group". In other words, the "biphenyl group" is a substituted phenyl group having a C$_6$-C$_{60}$ aryl group as a substituent.

The term "terphenyl group" as used herein refers to "a phenyl group substituted with a biphenyl group". In other words, the "terphenyl group" is a phenyl group having, as a substituent, a C$_6$-C$_{60}$ aryl group substituted with a C$_5$-C$_{60}$ aryl group.

*, *', and *'', as used herein, unless defined otherwise, each refer to a binding site to a neighboring atom in a corresponding formula.

Hereinafter, a compound according to embodiments and an organic light-emitting device according to embodiments will be described in detail with reference to Synthesis Examples and Examples. The wording "B was used instead of A" used in describing Synthesis Examples refers to where an identical molar equivalent of B was used in place of A.

SYNTHESIS EXAMPLES

Synthesis Example 1: Synthesis of Compound 1

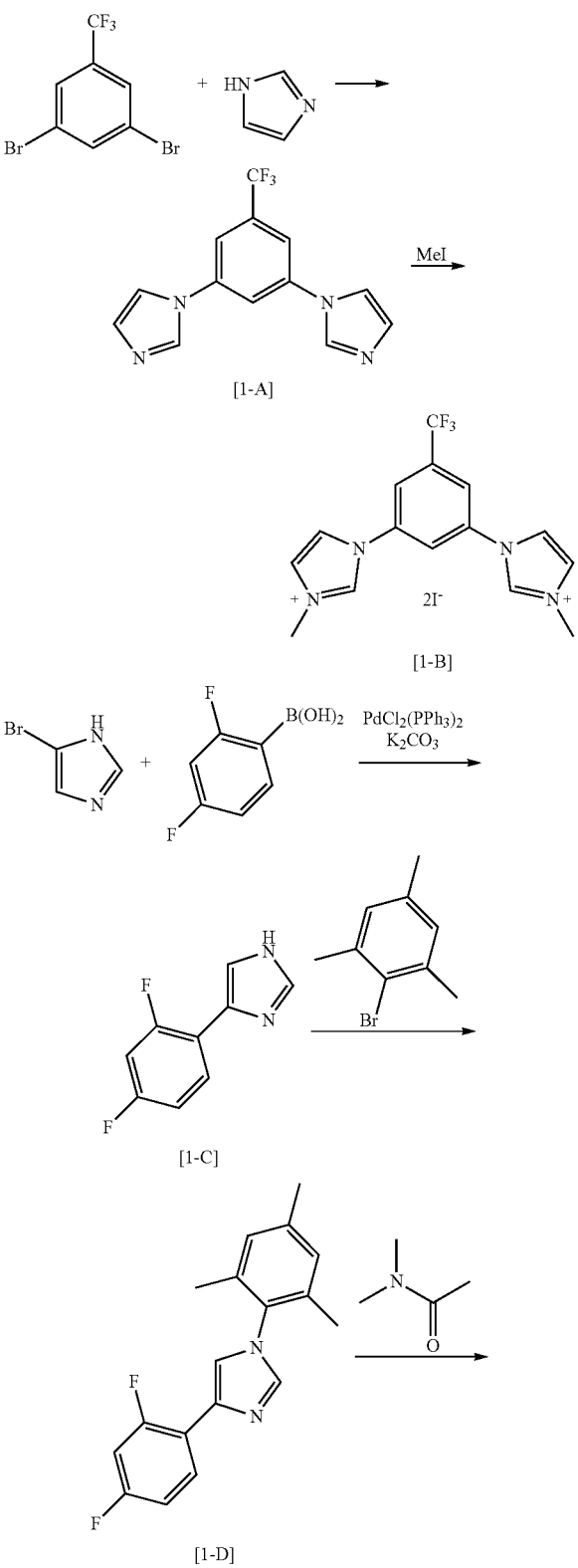

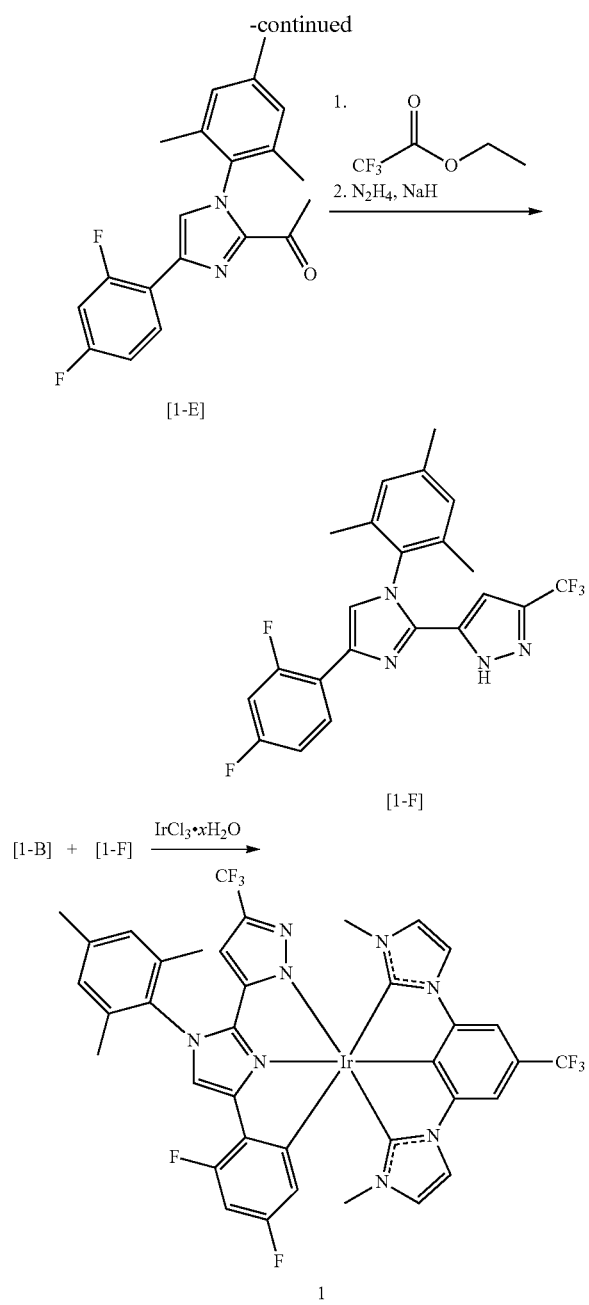

Synthesis of Intermediate Compound [1-A]

1,3-dibromo-5-(trifluoromethyl)benzene (1.0 eq), imidazole (3.0 eq), CuI (002 eq), K$_2$CO$_3$ (3.0 eq), and L-Proline (0.04 eq) were dissolved in dimethylsulfonate (0.1M), and stirred at a temperature of 160° C. for 48 hours. The reaction mixture was cooled to room temperature and subjected to an extraction process three times with dichloromethane and water to obtain an organic layer. The obtained organic layer was dried using magnesium sulfate, and concentrated to synthesize Intermediate compound [1-A] (Yield: 43%) using column chromatography.

(2) Synthesis of Intermediate Compound [1-B]

Intermediate compound [1-A] (1.0 eq) and iodomethane (3.0 eq) were dissolved in toluene (1.0 M), and stirred at a temperature of 120° C. for 12 hours. The reaction mixture was cooled to room temperature, washed with toluene and filtered to obtain a solid. The obtained solid was dried to synthesize Intermediate compound [1-B] (Yield: 71%).

(3) Synthesis of Intermediate Compound [1-C]

5-bromo-1H-imidazole (1.0 eq), (2,4-difluorophenyl)boronic acid (1.1 eq), PdCl$_2$(PPh$_3$)$_2$ (0.002 eq), and K$_2$CO$_3$ (2.0 eq) were dissolved in dioxane:H$_2$O (2:1, 0.1M), and stirred at a temperature of 90° C. for 12 hours. The reaction mixture was cooled to room temperature and subjected to an extraction process three times with dichloromethane and water to obtain an organic layer. The obtained organic layer was dried using magnesium sulfate, and concentrated to synthesize Intermediate compound [1-C] (Yield: 66%) using column chromatography.

(4) Synthesis of Intermediate Compound [1-D]

Intermediate compound [1-C] (1.0 eq), 2-bromo-1,3,5-trimethylbenzene (1.2 eq), Pd$_2$(dba)$_3$ (0.002 eq), and K$_3$PO$_4$ (2.0 eq) were dissolved in toluene (0.1M), and stirred at a temperature of 120° C. for 24 hours. The reaction mixture was cooled to room temperature and subjected to an extraction process three times with dichloromethane and water to obtain an organic layer. The obtained organic layer was dried using magnesium sulfate, and concentrated to synthesize Intermediate compound [1-D] (Yield: 63%) using column chromatography.

(5) Synthesis of Intermediate Compound [1-E]

Intermediate compound [1-D] (1.0 eq) was dissolved in tetrahydrofuran (0.5 M), and at a temperature of −78° C., n-butyl lithium (1M in THF, 1.0 eq) was slowly added thereto. After stirring the result at a temperature of −78° C. for 30 minutes, N,N-dimethyl acetamide (1.2 eq) was added thereto. The reaction product was stirred at room temperature for 3 hours. The reaction product was extracted three times with diethyl ether and water to obtain an organic layer. The obtained organic layer was dried using magnesium sulfate, and concentrated to synthesize Intermediate compound [1-E](Yield: 77%) using column chromatography.

(6) Synthesis of Intermediate Compound [1-F]

Intermediate compound [1-E] (1.0 eq) and sodium ethoxide (1.2 eq) were dissolved in tetrahydrofuran (1.0 M), and ethyl 2,2,2-trifluoroacetate (1.1 eq) was added thereto at a temperature of 0° C. The reaction product was stirred for 12 hours at a temperature of 70° C. The reaction product was cooled to room temperature and neutralized with a 2N HCl aqueous solution. After the remaining tetrahydrofuran solvent was removed under reduced pressure, the reaction product was extracted three times with ethyl acetate to obtain an organic layer. The obtained organic layer was dried using sodium sulfate and concentrated. A hydrazine monohydrate (3.0 eq), a catalytic amount of NaH and ethyl alcohol (1.0 M) were added thereto, followed by stirring at a temperature of 60° C. for 12 hours. After cooling the reaction product to room temperature, the solvent was removed under reduced pressure, and an extraction process was performed thereon three times with ethyl acetate and H$_2$O to obtain an organic layer. The obtained organic layer was dried using sodium sulfate, and concentrated to synthesize Intermediate compound [1-F] (Yield: 72%) using column chromatography.

(7) Synthesis of Compound 1

Intermediate compound [1-B] (1.0 eq), Intermediate compound [1-F] (1.0 eq), iridium chloride hydrate (1.1 eq), and K₂CO₃ (10 eq) were dissolved in propionic acid (0.2 M), and stirred at a temperature of 140° C. for 12 hours. The reaction was cooled to room temperature, and a solvent was removed therefrom under reduced pressure. An organic layer was extracted therefrom three times by using dichloromethane and water. The obtained organic layer was dried using magnesium sulfate, and concentrated to synthesize Compound 1 (Yield: 23%) using column chromatography.

Synthesis Example 2: Synthesis of Compound 2

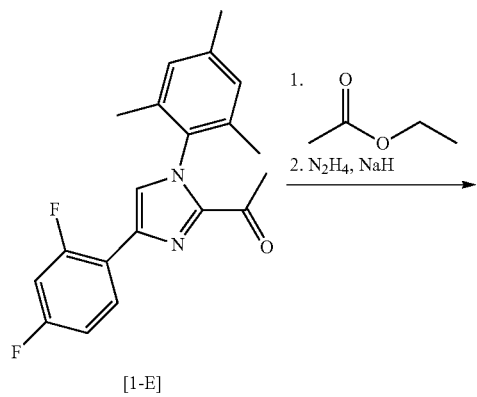

[1-E]

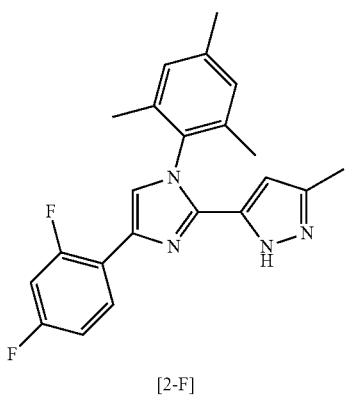

[2-F]

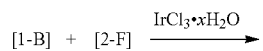

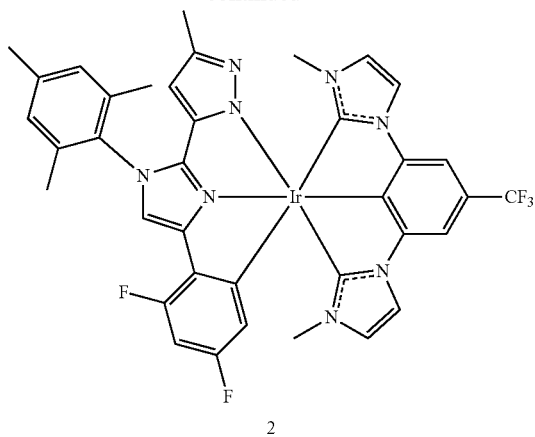

2

Synthesis of Intermediate Compound [2-F]

Intermediate compound [1-E] (1.0 eq) and sodium ethoxide (1.2 eq) were dissolved in tetrahydrofuran (1.0 M), and ethyl acetate (1.1 eq) was added thereto at a temperature of 0° C. The reaction product was stirred for 12 hours at a temperature of 70° C. The reaction product was cooled to room temperature and neutralized with a 2N HCl aqueous solution. After the remaining tetrahydrofuran solvent was removed under reduced pressure, the reaction product was extracted three times with ethyl acetate to obtain an organic layer. The obtained organic layer was dried using sodium sulfate and concentrated. A hydrazine monohydrate (3.0 eq), a catalytic amount of NaH and ethyl alcohol (1.0 M) were added thereto, followed by stirring at a temperature of 60° C. for 12 hours. After cooling the reaction product to room temperature, the solvent was removed under reduced pressure, and an extraction process was performed thereon three times with ethyl acetate and H₂O to obtain an organic layer. The obtained organic layer was dried using sodium sulfate, and concentrated to synthesize Intermediate compound [2-F] (Yield: 72%) using column chromatography.

(2) Synthesis of Compound 2

Intermediate compound [1-B] (1.0 eq), Intermediate compound [2-F] (1.0 eq), iridium chloride hydrate (1.1 eq), and K₂CO₃ (10 eq) were dissolved in propionic acid (0.2 M), and stirred at a temperature of 140° C. for 12 hours. The reaction was cooled to room temperature, and a solvent was removed therefrom under reduced pressure. An organic layer was extracted therefrom three times by using dichloromethane and water. The obtained organic layer was dried using magnesium sulfate, and concentrated to synthesize Compound 2 (Yield: 23%) using column chromatography.

Synthesis Example 3: Synthesis of Compound 6

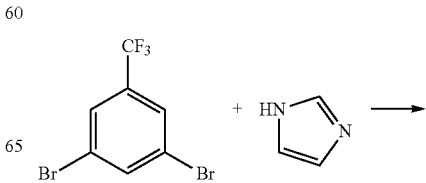

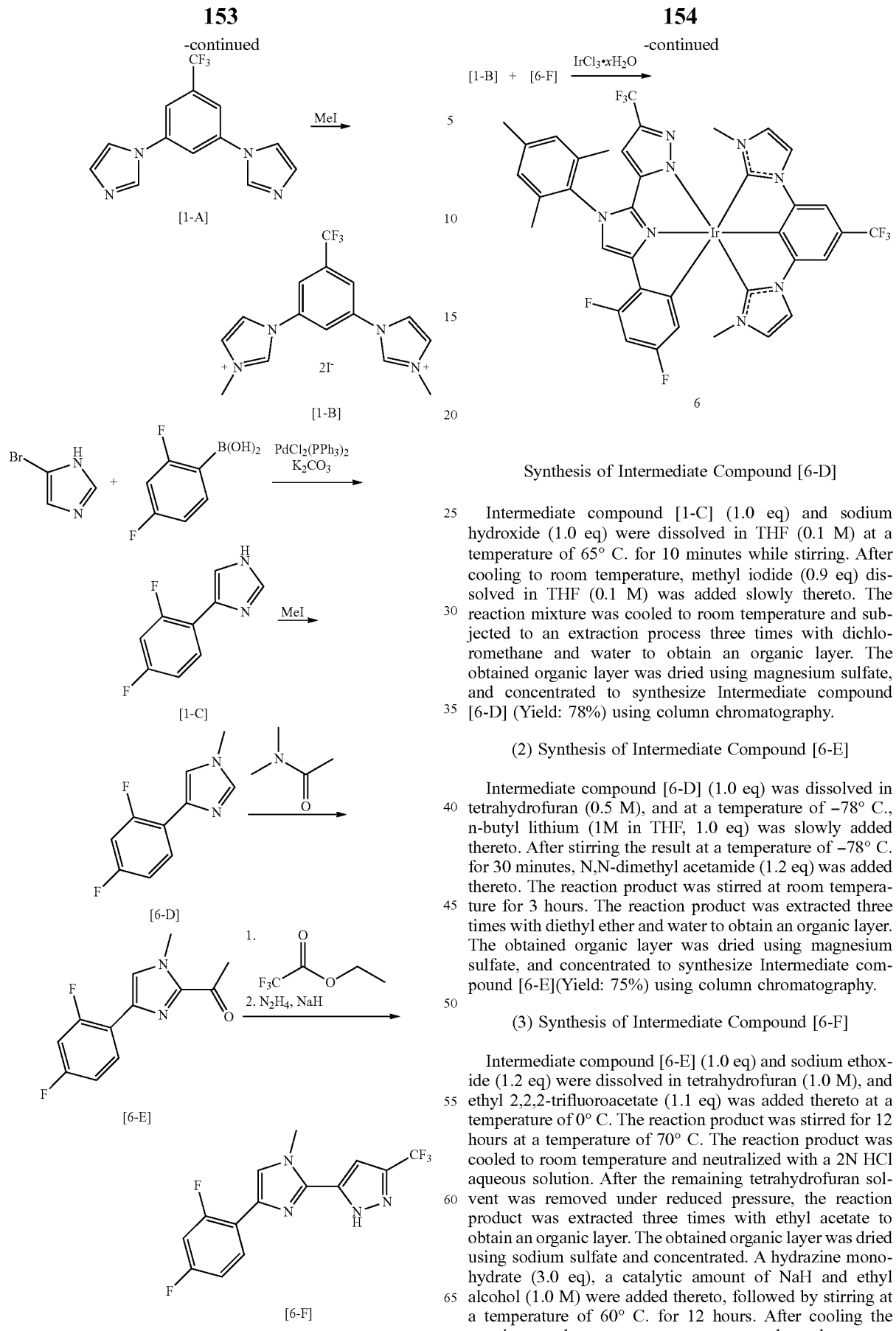

Synthesis of Intermediate Compound [6-D]

Intermediate compound [1-C] (1.0 eq) and sodium hydroxide (1.0 eq) were dissolved in THF (0.1 M) at a temperature of 65° C. for 10 minutes while stirring. After cooling to room temperature, methyl iodide (0.9 eq) dissolved in THF (0.1 M) was added slowly thereto. The reaction mixture was cooled to room temperature and subjected to an extraction process three times with dichloromethane and water to obtain an organic layer. The obtained organic layer was dried using magnesium sulfate, and concentrated to synthesize Intermediate compound [6-D] (Yield: 78%) using column chromatography.

(2) Synthesis of Intermediate Compound [6-E]

Intermediate compound [6-D] (1.0 eq) was dissolved in tetrahydrofuran (0.5 M), and at a temperature of −78° C., n-butyl lithium (1M in THF, 1.0 eq) was slowly added thereto. After stirring the result at a temperature of −78° C. for 30 minutes, N,N-dimethyl acetamide (1.2 eq) was added thereto. The reaction product was stirred at room temperature for 3 hours. The reaction product was extracted three times with diethyl ether and water to obtain an organic layer. The obtained organic layer was dried using magnesium sulfate, and concentrated to synthesize Intermediate compound [6-E](Yield: 75%) using column chromatography.

(3) Synthesis of Intermediate Compound [6-F]

Intermediate compound [6-E] (1.0 eq) and sodium ethoxide (1.2 eq) were dissolved in tetrahydrofuran (1.0 M), and ethyl 2,2,2-trifluoroacetate (1.1 eq) was added thereto at a temperature of 0° C. The reaction product was stirred for 12 hours at a temperature of 70° C. The reaction product was cooled to room temperature and neutralized with a 2N HCl aqueous solution. After the remaining tetrahydrofuran solvent was removed under reduced pressure, the reaction product was extracted three times with ethyl acetate to obtain an organic layer. The obtained organic layer was dried using sodium sulfate and concentrated. A hydrazine monohydrate (3.0 eq), a catalytic amount of NaH and ethyl alcohol (1.0 M) were added thereto, followed by stirring at a temperature of 60° C. for 12 hours. After cooling the reaction product to room temperature, the solvent was removed under reduced pressure, and an extraction process was performed thereon three times with ethyl acetate and H₂O to obtain an organic layer. The obtained organic layer was dried using sodium sulfate, and concentrated to synthesize Intermediate compound [6-F] (Yield: 74%) using column chromatography.

(4) Synthesis of Compound 6

Intermediate compound [1-B] (1.0 eq), Intermediate compound [6-F] (1.0 eq), iridium chloride hydrate (1.1 eq), and K₂CO₃ (10 eq) were dissolved in propionic acid (0.2 M), and stirred at a temperature of 140° C. for 12 hours. The reaction was cooled to room temperature, and a solvent was removed therefrom under reduced pressure. An organic layer was extracted therefrom three times by using dichloromethane and water. The obtained organic layer was dried using magnesium sulfate, and concentrated to synthesize Compound 6 (Yield: 19%) using column chromatography.

Synthesis Example 4: Synthesis of Compound 7

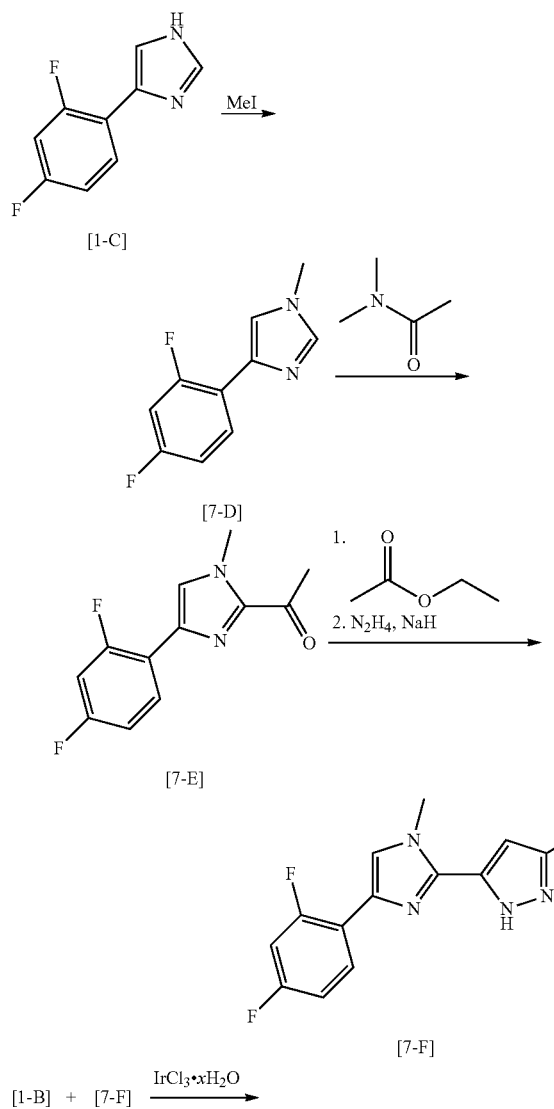

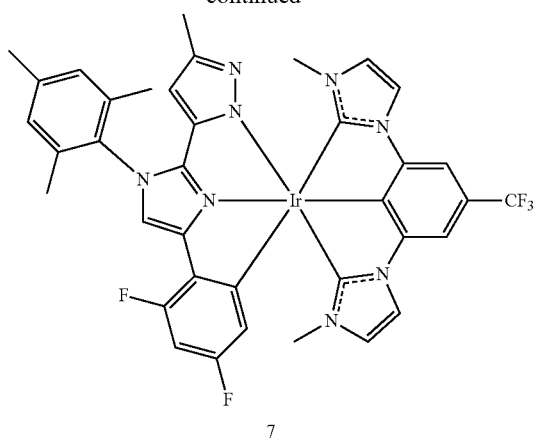

7

Synthesis of Intermediate Compound [7-D]

Intermediate compound [1-C] (1.0 eq), Methyl iodide (1.5 eq), Pd₂(dba)₃ (0.002 eq), and K₃PO₄ (2.0 eq) were dissolved in toluene (0.1M), and stirred at a temperature of 120° C. for 24 hours. The reaction mixture was cooled to room temperature and subjected to an extraction process three times with dichloromethane and water to obtain an organic layer. The obtained organic layer was dried using magnesium sulfate, and concentrated to synthesize Intermediate compound [7-D](Yield: 72%) using column chromatography.

(2) Synthesis of Intermediate Compound [7-E]

Intermediate compound [7-D] (1.0 eq) was dissolved in tetrahydrofuran (0.5 M), and at a temperature of −78° C., n-butyl lithium (1M in THF, 1.0 eq) was slowly added thereto. After stirring the result at a temperature of −78° C. for 30 minutes, N,N-dimethyl acetamide (1.2 eq) was added thereto. The reaction product was stirred at room temperature for 3 hours. The reaction product was extracted three times with diethyl ether and water to obtain an organic layer. The obtained organic layer was dried using magnesium sulfate, and concentrated to synthesize Intermediate compound [7-E](Yield: 77%) using column chromatography.

(3) Synthesis of Intermediate Compound [7-F]

Intermediate compound [7-E] (1.0 eq) and sodium ethoxide (1.2 eq) were dissolved in tetrahydrofuran (1.0 M), and ethyl acetate (1.1 eq) was added thereto at a temperature of 0° C. The reaction product was stirred for 12 hours at a temperature of 70° C. The reaction product was cooled to room temperature and neutralized with a 2N HCl aqueous solution. After the remaining tetrahydrofuran solvent was removed under reduced pressure, the reaction product was extracted three times with ethyl acetate to obtain an organic layer. The obtained organic layer was dried using sodium sulfate and concentrated. A hydrazine monohydrate (3.0 eq), a catalytic amount of NaH and ethyl alcohol (1.0 M) were added thereto, followed by stirring at a temperature of 60° C. for 12 hours. After cooling the reaction product to room temperature, the solvent was removed under reduced pressure, and an extraction process was performed thereon three times with ethyl acetate and H₂O to obtain an organic layer. The obtained organic layer was dried using sodium sulfate, and concentrated to synthesize Intermediate compound [7-F] (Yield: 72%) using column chromatography.

(4) Synthesis of Compound 7

Intermediate compound [1-B] (1.0 eq), Intermediate compound [7-F] (1.0 eq), iridium chloride hydrate (1.1 eq), and $K_2CO_3$ (10 eq) were dissolved in propionic acid (0.2 M), and stirred at a temperature of 140° C. for 12 hours. The reaction was cooled to room temperature, and a solvent was removed therefrom under reduced pressure. An organic layer was extracted therefrom three times by using dichloromethane and water. The obtained organic layer was dried using magnesium sulfate, and concentrated to synthesize Compound 7 (Yield: 23%) using column chromatography.

Synthesis Example 5: Synthesis of Compound 11

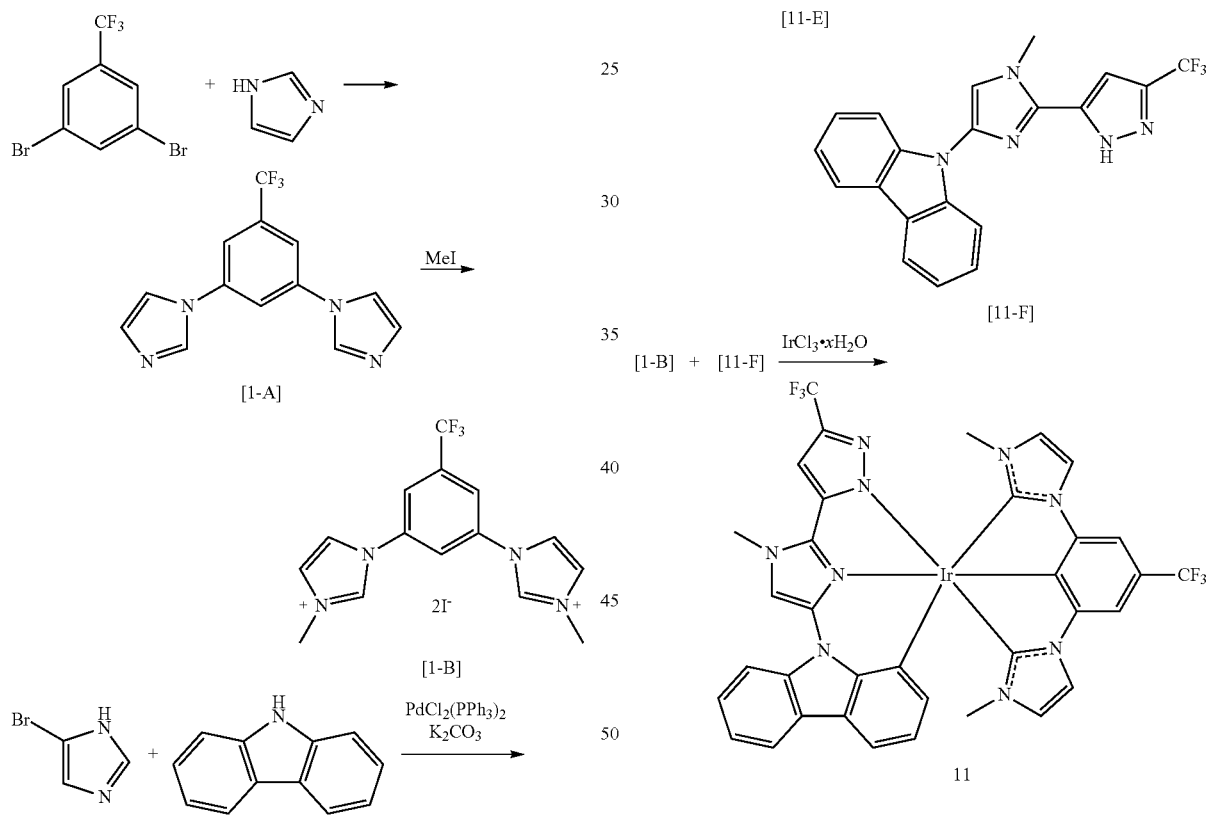

Synthesis of Intermediate Compound [11-C]

5-bromo-1H-imidazole (1.0 eq), Carbazole (1.1 eq), Pd(PPh$_3$)$_4$ (0.05 eq), and $K_2CO_3$ (2.0 eq) were dissolved in dioxane:H$_2$O (4:1, 0.1M), and stirred at a temperature of 110° C. for 12 hours. The reaction mixture was cooled to room temperature and subjected to an extraction process three times with dichloromethane and water to obtain an organic layer. The obtained organic layer was dried using magnesium sulfate, and concentrated to synthesize Intermediate compound [11-C] (Yield: 87%) using column chromatography.

(2) Synthesis of Intermediate Compound [11-D]

Intermediate compound [11-C] (1.0 eq) and sodium hydroxide (1.0 eq) were dissolved in THF (0.1 M) at a temperature of 65° C. for 10 minutes while stirring. After cooling to room temperature, methyl iodide (0.9 eq) dissolved in THF (0.1 M) was added slowly thereto. The reaction mixture was cooled to room temperature and subjected to an extraction process three times with dichloromethane and water to obtain an organic layer. The obtained organic layer was dried using magnesium sulfate, and concentrated to synthesize Intermediate compound [11-D] (Yield: 81%) using column chromatography.

(3) Synthesis of Intermediate Compound [11-E]

Intermediate compound [11-D] (1.0 eq) was dissolved in tetrahydrofuran (0.5 M), and at a temperature of −78° C., n-butyl lithium (1M in THF, 1.0 eq) was slowly added thereto. After stirring the result at a temperature of −78° C. for 30 minutes, N,N-dimethyl acetamide (1.2 eq) was added thereto. The reaction product was stirred at room temperature for 3 hours. The reaction product was extracted three times with diethyl ether and water to obtain an organic layer. The obtained organic layer was dried using magnesium sulfate, and concentrated to synthesize Intermediate compound [11-E](Yield: 77%) using column chromatography.

(4) Synthesis of Intermediate Compound [11-F]

Intermediate compound [11-E] (1.0 eq) and sodium ethoxide (1.2 eq) were dissolved in tetrahydrofuran (1.0 M), and ethyl 2,2,2-trifluoroacetate (1.1 eq) was added thereto at a temperature of 0° C. The reaction product was stirred for 12 hours at a temperature of 70° C. The reaction product was cooled to room temperature and neutralized with a 2N HCl aqueous solution. After the remaining tetrahydrofuran solvent was removed under reduced pressure, the reaction product was extracted three times with ethyl acetate to obtain an organic layer. The obtained organic layer was dried using sodium sulfate and concentrated. A hydrazine monohydrate (3.0 eq), a catalytic amount of NaH and ethyl alcohol (1.0 M) were added thereto, followed by stirring at a temperature of 60° C. for 12 hours. After cooling the reaction product to room temperature, the solvent was removed under reduced pressure, and an extraction process was performed thereon three times with ethyl acetate and H₂O to obtain an organic layer. The obtained organic layer was dried using sodium sulfate, and concentrated to synthesize Intermediate compound [11-F] (Yield: 72%) using column chromatography.

(7) Synthesis of Compound 11

Intermediate compound [1-B] (1.0 eq), Intermediate compound [11-F] (1.0 eq), iridium chloride hydrate (1.1 eq), and K₂CO₃ (10 eq) were dissolved in propionic acid (0.2 M), and stirred at a temperature of 140° C. for 12 hours. The reaction was cooled to room temperature, and a solvent was removed therefrom under reduced pressure. An organic layer was extracted therefrom three times by using dichloromethane and water. The obtained organic layer was dried using magnesium sulfate, and concentrated to synthesize Compound 11 (Yield: 21%) using column chromatography.

Synthesis Example 6: Synthesis of Compound 12

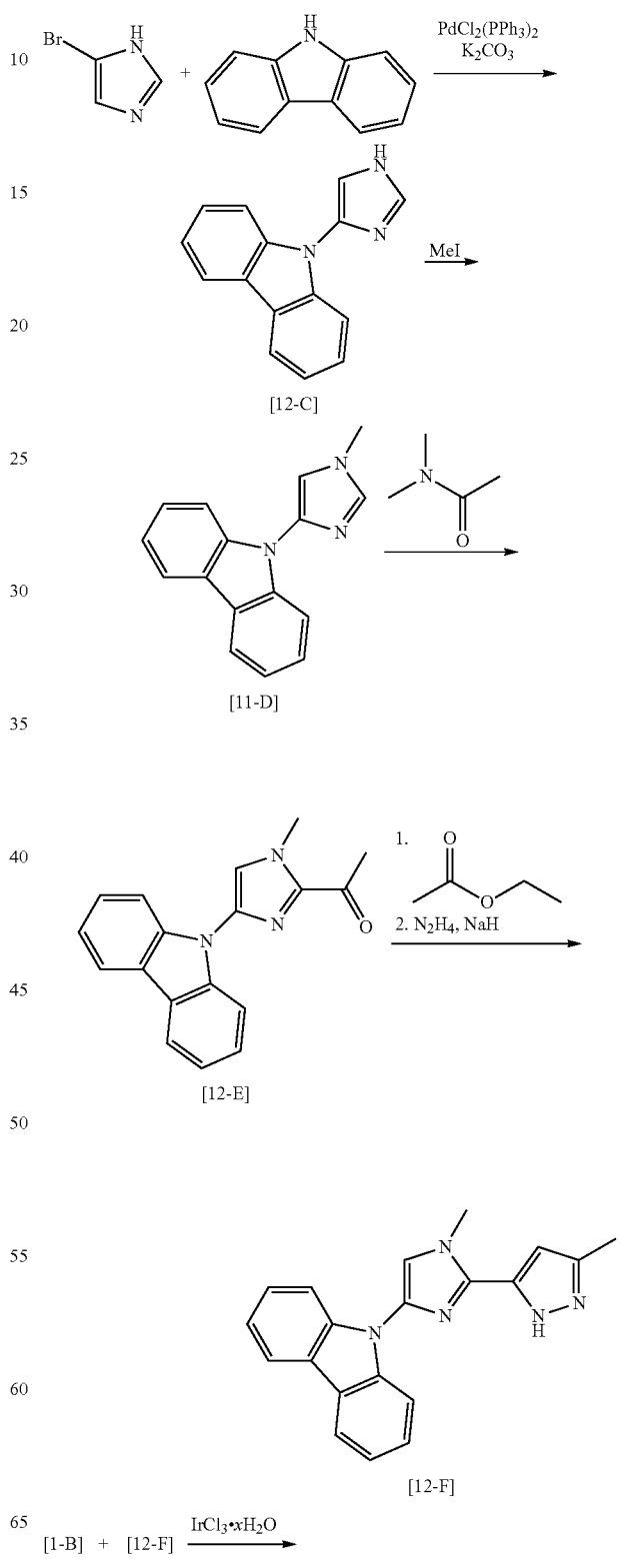

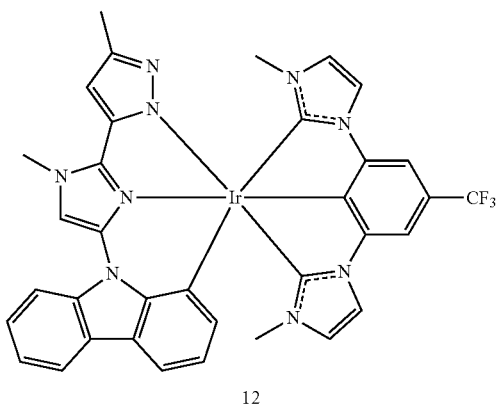

12

Synthesis of Intermediate Compound [12-C]

5-bromo-1H-imidazole (1.0 eq), Carbazole (1.1 eq), Pd(PPh₃)₄ (0.05 eq), and K₂CO₃ (2.0 eq) were dissolved in dioxane:H₂O (4:1, 0.1M), and stirred at a temperature of 110° C. for 12 hours. The reaction mixture was cooled to room temperature and subjected to an extraction process three times with dichloromethane and water to obtain an organic layer. The obtained organic layer was dried using magnesium sulfate, and concentrated to synthesize Intermediate compound [12-C] (Yield: 88%) using column chromatography.

(2) Synthesis of Intermediate Compound [12-D]

Intermediate compound [12-C] (1.0 eq) and sodium hydroxide (1.0 eq) were dissolved in THF (0.1 M) at a temperature of 65° C. for 10 minutes while stirring. After cooling to room temperature, methyl iodide (0.9 eq) dissolved in THF (0.1 M) was added slowly thereto. The reaction mixture was cooled to room temperature and subjected to an extraction process three times with dichloromethane and water to obtain an organic layer. The obtained organic layer was dried using magnesium sulfate, and concentrated to synthesize Intermediate compound [12-D] (Yield: 77%) using column chromatography.

(3) Synthesis of Intermediate Compound [12-E]

Intermediate compound [12-D] (1.0 eq) was dissolved in tetrahydrofuran (0.5 M), and at a temperature of −78° C., n-butyl lithium (1M in THF, 1.0 eq) was slowly added thereto. After stirring the result at a temperature of −78° C. for 30 minutes, N,N-dimethyl acetamide (1.2 eq) was added thereto. The reaction product was stirred at room temperature for 3 hours. The reaction product was extracted three times with diethyl ether and water to obtain an organic layer. The obtained organic layer was dried using magnesium sulfate, and concentrated to synthesize Intermediate compound [12-E](Yield: 76%) using column chromatography.

(4) Synthesis of Intermediate Compound [12-F]

Intermediate compound [12-E] (1.0 eq) and sodium ethoxide (1.2 eq) were dissolved in tetrahydrofuran (1.0 M), and ethyl acetate (1.1 eq) was added thereto at a temperature of 0° C. The reaction product was stirred for 12 hours at a temperature of 70° C. The reaction product was cooled to room temperature and neutralized with a 2N HCl aqueous solution. After the remaining tetrahydrofuran solvent was removed under reduced pressure, the reaction product was extracted three times with ethyl acetate to obtain an organic layer. The obtained organic layer was dried using sodium sulfate and concentrated. A hydrazine monohydrate (3.0 eq), a catalytic amount of NaH and ethyl alcohol (1.0 M) were added thereto, followed by stirring at a temperature of 60° C. for 12 hours. After cooling the reaction product to room temperature, the solvent was removed under reduced pressure, and an extraction process was performed thereon three times with ethyl acetate and H₂O to obtain an organic layer. The obtained organic layer was dried using sodium sulfate, and concentrated to synthesize Intermediate compound [12-F] (Yield: 72%) using column chromatography.

(7) Synthesis of Compound 12

Intermediate compound [1-B] (1.0 eq), Intermediate compound [12-F] (1.0 eq), iridium chloride hydrate (1.1 eq), and K₂CO₃ (10 eq) were dissolved in propionic acid (0.2 M), and stirred at a temperature of 140° C. for 12 hours. The reaction was cooled to room temperature, and a solvent was removed therefrom under reduced pressure. An organic layer was extracted therefrom three times by using dichloromethane and water. The obtained organic layer was dried using magnesium sulfate, and concentrated to synthesize Compound 12 (Yield: 23%) using column chromatography.

Synthesis Example 7: Synthesis of Compound 21

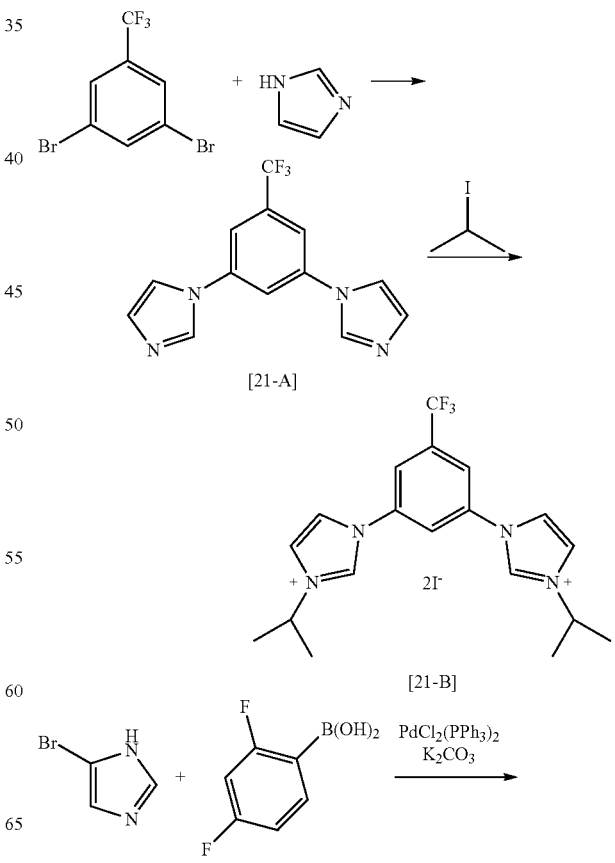

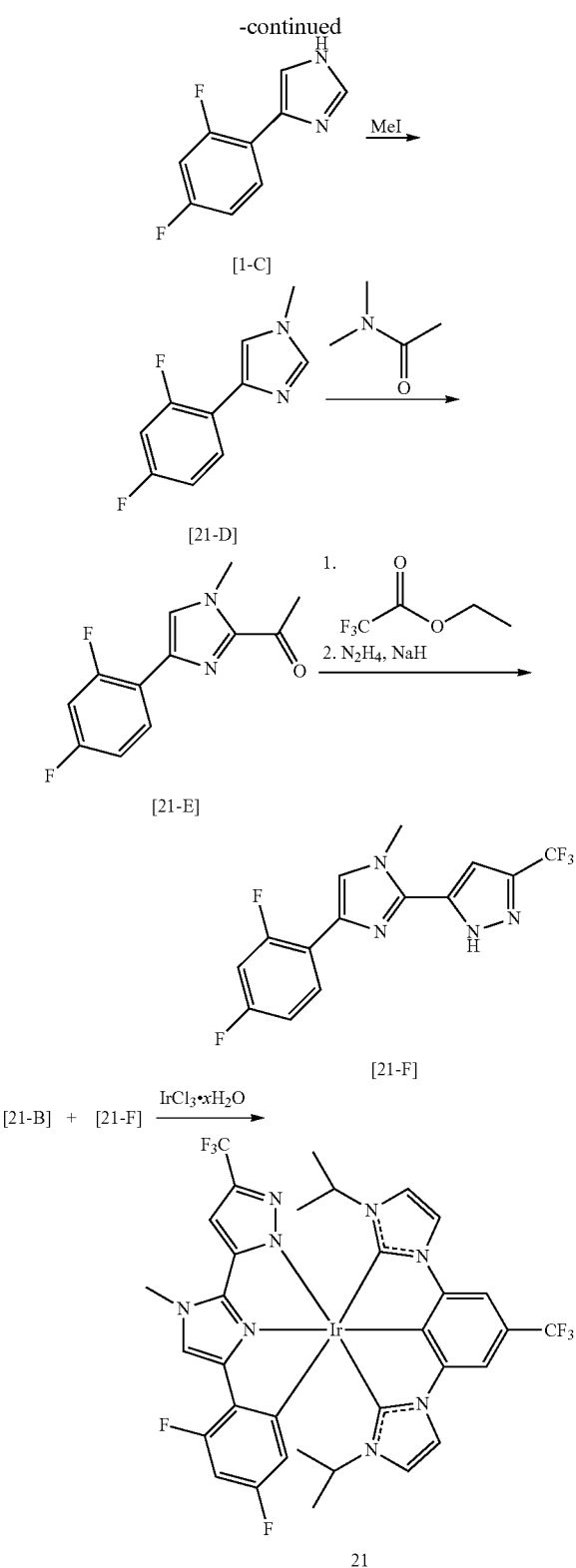

Synthesis of Intermediate Compound [21-A]

1,3-dibromo-5-(trifluoromethyl)benzene (1.0 eq), imidazole (3.0 eq), CuI (0.02 eq), $K_2CO_3$ (3.0 eq), and L-Proline (0.04 eq) were dissolved in dimethylsulfonate (0.1M), and stirred at a temperature of 160° C. for 48 hours. The reaction mixture was cooled to room temperature and subjected to an extraction process three times with dichloromethane and water to obtain an organic layer. The obtained organic layer was dried using magnesium sulfate, and concentrated to synthesize Intermediate compound [21-A] (Yield: 43%) using column chromatography.

(2) Synthesis of Intermediate Compound [21-B]

Intermediate compound [21-A] (1.0 eq) was dissolved in 2-iodopropane (3.0 eq), and stirred at a temperature of 120° C. for 12 hours. The reaction mixture was cooled to room temperature, washed with diethyl ether and filtered to obtain a solid. The obtained solid was dried to synthesize Intermediate compound [21-B] (Yield: 52%).

(3) Synthesis of Intermediate Compound [21-D]

Intermediate compound [1-C] (1.0 eq) and sodium hydroxide (1.0 eq) were dissolved in THF (0.1 M) at a temperature of 65° C. for 10 minutes while stirring. After cooling to room temperature, methyl iodide (0.9 eq) dissolved in THF (0.1 M) was added slowly thereto. The reaction mixture was cooled to room temperature and subjected to an extraction process three times with dichloromethane and water to obtain an organic layer. The obtained organic layer was dried using magnesium sulfate, and concentrated to synthesize Intermediate compound [21-D] (Yield: 78%) using column chromatography.

(4) Synthesis of Intermediate Compound [21-E]

Intermediate compound [21-D] (1.0 eq) was dissolved in tetrahydrofuran (0.5 M), and at a temperature of −78° C., n-butyl lithium (1M in THF, 1.0 eq) was slowly added thereto. After stirring the result at a temperature of −78° C. for 30 minutes, N,N-dimethyl acetamide (1.2 eq) was added thereto. The reaction product was stirred at room temperature for 3 hours. The reaction product was extracted three times with diethyl ether and water to obtain an organic layer. The obtained organic layer was dried using magnesium sulfate, and concentrated to synthesize Intermediate compound [21-E](Yield: 75%) using column chromatography.

(5) Synthesis of Intermediate Compound [21-F]

Intermediate compound [21-E] (1.0 eq) and sodium ethoxide (1.2 eq) were dissolved in tetrahydrofuran (1.0 M), and ethyl 2,2,2-trifluoroacetate (1.1 eq) was added thereto at a temperature of 0° C. The reaction product was stirred for 12 hours at a temperature of 70° C. The reaction product was cooled to room temperature and neutralized with a 2N HCl aqueous solution. After the remaining tetrahydrofuran solvent was removed under reduced pressure, the reaction product was extracted three times with ethyl acetate to obtain an organic layer. The obtained organic layer was dried using sodium sulfate and concentrated. A hydrazine monohydrate (3.0 eq), a catalytic amount of NaH and ethyl alcohol (1.0 M) were added thereto, followed by stirring at a temperature of 60° C. for 12 hours. After cooling the reaction product to room temperature, the solvent was removed under reduced pressure, and an extraction process was performed thereon three times with ethyl acetate and $H_2O$ to obtain an organic layer. The obtained organic layer was dried using sodium sulfate, and concentrated to synthesize Intermediate compound [21-F] (Yield: 74%) using column chromatography.

(6) Synthesis of Compound 21

Intermediate compound [21-B] (1.0 eq), Intermediate compound [21-F] (1.0 eq), iridium chloride hydrate (1.1 eq), and $K_2CO_3$ (10 eq) were dissolved in propionic acid (0.2 M), and stirred at a temperature of 140° C. for 12 hours. The reaction was cooled to room temperature, and a solvent was removed therefrom under reduced pressure. An organic layer was extracted therefrom three times by using dichloromethane and water. The obtained organic layer was dried using magnesium sulfate, and concentrated to synthesize Compound 21 (Yield: 18%) using column chromatography.

Synthesis Example 8: Synthesis of Compound 22

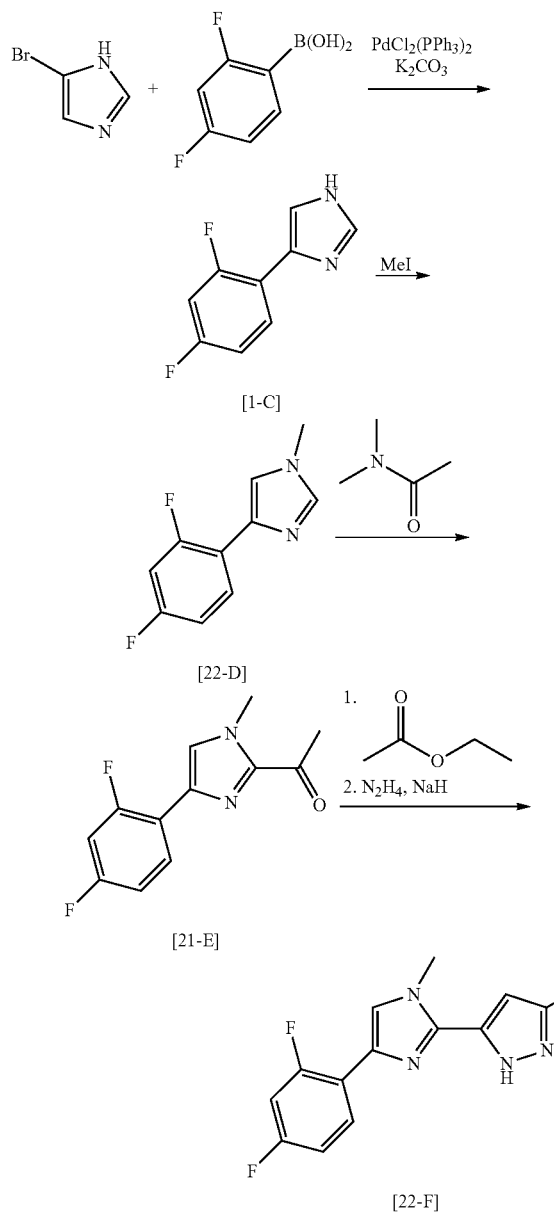

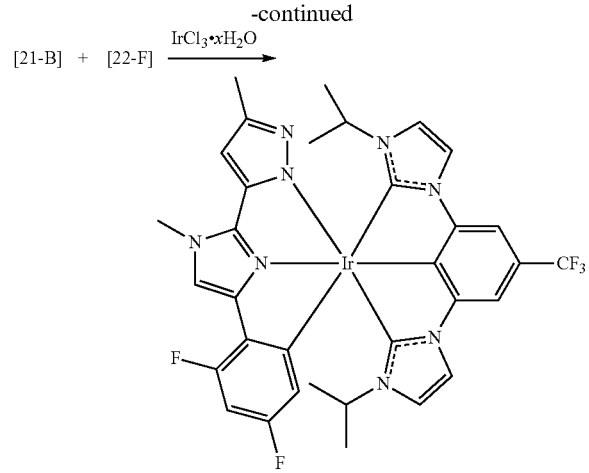

Synthesis of Intermediate Compound [22-D]

Intermediate compound [1-C] (1.0 eq), methyl iodide (1.5 eq), $Pd_2(dba)_3$ (0.002 eq), and $K_3PO_4$ (2.0 eq) were dissolved in toluene (0.1M), and stirred at a temperature of 120° C. for 24 hours. The reaction mixture was cooled to room temperature and subjected to an extraction process three times with dichloromethane and water to obtain an organic layer. The obtained organic layer was dried using magnesium sulfate, and concentrated to synthesize Intermediate compound [22-D](Yield: 74%) using column chromatography.

(2) Synthesis of Intermediate Compound [22-E]

Intermediate compound [22-D] (1.0 eq) was dissolved in tetrahydrofuran (0.5 M), and at a temperature of −78° C., n-butyl lithium (1M in THF, 1.0 eq) was slowly added thereto. After stirring the result at a temperature of −78° C. for 30 minutes, N,N-dimethyl acetamide (1.2 eq) was added thereto. The reaction product was stirred at room temperature for 3 hours. The reaction product was extracted three times with diethyl ether and water to obtain an organic layer. The obtained organic layer was dried using magnesium sulfate, and concentrated to synthesize Intermediate compound [22-E](Yield: 78%) using column chromatography.

(3) Synthesis of Intermediate Compound [22-F]

Intermediate compound [22-E] (1.0 eq) and sodium ethoxide (1.2 eq) were dissolved in tetrahydrofuran (1.0 M), and ethyl acetate (1.1 eq) was added thereto at a temperature of 0° C. The reaction product was stirred for 12 hours at a temperature of 70° C. The reaction product was cooled to room temperature and neutralized with a 2N HCl aqueous solution. After the remaining tetrahydrofuran solvent was removed under reduced pressure, the reaction product was extracted three times with ethyl acetate to obtain an organic layer. The obtained organic layer was dried using sodium sulfate and concentrated. A hydrazine monohydrate (3.0 eq), a catalytic amount of NaH and ethyl alcohol (1.0 M) were added thereto, followed by stirring at a temperature of 60° C. for 12 hours. After cooling the reaction product to room temperature, the solvent was removed under reduced pressure, and an extraction process was performed thereon three times with ethyl acetate and H₂O to obtain an organic layer. The obtained organic layer was dried using sodium sulfate, and concentrated to synthesize Intermediate compound [22-F] (Yield: 75%) using column chromatography.

(4) Synthesis of Compound 22

Intermediate compound [21-B] (1.0 eq), Intermediate compound [22-F] (1.0 eq), iridium chloride hydrate (1.1 eq), and K₂CO₃ (10 eq) were dissolved in propionic acid (0.2 M), and stirred at a temperature of 140° C. for 12 hours. The reaction was cooled to room temperature, and a solvent was removed therefrom under reduced pressure. An organic layer was extracted therefrom three times by using dichloromethane and water. The obtained organic layer was dried using magnesium sulfate, and concentrated to synthesize Compound 22 (Yield: 19%) using column chromatography.

Synthesis Example 9: Synthesis of Compound 36

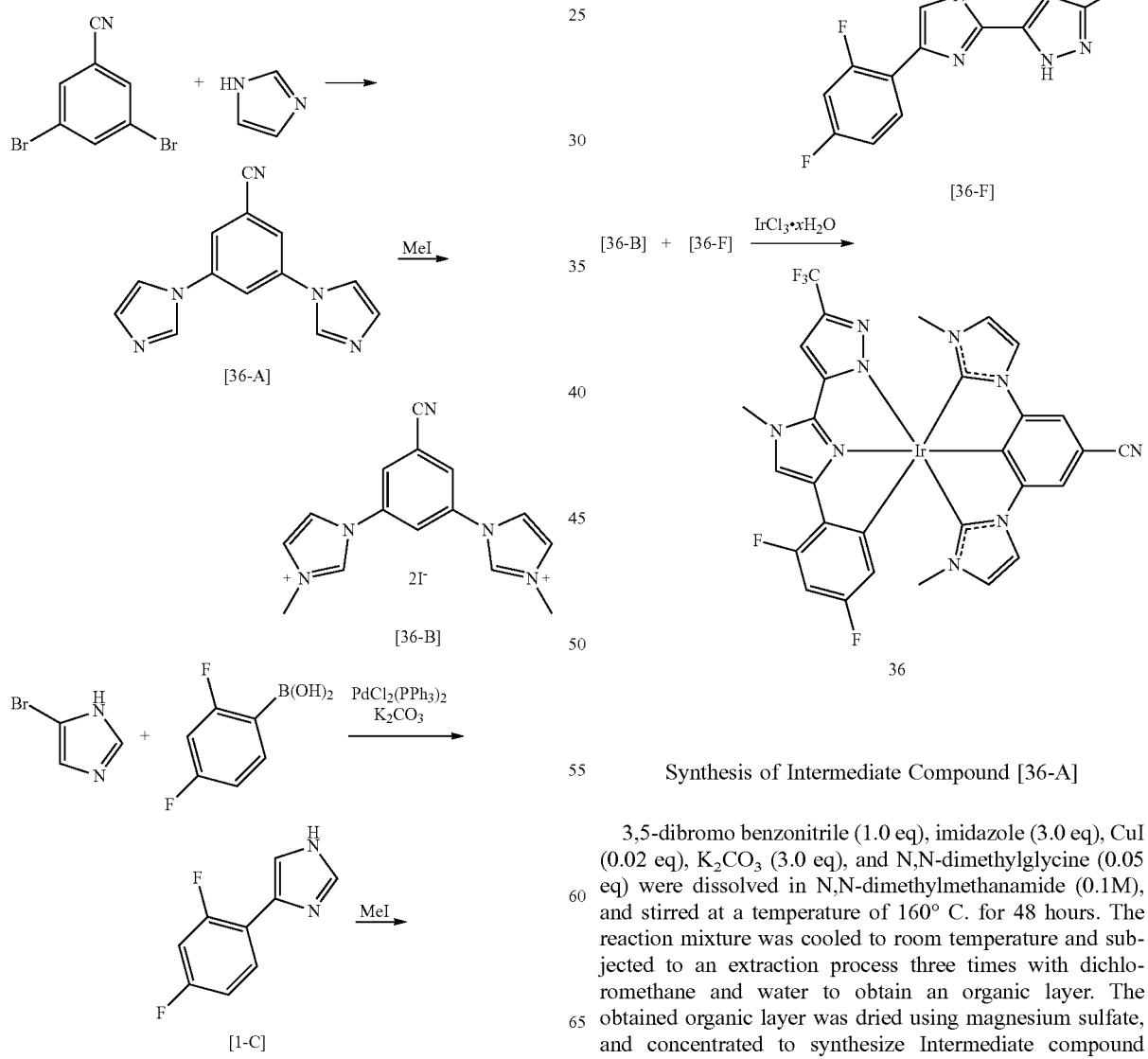

Synthesis of Intermediate Compound [36-A]

3,5-dibromo benzonitrile (1.0 eq), imidazole (3.0 eq), CuI (0.02 eq), K₂CO₃ (3.0 eq), and N,N-dimethylglycine (0.05 eq) were dissolved in N,N-dimethylmethanamide (0.1M), and stirred at a temperature of 160° C. for 48 hours. The reaction mixture was cooled to room temperature and subjected to an extraction process three times with dichloromethane and water to obtain an organic layer. The obtained organic layer was dried using magnesium sulfate, and concentrated to synthesize Intermediate compound [36-A] (Yield: 80%) using column chromatography.

(2) Synthesis of Intermediate Compound [36-B]

Intermediate compound [36-A] (1.0 eq) and iodomethane (3.0 eq) were dissolved in toluene (1.0 M), and stirred at a temperature of 120° C. for 12 hours. The reaction mixture was cooled to room temperature, washed with toluene and filtered to obtain a solid. The obtained solid was dried to synthesize Intermediate compound [36-B] (Yield: 71%).

(3) Synthesis of Intermediate Compound [36-D]

Intermediate compound [1-C] (1.0 eq) and sodium hydroxide (1.0 eq) were dissolved in THF (0.1 M) at a temperature of 65° C. for 10 minutes while stirring. After cooling to room temperature, methyl iodide (0.9 eq) dissolved in THF (0.1 M) was added slowly thereto. The reaction mixture was cooled to room temperature and subjected to an extraction process three times with dichloromethane and water to obtain an organic layer. The obtained organic layer was dried using magnesium sulfate, and concentrated to synthesize Intermediate compound [36-D] (Yield: 79%) using column chromatography.

(4) Synthesis of Intermediate Compound [36-E]

Intermediate compound [36-D] (1.0 eq) was dissolved in tetrahydrofuran (0.5 M), and at a temperature of −78° C., n-butyl lithium (1M in THF, 1.0 eq) was slowly added thereto. After stirring the result at a temperature of −78° C. for 30 minutes, N,N-dimethyl acetamide (1.2 eq) was added thereto. The reaction product was stirred at room temperature for 3 hours. The reaction product was extracted three times with diethyl ether and water to obtain an organic layer. The obtained organic layer was dried using magnesium sulfate, and concentrated to synthesize Intermediate compound [36-E](Yield: 76%) using column chromatography.

(5) Synthesis of Intermediate Compound [36-F]

Intermediate compound [36-E] (1.0 eq) and sodium ethoxide (1.2 eq) were dissolved in tetrahydrofuran (1.0 M), and ethyl 2,2,2-trifluoroacetate (1.1 eq) was added thereto at a temperature of 0° C. The reaction product was stirred for 12 hours at a temperature of 70° C. The reaction product was cooled to room temperature and neutralized with a 2N HCl aqueous solution. After the remaining tetrahydrofuran solvent was removed under reduced pressure, the reaction product was extracted three times with ethyl acetate to obtain an organic layer. The obtained organic layer was dried using sodium sulfate and concentrated. A hydrazine monohydrate (3.0 eq), a catalytic amount of NaH and ethyl alcohol (1.0 M) were added thereto, followed by stirring at a temperature of 60° C. for 12 hours. After cooling the reaction product to room temperature, the solvent was removed under reduced pressure, and an extraction process was performed thereon three times with ethyl acetate and H$_2$O to obtain an organic layer. The obtained organic layer was dried using sodium sulfate, and concentrated to synthesize Intermediate compound [36-F] (Yield: 78%) using column chromatography.

(6) Synthesis of Compound 36

Intermediate compound [36-B] (1.0 eq), Intermediate compound [36-F] (1.0 eq), iridium chloride hydrate (1.1 eq), and K$_2$CO$_3$ (10 eq) were dissolved in propionic acid (0.2 M), and stirred at a temperature of 140° C. for 12 hours. The reaction was cooled to room temperature, and a solvent was removed therefrom under reduced pressure. An organic layer was extracted therefrom three times by using dichloromethane and water. The obtained organic layer was dried using magnesium sulfate, and concentrated to synthesize Compound 36 (Yield: 23%) using column chromatography.

Synthesis Example 10: Synthesis of Compound 37

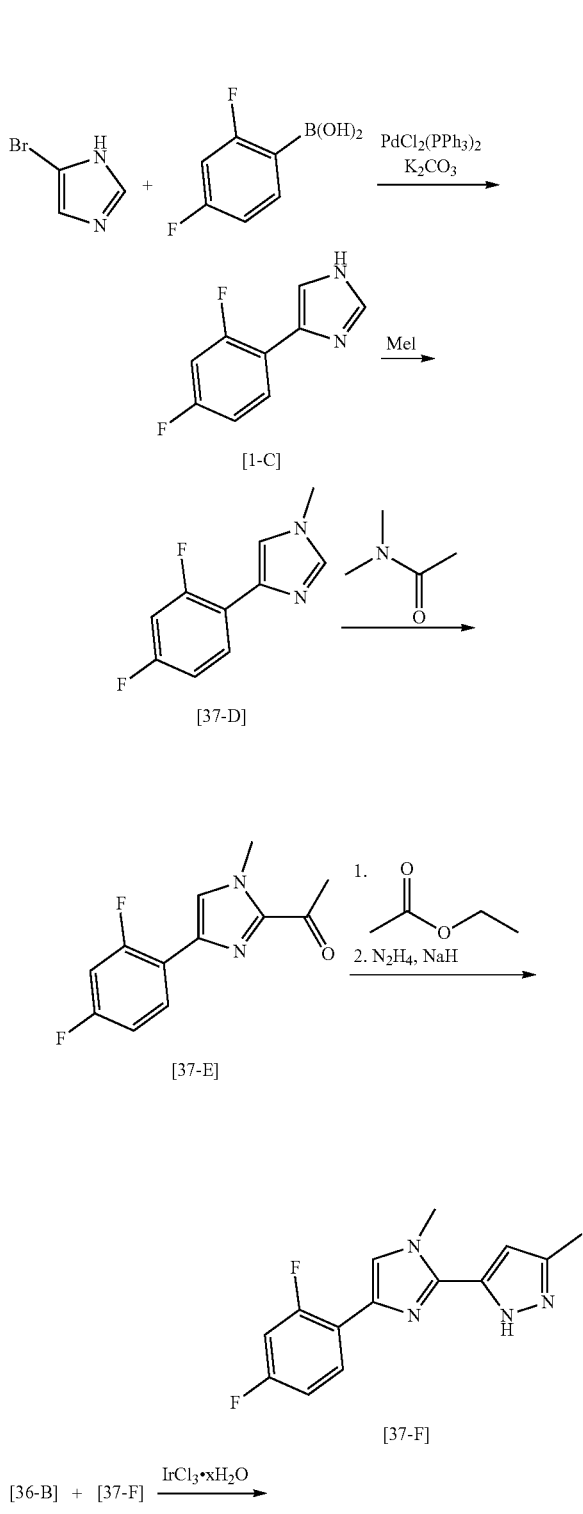

-continued

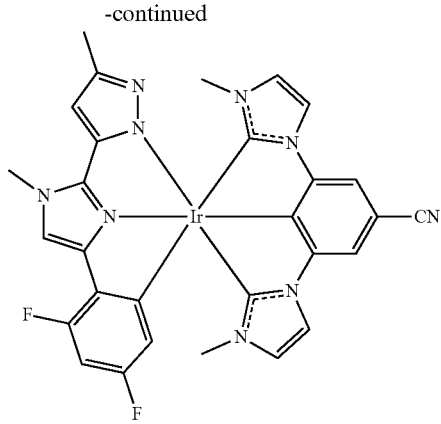

37

Synthesis of Intermediate Compound [37-D]

Intermediate compound [1-C] (1.0 eq), Methyl iodide (1.5 eq), Pd$_2$(dba)$_3$ (0.002 eq), and K$_3$PO$_4$ (2.0 eq) were dissolved in toluene (0.1M), and stirred at a temperature of 120° C. for 24 hours. The reaction mixture was cooled to room temperature and subjected to an extraction process three times with dichloromethane and water to obtain an organic layer. The obtained organic layer was dried using magnesium sulfate, and concentrated to synthesize Intermediate compound [37-D](Yield: 71%) using column chromatography.

(2) Synthesis of Intermediate Compound [37-E]

Intermediate compound [37-D] (1.0 eq) was dissolved in tetrahydrofuran (0.5 M), and at a temperature of −78° C., n-butyl lithium (1M in THF, 1.0 eq) was slowly added thereto. After stirring the result at a temperature of −78° C. for 30 minutes, N,N-dimethyl acetamide (1.2 eq) was added thereto. The reaction product was stirred at room temperature for 3 hours. The reaction product was extracted three times with diethyl ether and water to obtain an organic layer. The obtained organic layer was dried using magnesium sulfate, and concentrated to synthesize Intermediate compound [37-E](Yield: 76%) using column chromatography.

(3) Synthesis of Intermediate Compound [37-F]

Intermediate compound [37-E] (1.0 eq) and sodium ethoxide (1.2 eq) were dissolved in tetrahydrofuran (1.0 M), and ethyl acetate (1.1 eq) was added thereto at a temperature of 0° C. The reaction product was stirred for 12 hours at a temperature of 70° C. The reaction product was cooled to room temperature and neutralized with a 2N HCl aqueous solution. After the remaining tetrahydrofuran solvent was removed under reduced pressure, the reaction product was extracted three times with ethyl acetate to obtain an organic layer. The obtained organic layer was dried using sodium sulfate and concentrated. A hydrazine monohydrate (3.0 eq), a catalytic amount of NaH and ethyl alcohol (1.0 M) were added thereto, followed by stirring at a temperature of 60° C. for 12 hours. After cooling the reaction product to room temperature, the solvent was removed under reduced pressure, and an extraction process was performed thereon three times with ethyl acetate and H$_2$O to obtain an organic layer. The obtained organic layer was dried using sodium sulfate, and concentrated to synthesize Intermediate compound [37-F] (Yield: 75%) using column chromatography.

(4) Synthesis of Compound 37

Intermediate compound [36-B] (1.0 eq), Intermediate compound [37-F] (1.0 eq), iridium chloride hydrate (1.1 eq), and K$_2$CO$_3$ (10 eq) were dissolved in propionic acid (0.2 M), and stirred at a temperature of 140° C. for 12 hours. The reaction was cooled to room temperature, and a solvent was removed therefrom under reduced pressure. An organic layer was extracted therefrom three times by using dichloromethane and water. The obtained organic layer was dried using magnesium sulfate, and concentrated to synthesize Compound 37 (Yield: 22%) using column chromatography.

Synthesis Example 11: Synthesis of Compound 41

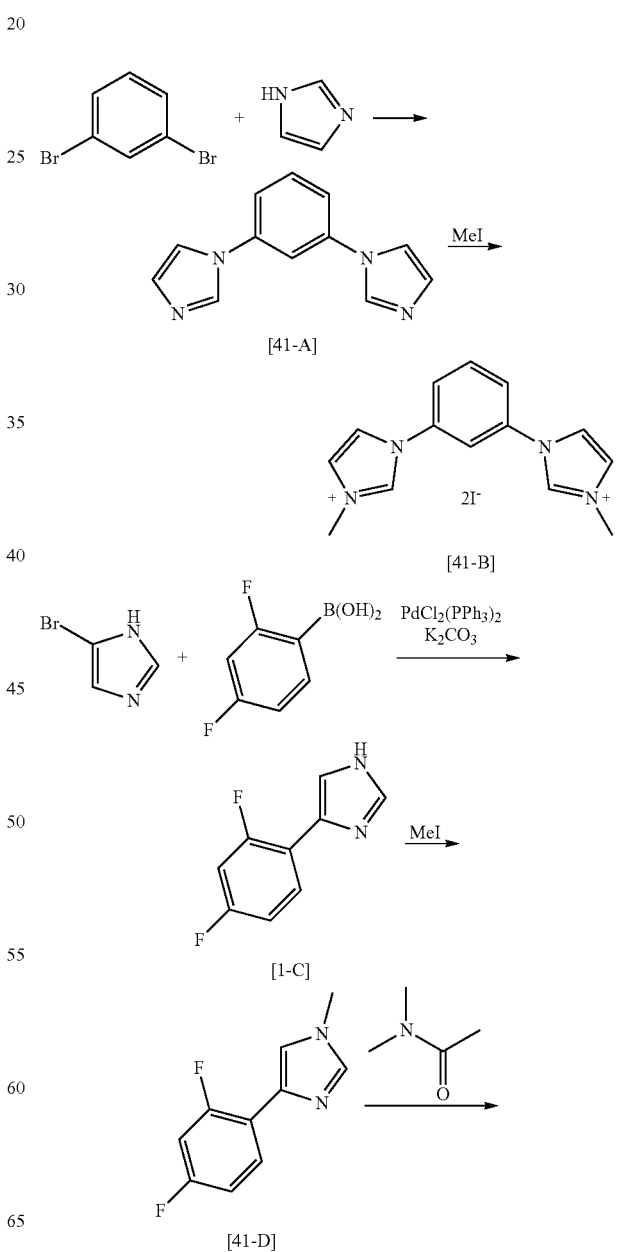

-continued

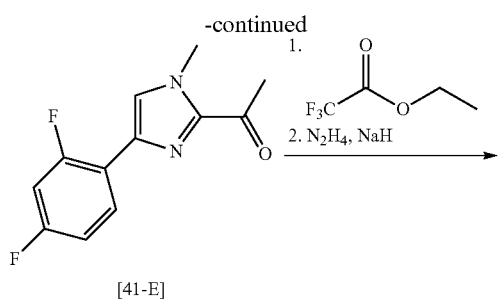

[41-E]

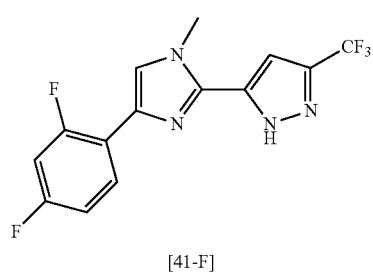

[41-F]

[41-B] + [41-F] →[IrCl₃·xH₂O]

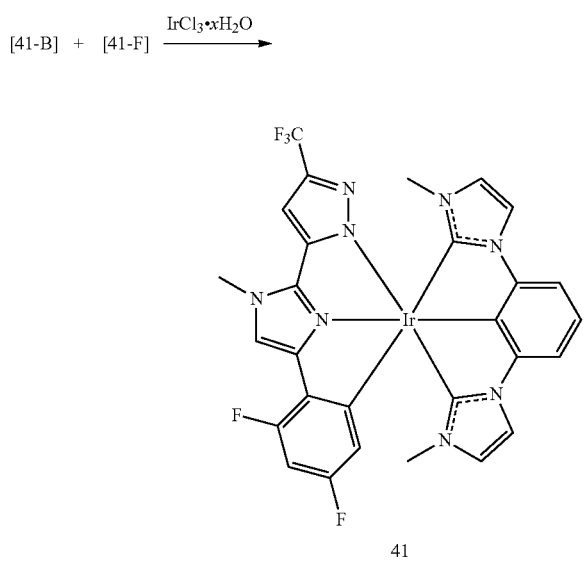

41

Synthesis of Intermediate Compound [41-A]

1,3-dibromobenzene (1.0 eq), imidazole (3.0 eq), CuI (0.02 eq), K₂CO₃ (3.0 eq), and N,N-dimethylglycine (0.05 eq) were dissolved in N,N-dimethylmethanamide (0.1M), and stirred at a temperature of 160° C. for 48 hours. The reaction mixture was cooled to room temperature and subjected to an extraction process three times with dichloromethane and water to obtain an organic layer. The obtained organic layer was dried using magnesium sulfate, and concentrated to synthesize Intermediate compound [41-A] (Yield: 79%) using column chromatography.

(2) Synthesis of Intermediate Compound [41-B]

Intermediate compound [41-A] (1.0 eq) and iodomethane (3.0 eq) were dissolved in toluene (1.0 M), and stirred at a temperature of 120° C. for 12 hours. The reaction mixture was cooled to room temperature, washed with toluene and filtered to obtain a solid. The obtained solid was dried to synthesize Intermediate compound [41-B] (Yield: 76%).

(3) Synthesis of Intermediate Compound [41-D]

Intermediate compound [1-C] (1.0 eq) and sodium hydroxide (1.0 eq) were dissolved in THF (0.1 M) at a temperature of 65° C. for 10 minutes while stirring. After cooling to room temperature, methyl iodide (0.9 eq) dissolved in THF (0.1 M) was added slowly thereto. The reaction mixture was cooled to room temperature and subjected to an extraction process three times with dichloromethane and water to obtain an organic layer. The obtained organic layer was dried using magnesium sulfate, and concentrated to synthesize Intermediate compound [41-D] (Yield: 79%) using column chromatography.

(4) Synthesis of Intermediate Compound [41-E]

Intermediate compound [41-D] (1.0 eq) was dissolved in tetrahydrofuran (0.5 M), and at a temperature of −78° C., n-butyl lithium (1M in THF, 1.0 eq) was slowly added thereto. After stirring the result at a temperature of −78° C. for 30 minutes, N,N-dimethyl acetamide (1.2 eq) was added thereto. The reaction product was stirred at room temperature for 3 hours. The reaction product was extracted three times with diethyl ether and water to obtain an organic layer. The obtained organic layer was dried using magnesium sulfate, and concentrated to synthesize Intermediate compound [41-E](Yield: 76%) using column chromatography.

(5) Synthesis of Intermediate Compound [41-F]

Intermediate compound [41-E] (1.0 eq) and sodium ethoxide (1.2 eq) were dissolved in tetrahydrofuran (1.0 M), and ethyl 2,2,2-trifluoroacetate (1.1 eq) was added thereto at a temperature of 0° C. The reaction product was stirred for 12 hours at a temperature of 70° C. The reaction product was cooled to room temperature and neutralized with a 2N HCl aqueous solution. After the remaining tetrahydrofuran solvent was removed under reduced pressure, the reaction product was extracted three times with ethyl acetate to obtain an organic layer. The obtained organic layer was dried using sodium sulfate and concentrated. A hydrazine monohydrate (3.0 eq), a catalytic amount of NaH and ethyl alcohol (1.0 M) were added thereto, followed by stirring at a temperature of 60° C. for 12 hours. After cooling the reaction product to room temperature, the solvent was removed under reduced pressure, and an extraction process was performed thereon three times with ethyl acetate and H₂O to obtain an organic layer. The obtained organic layer was dried using sodium sulfate, and concentrated to synthesize Intermediate compound [41-F] (Yield: 78%) using column chromatography.

(6) Synthesis of Compound 41

Intermediate compound [41-B] (1.0 eq), Intermediate compound [41-F] (1.0 eq), iridium chloride hydrate (1.1 eq), and K₂CO₃ (10 eq) were dissolved in propionic acid (0.2 M), and stirred at a temperature of 140° C. for 12 hours. The reaction was cooled to room temperature, and a solvent was removed therefrom under reduced pressure. An organic layer was extracted therefrom three times by using dichloromethane and water. The obtained organic layer was dried using magnesium sulfate, and concentrated to synthesize Compound 41 (Yield: 23%) using column chromatography.

Synthesis Example 12: Synthesis of Compound 42

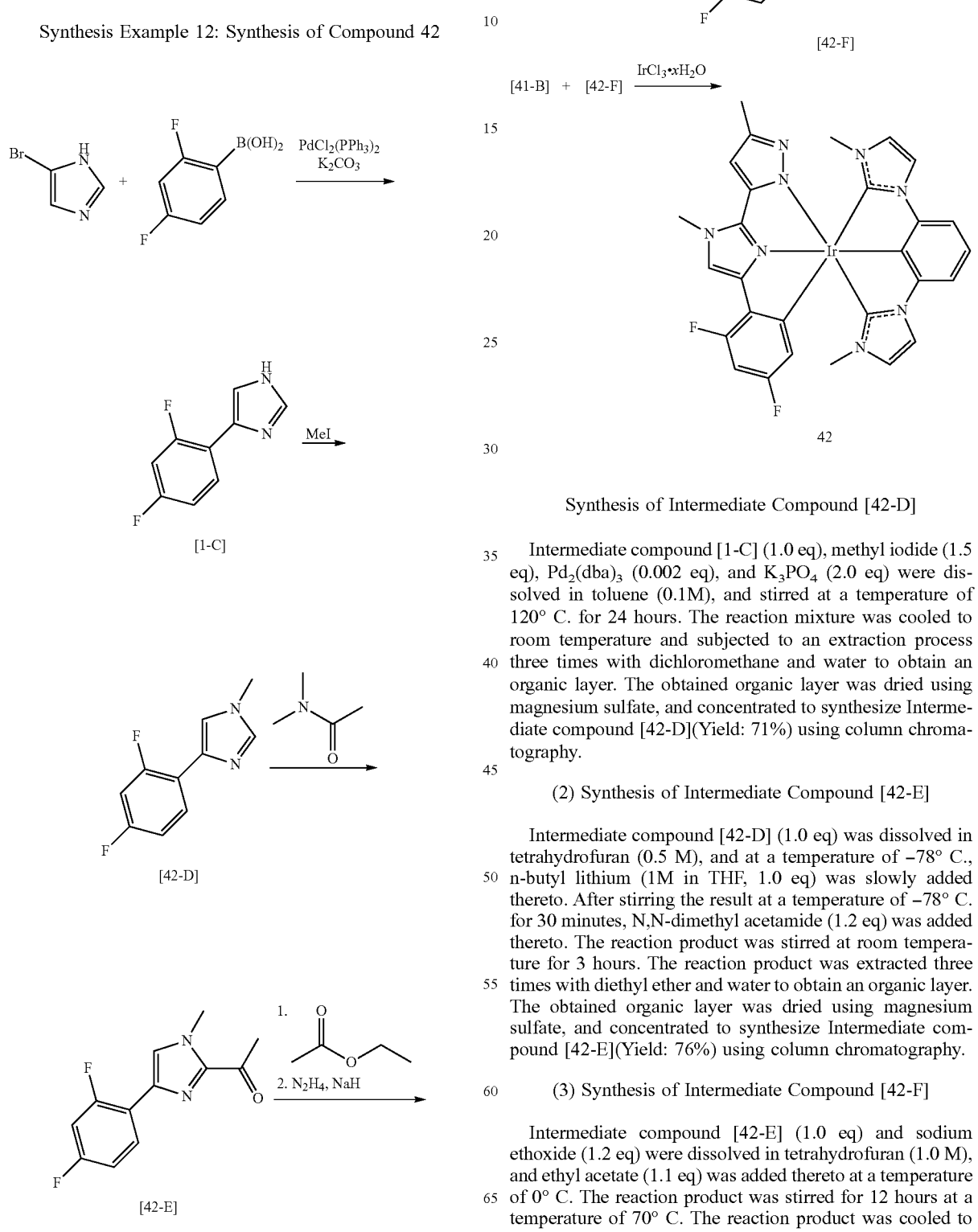

Synthesis of Intermediate Compound [42-D]

Intermediate compound [1-C] (1.0 eq), methyl iodide (1.5 eq), Pd$_2$(dba)$_3$ (0.002 eq), and K$_3$PO$_4$ (2.0 eq) were dissolved in toluene (0.1M), and stirred at a temperature of 120° C. for 24 hours. The reaction mixture was cooled to room temperature and subjected to an extraction process three times with dichloromethane and water to obtain an organic layer. The obtained organic layer was dried using magnesium sulfate, and concentrated to synthesize Intermediate compound [42-D](Yield: 71%) using column chromatography.

(2) Synthesis of Intermediate Compound [42-E]

Intermediate compound [42-D] (1.0 eq) was dissolved in tetrahydrofuran (0.5 M), and at a temperature of −78° C., n-butyl lithium (1M in THF, 1.0 eq) was slowly added thereto. After stirring the result at a temperature of −78° C. for 30 minutes, N,N-dimethyl acetamide (1.2 eq) was added thereto. The reaction product was stirred at room temperature for 3 hours. The reaction product was extracted three times with diethyl ether and water to obtain an organic layer. The obtained organic layer was dried using magnesium sulfate, and concentrated to synthesize Intermediate compound [42-E](Yield: 76%) using column chromatography.

(3) Synthesis of Intermediate Compound [42-F]

Intermediate compound [42-E] (1.0 eq) and sodium ethoxide (1.2 eq) were dissolved in tetrahydrofuran (1.0 M), and ethyl acetate (1.1 eq) was added thereto at a temperature of 0° C. The reaction product was stirred for 12 hours at a temperature of 70° C. The reaction product was cooled to room temperature and neutralized with a 2N HCl aqueous solution. After the remaining tetrahydrofuran solvent was removed under reduced pressure, the reaction product was extracted three times with ethyl acetate to obtain an organic layer. The obtained organic layer was dried using sodium sulfate and concentrated. A hydrazine monohydrate (3.0 eq), a catalytic amount of NaH and ethyl alcohol (1.0 M) were added thereto, followed by stirring at a temperature of 60° C. for 12 hours. After cooling the reaction product to room temperature, the solvent was removed under reduced pressure, and an extraction process was performed thereon three times with ethyl acetate and H₂O to obtain an organic layer. The obtained organic layer was dried using sodium sulfate, and concentrated to synthesize Intermediate compound [42-F] (Yield: 75%) using column chromatography.

(4) Synthesis of Compound 42

Intermediate compound [41-B] (1.0 eq), Intermediate compound [42-F] (1.0 eq), iridium chloride hydrate (1.1 eq), and $K_2CO_3$ (10 eq) were dissolved in propionic acid (0.2 M), and stirred at a temperature of 140° C. for 12 hours. The reaction was cooled to room temperature, and a solvent was removed therefrom under reduced pressure. An organic layer was extracted therefrom three times by using dichloromethane and water. The obtained organic layer was dried using magnesium sulfate, and concentrated to synthesize Compound 42 (Yield: 22%) using column chromatography.

$^1$H NMR and LC-MS of the compounds synthesized in Synthesis Examples 1 to 12 are shown in Table 1 below.

Even compounds other than the compounds shown in Table 1 may be easily recognized by those skilled in the art by referring to the above synthesis routes and source materials.

TABLE 1

| Compound No. | $^1$H NMR (CDCl$_3$, 400 MHz) (ppm) | LC-MS found | LC-MS calc. |
|---|---|---|---|
| 1 | 9.13 (1H, s), 7.00 (1H, m), 6.94 (1 H, t), 6.72 (2H, m), 6.47 (2H, m), 6.02 (1H, s), 5.21 (2H, dd), 5.06 (2H, dd), 4.10 (2H, dd), 2.71 (6H, s), 2.50 (6H, m), 2.27 (3H, s) | 932.20 | 932.19 |
| 2 | 9.13 (1H, s), 7.00 (1H, m), 6.94 (1H, t), 6.72 (2H, m), 6.47 (2H, m), 6.02 (1H, s), 5.21 (2H, dd), 5.06 (2H, dd), 4.10 (2H, m), 2.71 (6H, s), 2.50 (6H, m), 2.33 (3H, s), 2.27 (3H, s) | 874.21 | 874.20 |
| 6 | 7.53 (1H, s), 7.38 (1H, s), 7.31 (1H, s), 7.27 (1H, s), 7.08 (1H, s), 6.87 (2H, m), 6.29 (2H, m), 3.73 (3H, s), 2.71 (6H, s) | 824.12 | 824.12 |
| 7 | 7.53 (1H, s), 7.38 (1H, s), 7.31 (1H, s), 7.27 (1H, s), 7.08 (1H, s), 6.87 (2H, m), 6.29 (2H, m), 3.73 (3H, s), 2.71 (6H, s), 2.33 (3H, s) | 770.15 | 770.12 |
| 11 | 8.55 (2H, m), 8.19 (2H, m), 7.52 (1H, s), 7.16 (1H, s), 7.11 (1H, s), 7.10 (1H, s), 7.03 (1H, s), 6.47 (1H, s), 6.02 (1H, s), 5.21 (2H, s), 5.06 (2H, s), 4.10 (1H, s), 2.71 (6H, m) | 879.18 | 879.11 |
| 12 | 8.55 (2H, m), 8.19 (2H, m), 7.52 (1H, s), 7.16 (1H, s), 7.11 (1H, s), 7.10 (1H, s), 7.03 (1H, s), 6.47 (1H, s), 6.02 (1H, s), 5.21 (2H, s), 5.06 (2H, s), 4.10 (1H, s), 3.73 (3H, s), 2.71 (6H, m) | 823.20 | 823.21 |
| 21 | 7.53 (1H, s), 7.00 (1H, m), 6.94 (1H, m), 6.47 (2H, s), 6.02 (1H, s), 5.21 (2H, d), 5.06 (2H, d), 4.10 (2H, s), 3.73 (3H, s), 2.83 (2H, dd), 1.26 (12H, s) | 880.19 | 880.17 |
| 22 | 7.53 (1H, s), 7.00 (1H, m), 6.94 (1H, m), 6.47 (2H, s), 6.02 (1H, s), 5.21 (2H, d), 5.06 (2H, d), 4.10 (2H, s), 3.73 (3H, s), 2.83 (2H, dd), 2.33 (3H, s), 1.26 (12H, s) | 826.21 | 826.20 |
| 36 | 7.53 (1H, s), 7.38 (1H, m), 7.31 (1H, s), 7.27 (1H, s), 7.08 (1H, s), 6.87 (2H, m), 6.29 (2H, m), 3.73 (3H, s), 2.71 (6H, s) | 781.13 | 781.12 |
| 37 | 7.53 (1H, s), 7.38 (1H, m), 7.31 (1H, s), 7.27 (1H, s), 7.08 (1H, s), 6.87 (2H, m), 6.29 (2H, m), 3.73 (3H, s), 2.71 (6H, s), 2.33 (3H, s) | 727.16 | 727.15 |
| 41 | 7.53 (1H, s), 7.38 (1H, m), 7.31 (1H, s), 7.27 (1H, s), 7.08 (1H, s), 6.87 (2H, m), 6.54 (1H, s), 6.29 (2H, m), 3.73 (3H, s), 2.71 (6H, s) | 756.14 | 756.13 |
| 42 | 7.53 (1H, s), 7.38 (1H, m), 7.31 (1H, s), 7.27 (1H, s), 7.08 (1H, s), 6.87 (2H, m), 6.29 (2H, m), 3.73 (3H, s), 2.71 (6H, s), 2.33 (3H, s) | 702.16 | 702.17 |

EVALUATION EXAMPLE

The highest occupied molecular orbital (HOMO) energy level, LUMO energy level, and T1 energy of the compounds synthesized according to Synthesis Example 1 to 12 were measured, and quantum simulations of a bond dissociation energy (BIDE) between Ir and a nitrogen atom in an imidazole ring and $^3$MC state energy were performed, and results thereof are shown in Table 2. HOMO, LUMO and T1 energy were measured by differential pulse voltammetry and UV-Vis spectroscopy. The bond dissociation energy was calculated by structural optimization at B3LYP, 6-31G (d, p) level using the Gaussian program's density functional theory (DFT) calculation method.

TABLE 2

| | HOMO energy level (eV) | LUMO energy level (eV) | T1 (nm) | T1 energy (eV) | Bond dissociation energy (eV) | $^3$MC state energy (eV) |
|---|---|---|---|---|---|---|
| Cormpound C1 | −5.72 | −1.78 | 458.51 | 2.70 | 3.58 | 0.41 |
| Compound C2 | −5.27 | −1.53 | 476.10 | 2.60 | 3.58 | 0.41 |
| Compound C3 | −5.39 | −1.46 | 446.11 | 2.78 | 3.54 | 0.39 |
| Compound 1 | −5.05 | −0.86 | 447.43 | 2.77 | 3.85 | 0.82 |
| Compound 2 | −4.89 | −1.40 | 455.43 | 2.72 | 3.85 | 0.82 |
| Compound 6 | −5.03 | −1.51 | 455.54 | 2.72 | 3.90 | 0.91 |
| Compound 7 | −4.82 | −1.10 | 493.54 | 2.51 | 3.90 | 0.91 |
| Compound 11 | −4.89 | −1.40 | 455.43 | 2.72 | 3.83 | 0.82 |
| Compound 12 | −4.85 | −1.48 | 475.47 | 2.61 | 3.83 | 0.82 |
| Compound 21 | −5.03 | −1.51 | 455.54 | 2.72 | 3.87 | 0.82 |
| Compound 22 | −4.82 | −1.10 | 493.54 | 2.51 | 3.87 | 0.82 |
| Compound 36 | −5.03 | −1.51 | 455.54 | 2.72 | 3.85 | 0.82 |
| Compound 37 | −4.82 | −1.10 | 493.54 | 2.51 | 3.85 | 0.82 |
| Compound 41 | −4.82 | −1.10 | 493.54 | 2.51 | 3.41 | 0.82 |
| Compound 42 | −4.75 | −1.57 | 502.7 | 2.47 | 3.41 | 0.82 |

T1(nm) is the wavelength calculated with T1 energy (eV) according to the photon energy formula E = hc/λ.

<Compound C1>

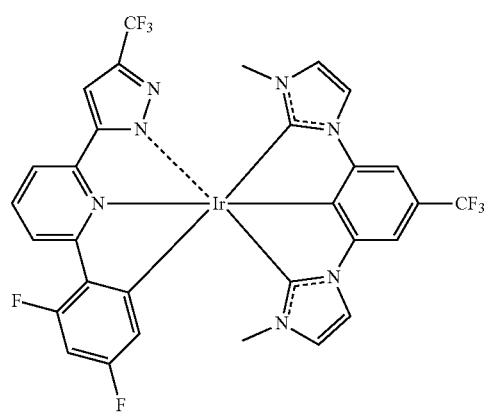

<Compound C2>

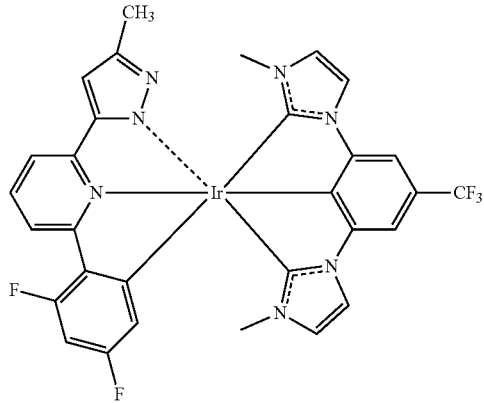

<Compound C3>

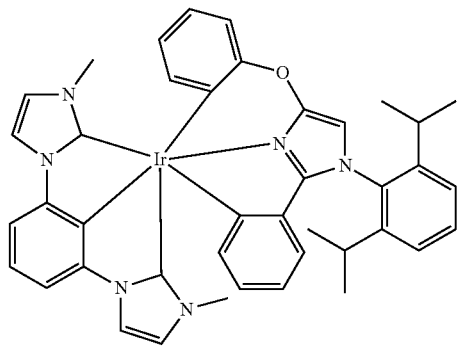

EXAMPLES

Example 1

For an anode, Corning 15 Ω/cm² (1200 Å) ITO glass substrate was cut into a size of 50 mm×50 mm×0.7 mm, ultrasonically cleaned with isopropyl alcohol and pure water, each for 5 minutes, and irradiated with ultraviolet light for 30 minutes, followed by exposure to ozone for cleaning. The resultant structure was placed in a vacuum deposition apparatus. 2-TNATA was vacuum-deposited on the glass substrate to form a hole injection layer having a thickness of 600 Å, and 4,4'-bis[N-(1-naphthyl)-N-phenyl aminobiphenyl (hereinafter referred to as NPB) was vacuum-deposited on the hole injection layer to form a hole transport layer having a thickness of 300 Å. Compound 1 (weight ratio 10%), which is a dopant, and 3,3-di(9H-carbazol-9-yl)biphenyl (mCBP), which is a host, were co-deposited on the hole transport layer to form an emission layer having a thickness of 300 Å. Diphenyl(4-(triphenyl-silyl)phenyl)-phosphine oxide (TSPO1) was vacuum-deposited on the emission layer to form a hole blocking layer having a thickness of 50 Å. Alq₃ was deposited on the hole blocking layer to form an electron transport layer having a thickness of 300 Å, and LiF, which is a halogenated alkaline metal, was deposited on the electron transport layer to form an electron injection layer having a thickness of 10 Å, and Al was vacuum-deposited thereon to form a cathode having a thickness of 3000 Å to form a LiF/Al electrode, thereby completing the manufacture of an organic light-emitting device.

Examples 2 to 12

Organic light-emitting devices were manufactured in the same manner as in Example 1, except that, in forming an emission layer, as a dopant, compounds shown in Table 3 were used instead of Compound 1.

Comparative Examples 1 to 3

Organic light-emitting devices were manufactured in the same manner as in Example 1, except that, in forming an emission layer, as a dopant, Compounds C1 to C3 were used instead of Compound 1.

The driving voltage at current density 50 mA/cm$^2$, luminance, luminescent efficiency, and maximum emission wavelength of the organic light-emitting devices manufactured according to Examples 1 to 12 and Comparative Examples 1 to 3 were measured by using Keithley SMU 236 and luminance meter PR650. The results thereof are shown in Table 3.

TABLE 3

| | Emission layer | Driving voltage (V) | Current density (mA/cm$^2$) | Luminance (cd/m$^2$) | Efficiency (cd/A) | Maximum emission wavelength (nm) |
| --- | --- | --- | --- | --- | --- | --- |
| Example 1 | Compound 1 | 5.33 | 50 | 4138 | 8.28 | 447 |
| Example 2 | Compound 2 | 5.37 | 50 | 4200 | 8.40 | 455 |
| Example 3 | Compound 6 | 5.35 | 50 | 4137 | 8.28 | 455 |
| Example 4 | Compound 7 | 5.23 | 50 | 4199 | 8.40 | 493 |
| Example 5 | Compound 11 | 5.33 | 50 | 4186 | 8.38 | 455 |
| Example 6 | Compound 12 | 5.34 | 50 | 4144 | 8.29 | 475 |
| Example 7 | Compound 21 | 5.33 | 50 | 4140 | 8.29 | 455 |
| Example 8 | Compound 22 | 5.09 | 49 | 4285 | 8.57 | 493 |
| Example 9 | Compound 36 | 5.31 | 50 | 4284 | 8.57 | 455 |
| Example 10 | Compound 37 | 5.21 | 50 | 4137 | 8.28 | 493 |
| Example 11 | Compound 41 | 5.02 | 49 | 4012 | 8.03 | 493 |
| Example 12 | Compound 42 | 4.97 | 48 | 4120 | 8.24 | 502 |
| Comparative Example 1 | Compound C1 | 5.32 | 50 | 3757 | 7.51 | 447 |
| Comparative Example 2 | Compound C2 | 5.50 | 50 | 3810 | 7.62 | 510 |
| Comparative Example 3 | Compound C3 | 6.11 | 50 | 3736 | 7.47 | 478 |

As shown in Table 3, the organic light-emitting device of Examples 1 to 12 using the compound according to one embodiment as a dopant of an emission layer have lower driving voltage, higher efficiency, and higher color purity than compared to the organic light-emitting device of Comparative Examples 1 to 3.

For example, when the organometallic compound is used in an organic light-emitting device of the device, high color purity can be realized, and excellent effects can be obtained in terms of driving voltage, efficiency and lifespan.

Organic light-emitting devices, including the organometallic compounds, can have low driving voltage, high efficiency and a long lifespan, and emission wavelengths thereof can be easily controlled, resulting in high color purity.

It should be understood that embodiments described herein should be considered in a descriptive sense only and not for purposes of limitation. Descriptions of features or aspects within each embodiment should typically be considered as available for other similar features or aspects in other embodiments. While the embodiments have been described with reference to the figures, it will be understood by those of ordinary skill in the art that various changes in form and details may be made therein without departing from the spirit and scope as defined by the following claims.

What is claimed is:

1. An organic light-emitting device comprising:
    a first electrode;
    a second electrode facing the first electrode; and
    an organic layer disposed between the first electrode and the second electrode and comprising an emission layer,
    wherein the organic light-emitting device includes an organometallic compound represented by Formula 1:

$$M(L_A)_{n1}(L_B)_{n2} \quad \text{<Formula 1>}$$

wherein in Formula 1,

M is selected from platinum (Pt), palladium (Pd), copper (Cu), zinc (Zn), silver (Ag), gold (Au), iridium (Ir), rhodium (Rh), cobalt (Co), ruthenium (Ru), rhenium (Re), osmium (Os), titanium (Ti), zirconium (Zr), hafnium (Hf), europium (Eu), terbium (Tb), and thulium (Tm), n1 is 1 or 2, n2 is 0 or 1, the sum of n1 and n2 is 2, $L_A$ is a tridentate ligand represented by Formula 1A, and $L_B$ is a tridentate ligand represented by Formula 1B:

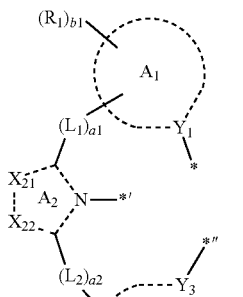

<Formula 1A>

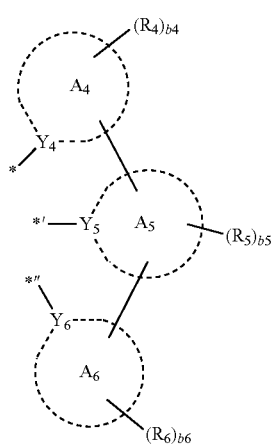

<Formula 1B> wherein in Formulae 1A and 1B,

*, *', and *" each are a binding site to M, $Y_1$ and $Y_3$ to $Y_6$ are each independently selected from N and C, $X_{21}$ is selected from $C(Z_{21})$, $N(Z_{21})$, N, O, and S, $X_{22}$ is selected from $C(Z_{22})$, $N(Z_{22})$, N, O, and S, $A_1$ is selected from groups represented by Formulae A1-1 to A1-7 and A1-14 to A1-21, and $A_3$ is selected from groups represented by Formulae A3-1 to A3-7:

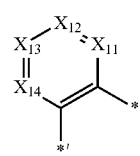

A1-1

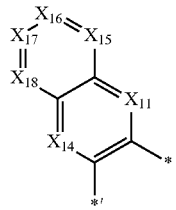

A1-2

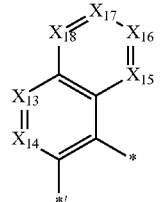

A1-3

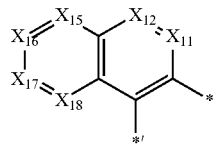

A1-4

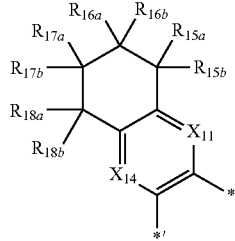

A1-5

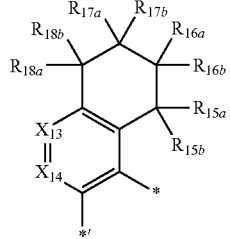

A1-6

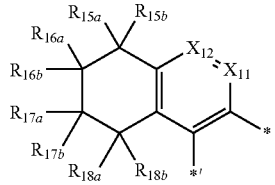

A1-7

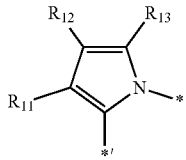

A1-14

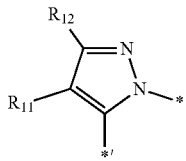

A1-15

-continued

A1-16

A1-17

A1-18

A1-19

A1-20

A1-21

A3-1

A3-2

A3-3

A3-4

A3-5

A3-6

A3-7 wherein in Formulae A1-1 to A1-7, A1-14 to A1-21, and A3-1 to A3-7

$X_{11}$ is N or $C(R_{11})$, $X_{12}$ is N or $C(R_{12})$, $X_{13}$ is N or $C(R_{13})$, $X_{14}$ is N or $C(R_{14})$, $X_{15}$ is N or $C(R_{15})$, $X_{16}$ is N or $C(R_{16})$, $X_{17}$ is N or $C(R_{17})$, $X_{18}$ is N or $C(R_{18})$, $X_{31}$ is N or $C(R_{31})$, $X_{32}$ is N or $C(R_{32})$, $X_{33}$ is N or $C(R_{33})$, $X_{34}$ is N or $C(R_{34})$, $X_{35}$ is N or $C(R_{35})$, $X_{36}$ is N or $C(R_{36})$, $X_{37}$ is N or $C(R_{37})$, $X_{38}$ is N or $C(R_{38})$, $R_{11}$ to $R_{18}$ and $R_{15a}$ to $R_{18b}$ are each independently the same as described in connection with $R_1$ in Formula 1A, $R_{31}$ to $R_{38}$ and $R_{35a}$ to $R_{38b}$ are each independently the same as described in connection with $R_3$ in Formula 1A,

* and *" each indicated a binding site to M, and

*' indicates a binding site to a neighboring atom, $A_2$ is selected from groups represented by Formulae A2-1 to A2-18:

A2-1

A2-2
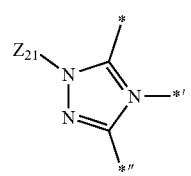
A2-3
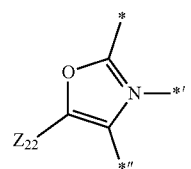
A2-4
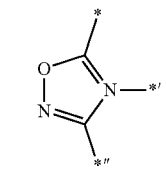
A2-5
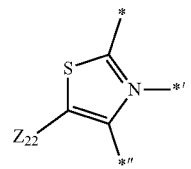
A2-6
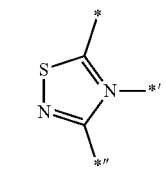
A2-7
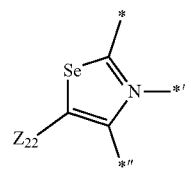
A2-8
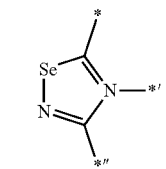
A2-9
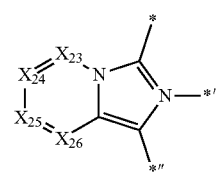
A2-10
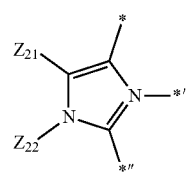
A2-11
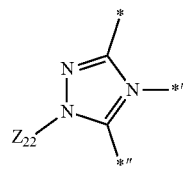
A2-12
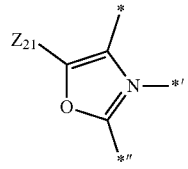
A2-13
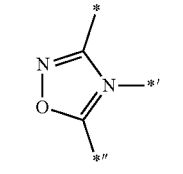
A2-14
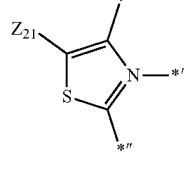
A2-15
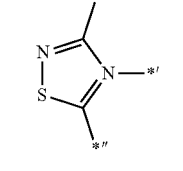
A2-16
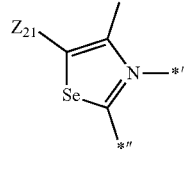
A2-17
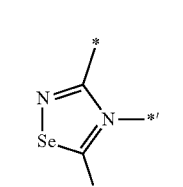
A2-18
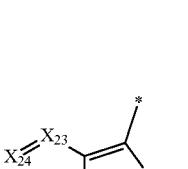

wherein in Formulae A2-1 to A2-18, $X_{23}$ is N or $C(R_{21})$, $X_{24}$ is N or $C(R_{22})$, $X_{25}$ is N or $C(R_{23})$, $X_{26}$ is N or $C(R_{24})$, $Z_{21}$ and $Z_{22}$ are the same as described in connection with Formula 1A, $R_{21}$ to $R_{24}$ are the same as described in connection with $R_1$ in Formula 1A, \* is a binding site to $L_1$, \*' is a binding site to M, and \*'' is a binding site to $L_2$, $A_4$ is selected from groups represented by Formulae A4-1 to A4-26, and $A_6$ is selected from groups represented by Formulae A6-1 to A6-26:

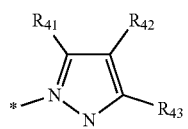
A4-1

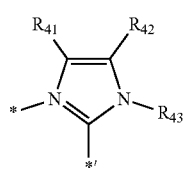
A4-2

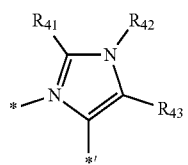
A4-3

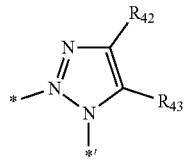
A4-4

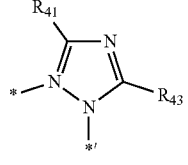
A4-5

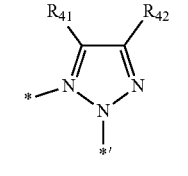
A4-6

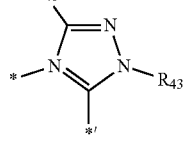
A4-7

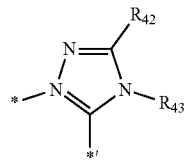
A4-8

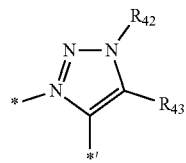
A4-9

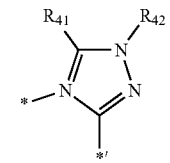
A4-10

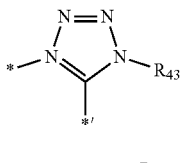
A4-11

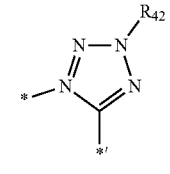
A4-12

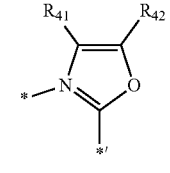
A4-13

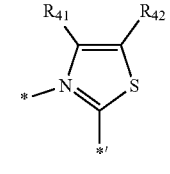
A4-14

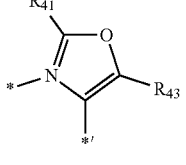
A4-15

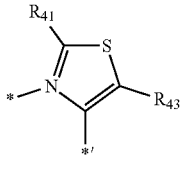
A4-16

| | |
|---|---|
| 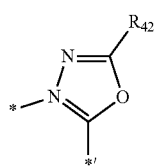 A4-17 | 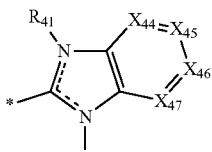 A4-26 |
| 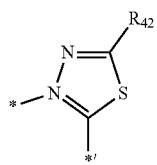 A4-18 | 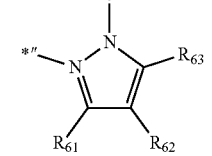 A6-1 |
| 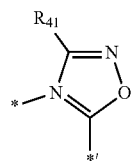 A4-19 | 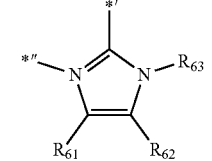 A6-2 |
| 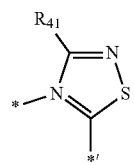 A4-20 | 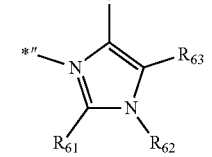 A6-3 |
| 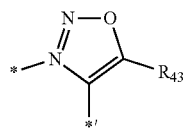 A4-21 | 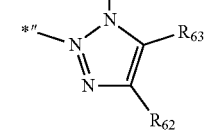 A6-4 |
| 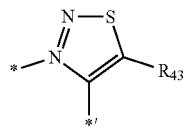 A4-22 | 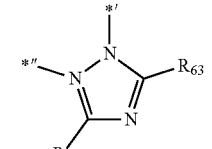 A6-5 |
| 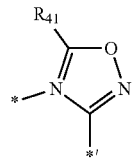 A4-23 | 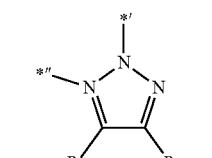 A6-6 |
| 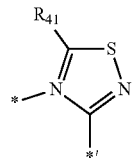 A4-24 | 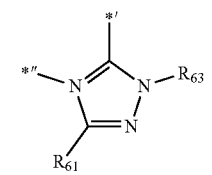 A6-7 |
| 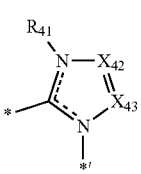 A4-25 | A6-8 |

193
-continued
A6-9
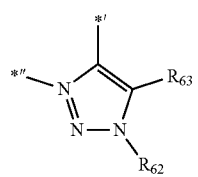
A6-10
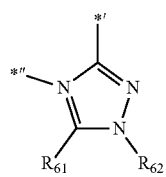
A6-11
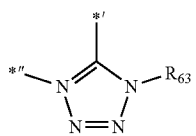
A6-12
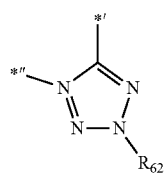
A6-13
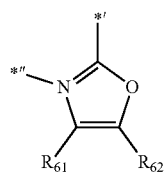
A6-14
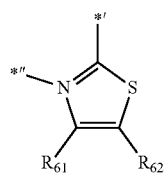
A6-15
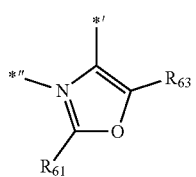
A6-16
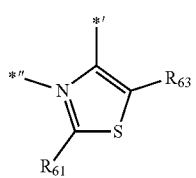
A6-17
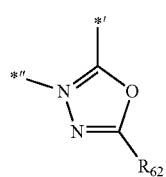
194
-continued
A6-18
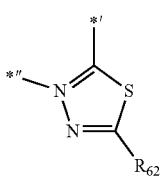
A6-19
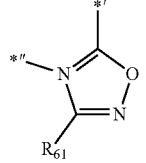
A6-20
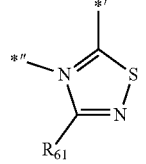
A6-21
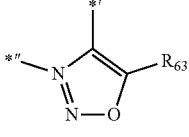
A6-22
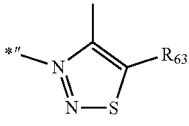
A6-23
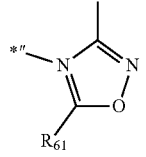
A6-24
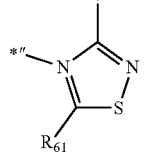
A6-25
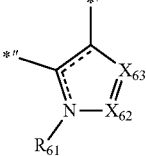
A6-26
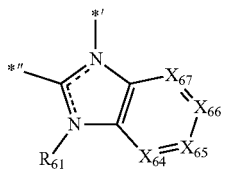

wherein in Formulae A-4-1 to A4-26 and A6-1 to A6-26,
$X_{42}$ is N or $C(R_{42})$, $X_{43}$ is N or $C(R_{43})$, $X_{44}$ is N or $C(R_{44})$, $X_{45}$ is N or $C(R_{45})$, $X_{46}$ is N or $C(R_{46})$, $X_{47}$ is N or $C(R_{47})$,
$X_{62}$ is N or $C(R_{62})$, $X_{63}$ is N or $C(R_{63})$, $X_{64}$ is N or $C(R_{64})$, $X_{65}$ is N or $C(R_{65})$, $X_{66}$ is N or $C(R_{66})$, $X_{67}$ is N or $C(R_{67})$,
$R_{41}$ to $R_{47}$ are each independently the same as described in connection with $R_4$ in Formula 1B,
$R_{61}$ to $R_{67}$ are each independently the same as described in connection with $R_6$ in Formula 1B,
* and *''' each indicate a binding site to M, and
*' indicates a binding site to a neighboring atom,
$A_5$ is selected from a group represented by one of Formulae A5-1 and A5-2:

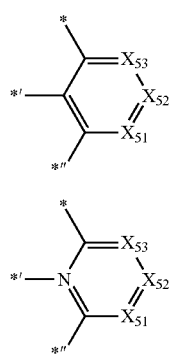

wherein in Formulae A5-1 and A5-2,
$X_{51}$ is N or $C(R_{51})$, $X_{52}$ is N or $C(R_{52})$, and $X_{53}$ is N or $C(R_{53})$,
$R_{51}$ to $R_{53}$ are each independently the same as described in connection with $R_5$ in Formula 1B,
* is a binding site to $A_4$,
*' is a binding site to M, and
*''' is a binding site to $A_6$,
wherein in Formulae 1A and 1B,
$L_1$ and $L_2$ are each independently selected from *—O—*', *—S—*', *—C($R_7$)($R_8$)—*', *—C($R_7$)=*', *=C($R_7$)—*', *—C($R_7$)=C($R_8$)—*', *—C(=O)—*', *—C(=S)—*', *—C≡C—*', *—B($R_7$)—*', *—N($R_7$)—*', *—P($R_7$)—*', *—Si($R_7$)($R_8$)—*', *—P($R_7$)($R_8$)—*', and *—Ge($R_7$)($R_8$)—*',
a1 and a2 are each independently selected from 0, 1, and 2,
$Z_{21}$, $Z_{22}$, $R_1$, and $R_3$ to $R_8$ are each independently selected from hydrogen, deuterium, —F —Cl, —Br, —I, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —C(=O)($Q_1$), —S(=O)$_2$($Q_1$), and —P(=O)($Q_1$)($Q_2$),
b1 and b3 to b6 are each independently selected from 1, 2, 3, 4, 5, 6, 7, and 8,
with the proviso that: at least one pair of substituents are optionally linked together to form a substituted or unsubstituted $C_5$-$C_{60}$ carbocyclic group or a substituted or unsubstituted $C_1$-$C_{60}$ heterocyclic group, the pair of substituents selected from the group consisting of $Z_{21}$ and $Z_{22}$, two neighboring $R_1$(s) in $R_1$(s) in the number of b1, two neighboring $R_3$(s) in $R_3$(s) in the number of b3, two neighboring $R_4$(s) in $R_4$(s) in the number of b4, two neighboring $R_5$(s) in $R_5$ (s) in the number of b5, two neighboring $R_6$(s) in $R_6$ (s) in the number of b6, $R_1$ and $R_7$, and $R_3$ and $R_7$, and
one of the following conditions i) to iii) is satisfied,
i) $Y_1$ is N, and $A_1$ is a $Y_1$-containing 5-membered ring, a $Y_1$-containing 6-membered ring, a $C_5$-$C_{60}$ heterocyclic ring to which a $Y_1$-containing 5-membered ring is condensed, or a $C_5$-$C_{60}$ heterocyclic ring to which a $Y_1$-containing 6-membered ring is condensed,
ii) $Y_1$ is C and each of a1 and a2 is 0,
iii) $Y_1$ is C and a1 and a2 are each independently selected from 1 and 2,
at least one substituent of the substituted $C_5$-$C_{60}$ carbocyclic group, the substituted $C_1$-$C_{60}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from:
deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;
a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);
a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each independently selected from hydrogen, deuterium, —F, —Cl, —Br, —I, a hydroxyl group, a cyano group, a nitro group, an amino group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

2. The organic light-emitting device of claim 1, wherein the organometallic compound has a T1 energy of greater than or equal to 2.25 eV.

3. The organic light-emitting device of claim 1, wherein the organic layer comprises the organometallic compound.

4. The organic light-emitting device of claim 1, wherein the emission layer comprises the organometallic compound.

5. The organic light-emitting device of claim 4, wherein, the emission layer further comprises a host, and
the amount of the host included in the emission layer is greater than the amount of the organometallic compound included in the emission layer.

6. The organic light-emitting device of claim 4, wherein the emission layer emits light having a wavelength of maximum emission from 445 nm to 550 nm.

7. The organic light-emitting device of claim 1, wherein the first electrode is an anode,
the second electrode is a cathode,
the organic layer further comprises:
a hole transport region disposed between the first electrode and the emission layer; and
an electron transport region disposed between the emission layer and the second electrode, the hole transport region comprises a hole injection layer, a hole transport layer, an emission auxiliary layer, an electron blocking layer, or any combination thereof, and
the electron transport region comprises a buffer layer, a hole blocking layer, an electron transport layer, an electron injection layer, or any combination thereof.

8. An organometallic compound represented by Formula 1:

$$M(L_A)_{n1}(L_B)_{n2} \qquad \text{<Formula 1>}$$

wherein in Formula 1,
M is selected from platinum (Pt), palladium (Pd), copper (Cu), zinc (Zn), silver (Ag), gold (Au), iridium (Ir), rhodium (Rh), cobalt (Co), ruthenium (Ru), rhenium (Re), osmium (Os), titanium (Ti), zirconium (Zr), hafnium (Hf), europium (Eu), terbium (Tb), and thulium (Tm),
n1 is 1 or 2,
n2 is 0 or 1,
the sum of n1 and n2 is 2,
$L_A$ is a tridentate ligand represented by Formula 1A, and
$L_B$ is a tridentate ligand represented by Formula 1B:

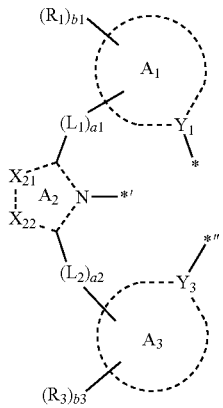

<Formula 1A>

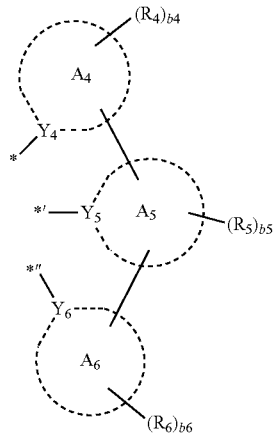

<Formula 1B> wherein in Formulae 1A and 1B,
*, *', and *'' each are a binding site to M,
$Y_1$ and $Y_3$ to $Y_6$ are each independently selected from N and C,
$X_{21}$ is selected from C($Z_{21}$), N($Z_{21}$), N, O, and S,
$X_{22}$ is selected from C($Z_{22}$), N($Z_{22}$), N, O, and S, A₁ is selected from groups represented by Formulae A1-1 to A1-7 and A1-14 to A1-21, and
A₃ is selected from groups represented by Formulae A3-1 to A3-7:
A1-1
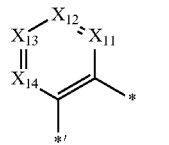
A1-2
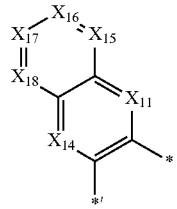
A1-3
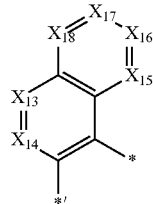
A1-4
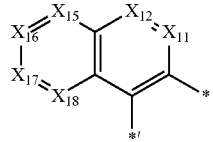
A1-5
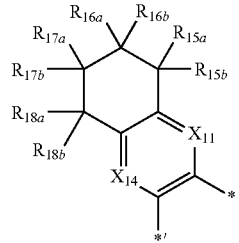
A1-6
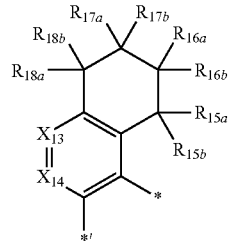
A1-7
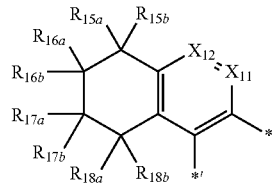
-continued
A1-14
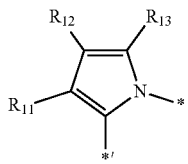
A1-15
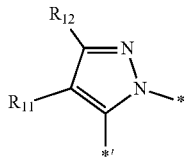
A1-16
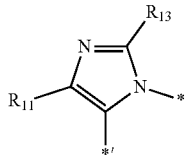
A1-17
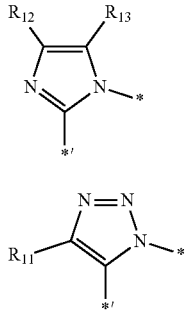
A1-18
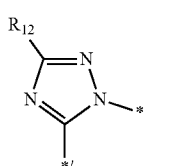
A1-19
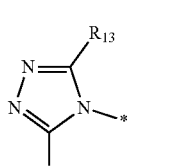
A1-20
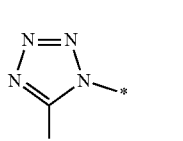
A1-21
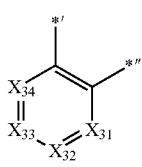
A3-1

-continued

A3-2
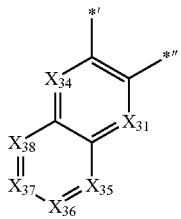

A3-3
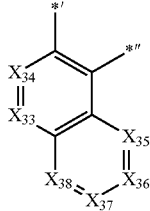

A3-4
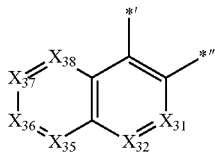

A3-5
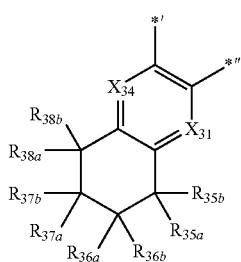

A3-6
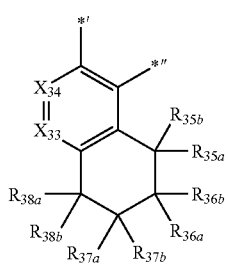

A3-7
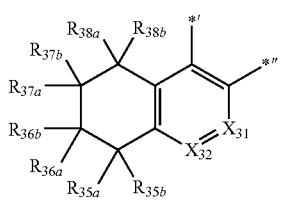

wherein in Formulae A1-1 to A1-7, A1-14 to A1-21, and A3-1 to A3-7
$X_{11}$ is N or $C(R_{11})$, $X_{12}$ is N or $C(R_{12})$, $X_{13}$ is N or $C(R_{13})$, $X_{14}$ is N or $C(R_{14})$, $X_{15}$ is N or $C(R_{15})$, $X_{16}$ is N or $C(R_{16})$, $X_{17}$ is N or $C(R_{17})$, $X_{18}$ is N or $C(R_{18})$,
$X_{31}$ is N or $C(R_{31})$, $X_{32}$ is N or $C(R_{32})$, $X_{33}$ is N or $C(R_{33})$, $X_{34}$ is N or $C(R_{34})$, $X_{35}$ is N or $C(R_{35})$, $X_{36}$ is N or $C(R_{36})$, $X_{37}$ is N or $C(R_{37})$, $X_{38}$ is N or $C(R_{38})$,
$R_{11}$ to $R_{18}$ and $R_{15a}$ to $R_{18b}$ are each independently the same as described in connection with $R_1$ in Formula 1A, $R_{31}$ to $R_{38}$ and $R_{35a}$ to $R_{38b}$ are each independently the same as described in connection with $R_3$ in Formula 1A,

* and *″ each indicated a binding site to M, and

*′ indicates a binding site to a neighboring atom, $A_2$ is selected from groups represented by Formulae A2-1 to A2-18:

A2-1
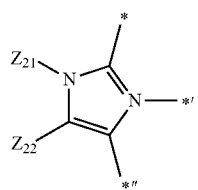

A2-2
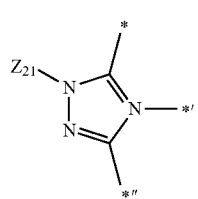

A2-3
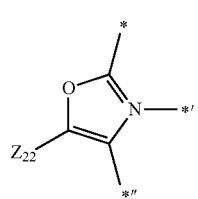

A2-4
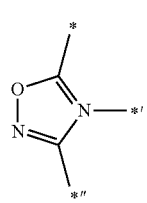

A2-5
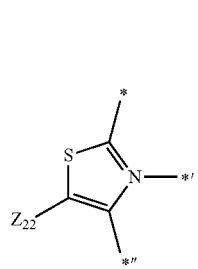

A2-6
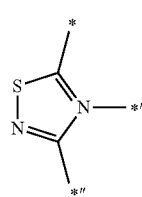

-continued

A2-7 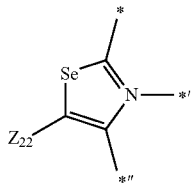

A2-8 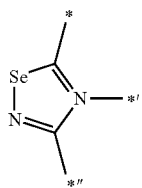

A2-9 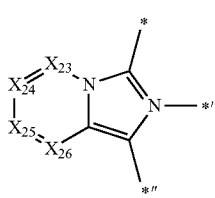

A2-10 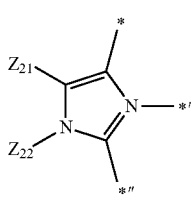

A2-11 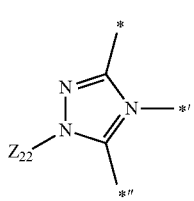

A2-12 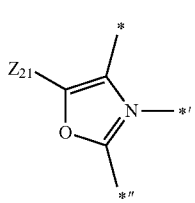

A2-13 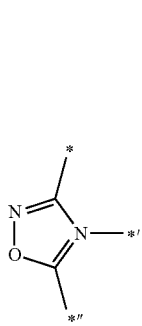

-continued

A2-14 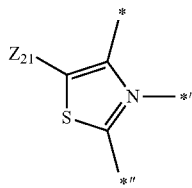

A2-15 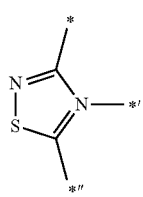

A2-16 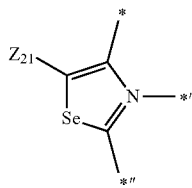

A2-17 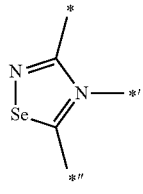

A2-18 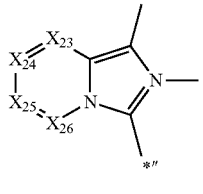

wherein in Formulae A2-1 to A2-18,
$X_{23}$ is N or $C(R_{21})$, $X_{24}$ is N or $C(R_{22})$, $X_{25}$ is N or $C(R_{23})$, $X_{26}$ is N or $C(R_{24})$,
$Z_{21}$ and $Z_{22}$ are the same as described in connection with Formula 1A,
$R_{21}$ to $R_{24}$ are the same as described in connection with $R_1$ in Formula 1A,
* is a binding site to $L_1$,
*′ is a binding site to M, and
*″ is a binding site to $L_2$,
$A_4$ is selected from groups represented by Formulae A4-1 to A4-26, and
$A_6$ is selected from groups represented by Formulae A6-1 to A6-26:

A4-1 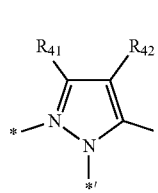

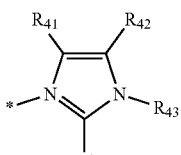 A4-2
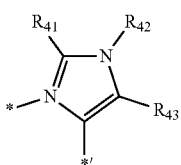 A4-3
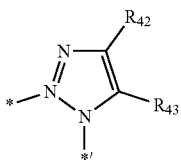 A4-4
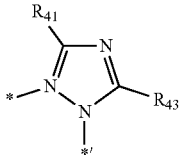 A4-5
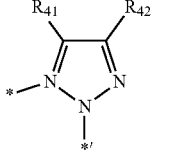 A4-6
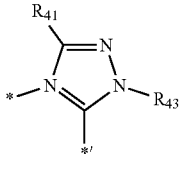 A4-7
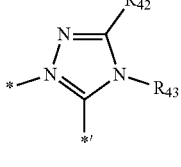 A4-8
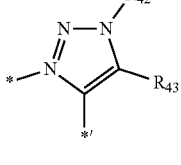 A4-9
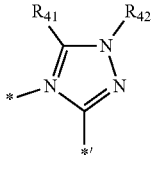 A4-10
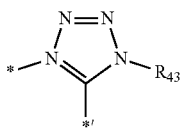 A4-11
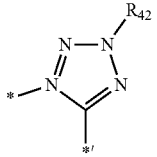 A4-12
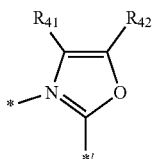 A4-13
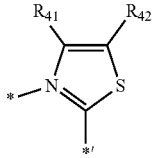 A4-14
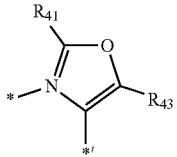 A4-15
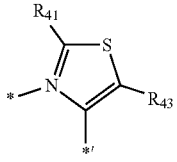 A4-16
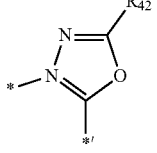 A4-17
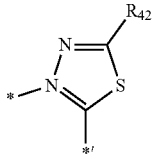 A4-18
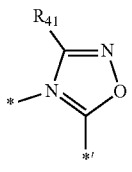 A4-19

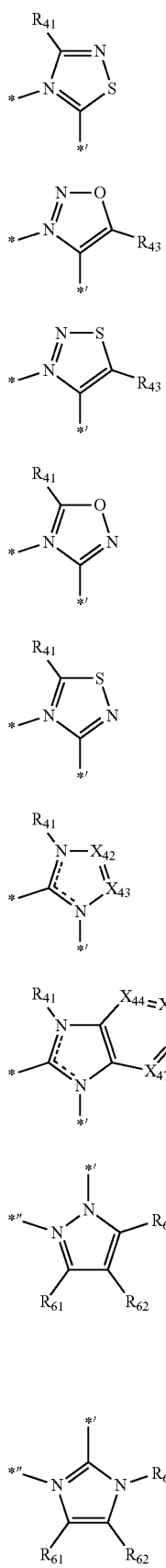
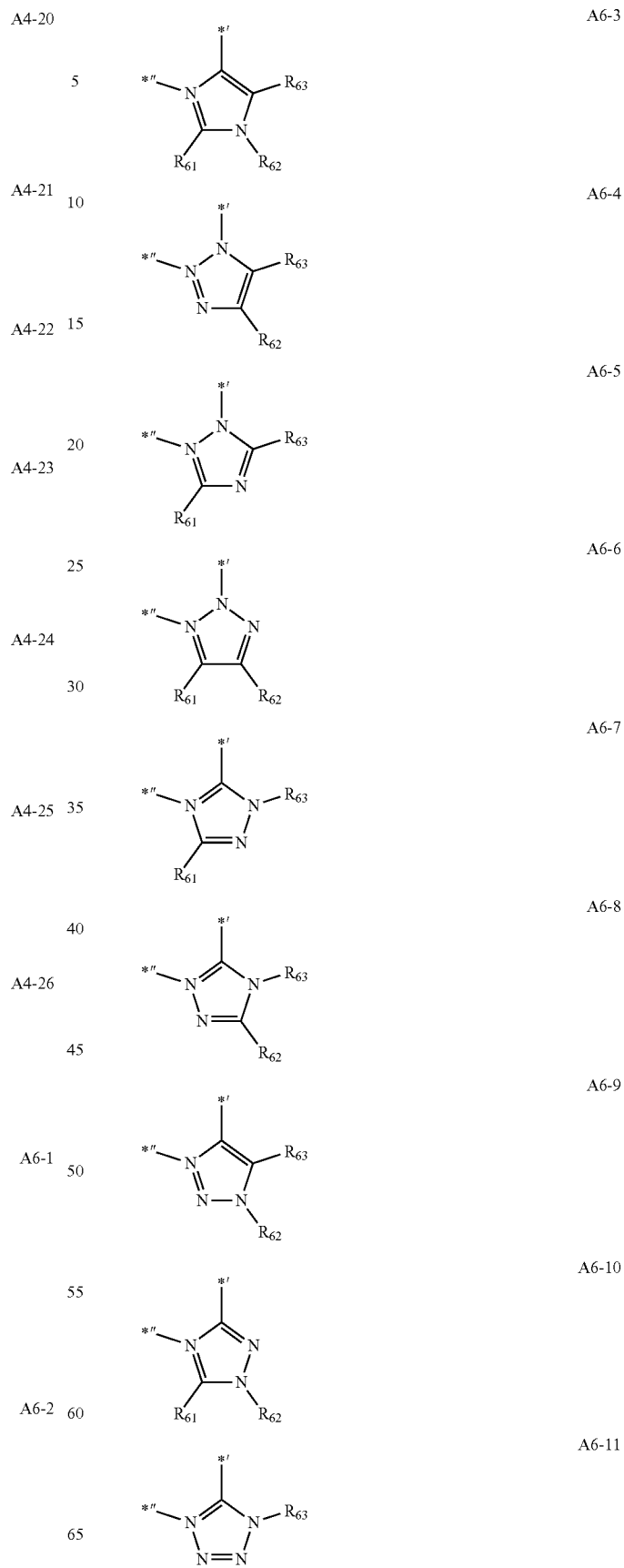

-continued

A6-12 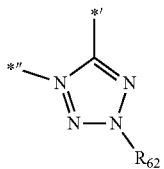

A6-13 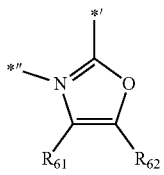

A6-14 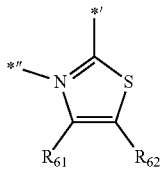

A6-15 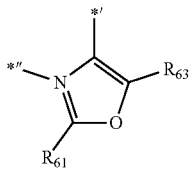

A6-16 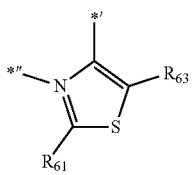

A6-17 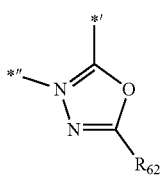

A6-18 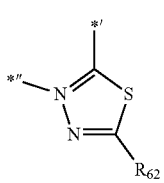

A6-19 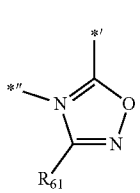

A6-20 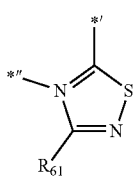

-continued

A6-21 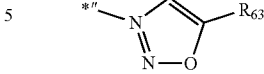

A6-22 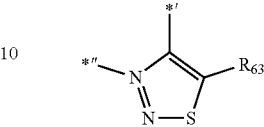

A6-23 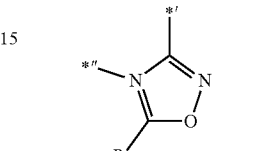

A6-24 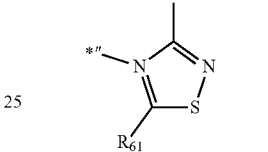

A6-25 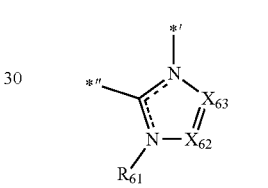

A6-26 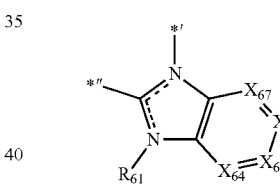

wherein in Formulae A-4-1 to A4-26 and A-6-1 to A6-26,
$X_{42}$ is N or $C(R_{42})$, $X_{43}$ is N or $C(R_{43})$, $X_{44}$ is N or $C(R_{44})$, $X_{45}$ is N or $C(R_{45})$, $X_{46}$ is N or $C(R_{46})$, $X_{47}$ is N or $C(R_{47})$,
$X_{62}$ is N or $C(R_{62})$, $X_{63}$ is N or $C(R_{63})$, $X_{64}$ is N or $C(R_{64})$, $X_{65}$ is N or $C(R_{65})$, $X_{66}$ is N or $C(R_{66})$, $X_{67}$ is N or $C(R_{67})$,
$R_{41}$ to $R_{47}$ are each independently the same as described in connection with $R_4$ in Formula 1B,
$R_{61}$ to $R_{67}$ are each independently the same as described in connection with $R_6$ in Formula 1B,
\* and \*″ each indicate a binding site to M, and
\*′ indicates a binding site to a neighboring atom,
$A_5$ is selected from a group represented by one of Formulae A5-1 and A5-2:

A5-1 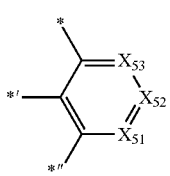

-continued

A5-2

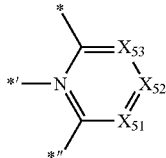

wherein in Formulae A5-1 and A5-2, $X_{51}$ is N or $C(R_{51})$, $X_{52}$ is N or $C(R_{52})$, and $X_{53}$ is N or $(R_{53})$, $R_{51}$ to $R_{53}$ are each independently the same as described in connection with $R_5$ in Formula 1B,

* is a binding site to $A_4$,
*' is a binding site to M, and
*'' is a binding site to $A_6$, wherein in Formulae 1A and 1B, $L_1$ and $L_2$ are each independently selected from *—O—*', *—S—*', *—C($R_7$)($R_8$)—*', *—C($R_7$)=*', *=C($R_7$)—*', *—C($R_7$)=C($R_8$)—*', *—C(=O)—*', *—C(=S)—*', *—C≡C—*', *—B($R_7$)—*', *—N($R_7$)—*', *—P($R_7$)—*', *—Si($R_7$)($R_8$)—*', *—P($R_7$)($R_8$)—*', and *—Ge($R_7$)($R_8$)—*', a1 and a2 are each independently selected from 0, 1, and 2, $Z_{21}$, $Z_{22}$, $R_1$, and $R_3$ to $R_8$ are each independently selected from hydrogen, deuterium, —F —Cl, —Br, —I, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —C(=O)($Q_1$), —S(=O)$_2$($Q_1$), and —P(=O)($Q_1$)($Q_2$), b1 and b3 to b6 are each independently selected from 1, 2, 3, 4, 5, 6, 7, and 8, with the proviso that: at least one pair of substituents are optionally linked together to form a substituted or unsubstituted $C_5$-$C_{60}$ carbocyclic group or a substituted or unsubstituted $C_1$-$C_{60}$ heterocyclic group, the pair of substituents selected from the group consisting of $Z_{21}$ and $Z_{22}$, two neighboring $R_1$(s) in $R_1$(s) in the number of b1, two neighboring $R_3$(s) in $R_3$(s) in the number of b3, two neighboring $R_4$(s) in $R_4$(s) in the number of b4, two neighboring $R_5$(s) in $R_5$ (s) in the number of b5, two neighboring $R_6$(s) in $R_6$ (s) in the number of b6, $R_1$ and $R_7$, and $R_3$ and $R_7$, one of the following conditions i) to iii) is satisfied, i) $Y_1$ is N, and $A_1$ is a $Y_1$-containing 5-membered ring, a $Y_1$-containing 6-membered ring, a $C_5$-$C_{60}$ heterocyclic ring to which a $Y_1$-containing 5-membered ring is condensed, or a $C_5$-$C_{60}$ heterocyclic ring to which a $Y_1$-containing 6-membered ring is condensed, ii) $Y_1$ is C and each of a1 and a2 is 0, iii) $Y_1$ is C and a1 and a2 are each independently selected from 1 and 2, and at least one substituent of the substituted $C_5$-$C_{60}$ carbocyclic group, the substituted $C_1$-$C_{60}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)

($Q_{22}$), —B($Q_{21}$)($Q_{22}$), —C(=O)($Q_{21}$), —S(=O)$_2$ ($Q_{21}$), and —P(=O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$) ($Q_{32}$), wherein $Q_1$ to $Q_3$, $Q_{11}$ to $Q_{13}$, $Q_{21}$ to $Q_{23}$, and $Q_{31}$ to $Q_{33}$ are each independently selected from hydrogen, deuterium, —F, —Cl, —Br, —I, a hydroxyl group, a cyano group, a nitro group, an amino group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

9. The organometallic compound of claim 8, wherein
n1 is 1, and
n2 is 1.

10. The organometallic compound of claim 8, wherein,
in Formula 1A, a bond between $Y_1$ and M is a covalent bond, a bond between M and N linked to *' in $A_2$ is a coordination bond, and a bond between $Y_3$ and M is a covalent bond, and
in Formula 1B, a bond between $Y_4$ and M is a coordination bond, a bond between $Y_5$ and M is a covalent bond, and a bond between $Y_6$ and M is a coordination bond.

11. The organometallic compound of claim 8, wherein
at least one of $Z_{21}$, $Z_{22}$, $R_1$(s) in the number of b1, $R_3$(s) in the number of b3, $R_4$(s) in the number of b4, $R_5$(s) in the number of b5, and $R_6$(s) in the number of b6 is selected from:

—F, a cyano group, a $C_1$-$C_{10}$ alkyl group substituted with at least one —F, a $C_1$-$C_{10}$ alkyl group substituted with at least one —Cl, a $C_1$-$C_{10}$ alkyl group substituted with at least one —Br, and a $C_1$-$C_{10}$ alkyl group substituted with at least one —I.

12. The organometallic compound of claim 8, wherein $L_A$ is selected from tridentate ligands represented by Formulae 1AA-1 to 1AA-3, 1AB-1 to 1AB-3, and 1AC-1 to 1AC-3:

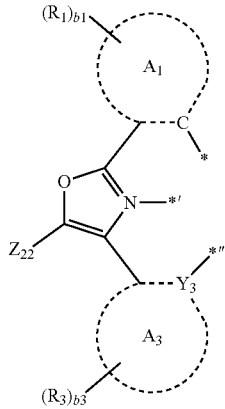

1AA-1

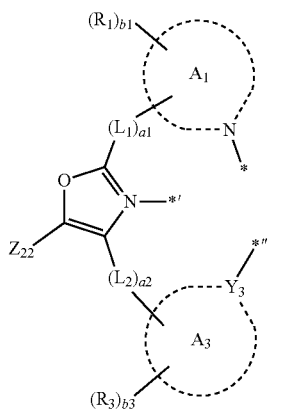

1AA-2

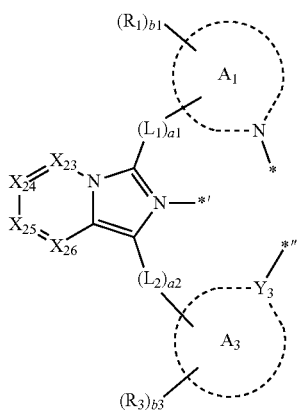

1AA-3

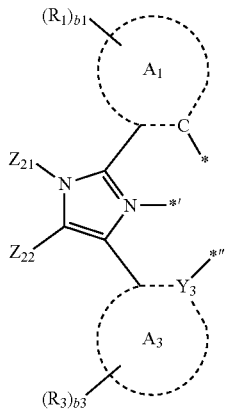

1AB-1

1AB-2

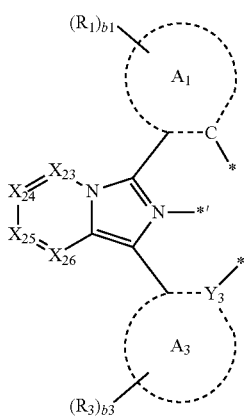

1AB-3

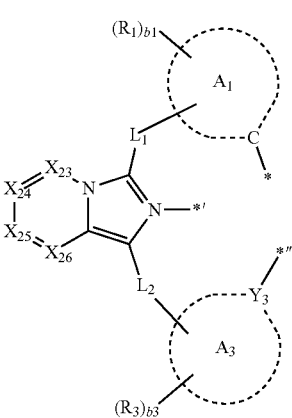

1AC-3

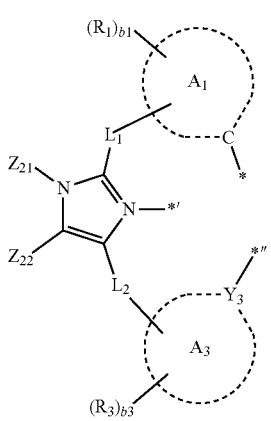

1AC-1

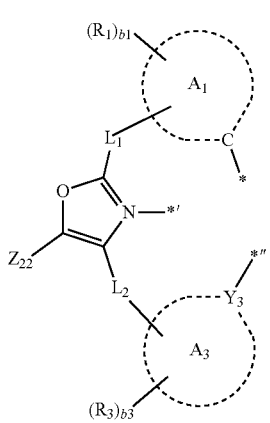

1AC-2 wherein in Formulae 1AA-1 to 1AA-3, 1AB-1 to 1AB-3, and 1AC-1 to 1AC-3, $Y_3$, $A_1$, $A_3$, $L_1$, $L_2$, a1, a2, $Z_{21}$, $Z_{22}$, $R_1$, $R_3$, b1, and b3 are the same as described in connection with Formula 1A, $X_{23}$ is N or $C(R_{21})$, $X_{24}$ is N or $C(R_{22})$, $X_{25}$ is N or $C(R_{23})$, $X_{26}$ is N or $C(R_{24})$, $R_{21}$ to $R_{24}$ are the same as described in connection with $R_1$ in Formula 1A, and

*, *', and *" are each a binding site to M.

13. The organometallic compound of claim 8, wherein $L_B$ is selected from tridentate ligands represented by Formulae 1B-1 and 1B-2:

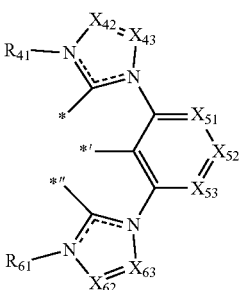

1B-1

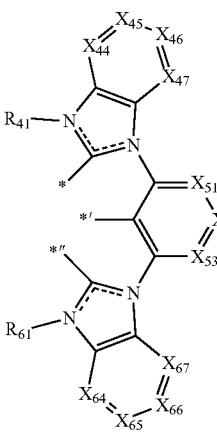

1B-2 wherein in Formulae 1B-1 and 1B-2, $X_{42}$ is N or $C(R_{42})$, $X_{43}$ is N or $C(R_{43})$, $X_{44}$ is N or $C(R_{44})$, $X_{45}$ is N or $C(R_{45})$, $X_{46}$ is N or $C(R_{46})$, $X_{47}$ is N or $C(R_{47})$, $X_{51}$ is N or $C(R_{51})$, $X_{52}$ is N or $C(R_{52})$, and $X_{53}$ is N or $C(R_{53})$, $X_{62}$ is N or $C(R_{62})$, $X_{63}$ is N or $C(R_{63})$, $X_{64}$ is N or $C(R_{64})$, $X_{65}$ is N or $C(R_{65})$, $X_{66}$ is N or $C(R_{66})$, $X_{67}$ is N or $C(R_{67})$, $R_{41}$ to $R_{47}$ are each independently the same as described in connection with $R_4$ in Formula 1B, $R_{51}$ to $R_{53}$ are each independently the same as described in connection with $R_5$ in Formula 1B, $R_{61}$ to $R_{67}$ are each independently the same as described in connection with $R_6$ in Formula 1B, and

*, *', and *" are each a binding site to M.

14. The organometallic compound of claim 8, wherein the organometallic compound is one selected from Compounds 1 to 10, 16 to 54, 56, 57 and 60 to 65:

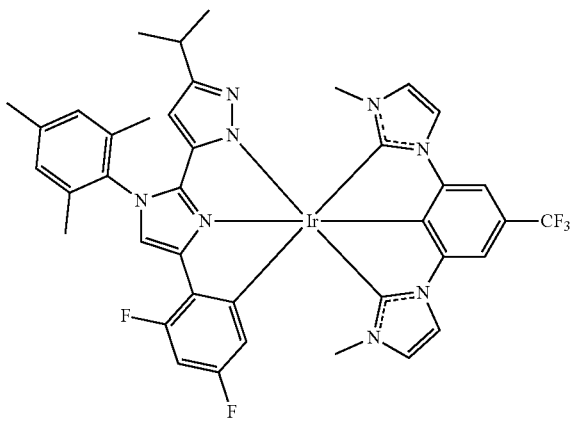

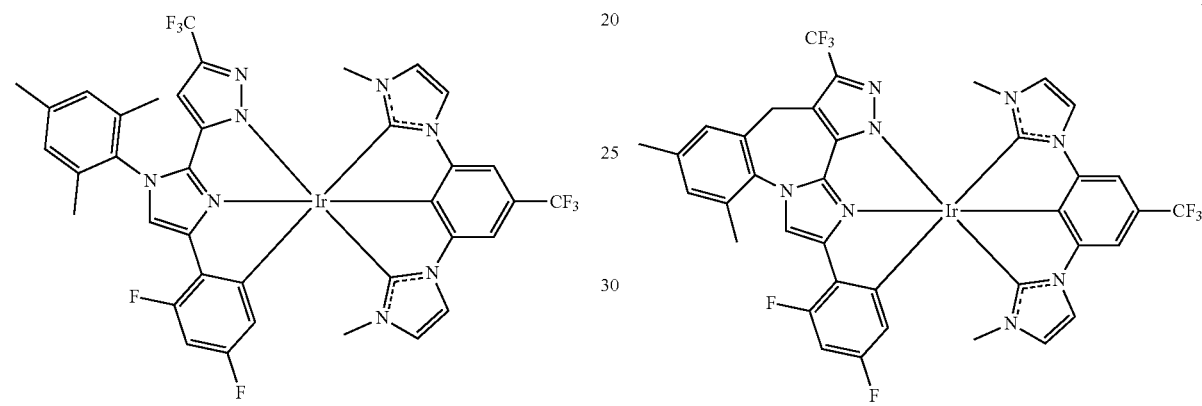

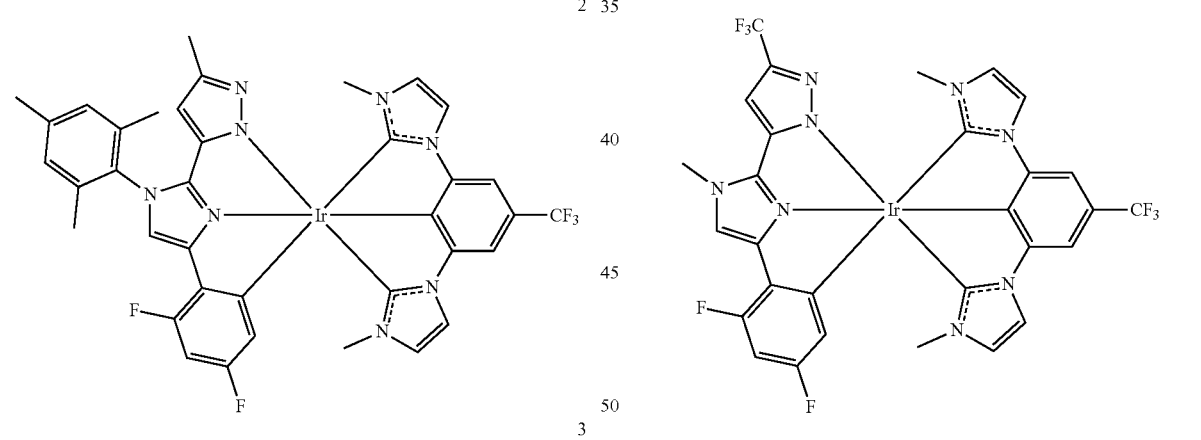

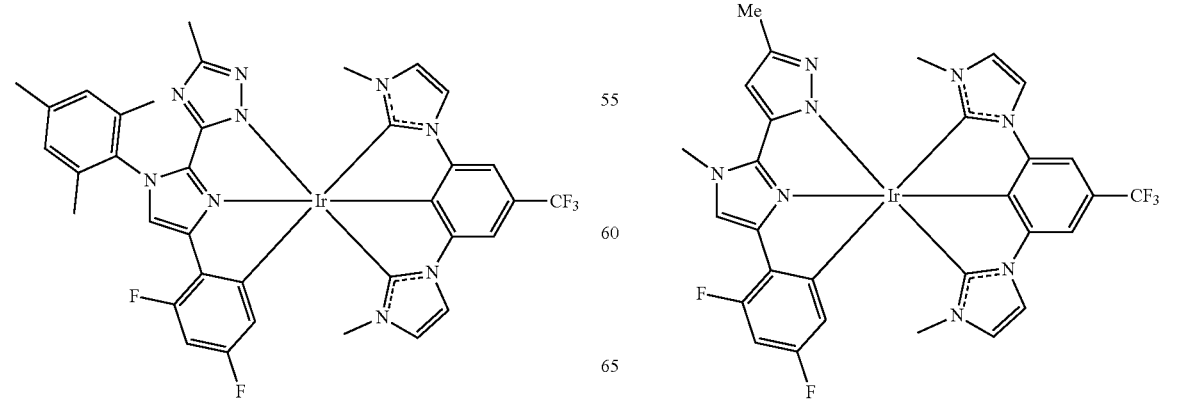

8
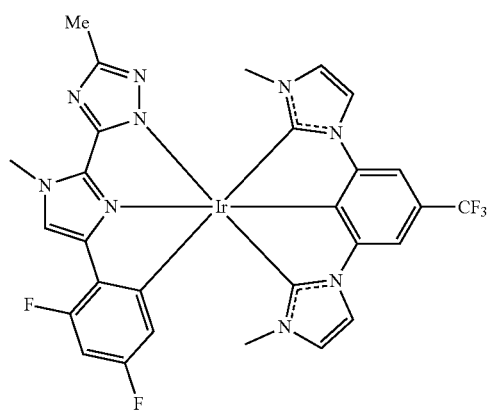
9
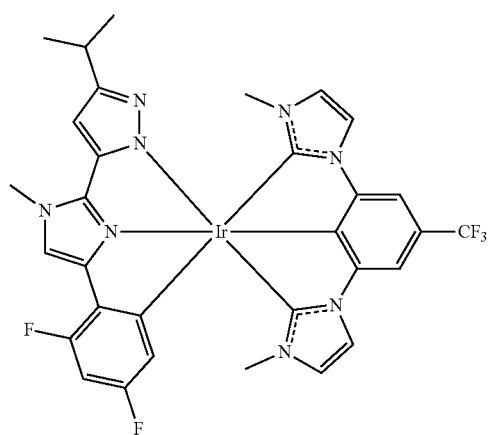
10
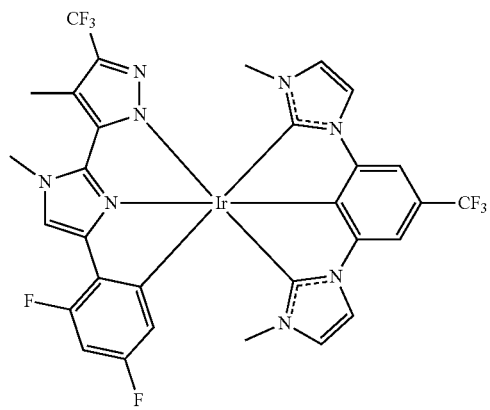
16
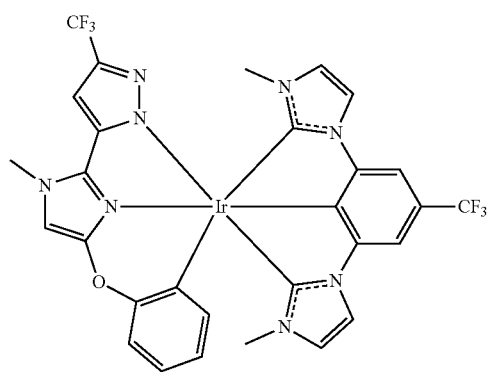
17
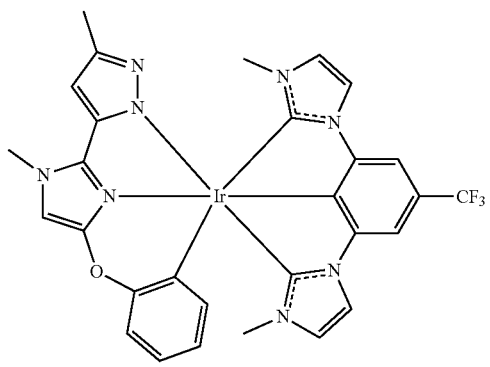
18
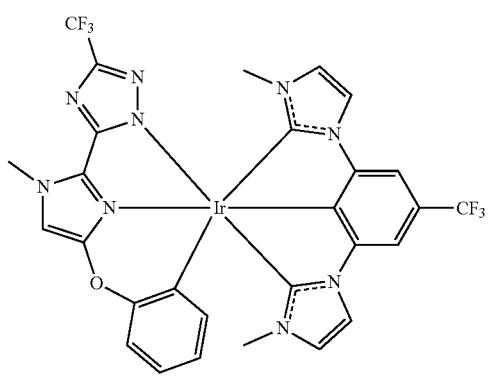
19
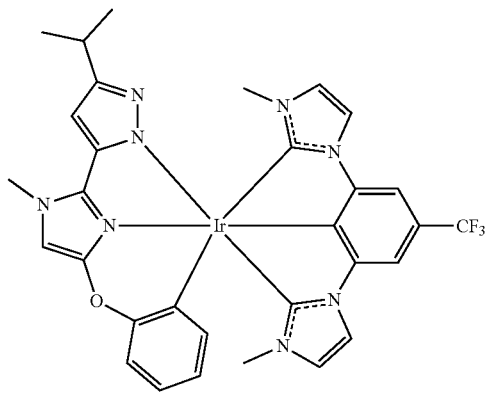
20
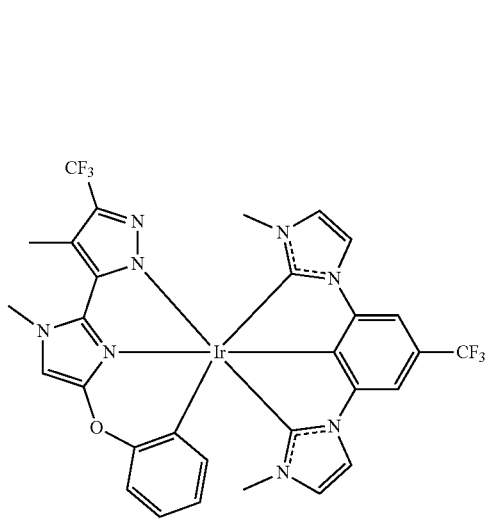

-continued
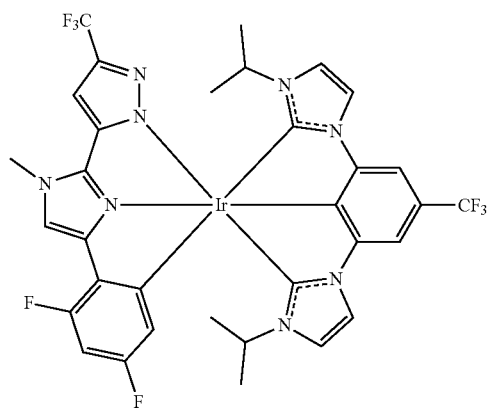
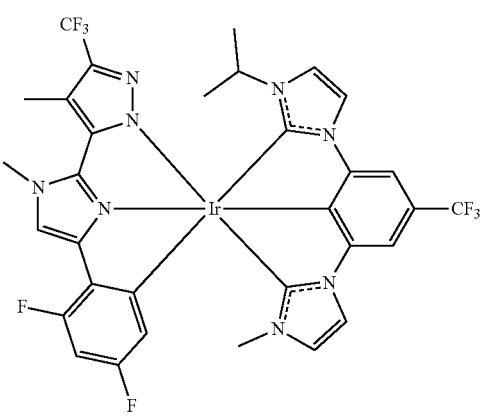
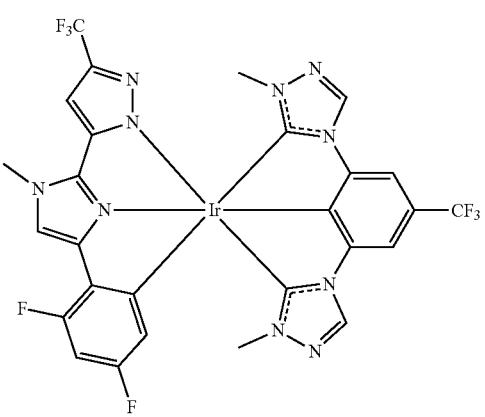
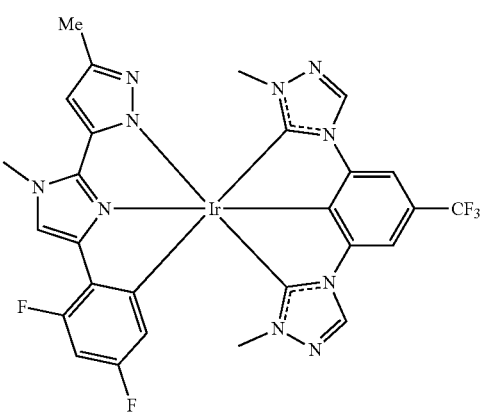
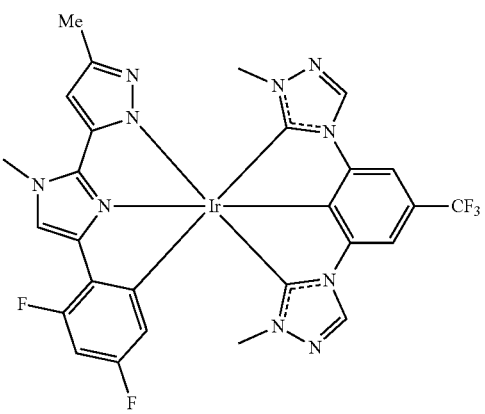

29
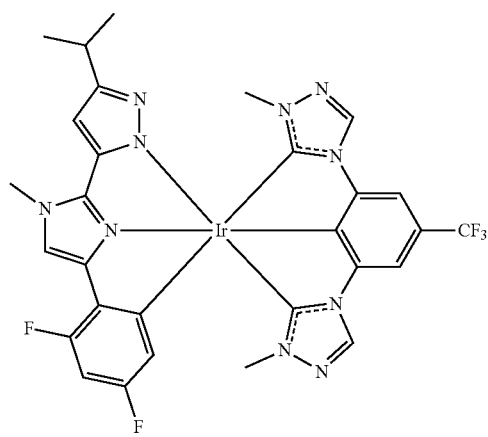
30
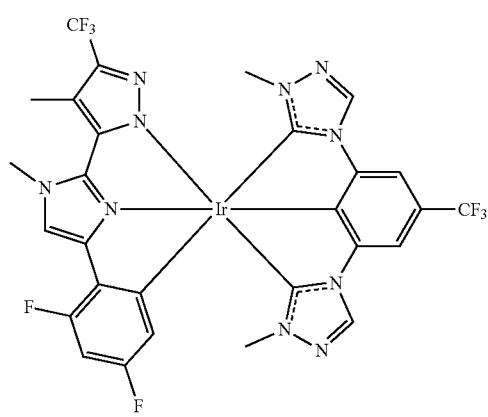
31
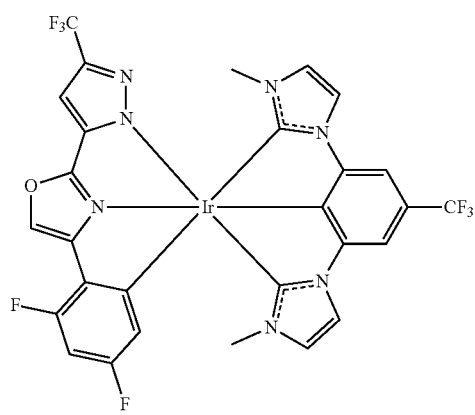
32
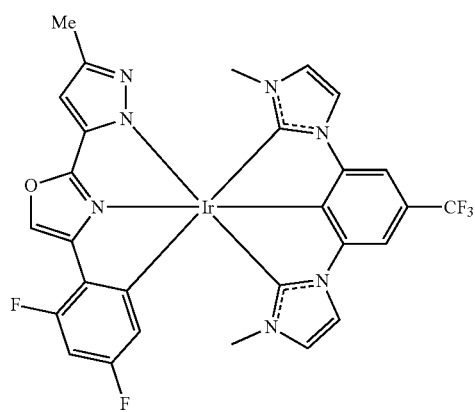
33
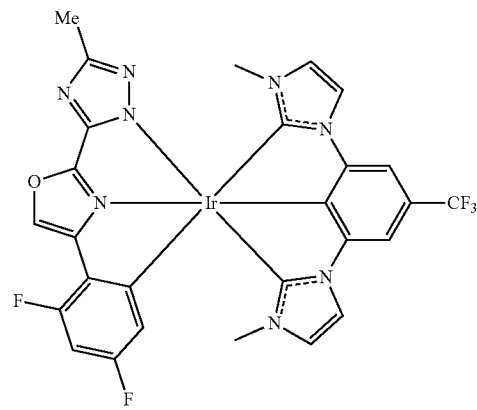
34
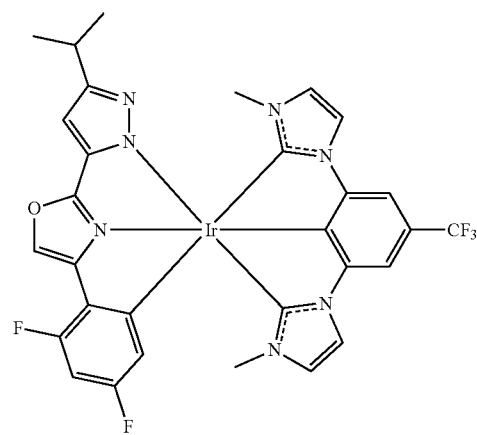
35
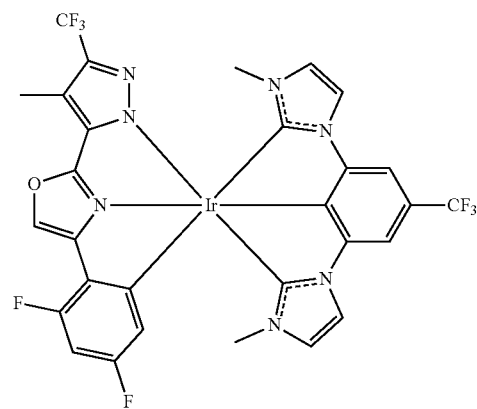
36
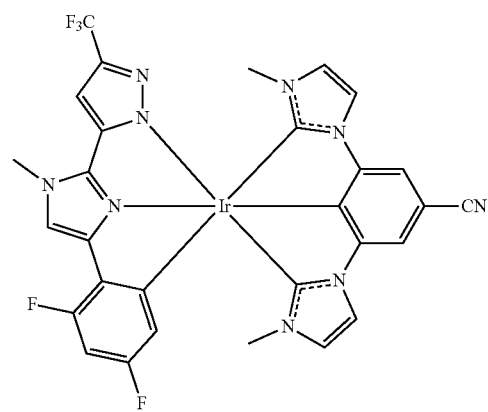

37
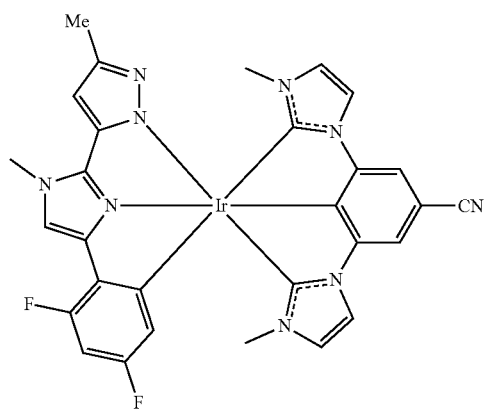
38
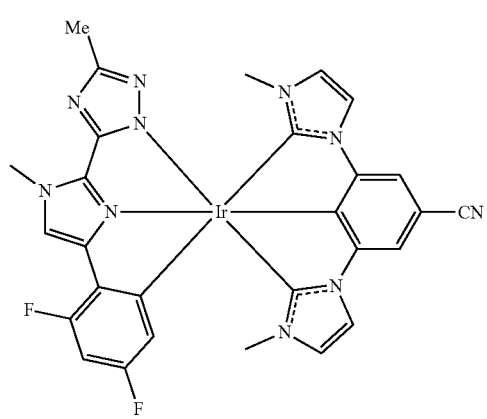
39
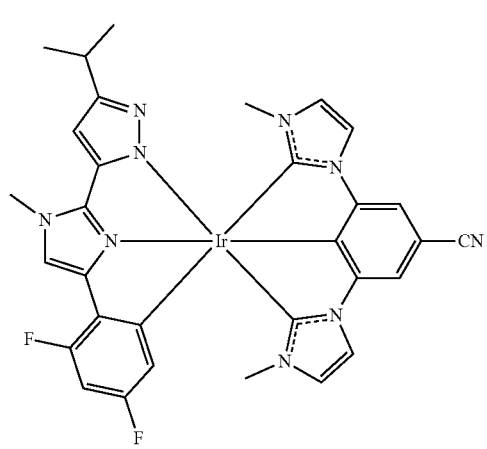
40
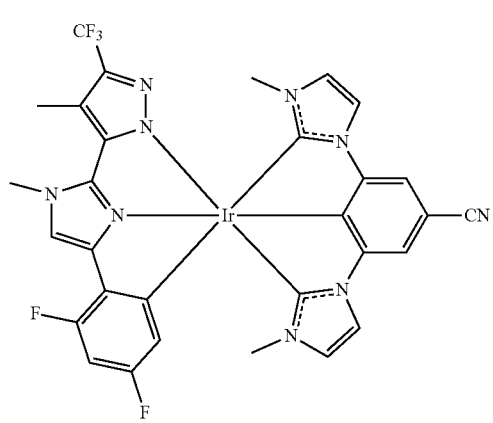
41
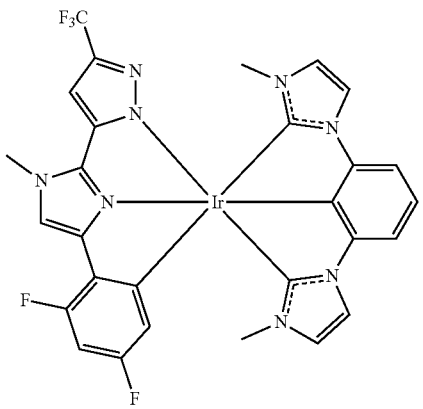
42
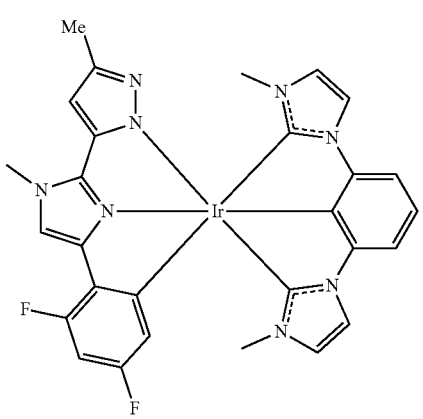
43
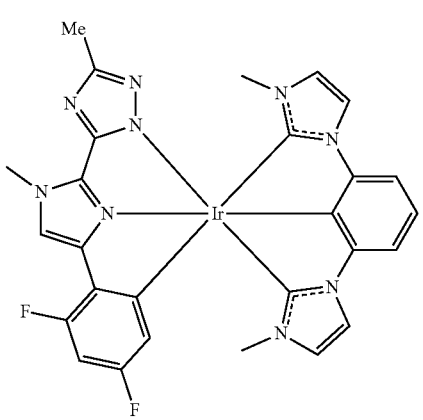
44
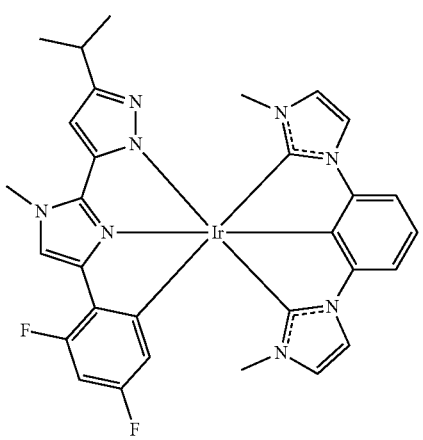

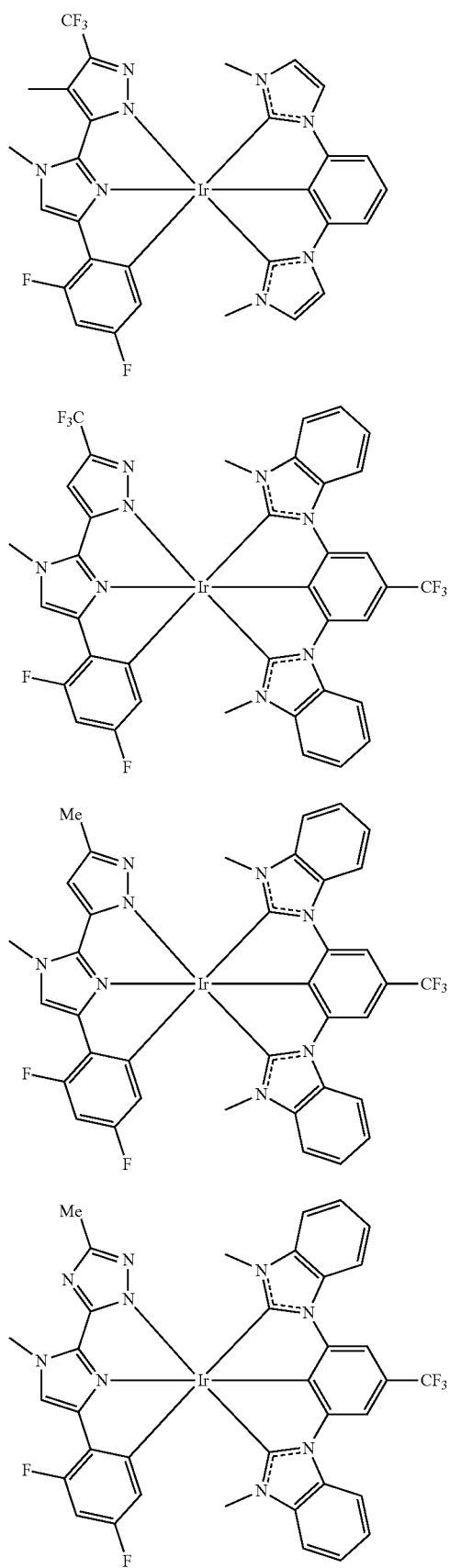
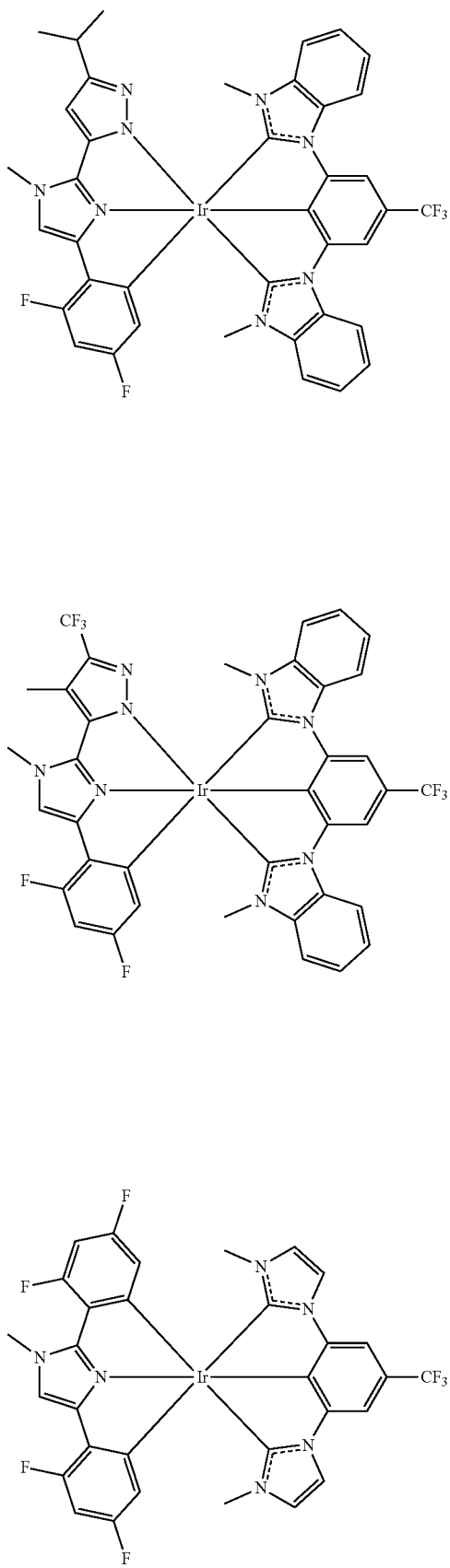

229
-continued
52
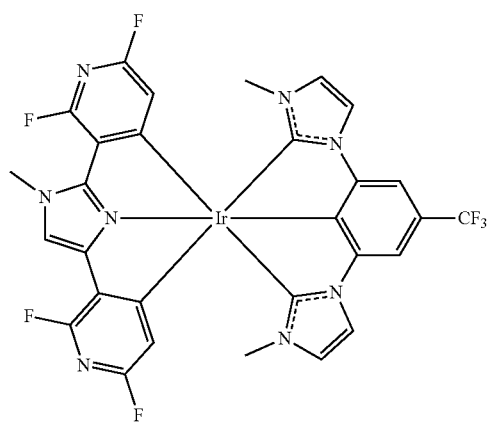
53
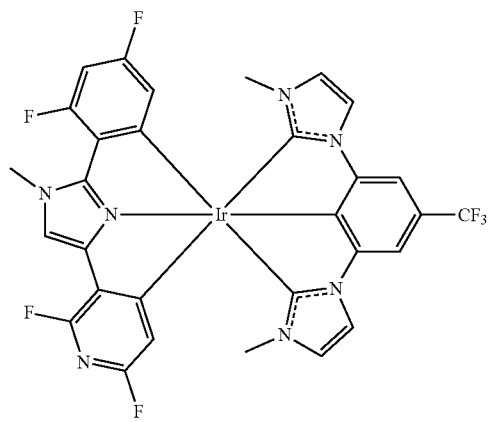
54
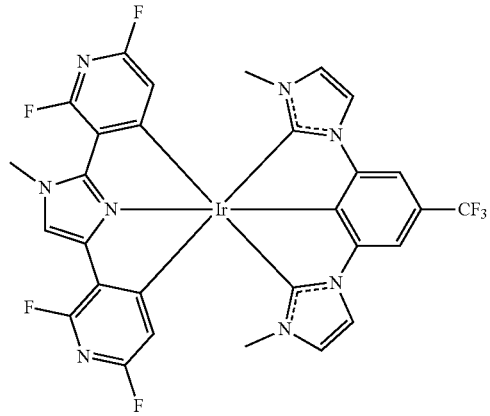
56
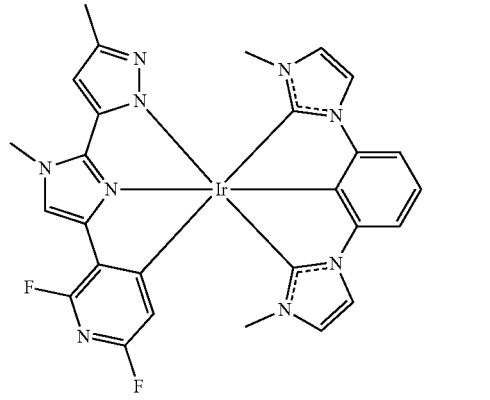
230
-continued
57
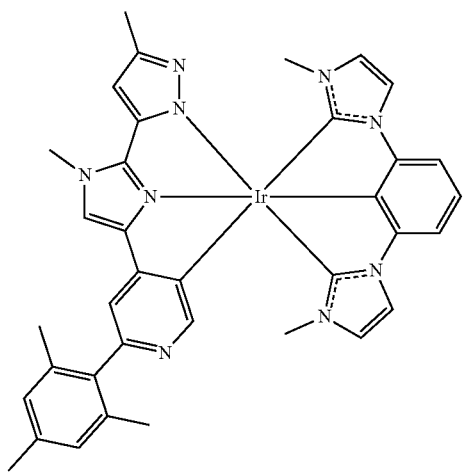
60
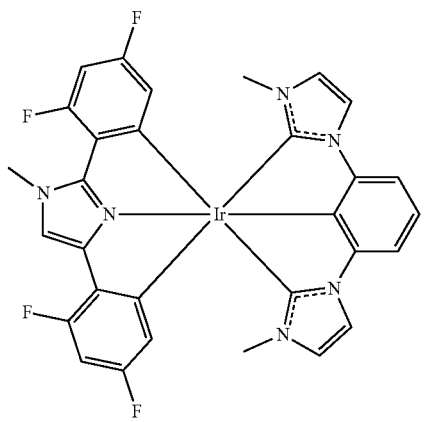
61
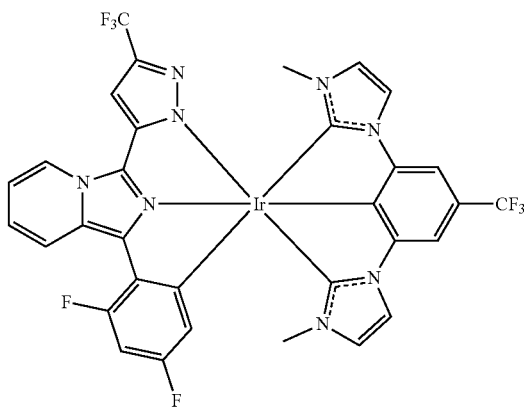

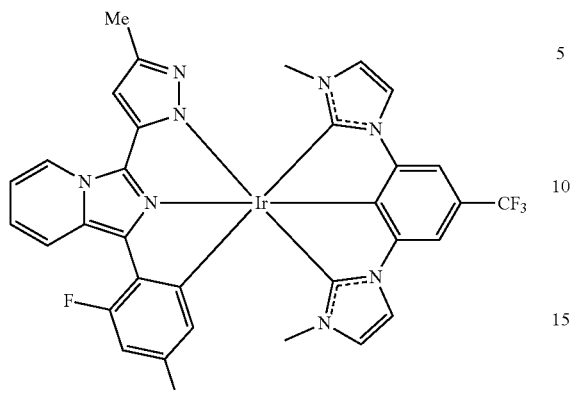
62
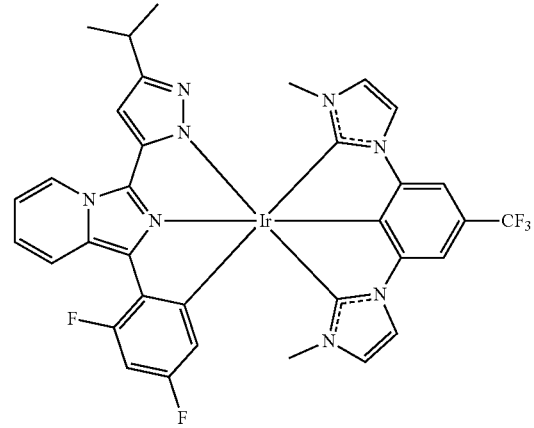
64
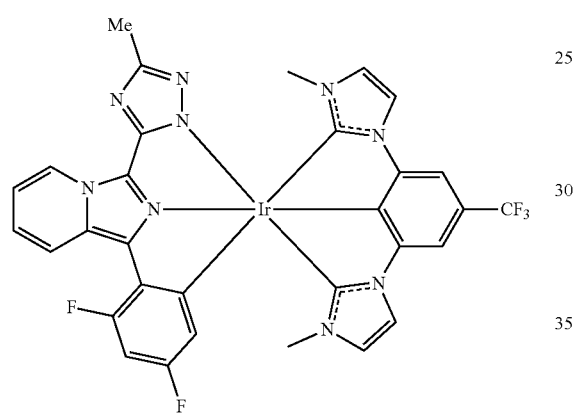
63
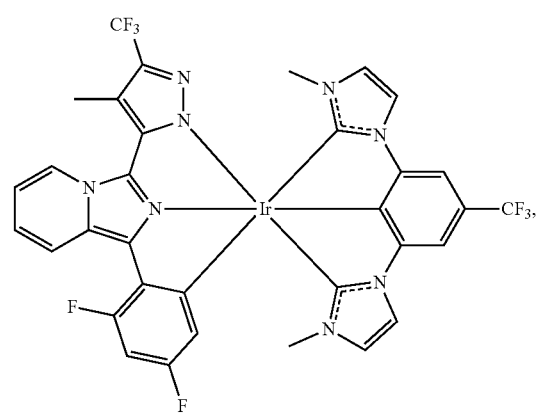
65
wherein Me represents a methyl group.
* * * * *